United States Patent
Chae et al.

(10) Patent No.: US 11,610,939 B2
(45) Date of Patent: Mar. 21, 2023

(54) LIGHT EMITTING DIODE (LED) STACK FOR A DISPLAY

(71) Applicant: SEOUL VIOSYS CO., LTD., Ansan-si (KR)

(72) Inventors: Jong Hyeon Chae, Ansan-si (KR); Chung Hoon Lee, Ansan-si (KR); Seong Gyu Jang, Ansan-si (KR); Chang Yeon Kim, Ansan-si (KR); Ho Joon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 131 days.

(21) Appl. No.: 17/366,510

(22) Filed: Jul. 2, 2021

(65) Prior Publication Data
US 2021/0335887 A1    Oct. 28, 2021

Related U.S. Application Data

(63) Continuation of application No. 16/915,384, filed on Jun. 29, 2020, which is a continuation of application (Continued)

(51) Int. Cl.
*H01L 27/12*    (2006.01)
*H01L 27/15*    (2006.01)
(Continued)

(52) U.S. Cl.
CPC ........ *H01L 27/156* (2013.01); *H01L 25/0756* (2013.01); *H01L 33/10* (2013.01);
(Continued)

(58) Field of Classification Search
CPC .............. H01L 27/156; H01L 27/1214; H01L 27/3209; H01L 27/3211; H01L 27/3216;
(Continued)

(56) References Cited

U.S. PATENT DOCUMENTS 5,583,349 A    12/1996    Norman et al.
5,583,350 A    12/1996    Norman et al.
(Continued)

FOREIGN PATENT DOCUMENTS

CN    1423345    6/2003
CN    102593290    7/2012
(Continued)

OTHER PUBLICATIONS

Notice of Allowance issued in U.S. Appl. No. 16/915,384 dated Apr. 21, 2022.
(Continued)

*Primary Examiner* — Ida M Soward
(74) *Attorney, Agent, or Firm* — H.C. Park & Associates, PLC

(57) ABSTRACT

A light emitting diode (LED) pixel for a display including a first LED stack, a second LED stack disposed on a partial region of the first LED stack, a third LED stack disposed on a partial region of the second LED stack, a first ohmic electrode disposed on the first LED stack and forming ohmic contact with the first LED stack, a second transparent electrode disposed between the second LED stack and the third LED stack and in ohmic contact with an upper surface of the second LED stack, and a third transparent electrode in ohmic contact with an upper surface of the third LED stack, in which the first ohmic electrode is laterally spaced apart from the second LED stack.

20 Claims, 80 Drawing Sheets

Related U.S. Application Data

No. 16/198,796, filed on Nov. 22, 2018, now Pat. No. 10,892,297.

(60) Provisional application No. 62/635,284, filed on Feb. 26, 2018, provisional application No. 62/621,503, filed on Jan. 24, 2018, provisional application No. 62/590,870, filed on Nov. 27, 2017, provisional application No. 62/590,810, filed on Nov. 27, 2017, provisional application No. 62/590,854, filed on Nov. 27, 2017.

(51) Int. Cl.
| | | |
|---|---|---|
| *H01L 27/32* | (2006.01) | |
| *H01L 25/07* | (2006.01) | |
| *H01L 25/16* | (2023.01) | |
| *H01L 33/10* | (2010.01) | |
| *H01L 33/30* | (2010.01) | |
| *H01L 33/38* | (2010.01) | |
| *H01L 33/40* | (2010.01) | |
| *H01L 33/42* | (2010.01) | |
| *H01L 33/46* | (2010.01) | |
| *H01L 33/50* | (2010.01) | |
| *H01L 33/58* | (2010.01) | |
| *H01L 33/60* | (2010.01) | |
| *H01L 33/00* | (2010.01) | |
| *H01L 33/08* | (2010.01) | |
| *H01L 25/075* | (2006.01) | |
| *G09G 3/32* | (2016.01) | |
| *H01L 33/22* | (2010.01) | |
| *H01L 29/45* | (2006.01) | |
| *H01L 33/24* | (2010.01) | |

(52) U.S. Cl.
CPC ............ *H01L 33/30* (2013.01); *H01L 33/405* (2013.01); *H01L 33/504* (2013.01); *G09G 3/32* (2013.01); *H01L 25/167* (2013.01); *H01L 27/1214* (2013.01); *H01L 27/322* (2013.01); *H01L 27/3209* (2013.01); *H01L 27/3211* (2013.01); *H01L 27/3216* (2013.01); *H01L 27/3218* (2013.01); *H01L 29/45* (2013.01); *H01L 33/0008* (2013.01); *H01L 33/0093* (2020.05); *H01L 33/08* (2013.01); *H01L 33/22* (2013.01); *H01L 33/24* (2013.01); *H01L 33/38* (2013.01); *H01L 33/385* (2013.01); *H01L 33/42* (2013.01); *H01L 33/46* (2013.01); *H01L 33/58* (2013.01); *H01L 33/60* (2013.01); *H01L 2251/301* (2013.01)

(58) Field of Classification Search
CPC ............ H01L 27/3218; H01L 27/322; H01L 25/0756; H01L 25/167; H01L 33/10; H01L 33/30; H01L 33/405; H01L 33/504; H01L 33/0008; H01L 33/08; H01L 33/38; H01L 33/385; H01L 33/42; H01L 33/46; H01L 33/58; H01L 33/60

See application file for complete search history.

(56) References Cited

U.S. PATENT DOCUMENTS

| | | | |
|---|---|---|---|
| 5,696,389 A | 12/1997 | Ishikawa et al. | |
| 5,703,436 A | 12/1997 | Forrest et al. | |
| 5,707,745 A | 1/1998 | Forrest et al. | |
| 5,739,552 A * | 4/1998 | Kimura | H01L 33/20 257/89 |
| 6,046,543 A | 4/2000 | Bulovic et al. | |
| 6,100,103 A | 8/2000 | Shim et al. | |
| 6,365,270 B2 | 4/2002 | Forrest et al. | |
| 6,563,139 B2 * | 5/2003 | Hen | H01L 25/0756 257/97 |
| 6,717,358 B1 | 4/2004 | Liao et al. | |
| 6,888,305 B2 | 5/2005 | Weaver | |
| 6,934,309 B2 | 8/2005 | Nishikawa et al. | |
| 7,282,741 B2 | 10/2007 | Kim et al. | |
| 7,514,720 B2 | 4/2009 | Kim et al. | |
| 7,570,310 B2 | 8/2009 | Harada et al. | |
| 7,714,504 B2 * | 5/2010 | Forrest | C09K 11/06 313/506 |
| 7,732,803 B2 | 6/2010 | Shum et al. | |
| 7,745,986 B2 | 6/2010 | Ito et al. | |
| 7,977,688 B2 | 7/2011 | Kim | |
| 7,982,228 B2 | 7/2011 | Choi et al. | |
| 8,017,955 B2 | 9/2011 | Wang et al. | |
| 8,022,421 B2 | 9/2011 | Hsueh et al. | |
| 8,035,115 B2 | 10/2011 | Ogihara et al. | |
| 8,058,663 B2 | 11/2011 | Fan et al. | |
| 8,089,074 B2 * | 1/2012 | Kim | H01L 27/153 438/26 |
| 8,324,803 B2 | 12/2012 | Forrest et al. | |
| 8,390,020 B2 | 3/2013 | Tanaka et al. | |
| 8,436,346 B2 | 5/2013 | Ushikubo et al. | |
| 8,466,542 B2 | 6/2013 | Kriman et al. | |
| 8,546,836 B2 | 10/2013 | Kamiya et al. | |
| 8,563,144 B2 | 10/2013 | Kim et al. | |
| 8,618,551 B2 | 12/2013 | Nishikawa et al. | |
| 8,624,274 B2 * | 1/2014 | Hsueh | H01L 27/15 257/89 |
| 8,766,295 B2 | 7/2014 | Kim | |
| 8,835,948 B2 | 9/2014 | Chang et al. | |
| 8,884,316 B2 | 11/2014 | Weaver et al. | |
| 8,941,566 B2 | 1/2015 | Haase | |
| 9,006,752 B2 | 4/2015 | So et al. | |
| 9,018,834 B2 | 4/2015 | Ide et al. | |
| 9,052,096 B2 | 6/2015 | Nishimura et al. | |
| 9,076,929 B2 | 7/2015 | Katsuno et al. | |
| 9,136,498 B2 | 9/2015 | Skipor | |
| 9,142,748 B2 | 9/2015 | Ohmae et al. | |
| 9,202,994 B2 * | 12/2015 | Hashimoto | H01L 33/504 |
| 9,252,380 B2 | 2/2016 | Seo et al. | |
| 9,312,249 B2 | 4/2016 | Choi et al. | |
| 9,318,651 B2 | 4/2016 | Avramescu et al. | |
| 9,337,400 B2 | 5/2016 | Hashimoto et al. | |
| 9,362,335 B2 | 6/2016 | Von Malm | |
| 9,379,286 B2 | 6/2016 | Gaertner et al. | |
| 9,406,908 B2 | 8/2016 | Kim et al. | |
| 9,419,031 B1 | 8/2016 | Or-Bach et al. | |
| 9,419,241 B2 * | 8/2016 | Furukawa | H01L 51/524 |
| 9,443,833 B2 | 9/2016 | Oraw | |
| 9,515,278 B2 | 12/2016 | Suzuki et al. | |
| 9,559,263 B2 | 1/2017 | Matsui et al. | |
| 9,577,012 B2 | 2/2017 | Ooki et al. | |
| 9,748,313 B2 | 8/2017 | Tsuji et al. | |
| 9,786,817 B2 | 10/2017 | Kim et al. | |
| 9,786,859 B2 | 10/2017 | Yamae et al. | |
| 9,847,051 B2 | 12/2017 | Choi et al. | |
| 9,853,187 B2 | 12/2017 | Kim | |
| 9,893,233 B2 | 2/2018 | Kong et al. | |
| 9,905,725 B2 | 2/2018 | Lee | |
| 9,960,212 B2 | 5/2018 | Gee et al. | |
| 9,960,390 B2 | 5/2018 | Höfle et al. | |
| 9,966,369 B2 | 5/2018 | Kim et al. | |
| 10,008,544 B2 | 6/2018 | Park et al. | |
| 10,056,535 B2 | 8/2018 | Chang et al. | |
| 10,069,036 B2 | 9/2018 | Atanackovic | |
| 10,079,265 B1 | 9/2018 | Wu et al. | |
| 10,134,813 B2 | 11/2018 | Choi | |
| 10,170,666 B2 | 1/2019 | Cha et al. | |
| 10,205,058 B2 | 2/2019 | Lee | |
| 10,304,811 B2 | 5/2019 | Zhang et al. | |
| 10,326,056 B2 | 6/2019 | Jung et al. | |
| 10,388,978 B2 | 8/2019 | Morris-Cohen et al. | |
| 10,418,577 B2 | 9/2019 | Yoo et al. | |
| 10,475,957 B2 | 11/2019 | Cha et al. | |
| 10,515,580 B2 | 12/2019 | Henry et al. | |
| 10,559,557 B2 | 2/2020 | Chang et al. | |
| 10,686,099 B2 | 6/2020 | Huppmann et al. | |

(56) References Cited

U.S. PATENT DOCUMENTS

| | | |
|---|---|---|
| 10,686,149 B2 | 6/2020 | Park et al. |
| 10,811,475 B2 | 10/2020 | Zhang et al. |
| 2002/0154259 A1 | 10/2002 | Freidhoff et al. |
| 2003/0047742 A1 | 3/2003 | Hen |
| 2003/0168989 A1 | 9/2003 | Hen |
| 2003/0213967 A1 | 11/2003 | Forrest et al. |
| 2004/0232433 A1 | 11/2004 | Doverspike et al. |
| 2005/0062049 A1 | 3/2005 | Lin et al. |
| 2005/0067627 A1 | 3/2005 | Shen et al. |
| 2005/0140278 A1 | 6/2005 | Kato |
| 2005/0264550 A1 | 12/2005 | Ohshima et al. |
| 2006/0027820 A1* | 2/2006 | Cao .............. H01L 33/382 257/89 |
| 2006/0231852 A1 | 10/2006 | Kususe et al. |
| 2006/0258026 A1 | 11/2006 | Miyachi et al. |
| 2007/0069220 A1 | 3/2007 | Ogihara |
| 2007/0170444 A1* | 7/2007 | Cao .............. H01L 33/382 257/E33.012 |
| 2007/0222922 A1 | 9/2007 | Jin et al. |
| 2008/0068315 A1 | 3/2008 | Kurosaki et al. |
| 2008/0099770 A1 | 5/2008 | Mendendorp et al. |
| 2008/0128728 A1 | 6/2008 | Nemchuk et al. |
| 2008/0130278 A1 | 6/2008 | Ushikubo et al. |
| 2008/0211416 A1 | 9/2008 | Negley et al. |
| 2008/0251799 A1 | 10/2008 | Ikezawa |
| 2008/0308819 A1 | 12/2008 | Louwsma et al. |
| 2009/0009101 A1 | 1/2009 | Kang et al. |
| 2009/0078955 A1 | 3/2009 | Fan et al. |
| 2009/0114931 A1 | 5/2009 | Hsueh et al. |
| 2009/0272989 A1 | 11/2009 | Shum et al. |
| 2010/0032691 A1 | 2/2010 | Kim |
| 2010/0045175 A1 | 2/2010 | Mathai et al. |
| 2010/0051975 A1 | 3/2010 | Suzuki et al. |
| 2010/0065867 A1 | 3/2010 | Unno |
| 2010/0066239 A1 | 3/2010 | Spindler et al. |
| 2010/0076527 A1 | 3/2010 | Hammond et al. |
| 2010/0084668 A1 | 4/2010 | Choi et al. |
| 2010/0144073 A1 | 6/2010 | Louwsma et al. |
| 2010/0159792 A1 | 6/2010 | Visser et al. |
| 2010/0224860 A1 | 9/2010 | Ibbetson et al. |
| 2010/0276706 A1 | 11/2010 | Herrmann |
| 2011/0057211 A1 | 3/2011 | Lee et al. |
| 2011/0086486 A1 | 4/2011 | Lee et al. |
| 2011/0156114 A1 | 6/2011 | Park et al. |
| 2011/0204376 A1 | 8/2011 | Su et al. |
| 2011/0215714 A1 | 9/2011 | Seo et al. |
| 2012/0034714 A1 | 2/2012 | Tsai et al. |
| 2012/0094414 A1 | 4/2012 | Or-Bach et al. |
| 2012/0124903 A1 | 5/2012 | Takeuchi |
| 2012/0223875 A1 | 9/2012 | Lau et al. |
| 2012/0231572 A1 | 9/2012 | Or-Bach et al. |
| 2012/0236532 A1 | 9/2012 | Koo et al. |
| 2012/0305959 A1 | 12/2012 | Yu et al. |
| 2013/0009543 A1 | 1/2013 | Kadoma et al. |
| 2013/0056717 A1 | 3/2013 | Ishihara et al. |
| 2013/0056785 A1 | 3/2013 | Hwang |
| 2013/0069191 A1 | 3/2013 | Or-Bach et al. |
| 2013/0075696 A1 | 3/2013 | Hsieh et al. |
| 2013/0163632 A1 | 6/2013 | Arai et al. |
| 2013/0228757 A1 | 9/2013 | Su et al. |
| 2013/0264587 A1 | 10/2013 | Chang |
| 2013/0285076 A1 | 10/2013 | Liu et al. |
| 2013/0292711 A1 | 11/2013 | Ogihara et al. |
| 2014/0145161 A1 | 5/2014 | Naijo |
| 2014/0184062 A1 | 7/2014 | Kolodin |
| 2014/0191243 A1 | 7/2014 | Singh et al. |
| 2014/0252382 A1 | 9/2014 | Hashimoto et al. |
| 2014/0284633 A1 | 9/2014 | Tsay et al. |
| 2015/0001572 A1 | 1/2015 | Katsuno et al. |
| 2015/0099728 A1 | 4/2015 | Frank et al. |
| 2015/0221627 A1 | 8/2015 | Nielson et al. |
| 2015/0325555 A1 | 11/2015 | Hashimoto et al. |
| 2015/0340348 A1 | 11/2015 | Katsuno et al. |
| 2015/0362165 A1 | 12/2015 | Chu et al. |
| 2016/0005375 A1 | 1/2016 | Naijo et al. |
| 2016/0043290 A1 | 2/2016 | Sogo et al. |
| 2016/0064439 A1 | 3/2016 | Or-Bach et al. |
| 2016/0099384 A1 | 4/2016 | Kim et al. |
| 2016/0155378 A1 | 6/2016 | Hack et al. |
| 2016/0155892 A1 | 6/2016 | Li et al. |
| 2016/0163940 A1 | 6/2016 | Huang et al. |
| 2016/0315068 A1 | 10/2016 | Lee et al. |
| 2016/0322293 A1 | 11/2016 | Kimura et al. |
| 2016/0336482 A1 | 11/2016 | Lu et al. |
| 2016/0359143 A1 | 12/2016 | Osawa et al. |
| 2017/0012173 A1 | 1/2017 | Lee et al. |
| 2017/0025593 A1 | 1/2017 | Bower et al. |
| 2017/0062680 A1 | 3/2017 | Yoo et al. |
| 2017/0064785 A1 | 3/2017 | Kim et al. |
| 2017/0069612 A1 | 3/2017 | Zhang et al. |
| 2017/0084876 A1 | 3/2017 | Suzuki |
| 2017/0104035 A1 | 4/2017 | Lee et al. |
| 2017/0117259 A1 | 4/2017 | Xu |
| 2017/0133357 A1 | 5/2017 | Kuo et al. |
| 2017/0162746 A1 | 6/2017 | Cha et al. |
| 2017/0194298 A1 | 7/2017 | Negley et al. |
| 2017/0194535 A1 | 7/2017 | Park et al. |
| 2017/0213502 A1 | 7/2017 | Henry et al. |
| 2017/0213989 A1 | 7/2017 | Tsunoi et al. |
| 2017/0236866 A1 | 8/2017 | Lee et al. |
| 2017/0250329 A1 | 8/2017 | Takeya et al. |
| 2017/0286044 A1 | 10/2017 | Kim et al. |
| 2017/0331009 A1 | 11/2017 | Shioji |
| 2017/0331021 A1 | 11/2017 | Chae et al. |
| 2017/0338275 A1 | 11/2017 | Banna et al. |
| 2017/0345801 A1 | 11/2017 | Lin et al. |
| 2018/0156965 A1 | 6/2018 | El-Ghoroury et al. |
| 2018/0158808 A1 | 6/2018 | Zhang et al. |
| 2018/0233492 A1 | 8/2018 | Liu et al. |
| 2018/0240952 A1 | 8/2018 | Moon et al. |
| 2018/0283642 A1 | 10/2018 | Liao et al. |
| 2019/0053347 A1 | 2/2019 | Lee et al. |
| 2019/0074324 A1 | 3/2019 | Kim et al. |
| 2019/0097088 A1 | 3/2019 | Huppmann et al. |
| 2019/0148612 A1 | 5/2019 | Lee et al. |
| 2019/0165207 A1 | 5/2019 | Kim et al. |
| 2019/0181181 A1 | 6/2019 | Yeon et al. |
| 2019/0229149 A1 | 7/2019 | Yoo |
| 2019/0267436 A1 | 8/2019 | Zhang et al. |
| 2019/0333964 A1 | 10/2019 | Lee et al. |
| 2020/0063920 A1 | 2/2020 | Vampola |
| 2020/0212017 A1 | 7/2020 | Oh et al. |
| 2020/0212262 A1 | 7/2020 | Jang et al. |
| 2020/0219858 A1 | 7/2020 | Chang |

FOREIGN PATENT DOCUMENTS

| | | |
|---|---|---|
| CN | 102593303 | 7/2012 |
| CN | 105789237 | 7/2016 |
| CN | 106848043 | 6/2017 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-041057 | 2/2010 |
| JP | 2010-525555 | 7/2010 |
| JP | 2011-151346 | 8/2011 |

(56) References Cited

FOREIGN PATENT DOCUMENTS

| | | |
|---|---|---|
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2017153123 | 9/2017 |

OTHER PUBLICATIONS

Non-Final Office Action dated May 11, 2022, in U.S. Appl. No. 17/164,829.
Notice of Allowance issued in U.S. Appl. No. 16/988,272 dated Jun. 8, 2022.
Notice of Allowance issued in U.S. Appl. No. 16/228,621 dated Jun. 15, 2022.
Substantive Examination Report Notice dated Jun. 15, 2022, in Saudi Arabian Patent Application No. 520412046.
Notice of Allowance issued in U.S. Appl. No. 16/673,184 daated Jun. 23, 2022.
Office Action dated Jul. 5, 2022 for Japanese Patent Application No. 2020-536804(with English Translation).
Notice of Allowance issued in U.S. Appl. No. 16/228,621 dated Feb. 17, 2022.
Notice of Allowance issued in U.S. Appl. No. 16/673,184 dated Mar. 15, 2022.
Notice of Allowance issued in U.S. Appl. No. 16/198,873 daated Mar. 16, 2022.
Notice of Allowance issued in U.S. Appl. No. 16/228,601 dated Mar. 17, 2022.
Notice of Allowance issued in U.S. Appl. No. 16/198,850 dated Mar. 30, 2022.
Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Extended European Search Report issued in European Patent Application 18886954.9 dated Aug. 3, 2021.
Examination Report issued in Indian Patent Application 202037026094 dated Mar. 28, 2022.
Final Office Action for U.S. Appl. No. 16/673,184 dated Jul. 23, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/200,036 dated Sep. 24, 2020.
Non-Final Office Action for U.S. Appl. No. 16/228,621 dated Sep. 29, 2020.
Final Office Action for U.S. Appl. No. 16/198,873 dated Oct. 15, 2020.
Notice of Allowance for U.S. Appl. No. 16/236,737 dated Oct. 28, 2020.
Non-Final Office Action for U.S. Appl. No. 16/198,784 dated Nov. 19, 2020.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.
Non-Final Office Action dated Mar. 18, 2021 in U.S. Appl. No. 16/228,601.
Final Office Action dated Apr. 21, 2021, in U.S. Appl. No. 16/198,784.
Final Office Action dated Mar. 25, 2021 in U.S. Appl. No. 16/200,036.
Non-Final Office Action dated Apr. 15, 2021, in U.S. Appl. No. 16/673,184.
Non-Final Office Action dated Jun. 10, 2021, in U.S. Appl. No. 16/198,873.
Non-Final Office Action dated Apr. 7, 2021, in U.S. Appl. No. 16/915,384.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR2018/014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.

(56) References Cited

OTHER PUBLICATIONS

Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Nov. 7, 2019, in U.S. Appl. No. 16/207,881.
Non-Final Office Action dated Oct. 31, 2019, in U.S. Appl. No. 16/198,850.
Non-Final Office Action dated Nov. 4, 2019, in U.S. Appl. No. 16/198,784.
Ex Parte Quayle Action issued on Nov. 19, 2019, in U.S. Appl. No. 16/198,796.
Non-Final Office Action dated Oct. 24, 2019, in U.S. Appl. No. 16/228,621.
Non-Final Office Action dated Jan. 9, 2020, in U.S. Appl. No. 16/673,184.
Notice of Allowance dated Mar. 31, 2020, in U.S. Appl. No. 16/234,541.
Non-Final Office Action dated Mar. 23, 2020, in U.S. Appl. No. 16/219,716.
Non-Final Office Action dated Apr. 15, 2020, in U.S. Appl. No. 16/198,873.
Final Office Action dated Apr. 20, 2020, in U.S. Appl. No. 16/228,621.
Notice of Allowance dated Mar. 12, 2020, in U.S. Appl. No. 16/198,784.
Notice of Allowance dated Feb. 10, 2020, in U.S. Appl. No. 16/198,796.
Non-Final Office Action dated Mar. 5, 2020, in U.S. Appl. No. 16/228,601.
Non-Final Office Action dated Nov. 19, 2019, in U.S. Appl. No. 16/198,792.
Notice of Allowance dated Apr. 9, 2020, in U.S. Appl. No. 16/198,792.
Final Office Action dated May 29, 2020, in U.S. Appl. No. 16/198,850.
Non-Final Office Action dated Jun. 24, 2020, in U.S. Appl. No. 16/236,737.
Final Office Action dated Jun. 25, 2020, in U.S. Appl. No. 16/228,601.
Notice of Allowance dated Aug. 26, 2021, in U.S. Appl. No. 16/789,877.
Notice of Allowance dated Jul. 12, 2021, in U.S. Appl. No. 16/198,784.
Non-Final Office Action dated Jul. 8, 2021, in U.S. Appl. No. 16/228,621.
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873 dated Aug. 9, 2022.
Notice of Allowance issued in U.S. Appl. No. 16/228,601 dated Aug. 9, 2022.
Non-Final Office Action dated Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 dated Sep. 26, 2022.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 14, 2021, in European Patent Application No. 18881496.6.
Notice of Allowance dated Sep. 14, 2021, in U.S. Appl. No. 16/899,522.
Notice of Allowance dated Sep. 22, 2021, in U.S. Appl. No. 16/200,036.
Final Office Action dated Sep. 27, 2021, in U.S. Appl. No. 16/915,384.
Extended European Search Report dated Sep. 29, 2021, in European Patent Application No. 18891199.4.
Final Office Action dated Sep. 30, 2021, in U.S. Appl. No. 16/228,601.
Final Office Action dated Sep. 30, 2021, in U.S. Appl. No. 16/198,850.
Extended European Search Report dated Oct. 5, 2021, in European Patent Application No. 18882087.2.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal dated Sep. 14, 2021, in Japanese Patent Application No. 2020-532747.
Final Office Action dated Dec. 2, 2021, in U.S. Appl. No. 16/228,621.
Notice of Allowance dated Dec. 9, 2021, in U.S. Appl. No. 16/915,384.
Final Office Action dated Dec. 24, 2021, in U.S. Appl. No. 16/198,873.
Non-Final Office Action dated Jan. 12, 2022, in U.S. Appl. No. 16/988,272.
Non-Final Office Action dated Jan. 21, 2022, in U.S. Appl. No. 16/673,114.
Final Office Action dated Nov. 12, 2021, in U.S. Appl. No. 16/673,184.
Notice of Allowance issued in U.S. Appl. No. 16/915,384 dated Nov. 8, 2022.
Notice of Allowance issued in U.S. Appl. No. 17/366,420 dated Nov. 21, 2022.
Notice of Allowance issued in U.S. Appl. No. 17/366,462 dated Jan. 24, 2023.
Ex Parte Quayle Action dated Jan. 24, 2023, in U.S. Appl. No. 17/518,602.
Office Action dated Dec. 6, 2022 for Japanese Patent Application No. 2020-533800(with English Translation).

* cited by examiner (a)

(b)

(c)

LIGHT EMITTING DIODE (LED) STACK FOR A DISPLAY

CROSS-REFERENCE TO RELATED APPLICATIONS

This application is a continuation of U.S. patent application Ser. No. 16/915,384, filed Jun. 29, 2020, which is a continuation of U.S. patent application Ser. No. 16/198,796, filed Nov. 22, 2018, each of which claims the benefit of U.S. Provisional Application No. 62/590,810, filed on Nov. 27, 2017, U.S. Provisional Application No. 62/590,854, filed on Nov. 27, 2017, U.S. Provisional Application No. 62/590,870, filed on Nov. 27, 2017, U.S. Provisional Application No. 62/621,503, filed on Jan. 24, 2018, and U.S. Provisional Application No. 62/635,284, filed on Feb. 26, 2018, the disclosures of which are hereby incorporated by reference for all purposes as if fully set forth herein.

BACKGROUND

Field

Exemplary implementations of the invention relate generally to light emitting diodes and, more particularly, to a micro light emitting diode ("micro LED") for a next generation display and a display apparatus including the same.

Discussion of the Background

A light emitting diode (LED) has been used as an inorganic light source in a wide range of fields, such as a display apparatus, an automotive lamp, general lighting, and the like. The light emitting diode is rapidly replacing the existing light sources due to its longer lifetime, lower power consumption, and faster rapid response.

A typical light emitting diode has been generally used as a backlight light source in a display apparatus. However, recently, micro LEDs have been developed as a next generation display that is capable of implementing images directly from the light emitting diodes.

In general, a display apparatus implements various colors by using mixed colors of blue, green, and red. As such, each pixel of the display apparatus includes blue, green, and red sub-pixels, and the color of the specific pixel is determined through the color of these sub-pixels, and an image is implemented by a combination of these pixels.

In a micro LED display, the micro LEDs are arranged on a two-dimensional plane to correspond to each pixel, and thus, a large number of micro LEDs need to be disposed on one substrate, typically in the millions or tens of millions. However, the small form factor of the micro LED, which generally has a surface area of about 10,000 square micrometers or less, may cause various problems during manufacture of a display apparatus. For example, handling a micro LED is difficult, and thus, it is difficult to mount the micro LEDs on a display panel, particularly when millions are required to be transferred to make a single display. In addition, it is difficult to replace a defective micro LED once the micro LED is mounted on the display panel.

Further, since the sub-pixels are arranged on a two-dimensional plane, an area occupied by one pixel that includes blue, green, and red sub-pixels is relatively large. As such, arranging the sub-pixels within a limited area may require reducing the area of each sub-pixel, which in turn may deteriorate brightness of the sub-pixels due to reduction of luminous areas.

The above information disclosed in this Background section is only for understanding of the background of the inventive concepts, and, therefore, it may contain information that does not constitute prior art.

SUMMARY

Light emitting diodes constructed according to the principles and some exemplary implementations of the invention and displays using the same are capable of increasing the light emitting area of each LED sub-pixel without increasing the corresponding surface area of the pixel area and without degrading display characteristics.

Light emitting diodes constructed according to the principles and some exemplary implementations of the invention and displays using the same have a sub-pixel structure in which at least two of the sub-pixels are vertically stacked, thereby reducing the surface area required to implement the display.

Light emitting diodes constructed according to the principles and some exemplary implementations of the invention and displays using the same have sub-pixels that may be independently driven.

Light emitting diodes constructed according to the principles and some exemplary implementations of the invention and displays using the same are particularly advantageous when constructed as micro LEDs. For example, micro LEDs constructed according to the principles and some exemplary implementations of the invention are capable of being simultaneously manufactured in a plurality on a wafer level, and thus obviate the need to individually mount the micro LEDS.

Light emitting diodes constructed according to the principles and some exemplary implementations of the invention and displays using the same advantageously employ a partial reflective layer between the red LED stack and the substrate, and/or control a bandgap of a semiconductor layer of each LED stack, to control the brightness of each LED stack of a pixel that uses the micro LEDs.

Additional features of the inventive concepts will be set forth in the description which follows, and in part will be apparent from the description, or may be learned by practice of the inventive concepts.

A light emitting diode (LED) stack for a display according to an exemplary embodiment includes a support substrate, a first LED sub-unit disposed on the support substrate, a second LED sub-unit disposed on the first LED sub-unit, a third LED sub-unit disposed on the second LED sub-unit, a first color filter interposed between the first LED sub-unit and the second LED sub-unit, and configured to transmit light generated in the first LED sub-unit and to reflect light generated in the second LED sub-unit, and a second color filter interposed between the second LED sub-unit and the third LED sub-unit, and configured to transmit light generated in the first and second LED sub-units and to reflect light generated in the third LED sub-unit, in which the second LED sub-unit and the third LED sub-unit are configured to transmit light generated in the first LED sub-unit, and third LED sub-unit is configured to transmit light generated in the second LED sub-unit.

The first, second, and third LED sub-units may include first, second, and third LED stacks, respectively.

The LED stack may include a micro LED having a surface area less than about 10,000 square µm.

The second LED sub-unit and the third LED sub-unit may be configured to transmit light generated in the first LED sub-unit to the outside of the micro LED stack, and third LED sub-unit may be configured to transmit light generated in the second LED sub-unit to the outside of the micro LED stack.

The first, second, and third LED stacks may be configured to emit red light, green light, and blue light, respectively.

The first color filter and the second color filter may include at least one of a low pass filter, a band pass filter, and a band stop filter, respectively.

The first color filter and the second color filter may include a distributed Bragg reflector.

The LED stack for a display may further include a first bonding layer interposed between the support substrate and the first LED stack, a second bonding layer interposed between the first LED stack and the first color filter, and a third bonding layer interposed between the second LED stack and the second color filter, in which the second bonding layer is configured to transmit light generated in the first LED stack, and the third bonding layer is configured to transmit light generated in the first LED stack and the second LED stack.

The first bonding layer, the second bonding layer, and the third bonding layer may include at least one of a transparent inorganic insulating film, a transparent organic insulating film, and a transparent conductive thin film.

The LED stack for a display may further include a first reflective electrode disposed between the first bonding layer and the first LED stack and in ohmic contact with a p-type semiconductor layer of the first LED stack, a second transparent electrode disposed between the first color filter and the second LED stack and in ohmic contact with a p-type semiconductor layer of the second LED stack, and a third transparent electrode disposed between the second color filter and the third LED stack and in ohmic contact with a p-type semiconductor layer of the third LED stack, in which the second transparent electrode and the third transparent electrode are configured to transmit light generated in the first LED stack to the outside, and the third transparent electrode is configured to transmit light generated in the second LED stack to the outside.

The second bonding layer may be in contact with an n-type semiconductor layer of the first LED stack, and the third bonding layer may be in contact with an n-type semiconductor layer of the second LED stack.

The LED stack for a display may further include a first bonding layer interposed between the support substrate and the first LED stack, a second bonding layer interposed between the first color filter and the second LED stack, and a third bonding layer interposed between the second LED stack and the second color filter, in which the second bonding layer and the third bonding layer are configured to transmit light generated in the first LED stack and the second LED stack.

The LED stack for a display may further include a first reflective electrode disposed between the first bonding layer and the first LED stack and in ohmic contact with an n-type semiconductor layer of the first LED stack, a first transparent electrode disposed between the first LED stack and the first color filter and in ohmic contact with a p-type semiconductor layer of the first LED stack, a second transparent electrode disposed between the second LED stack and the third bonding layer and in ohmic contact with a p-type semiconductor layer of the second LED stack, and a third transparent electrode disposed between the second color filter and the third LED stack and in ohmic contact with a p-type semiconductor layer of the third LED stack, in which the first, second, and third transparent electrodes are configured to trasmit light generated in the first LED stack to the outside, and the second and third transparent electrodes are configured to transmit light generated in the second LED stack to the outside.

The LED stack for a display may further include a second reflective electrode disposed between the second bonding layer and the second LED stack, in which the second transparent electrode is in ohmic contact with an n-type semiconductor layer of the second LED stack.

A display apparatus may include a plurality of pixels arranged on a support substrate, in which at least some of the pixels include the LED stack according to an exemplary embodiment.

Each of the first, second, and third LED stacks may include a p-type semiconductor layer and an n-type semiconductor layer, the p-type semiconductor layers of each pixel may be electrically connected to a common line, and the n-type semiconductor layers of each pixel may be electrically connected to different lines from each other.

The common line may include a data line and the different lines may include scan lines.

The display apparatus may further include a lower insulating layer covering side surfaces of the first, second, and third LED stacks, in which the lower insulating layer has an opening that exposes a portion of the first, second, and third LED stacks.

The lower insulating layer may include a distributed Bragg reflector configured to reflect red light, green light, and blue light.

The display apparatus may further include a reflective electrode disposed between the support substrate and the first LED stack, in which the reflective electrode includes the common line is continuously disposed over the plurality of pixels.

The display apparatus may further include a plurality of reflective electrodes disposed between the support substrate and the first LED stack, in which each reflective electrode is disposed within each pixel region.

The third LED stack may include a roughened surface region on an upper surface thereof.

The first, second, and third LED stacks of each pixel may be drivable independently.

An LED pixel for a display according to an exemplary embodiment includes a first LED sub-unit having a first surface and a second surface, a second LED sub-unit disposed on a portion of the first surface of the first LED sub-unit, a third LED sub-unit disposed on a portion of the second LED sub-unit, a reflective electrode disposed on the second surface of the first LED sub-unit, a second transparent electrode disposed between the second LED sub-unit and the third LED sub-unit, and in ohmic contact with an upper surface of the second LED sub-unit, and a third transparent electrode in ohmic contact with an upper surface of the third LED sub-unit, in which each of the first, second, and third LED sub-units includes an n-type semiconductor layer and a p-type semiconductor layer, each of the the n-type semiconductor layers of the first, second, and third sub-units is electrically connected to the reflective electrode, and the first LED sub-unit, the second LED sub-unit, and the third LED sub-unit are independently drivable.

The first, second, and third LED sub-units may include first, second, and third LED stacks, respectively.

The LED pixel may include a micro LED having a surface area less than about 10,000 square μm.

The first LED stack, the second LED stack, and the third LED stack may be configured to emit red light, green light, and blue light, respectively.

A first portion of light generated in the first LED stack may be configured to be emitted to the outside without passing through the second LED stack, a second portion of light generated in the first LED stack may be configured to be emitted to the outside by transmitting through the second LED stack and the second transparent electrode, a third portion of light generated in the first LED stack may be configured to be emitted to the outside by transmitting through the second LED stack, the second transparent electrode, the third LED stack, and the third transparent electrode, a first portion of light generated in the second LED stack may be configured to be emitted to the outside without passing through the third LED stack, and a second portion of light generated in the second LED stack may be configured to be emitted to the outside by transmitting through the third LED stack and the third transparent electrode.

Each of the p-type semiconductor layers of the first, second, and third LED stacks may be disposed on corresponding n-type semiconductor layer, the reflective electrode may be in ohmic contact with the n-type semiconductor layer of the first LED stack, and the second transparent electrode and the third transparent electrode may be in ohmic contact with the p-type semiconductor layers of the second LED stack and the third LED stack, respectively.

The LED pixel for a display may further include a first color filter interposed between the first LED stack and the second LED stack, and a second color filter interposed between the second LED stack and the third LED stack, in which the first color filter is configured to transmit light generated in the first LED stack and reflect light generated in the second LED stack, and the second color filter is configured to transmit light generated in the second LED stack and reflect light generated in the third LED stack.

The first color filter may contact the n-type semiconductor layer of the second LED stack, and the second color filter may contact the n-type semiconductor layer of the third LED stack.

The LED pixel for a display may further include a first bonding layer interposed between the first LED stack and the first color filter, and a second bonding layer interposed between the second LED stack and the second color filter, in which the second bonding layer is configured to transmit light generated in the first LED stack and the third bonding layer is configured to transmit light generated in the second LED stack.

The LED pixel for a display may further include a first ohmic electrode in ohmic contact with the p-type semiconductor layer of the first LED stack, a second ohmic electrode in contact with the n-type semiconductor layer of the second LED stack, a third ohmic electrode in contact with the n-type semiconductor layer of the third LED stack, a second current spreading layer disposed on the second transparent electrode, and a third current spreading layer disposed on the third transparent electrode, in which the second ohmic electrode is disposed on a portion of the n-type semiconductor layer of the second LED stack not overlapping the third LED stack, and the second current spreading layer is disposed on the second transparent electrode.

The third ohmic electrode and the third current spreading layer may include the same material.

The second ohmic electrode, the second current spreading layer, the third ohmic electrode, and the third current spreading layer may include the same material.

The LED pixel for a display may further include a first current spreading layer disposed on the first ohmic electrode, in which the first ohmic electrode is transparent, and the first, second, and third current spreading layers comprise the same material.

A display apparatus may include a plurality of pixels arranged on a support substrate, in which at least some of the pixels include the LED pixel according to an exemplary embodiment.

Each of the p-type semiconductor layers of the first, second, and third LED stacks may be electrically connected to different lines from each other.

An LED stack for a display according to an exemplary embodiment includes a first LED sub-unit having a first surface and a second surface, a second LED sub-unit disposed on the first surface of the first LED sub-unit, a third LED sub-unit disposed on the second LED sub-unit, a reflective electrode disposed on the second surface of the first LED sub-unit and forming ohmic contact with the first LED sub-unit, and an ohmic electrode interposed between the first LED sub-unit and the second LED sub-unit and forming ohmic contact with the first LED sub-unit, in which the second LED sub-unit and the third LED sub-unit are configured to transmit light generated from the first LED sub-unit, and the third LED sub-unit is configured to transmit light generated from the second LED sub-unit.

The first, second, and third LED sub-units may include first, second, and third LED stacks, respectively.

The LED stack may include a micro LED having a surface area less than about 10,000 square μm.

The reflective electrode and the ohmic electrode may have different reflective indices from each other.

The first, second, and third LED stacks may be configured to emit red light, green light, and blue light, respectively.

The LED stack for a display may further include a first color filter interposed between the first LED stack and the second LED stack, and configured to transmit light generated from the first LED stack and reflect light generated from the second LED stack, and a second color filter interposed between the second LED stack and the third LED stack, and configured to transmit light generated from the first and second LED stacks and reflect light generated from the third LED stack.

Each of the first color filter and the second color filter may include at least one of a low pass filter, a band pass filter, and a band stop filter.

Each of the first and second color filters may include a distributed Bragg reflector.

The LED stack for a display may further include a support substrate, a first bonding layer interposed between the support substrate and the first LED stack, a second bonding layer interposed between the first LED stack and the second LED stack, and a third bonding layer interposed between the second LED stack and the third LED stack, in which the second bonding layer is configured to transmit light generated from the first LED stack, and the third bonding layer is configured to transmit light generated from the first and second LED stacks.

The first bonding layer may adjoin the reflective electrode, and the second bonding layer may adjoin the ohmic electrode.

The LED stack for a display may further include a second transparent electrode forming ohmic contact with a p-type semiconductor layer of the second LED stack, and a third-p transparent electrode forming ohmic contact with a p-type semiconductor layer of the third LED stack.

The second bonding layer may adjoin an n-type semiconductor layer of the first LED stack, and the third bonding layer may adjoin an n-type semiconductor layer of the second LED stack.

The LED stack for a display may further include a first color filter interposed between the first LED stack and the second LED stack and configured to transmit light generated from the first LED stack and reflect light generated from the second LED stack, and a second color filter interposed between the second LED stack and the third LED stack, and configured to transmit light generated from the first and second LED stacks and reflect light generated from the third LED stack, in which the first color filter is disposed on the second bonding layer and the second color filter is disposed on the third bonding layer.

A display apparatus may include a plurality of pixels arranged on a support substrate, in which at least some of the pixels include the LED stack according to an exemplary embodiment.

Each of the first, second, and third LED stacks may include a p-type semiconductor layer and an n-type semiconductor layer, each of the p-type semiconductor layers of the first, second, and third LED stacks may be electrically connected to a common line, and each of the n-type semiconductor layers of the first, second, and third LED stacks may be electrically connected to different lines from each other.

The common line may include a data line and the different lines may include scan lines.

The display apparatus may further include a lower insulation layer covering side surfaces of the first, second, and third LED stacks, the lower insulation layer including openings exposing the ohmic electrode, the reflective electrode, the second LED stack, and the third LED stack.

The lower insulation layer may include a distributed Bragg reflector configured to reflect red, green, and blue light.

The reflective electrode may include the common line and may be continuously disposed over the plurality of pixels.

The reflective electrode may be disposed within each pixel region.

An LED stack for a display according to an exemplary embodiment includes a first LED sub-unit configured to emit a first colored light, a second LED sub-unit disposed on the first LED stack and configured to emit a second colored light, and a third LED sub-unit disposed on at least one of the first LED sub-unit and the second LED sub-unit and configured to emit a third colored light, in which the first LED sub-unit is configured to emit light through the second LED sub-unit and the third LED sub-unit, and the second LED sub-unit is configured to emit light through the third LED sub-unit.

The first, second, and third LED sub-units may include first, second, and third LED stacks, respectively.

The LED stack may include a micro LED having a surface area less than about 10,000 square μm.

The first colored light may have a longer wavelength than the second colored light, and the second colored light may have a longer wavelength than the third colored light.

The first, second, and third colored light may be red light, green light, and blue light, respectively.

The first LED stack may be configured to generate light when a portion of the second colored light is incident thereon, and the second LED stack may be configured to generate light when a portion of the third colored light is incident thereon.

The intensity of the second colored light emitted to the outside may be at least about 10 times than the intensity of the first colored light emitted caused by the second colored light, and the intensity of the third colored light emitted to the outside may be at least about 10 times than the intensity of the second colored light caused by the third colored light.

The LED stack for a display may further include a support substrate, a reflective electrode interposed between the first LED stack and the support substrate, and forming ohmic contact with the first LED stack, and an ohmic electrode interposed between the first LED stack and the second LED stack, and forming ohmic contact with the first LED stack.

The LED stack for a display may further include a first bonding layer interposed between the support substrate and the first LED stack, a second bonding layer interposed between the first LED stack and the second LED stack, and a third bonding layer interposed between the second LED stack and the third LED stack, in which the second bonding layer is configured to transmit the first colored light and the third bonding layer is configured to transmit the first colored light and the second colored light.

The first bonding layer may adjoin the reflective electrode and the second bonding layer adjoins the ohmic electrode.

The LED stack for a display may further include a second transparent electrode forming ohmic contact with a p-type semiconductor layer of the second LED stack, and a third transparent electrode forming ohmic contact with a p-type semiconductor layer of the third LED stack.

The second bonding layer may adjoin an n-type semiconductor layer of the first LED stack and the third bonding layer adjoins an n-type semiconductor layer of the second LED stack.

A display apparatus may include a plurality of pixels arranged on the support substrate, in which at least some of the pixels include the LED stack according to an exemplary embodiment.

The first LED stack may have a first area, a second area, and a third area, the first area may not be overlapped by the second and third LED stacks in plan view, the second area may be overlapped by the second LED stack and not overlapped by the third LED stack in plan view, and the third area may be overlapped by both of the second and third LED stacks in plan view.

The first, second, and third LED stacks may have substantially the same width with each other in plan view.

The width of the first LED stack may be greater than the second or third LED stacks in plan view.

The display apparatus may further include a lower insulation layer covering side surfaces of the first, second, and third LED stacks, in which the lower insulation layer includes openings exposing an ohmic electrode, the reflective electrode, the second LED stack, and the third LED stack.

The lower insulation layer may include a distributed Bragg reflector configured to reflect red, green, and blue light.

Each of the first, second, and third LED stacks may include a p-type semiconductor layer and an n-type semiconductor layer, and each of the p-type semiconductor layers of the first, second, and third LED stacks may be electrically connected to a common line, and each of the n-type semiconductor layers of the first, second, and third LED stacks may be electrically connected to different lines from each other.

The reflective electrode may include the common line and may be continuously disposed over the plurality of pixels.

The reflective electrode may be disposed within each pixel region.

The first, second, and third LED stacks may be configured to be driven independently.

An LED pixel for a display according to an exemplary embodiment includes a substrate, a first LED sub-unit disposed on the substrate, a second LED sub-unit disposed on the first LED sub-unit, a third LED sub-unit disposed on at least one of the first and second LED sub-units, and vias in the substrate, in which each of the first, second, and third LED sub-units includes a first conductivity type semiconductor layer and a second conductivity type semiconductor layer, and each of the vias is electrically connected to at least one of the first, second, and third LED sub-units.

The first, second, and third LED sub-units may include first, second, and third LED stacks, respectively.

The LED pixel may include a micro LED having a surface area less than about 10,000 square μm.

The first LED stack, the second LED stack, and the third LED stack may be configured to emit light having different wavelengths with each other.

The first LED stack, the second LED stack, and the third LED stack may be configured to emit red light, green light, and blue light, respectively.

The substrate may include a GaAs substrate, and the first LED stack comprises AlGaInP-based semiconductor layers.

The LED pixel for a display may further include a distributed Bragg reflector interposed between the substrate and the first LED stack, in which the distributed Bragg reflector may include semiconductor layers.

The distributed Bragg reflector may include AlAs layers and AlGaAs layers alternately disposed with each other.

The LED pixel for a display may further include a first bonding layer interposed between the first LED stack and the second LED stack, and a second bonding layer interposed between the second LED stack and the third LED stack.

The LED pixel for a display may further include a lower second ohmic electrode interposed between the first bonding layer and the second LED stack, and forming ohmic contact with the second LED stack, and a lower third ohmic electrode interposed between the second bonding layer and the third LED stack, and forming ohmic contact with the third LED stack.

Each of the lower second ohmic electrode and the lower third ohmic electrode may include a reflective layer.

The vias may include first, second, and third vias, the first via may be electrically connected to the second conductivity type semiconductor layer of the first LED stack, the second via may be electrically connected to the second conductivity type semiconductor layer of the second LED stack, and the third via may be electrically connected to the second conductivity type semiconductor layer of the third LED stack.

The first conductivity type semiconductor layers of the first, second, and third LED stacks may be electrically connected to one another.

The LED pixel for a display may further include an upper first ohmic electrode contacting the first conductivity type semiconductor layer of the first LED stack, a lower first ohmic electrode contacting the second conductivity type semiconductor layer of the first LED stack, an upper second ohmic electrode contacting the first conductivity type semiconductor layer of the second LED stack, a lower second ohmic electrode contacting the second conductivity type semiconductor layer of the second LED stack, an upper third ohmic electrode contacting the first conductivity type semiconductor layer of the third LED stack, and a lower third ohmic electrode contacting the second conductivity type semiconductor layer of the third LED stack, in which the first, second, and third vias are electrically connected to the lower first ohmic electrode, the lower second ohmic electrode, and the lower third ohmic electrode, respectively, and the upper first ohmic electrode, the upper second ohmic electrode, and the upper third ohmic electrode are electrically connected to each other.

The LED pixel for a display may further include bonding pads disposed on a lower surface of the substrate, in which the vias are connected to the bonding pads, respectively.

The bonding pads may include first bonding pads insulated from the substrate and at least one second bonding pad electrically connected to the substrate, and the vias may be electrically connected to the first bonding pads, respectively.

A display apparatus may include a circuit board and a plurality of pixels arranged on the circuit board, in which at least some of the pixels include the LED pixel according to an exemplary embodiment.

The circuit board may include at least one of a passive circuit and an active circuit, and the vias are electrically connected to the circuit board.

The substrate may be continuously disposed over the plurality of pixels and is connected to the ground through electrical connection to the circuit board.

The display apparatus may further include electrode pads interposed between the substrate and the circuit board, in which at least one of the electrode pads is electrically connected to the substrate, and the vias are electrically connected to the circuit board through the electrode pads.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
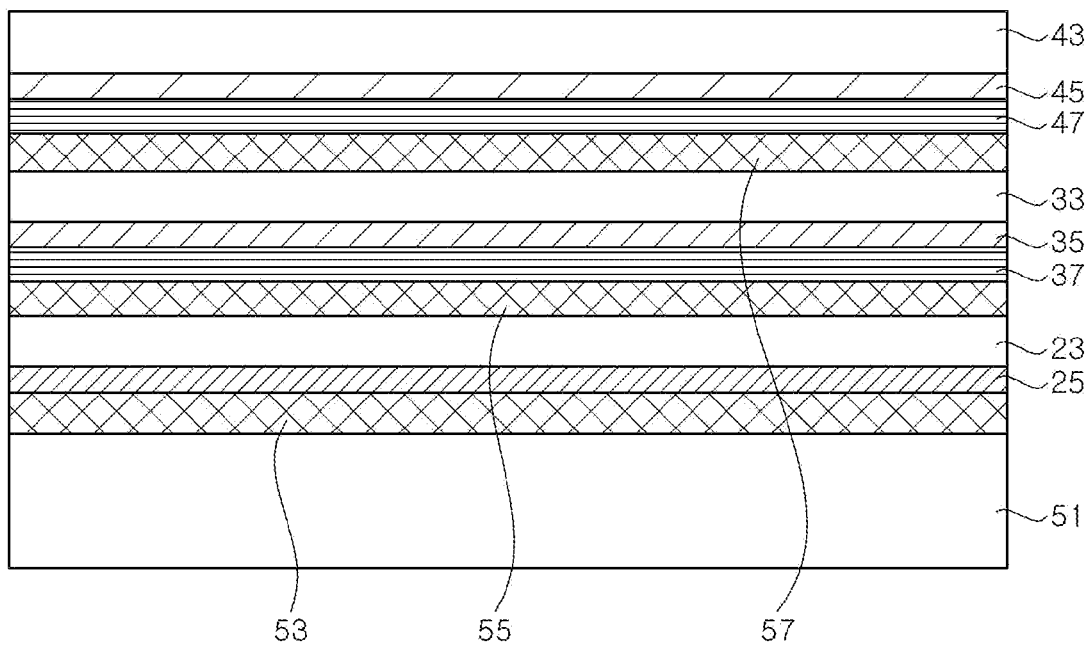
FIG. 1 is a schematic cross-sectional view of a light emitting diode stack for a display according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, a light emitting diode stack or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application.

Referring to FIG. 1, the light emitting diode stack 100 for a display may include a support substrate 51, a first LED stack 23, a second LED stack 33, a third LED stack 43, a first-p reflective electrode 25, a second-p transparent electrode 35, a third-p transparent electrode 45, a first color filter 37, a second color filter 47, a first bonding layer 53, a second bonding layer 55, and a third bonding layer 57. As used for the exemplary embodiments disclosed herein, a light emitting diode stack may refer to a micro LED (or a micro LED stack).

The support substrate 51 supports the first, second, and third LED stacks 23, 33 and 43. The support substrate 51 may have a circuit on a surface or in an inner part thereof, but the inventive concepts are not limited thereto. The support substrate 51 may include, for example, a Si substrate, or a Ge substrate.

The first LED stack 23, the second LED stack 33, and the third LED stack 43 each include an n-type semiconductor layer, a p-type semiconductor layer, and an active layer interposed therebetween. The active layer may have a multiple quantum well structure.

For example, the first LED stack 23 may be an inorganic light emitting diode that emits red light, the second LED stack 33 may be an inorganic light emitting diode that emits green light, and the third LED stack 43 may be an inorganic light emitting diode that emits blue light. The first LED stack 23 may include a GaInP-based well layer, and the second LED stack 33 and the third LED stack 43 may include a GaInN-based well layer. However, the inventive concepts are not limited thereto, and when the light emitting diode stack 100 includes micro LEDs, the first LED stack 23 may emit any one of red, green, and blue light, and the second and third LED stacks 33 and 43 may emit a different one of the red, green, and blue light without adversely affecting operation or requiring color filters due to its small form factor.

Top and bottom surfaces of each of the first, second, and third LED stacks 23, 33, or 43 may include an n-type semiconductor layer and a p-type semiconductor layer, respectively. In FIG. 1, an upper surface of each of the first to third LED stacks 23, 33, and 43 is described as including an n-type semiconductor layer, and a lower surface thereof is described as including a p-type semiconductor layer. Since the upper surface of the third LED stack 43 is n-type, a roughened surface may be formed on the upper surface of the third LED stack 43 through chemical etching. However, the inventive concepts are not limited thereto, and the semiconductor type of the upper surface and the lower surface of each of the LED stacks may be reversed.

The first LED stack 23 is disposed closer to the support substrate 51, the second LED stack 33 is disposed on the first LED stack 23, and the third LED stack 43 is disposed on the second LED stack 33. Since the first LED stack 23 emits light having a longer wavelength than the second and third LED stacks 33 and 43, light generated in the first LED stack 23 may be transmitted through the second and third LED stacks 33 and 43 and emitted to the outside. Further, since the second LED stack 33 emits light having a longer wavelength than the third LED stack 43, light generated in the second LED stack 33 may be transmitted through the third LED stack 43 and emitted to the outside.

The first-p reflective electrode 25 is in ohmic contact with the p-type semiconductor layer of the first LED stack 23 and may reflect light generated from the first LED stack 23. For example, the first-p reflective electrode 25 may include Au—Ti, Au—Sn, or the like. Further, the first-p reflective electrode 25 may include a diffusion barrier layer.

The second-p transparent electrode 35 is in ohmic contact with the p-type semiconductor layer of the second LED stack 33. The second-p transparent electrode 35 may include a metal layer or a conductive oxide layer, which is transparent to red light and green light.

The third-p transparent electrode 45 is in ohmic contact with the p-type semiconductor layer of the third LED stack 43. The third-p transparent electrode 45 may include a metal layer or a conductive oxide layer, which is transparent to red light, green light, and blue light.

The first-p reflective electrode 25, the second-p transparent electrode 35, and the third-p transparent electrode 45 are in ohmic contact with the p-type semiconductor layer of each LED stack 23, 33, and 43, and may assist in current spreading.

Meanwhile, the first color filter 37 may be disposed between the first LED stack 23 and the second LED stack 33. In addition, the second color filter 47 may be disposed between the second LED stack 33 and the third LED stack 43. The first color filter 37 transmits light generated in the first LED stack 23 and reflects light generated in the second LED stack 33. Meanwhile, the second color filter 47 transmits light generated in the first and second LED stacks 23 and 33 and reflects light generated in the third LED stack 43. Thus, light generated in the first LED stack 23 may be emitted to the outside through the second LED stack 33 and the third LED stack 43, and light generated in the second LED stack 33 may be emitted to the outside through the third LED stack 43. Further, light generated in the second LED stack 33 may be prevented from being incident on the first LED stack 23 to be lost, and light generated in the third LED stack 43 may be prevented from being incident on the second LED stack 33 to be lost. According to an exemplary embodiment, the first color filter 37 may also reflect light generated in the third LED stack 43.

Each of the first and second color filters 37 and 47 may be, for example, a low pass filter that passes through only a low frequency region (e.g., a long wavelength region), a band pass filter that passes through only a predetermined wavelength band, or a band stop filter that blocks only a predetermined wavelength band. In particular, the first and second color filters 37 and 47 may include a distributed Bragg reflector (DBR). The distributed Bragg reflector may reflect light at a specific wavelength band (stop band) while transmitting light at another wavelength region. The distributed Bragg reflector may be formed by alternately stacking insulating layers having different refractive indices, and may be formed, for example, by alternately stacking $TiO_2$ and $SiO_2$. In addition, the stop band of the distributed Bragg reflector may be controlled by adjusting the thicknesses of $TiO_2$ and $SiO_2$. The low pass filter and the band pass filter may also be formed by alternately stacking the insulating layers having different refractive indices one above another.

The first bonding layer 53 couples the first LED stack 23 to the support substrate 51. As shown in FIG. 1, the first-p reflective electrode 25 may be in contact with the first bonding layer 53. The first bonding layer 53 may be a light transmissive or opaque layer. The first bonding layer 53 may be, for example, a transparent inorganic insulating film, a transparent organic insulating film, or a transparent conductive thin film.

The second bonding layer 55 couples the second LED stack 33 to the first LED stack 23. As shown in FIG. 1, the second bonding layer 55 may be in contact with the first LED stack 23 and the first color filter 37. However, the inventive concepts are not limited thereto, and a transparent conductive layer may be additionally disposed on the first LED stack 23. The second bonding layer 55 transmits light generated in the first LED stack 23. The second bonding layer 55 may be, for example, a transparent inorganic insulating film, a transparent organic insulating film, or a transparent conductive thin film, and may be formed of, for example, light transmissive spin-on-glass.

The third bonding layer 57 couples the third LED stack 43 to the second LED stack 33. As shown in FIG. 1, the third bonding layer 57 may be in contact with the second LED stack 33 and the second color filter 47. However, the inventive concepts are not limited thereto, and a transparent conductive layer may be additionally disposed on the second LED stack 33. The third bonding layer 57 transmits light generated in the first LED stack 23 and the second LED stack 33. The third bonding layer 57 may be, for example, a transparent inorganic insulating film, a transparent organic insulating film, or a transparent conductive thin film, and may be formed of, for example, light transmissive spin-on-glass.

Figure 2:
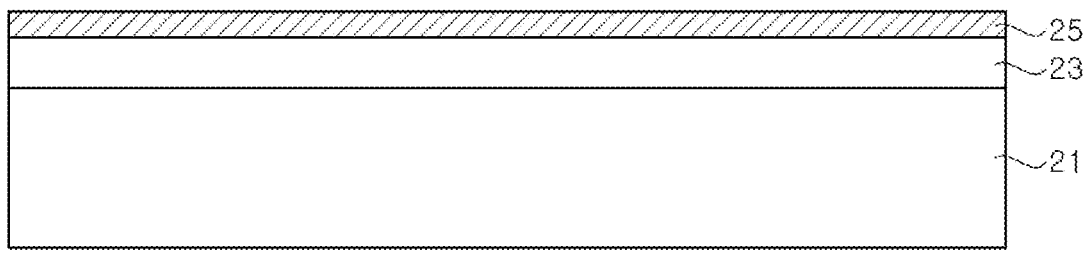
FIG. 2 is schematic cross-sectional views illustrating a manufacturing method of a light emitting diode stack for a display according to an exemplary embodiment.
Figure 2:
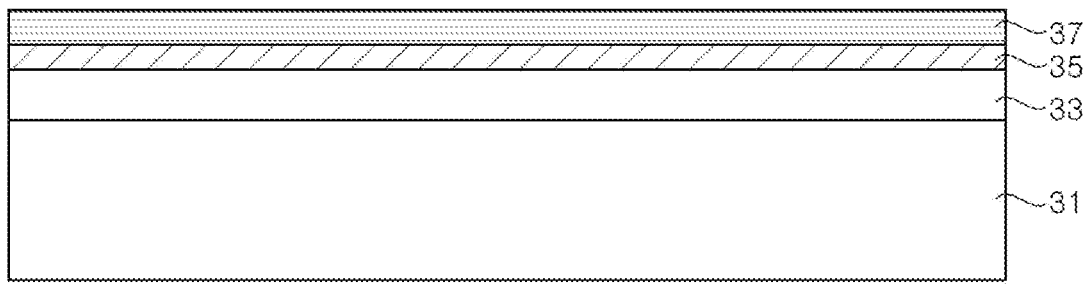
Figure 2:
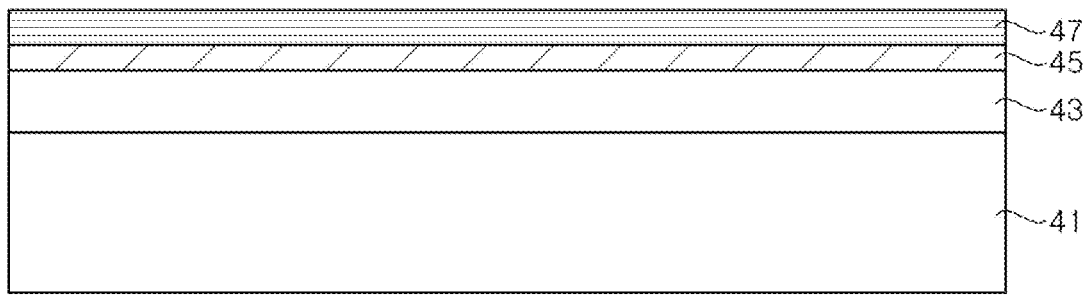

FIG. 2 is schematic cross-sectional views illustrating a manufacturing method of a light emitting diode stack for a display according to an exemplary embodiment.

Referring to FIG. 2, first, the first LED stack 23 is grown on a first substrate 21, and a first-p reflective electrode 25 is formed on the first LED stack 23.

The first substrate 21 may be, for example, a GaAs substrate. Further, the first LED stack 23 is formed as AlGaInP-based semiconductor layers, and includes an n-type semiconductor layer, an active layer, and a p-type semiconductor layer. The first-p reflective electrode 25 is in ohmic contact with the p-type semiconductor layer of the first LED stack 23.

Meanwhile, a second LED stack 33 is grown on a second substrate 31, and a second-p transparent electrode 35 and a first color filter 37 are formed on the second LED stack 33. The second LED stack 33 is formed of gallium nitride-based semiconductor layers, and may include a GaInN well layer. The second substrate 31 is a substrate, on which the gallium nitride-based semiconductor layer may be grown, and is different from the first substrate 21. A composition ratio of GaInN may be determined so that the second LED stack 33 emits green light. The second-p transparent electrode 35 is in ohmic contact with the p-type semiconductor layer of the second LED stack 33.

Further, a third LED stack 43 is grown on a third substrate 41, and a third-p transparent electrode 45 and a second color filter 47 are formed on the third LED stack 43. The third LED stack 43 is formed of gallium nitride-based semiconductor layers, and may include a GaInN well layer. The third substrate 41 is a substrate, on which the gallium nitride-based semiconductor layer may be grown, and is different from the first substrate 21. A composition ratio of GaInN may be determined so that the third LED stack 43 emits blue light. Meanwhile, the third-p transparent electrode 45 is in ohmic contact with the p-type semiconductor layer of the third LED stack 43.

The first color filter 37 and the second color filter 47 of FIG. 2 are the same as those described with reference to FIG. 1, and thus, detailed descriptions thereof will be omitted to avoid redundancy.

Referring to FIGS. 1 and 2, the first LED stack 23 is bonded to the support substrate 51 via the first bonding layer 53. The first bonding layer 53 may be disposed on the support substrate 51 in advance, and the first-p reflective electrode 25 may be bonded to the first bonding layer 53 and face the support substrate 51. Meanwhile, the first substrate 21 is removed from the first LED stack 23 using a chemical etching technique.

Then, the second LED stack 33 is bonded to the first LED stack 23 via the second bonding layer 55. The first color filter 37 is bonded to the second bonding layer 55 and face the first LED stack 23. The second bonding layer 55 may be disposed on the first LED stack 23 in advance, and the first color filter 37 may be disposed to face and bonded to the second bonding layer 55. Meanwhile, the second substrate 31 may be separated from the second LED stack 33 using techniques such as laser lift-off, chemical lift-off, and the like.

Then, the third LED stack 43 is bonded to the second LED stack 33 via the third bonding layer 57. The second color filter 47 is bonded to the third bonding layer 57 and face the second LED stack 33. The third bonding layer 57 may be disposed on the second LED stack 33 in advance, and the second color filter 47 may be disposed to face and bonded to the third bonding layer 57. Meanwhile, the third substrate 41 may be separated from the third LED stack 43 using techniques such as laser lift-off, chemical lift-off, and the like. In this manner, a light emitting diode stack for a display shown in FIG. 1 is formed, in which the n-type semiconductor layer of the third LED stack 43 is exposed.

A display apparatus according to an exemplary embodiment may be formed by patterning the stack of the first to third LED stacks 23, 33, and 43 disposed on the support substrate 51 in pixel units, and connecting these LED stacks to one another through interconnections. Hereinafter, a display apparatus according to an exemplary embodiment will be described.

Figure 3:
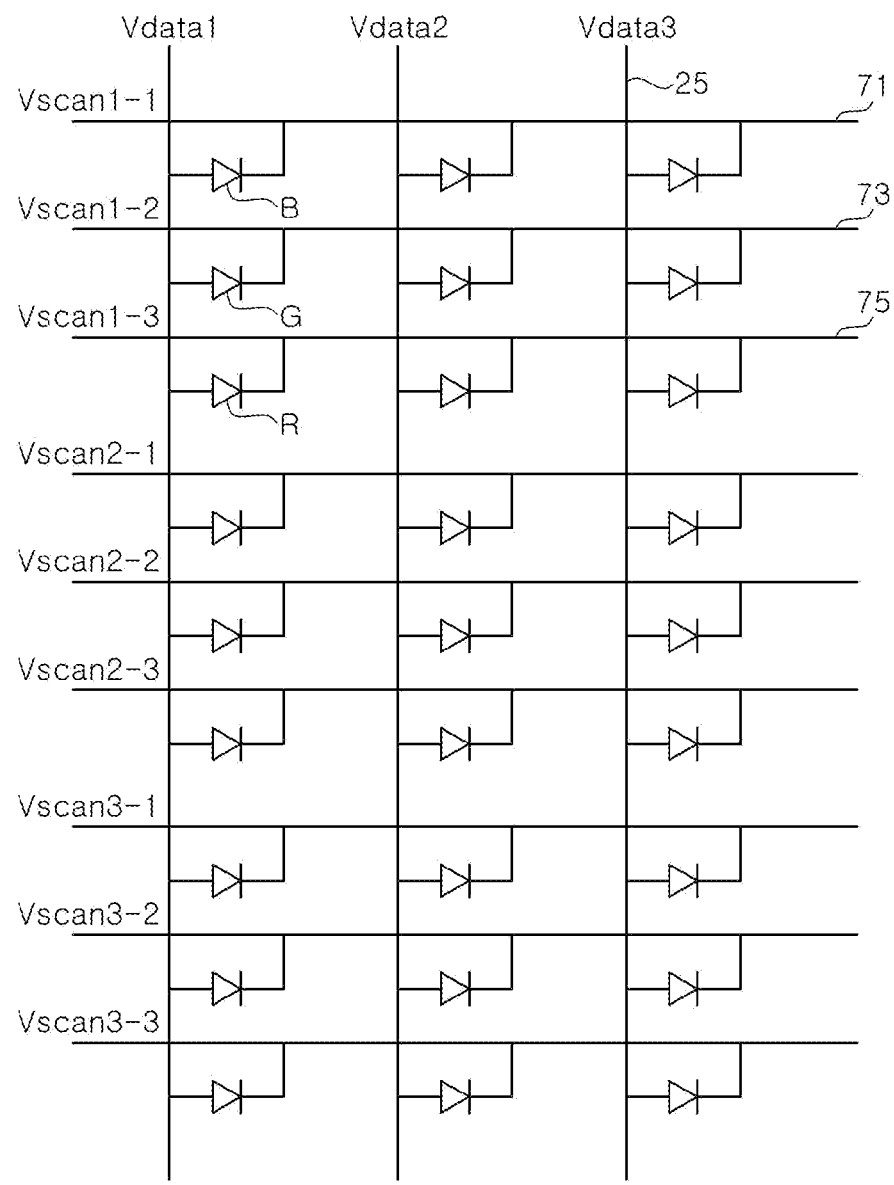
FIG. 3 is a schematic circuit diagram of a display apparatus according to an exemplary embodiment.
Figure 4:
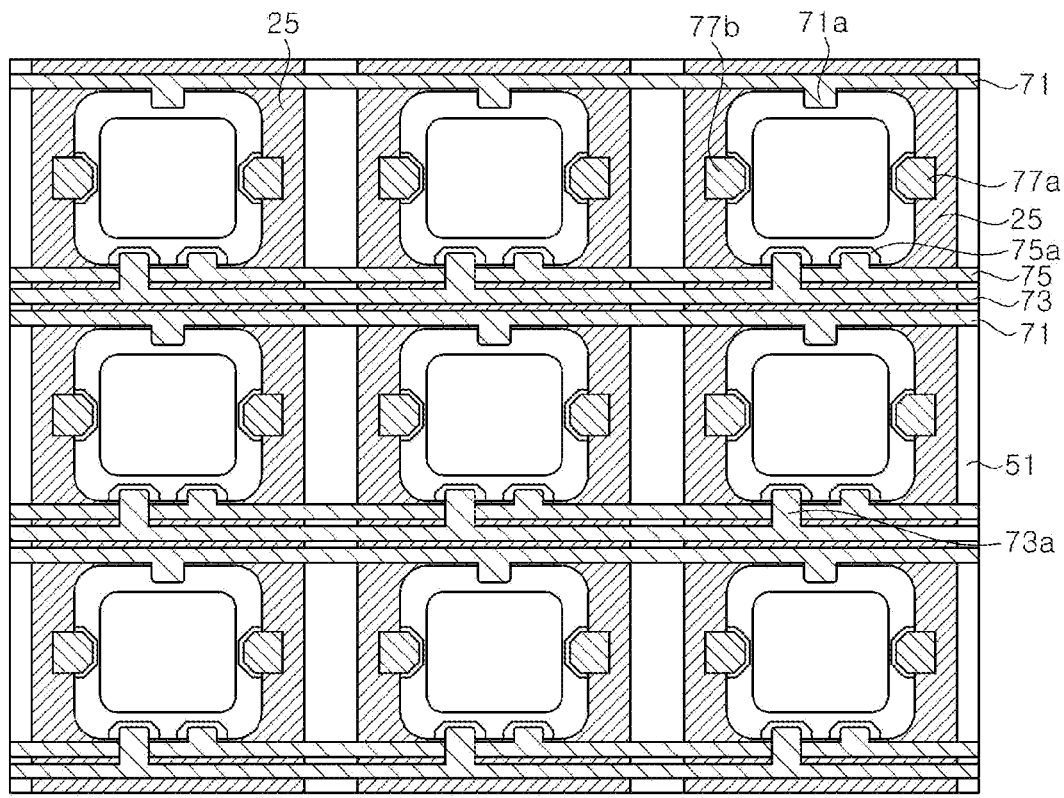
FIG. 4 is a schematic plan view of a display apparatus according to an exemplary embodiment.
Figure 5:
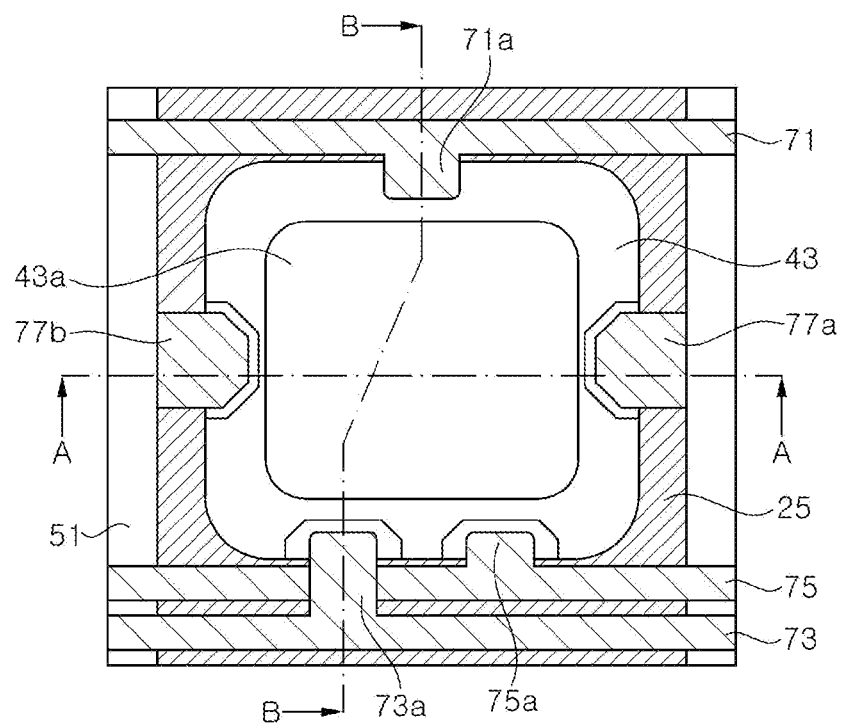
FIG. 5 is an enlarged plan view of one pixel of the display apparatus of FIG. 4 according to an exemplary embodiment.
Figure 6:
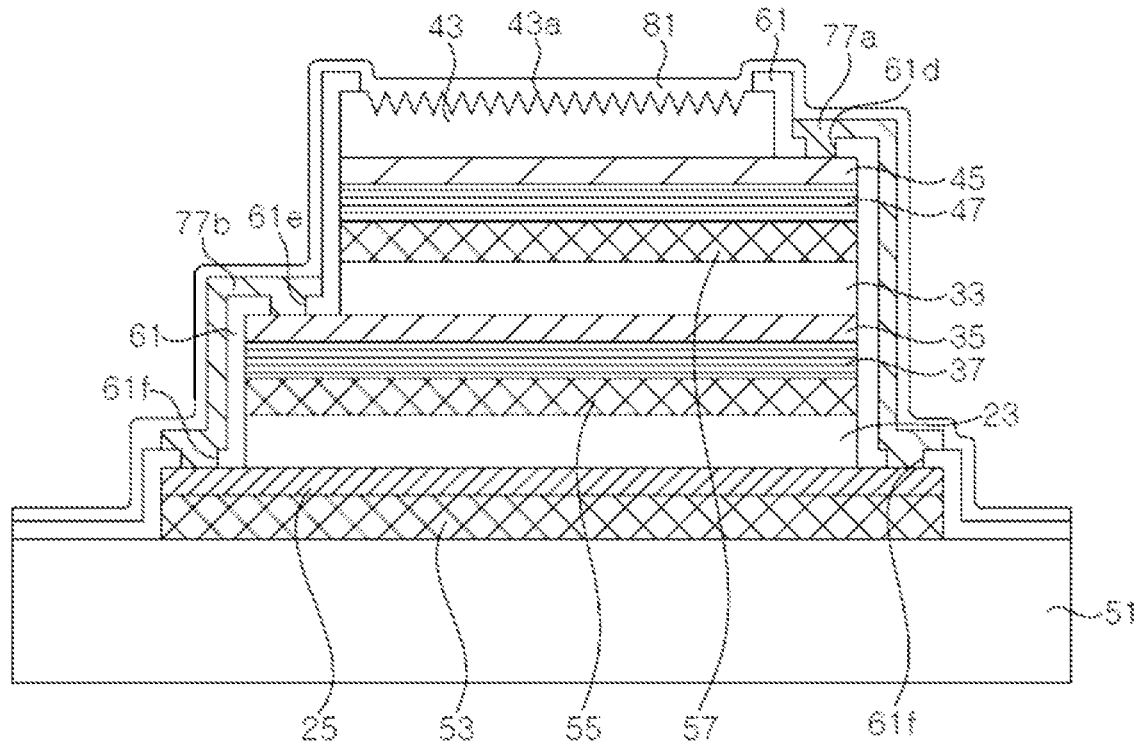
FIG. 6 is a schematic cross-sectional view taken along line A-A of FIG. 5.
Figure 7:
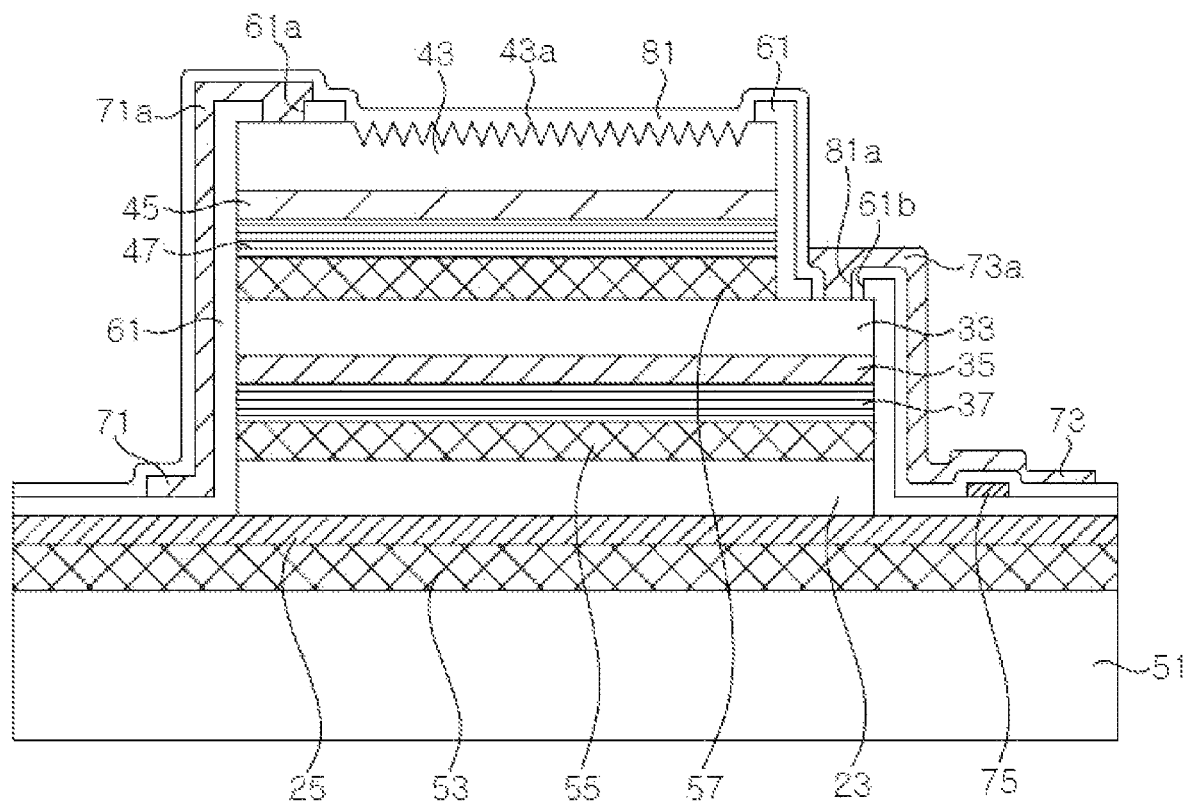
FIG. 7 is a schematic cross-sectional view taken along line B-B of FIG. 5.

FIG. 3 is a schematic circuit diagram of a display apparatus according to an exemplary embodiment. FIG. 4 is a schematic plan view of a display apparatus according to an exemplary embodiment. FIG. 5 is an enlarged plan view of one pixel region of the display apparatus of FIG. 4 according to an exemplary embodiment. FIG. 6 is a schematic cross-sectional view taken along line A-A of FIG. 5, and FIG. 7 is a schematic cross-sectional view taken along line B-B of FIG. 5.

Referring to FIGS. 3 and 4, the display apparatus according to the exemplary embodiment may be implemented to be driven in a passive matrix manner.

For example, the light emitting diode stack for a display described with reference to FIG. 1 has a structure, in which the first to third LED stacks 23, 33 and 43 are stacked in a vertical direction, and thus, one pixel includes three light emitting diodes R, G, and B. Here, the first light emitting diode R corresponds to the first LED stack 23, the second light emitting diode G corresponds to the second LED stack 33, and the third light emitting diode B corresponds to the third LED stack 43.

In FIGS. 3 and 4, one pixel includes the first to third light emitting diodes R, G, and B, and each light emitting diode corresponds to a sub-pixel. Anodes of the first to third light emitting diodes R, G, and B are connected to a common line (e.g., a data line), and cathodes thereof are connected to different lines (e.g., scan lines). More particularly, in a first pixel, the anodes of the first to third light emitting diodes R, G, and B are connected in common to the data line Vdata1, and the cathodes thereof are connected to the scan lines Vscan1-1, Vscan1-2, and Vscan1-3, respectively. Thus, the light emitting diodes R, G, and B in the same pixel may be driven independently.

Further, each of the light emitting diodes R, G, and B may be driven in a pulse width modulation scheme or by changing the intensity of the current, thereby adjusting luminance of each sub-pixel.

Referring to FIG. 4, a plurality of pixels are formed by patterning the LED stacks described with reference to FIG. 1, and each of the pixels is connected to the first-p reflective electrodes 25 and interconnection lines 71, 73, and 75. As shown in FIG. 3, the first-p reflective electrode 25 may be used as the data line Vdata, and the interconnection lines 71, 73, and 75 may be used as the scan lines.

The pixels may be arranged in a matrix form, the anodes of the light emitting diodes R, G, and B of each pixel are connected in common to the first-p reflective electrode 25, and the cathodes thereof are connected to the interconnection lines 71, 73 and 75, respectively, which are spaced apart from each other. The interconnection lines 71, 73, and 75 may be used as a scan line Vscan.

Referring to FIGS. 4 to 7, a portion of the first-p reflective electrode 25, a portion of the upper surface of the first LED stack 23, a portion of the second-p transparent electrode 35, a portion of the upper surface of the second LED stack 33, a portion of the third-p transparent electrode 45, and the upper surface of the third LED stack 43 in each pixel are exposed to the outside.

The third LED stack 43 may have a roughened surface 43a on the upper surface thereof. The roughened surface 43a may be formed on the entire upper surface of the third LED stack 43, or may be formed on a part thereof as shown in FIG. 6.

The first insulating layer 61 may cover a side surface of each pixel. The first insulating layer 61 may be formed of a light transmissive material such as $SiO_2$. In this case, the first insulating layer 61 may cover the entire upper surface of the third LED stack 43. Alternatively, the first insulating layer 61 may include a distributed Bragg reflector to reflect light traveling towards the side surface in the first to third LED stacks 23, 33 and 43. In this case, the first insulating layer 61 at least partially exposes the upper surface of the third LED stack 43.

The first insulating layer 61 may have an opening 61a exposing the upper surface of the third LED stack 43, an opening 61b exposing the upper surface of the second LED stack 33, an opening 61c (well shown in FIG. 8H) exposing the upper surface of the first LED stack 23 an opening 61d exposing the third-p transparent electrode 45, an opening 61e exposing the second-p transparent electrode 35, and openings 61f exposing the first-p reflective electrode 25.

The interconnection line 71 and the interconnection line 75 may be formed on the support substrate 51 in the vicinity of the first to third LED stacks 23, 33 and 43, and may be disposed on the first insulating layer 61 to be insulated from the first-p reflective electrode 25. Meanwhile, a connector 77a connects the third-p transparent electrode 45 to the first-p reflective electrode 25, a connector 77b connects the second-p transparent electrode 35 to the first-p reflective electrode 25, and the anodes of the first LED stack 23, the second LED stack 33, and the third LED stack 43 are connected in common to the first-p reflective electrode 25.

Meanwhile, a connector 71a connects the upper surface of the third LED stack 43 to the interconnection line 71, and a connector 75a connects the upper surface of the first LED stack 23 to the interconnection line 75.

The second insulating layer 81 is disposed on the interconnection lines 71 and 75 and the first insulating layer 61, and may cover the upper surface of the third LED stack 43. The second insulating layer 81 may have an opening 81a that exposes a portion of the upper surface of the second LED stack 33.

The interconnection line 73 may be disposed on the second insulating layer 81, and a connector 73a may connect the upper surface of the second LED stack 33 to the interconnection line 73. The connector 73a may pass over the upper part of the interconnection line 75 and is insulated from the interconnection line 75 by the second insulating layer 81.

As described above, the electrodes of each pixel according to an exemplary embodiment may be connected to the data lines and the scan lines. In particular, FIGS. 4-7 show that the interconnection lines 71 and 75 are formed on the first insulating layer 61 and the interconnection line 73 is formed on the second insulating layer 81, however, the inventive concepts are not limited thereto. For example, each of the interconnection lines 71, 73, and 75 may be formed on the first insulating layer 61 and covered with the second insulating layer 81, and the second insulating layer 81 may have an opening that exposes the interconnection line 73. In this case, the connector 73a may connect the upper surface of the second LED stack 33 to the interconnection line 73 through the openings of the second insulating layer 81.

Meanwhile, the interconnection lines 71, 73, and 75 may be formed in the support substrate 51, and the connectors 71a, 73a, and 75a may connect the upper surfaces of the first to third LED stacks 23, 33 and 43 to the interconnection lines 71, 73, and 75 on the first insulating layer 61.

FIGS. 8A to 8K are schematic plan views illustrating a manufacturing method of a display apparatus according to an exemplary embodiment.

First, a light emitting diode stack 100 shown in FIG. 1 is provided.

Figure 8A:
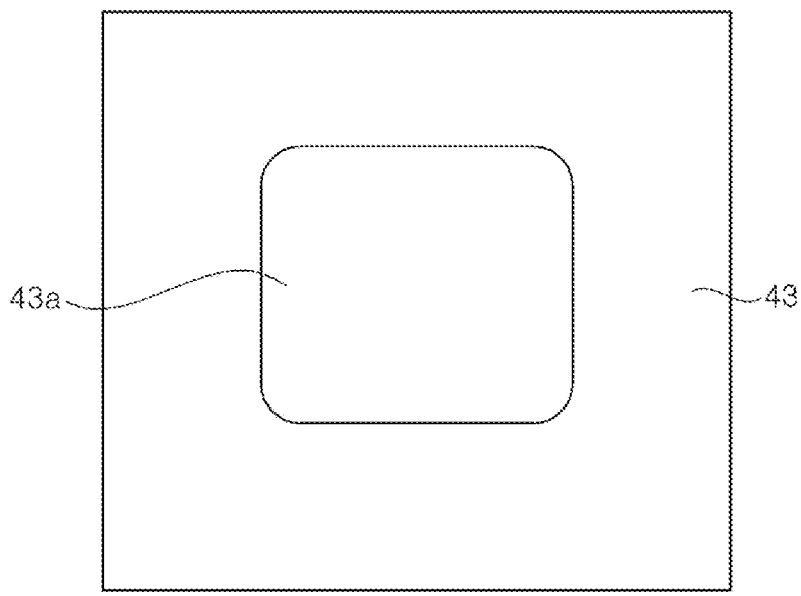
FIGS. 8A, 8B, 8C, 8D, 8E, 8F, 8G, 8H, 8I, 8J, and 8K are schematic plan views illustrating a manufacturing method of a display apparatus according to an exemplary embodiment.

Next, referring to FIG. 8A, a roughened surface 43a may be formed on the upper surface of the third LED stack 43. The roughened surface 43a may be formed to correspond each pixel region on the upper surface of the third LED stack 43. The roughened surface 43a may be formed by a chemical etching technique, for example, by a photo-enhanced chemical etch (PEC) technique.

The roughened surface 43a may be partially formed within each pixel region in consideration of the region of the third LED stack 43 to be further etched, but the inventive concepts are not limited thereto, and may be formed over the entire upper surface of the third LED stack 43.

Figure 8B:
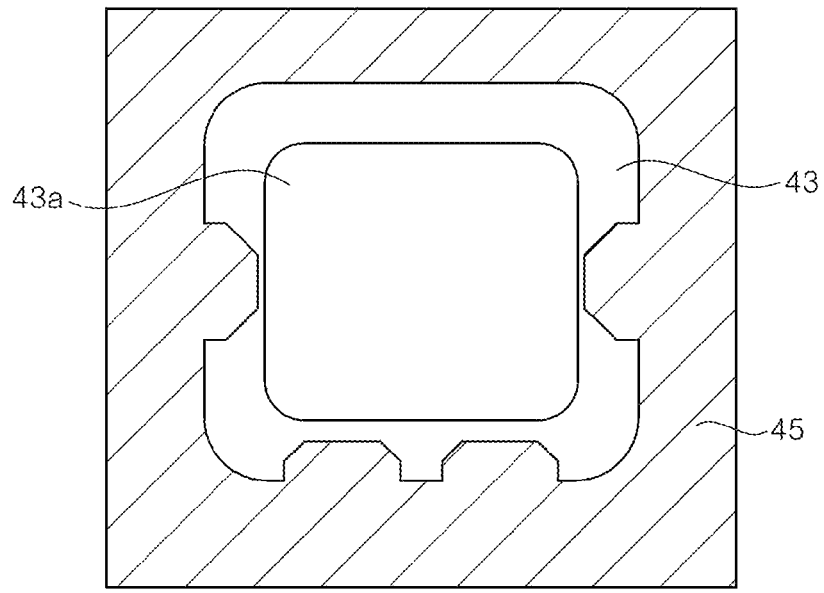

Referring to FIG. 8B, a peripheral region of the third LED stack 43 is then etched in each pixel region to expose the third-p transparent electrode 45. The remaining third LED stack 43 may have a rectangular or square shape, and a plurality of depression parts may be formed along the edges thereof.

Figure 8C:
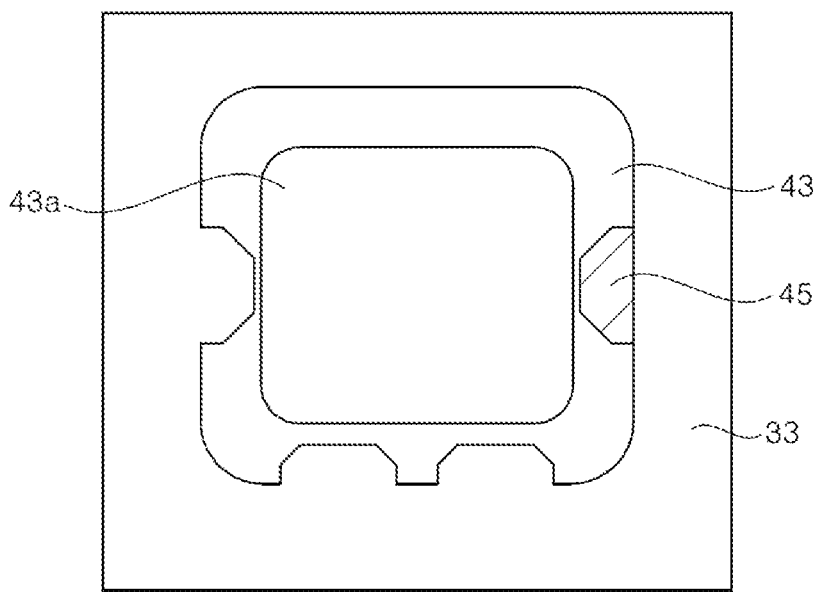

Referring to FIG. 8C, the exposed third-p transparent electrode 45 is then removed except for a part thereof that corresponds to one depression part formed in the third LED stack 43, to expose the upper surface of the second LED stack 33. The upper surface of the second LED stack 33 is exposed around the third LED stack 43 and in other depression parts of the third LED stack 43 other than the one where the third-p transparent electrode 45 is remained.

Figure 8D:
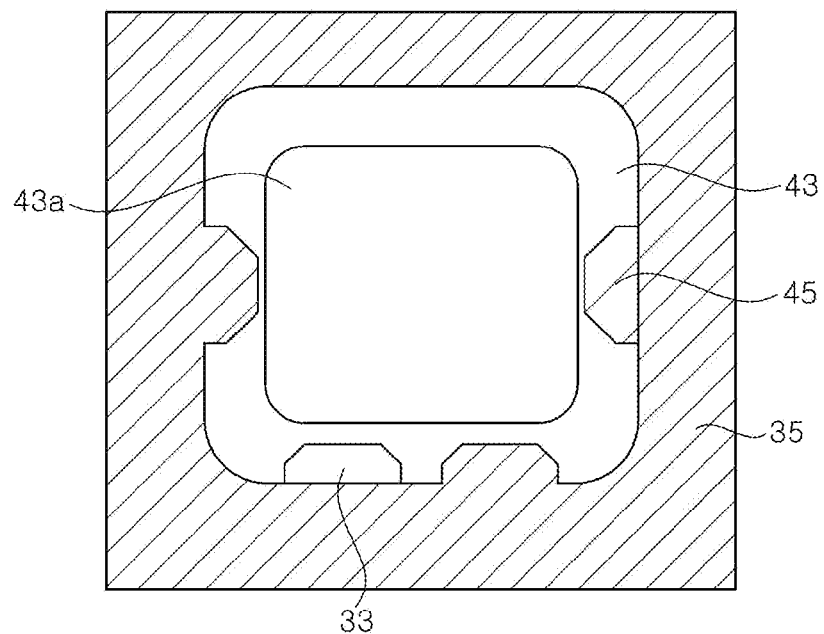

Referring to FIG. 8D, the exposed second LED stack 33 is removed except for a part thereof that corresponds to another depression part of the third LED stack 43, to thereby expose the second-p transparent electrode 35.

Figure 8E:
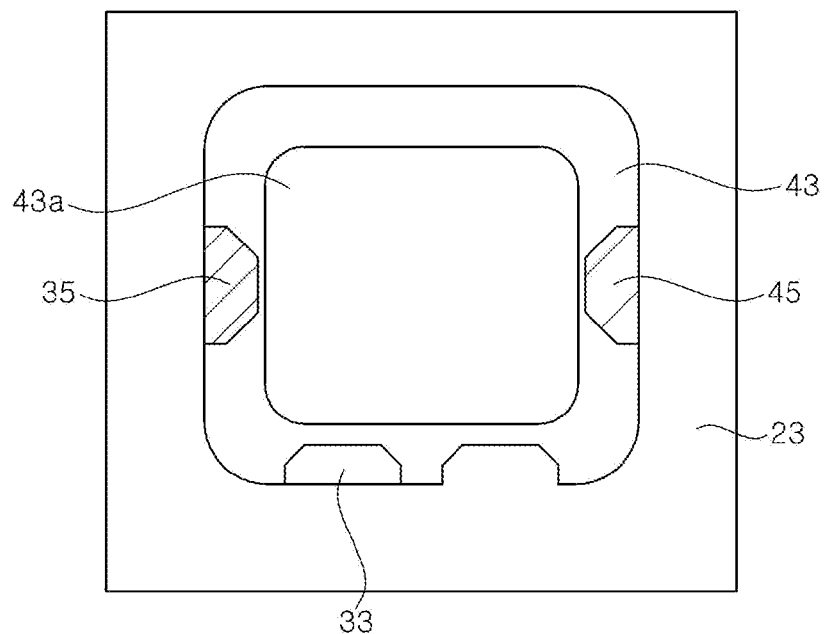

Referring to FIG. 8E, the exposed second-p transparent electrode 35 is then removed except for a part that thereof that corresponds to still another depression part of the third LED stack 43, to expose the upper surface of the first LED stack 23. Thus, the upper surface of the first LED stack 23 is exposed around the third LED stack 43, and the upper surface of the first LED stack 23 is also exposed to at least one of the depression parts of the third LED stack 43.

Figure 8F:
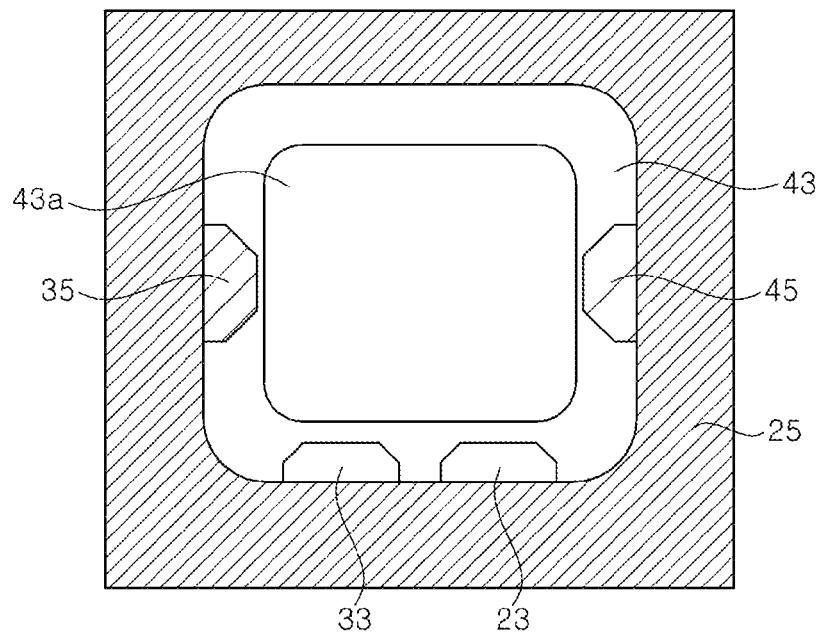

Referring to FIG. 8F, the exposed first LED stack 23 is removed except for a part thereof that corresponds to yet another depression part of the third LED stack 43, to expose the first-p reflective electrode 25. The first-p reflective electrode 25 is exposed around the third LED stack 43.

Figure 8G:
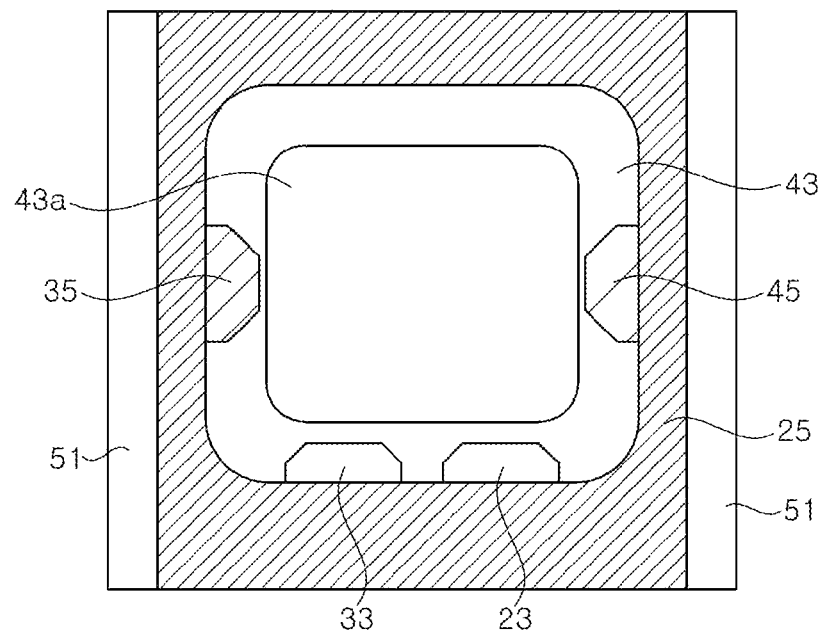

Referring to FIG. 8G, the first-p reflective electrode 25 is patterned to form linear interconnection lines such that the support substrate 51 may be exposed. The first-p reflective electrode 25 may connect the pixels arranged in a column to each other as shown in FIG. 4.

Figure 8H:
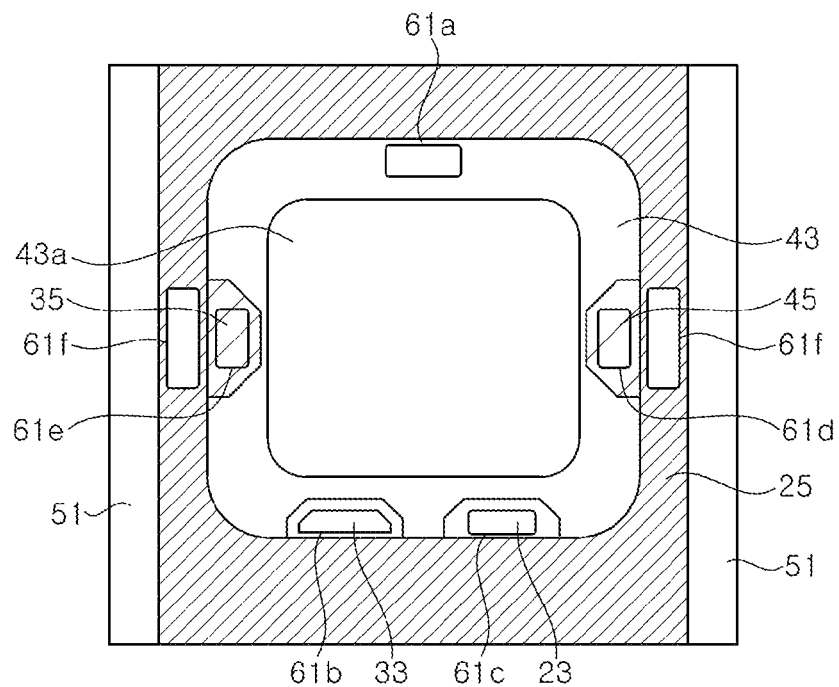

Referring to FIG. 8H, a first insulating layer (61 in FIGS. 6 and 7) is formed to cover the pixel. In particular, the first insulating layer 61 covers side surfaces of the first to third LED stacks 23, 33, and 43 while covering the first-p reflective electrode 25. In addition, the first insulating layer 61 may at least partially cover the upper surface of the third LED stack 43. When the first insulating layer 61 is a transparent layer, such as $SiO_2$, the first insulating layer 61 may cover the entire upper surface of the third LED stack 43. Alternatively, when the first insulating layer 61 includes a distributed Bragg reflector, the first insulating layer 61 may expose at least a portion of the upper surface of the third LED stack 43 so that light is emitted to the outside.

Meanwhile, the first insulating layer 61 may include an opening 61a exposing the third LED stack 43, an opening 61b exposing the second LED stack 33, an opening 61c exposing the first LED stack 23, an opening 61d exposing the third-p transparent electrode 45, an opening 61e exposing the second-p transparent electrode 35, and an opening 61f exposing the first-p reflective electrode 25. At least two openings 61f exposing the first-p reflective electrode 25 may be formed.

Figure 8I:
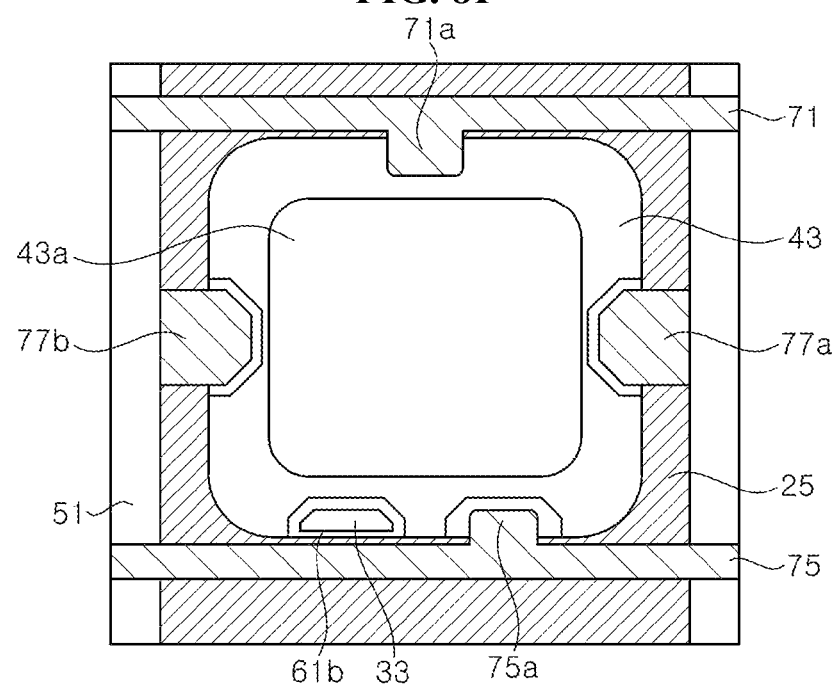

Referring to FIG. 8I, interconnection lines 71 and 75 and connectors 71a, 75a, 77a, and 77b are then formed by using a lift-off technique or the like. The interconnection lines 71 and 75 are insulated from the first-p reflective electrode 25 by the first insulating layer 61. The connector 71a electrically connects the third LED stack 43 to the interconnection line 71, and the connector 75a electrically connects the first LED stack 23 to the interconnection line 75. Meanwhile, the connector 77a electrically connects the third-p transparent electrode 45 to the first-p reflective electrode 25, and the connector 77b electrically connects the second-p transparent electrode 35 to the first-p reflective electrode 25.

Figure 8J:
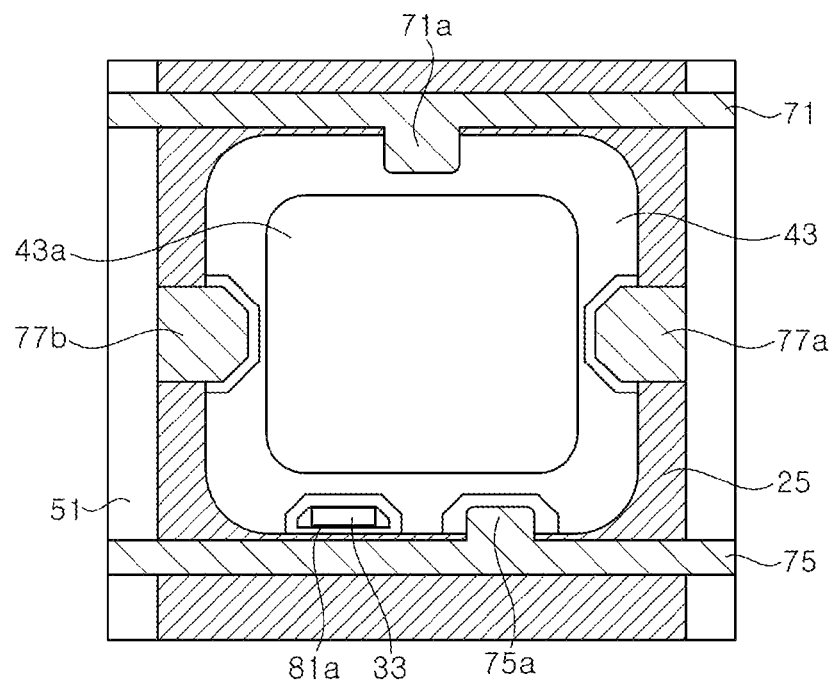

Referring to FIG. 8J, a second insulating layer (81 in FIG. 6 and FIG. 7) then covers the interconnection lines 71 and 75 and the connectors 71a, 75a, 77a, and 77b. The second insulating layer 81 may also cover the entire upper surface of the third LED stack 43. Meanwhile, the second insulating layer 81 has an opening 81a exposing the upper surface of the second LED stack 33. The second insulating layer 81 may be formed of, for example, a silicon oxide film or a silicon nitride film, and may also include a distributed Bragg reflector. When the second insulating layer 81 includes a distributed Bragg reflector, the second insulating layer 81 may at least partially expose the upper surface of the third LED stack 43 to emit light to the outside.

Figure 8K:
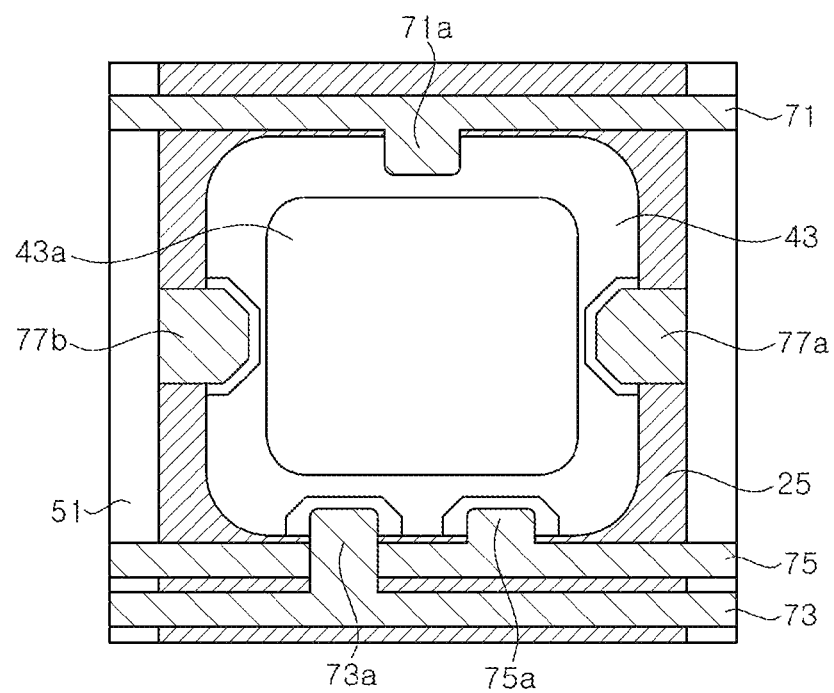

Referring to FIG. 8K, the interconnection line 73 and the connector 73a are then formed by a lift-off technique or the like. The interconnection line 73 is disposed on the second insulating layer 81 and is insulated from the first-p reflective electrode 25 and the interconnection lines 71 and 75. The connector 73a electrically connects the second LED stack 33 and the interconnection line 73. The connector 73a may cross over an upper part of the interconnection line 75 and is insulated from the interconnection line 75 by the second insulating layer 81.

In this manner, a pixel region shown in FIG. 5 may be formed. Further, as shown in FIG. 4, the plurality of pixels may be formed on the support substrate 51, and these pixels may be connected to each other by the first-p reflective electrode 25 and the interconnection lines 71, 73, and 75 so as to be driven in a passive matrix manner.

As described above, a manufacturing method of a display apparatus driven in a passive matrix manner has been described according to an exemplary embodiment. However, the inventive concepts are not limited to the particular manufacturing method described above, and a display apparatus to be driven in a passive matrix manner may be manufactured in various ways by using the light emitting diode stack shown in FIG. 1. For example, the interconnection line 73 has been described as being formed on the second insulating layer 81, but the interconnection line 73 may be formed on the first insulating layer 61 together with the interconnection lines 71 and 75, and the connector 73a may be formed on the second insulating layer 81 to connect the second LED stack 33 to the interconnection line 73. Further, the interconnection lines 71, 73, and 75 may be provided in the support substrate 51.

Figure 9:
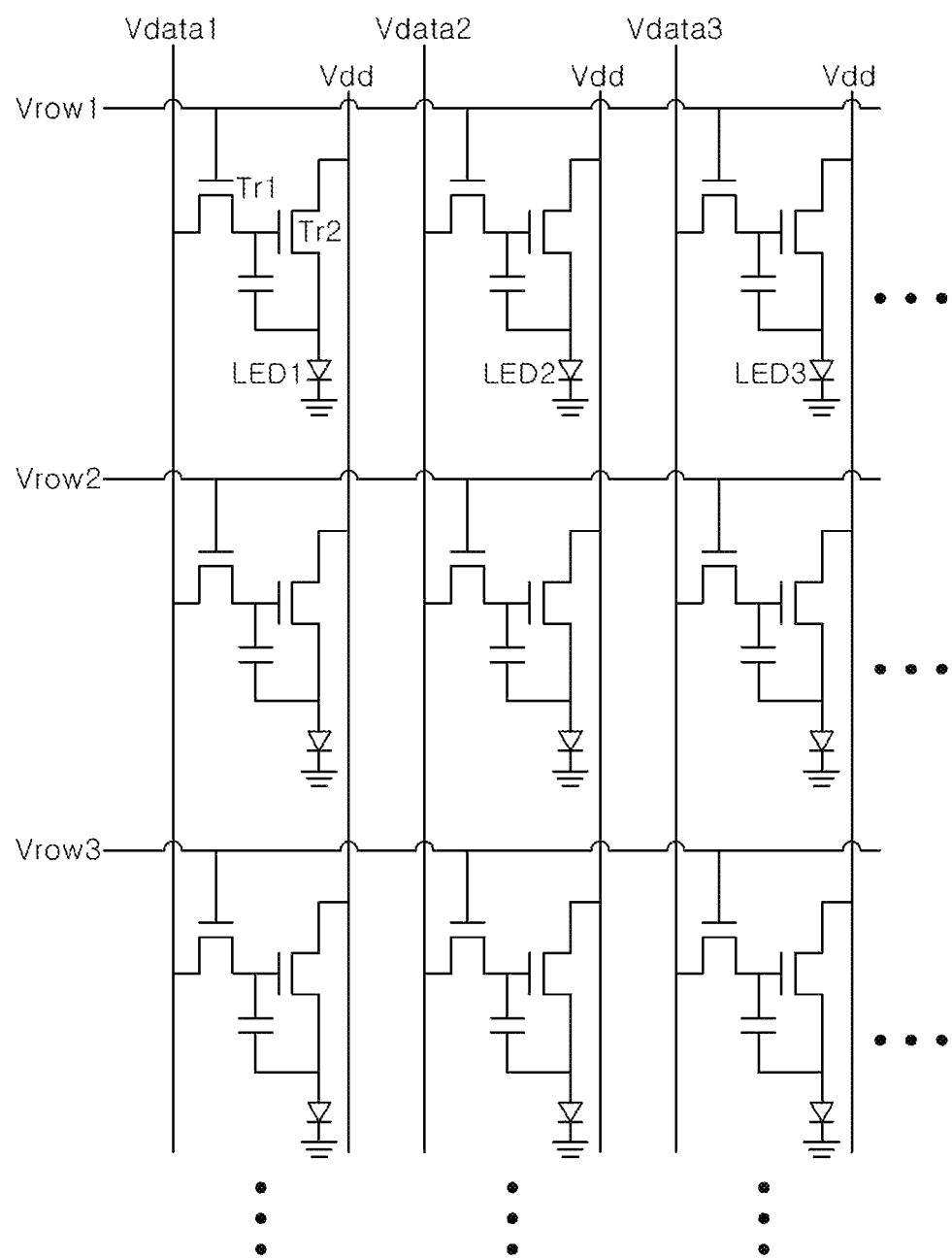
FIG. 9 is a schematic circuit diagram a display apparatus according to another exemplary embodiment.

FIG. 9 is a schematic circuit diagram of a display apparatus according to another exemplary embodiment. While the display apparatus described with reference to FIGS. 3-8 is configured to be driven in a passive matrix manner, the display apparatus according to the illustrated embodiment is for active matrix driving.

Referring to FIG. 9, a driving circuit according to an exemplary embodiment includes two or more transistors Tr1 and Tr2 and a capacitor. When power supply is connected to selection lines Vrow1 to Vrow3, and a data voltage is applied to the data lines Vdata1 to Vdata3, a voltage is applied to the corresponding light emitting diode. Further, charges are charged in the corresponding capacitor in accordance with the values of Vdata1 to Vdata3. The transistor Tr2 may maintain a turn-on state by the charged voltage of the capacitor, and thus, even when power supply is cut off to the selection line Vrow1, voltage of the capacitor may be maintained, and the voltage may be applied to the light emitting diodes LED1 to LED3. Further, currents flowing through the LED1 to the LED3 may be changed according to values of Vdata1 to Vdata3. Since the current may always be supplied through Vdd, light may be emitted continuously.

The transistors Tr1 and Tr2 and the capacitor may be formed in the support substrate 51. For example, a thin film transistor formed on a silicon substrate may be used for active matrix driving.

The light emitting diodes LED1, LED, and LED3 may correspond to the first, second, and third LED stacks 23, 33, and 43 stacked in one pixel. Anodes of the first to third LED stacks 23, 33, and 43 may be connected to the transistor Tr2, and cathodes thereof may be grounded.

While FIG. 9 shows a driving circuit of a display apparatus for active matrix driving, the inventive concepts are not limited thereto, and other circuits may be used. Further, while the anodes of the light emitting diodes LED1 to LED3 are described as being connected to the different transistors Tr2 and the cathodes thereof are grounded, alternatively, the anodes of the light emitting diodes may be connected to the current supplies Vdd, and the cathodes thereof may be connected to different transistors.

Figure 10:
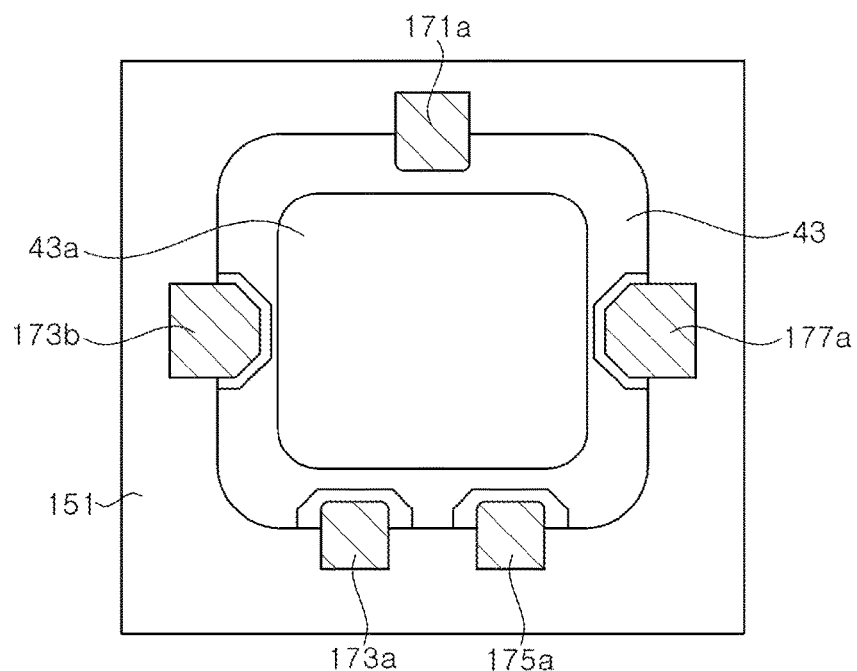
FIG. 10 is a schematic plan view of a pixel according to another exemplary embodiment.

FIG. 10 is a schematic plan view of a display apparatus according to still another exemplary embodiment. Hereinafter, one pixel of the plurality of pixels arranged on the support substrate 151 will be described.

Referring to FIG. 10, the pixel according to an exemplary embodiment is generally similar to the pixel described with reference to FIGS. 4 to 7, except that the support substrate 151 is a thin film transistor panel including a transistor and a capacitor, and the first-p reflective electrode 25 is defined within a lower region of the first LED stack 23.

The cathode of the third LED stack 43 is connected to the support substrate 151 through the connector 171*a*. For example, as shown in FIG. 9, the cathode of the third LED stack 43 (e.g., LED 3) may be electrically connected to the support substrate 151 and grounded. The cathodes of the second LED stack 33 (e.g., LED 2) and the first LED stack 23 (e.g., LED 1) may also be connected to the support substrate 151 through the connectors 173*a* and 175*a*, and are grounded, respectively.

Meanwhile, the first-p reflective electrode 25 is connected to a transistor (Tr2 in FIG. 9) provided in the support substrate 151. The third-p transparent electrode 45 and the second-p transparent electrode 35 are also connected to the transistor (Tr2 in FIG. 9) provided in the support substrate 151 through the connectors 177*a* and 173*b*, respectively.

By connecting the first to third LED stacks 23, 33, and 43 as described above, a circuit for active matrix driving as shown in FIG. 9 may be constructed.

While FIG. 10 shows a pixel of a display apparatus for active matrix driving, the inventive concepts are not limited thereto, and various modifications may be made to various circuits for active matrix driving.

Meanwhile, referring back to FIG. 1, the first-p reflective electrode 25, the second-p transparent electrode 35, and the third-p transparent electrode 45 are described as being in ohmic contact with the p-type semiconductor layers of the first LED stack 23, the second LED stack 33, and the third LED stack 43, respectively, but the ohmic contact layer is not separately provided in the n-type semiconductor layers. This is because when a pixel size is as small as 200 micrometers or less, there is less difficulty in current spreading even without forming a separate ohmic contact layer in the n-type semiconductor layer. However, for current spreading, transparent electrode layers may still be disposed on the n-type semiconductor layer of each LED stack if needed.

The first to third LED stacks 23, 33, and 43 may be bonded to each other by various configurations.

Figure 11:
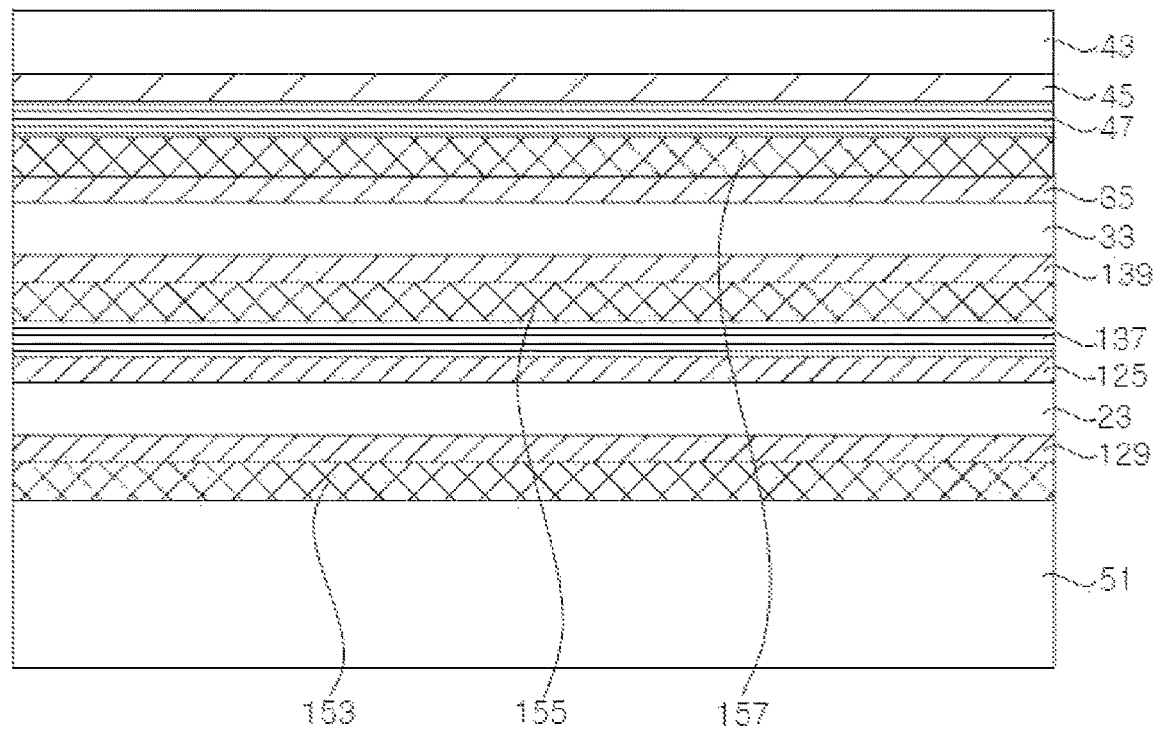
FIG. 11 is a schematic cross-sectional view of a light emitting diode stack for a display according to still another exemplary embodiment.

FIG. 11 is a schematic cross-sectional view of a light emitting diode stack for a display according to still another exemplary embodiment.

Referring to FIG. 11, the light emitting diode stack 101 may include the support substrate 51, the first LED stack 23, the second LED stack 33, the third LED stack 43, the second-p transparent electrode 35, the third-p transparent electrode 45, the first color filter 137, the second color filter 47, a first bonding layer 153, a second bonding layer 155, and a third bonding layer 157, similarly to the light emitting diode stack 100 of FIG. 1. The light emitting diode stack 101 may further include a first-n reflective electrode 129, a first-p transparent electrode 125, and a second-n transparent electrode 139.

The support substrate 51 supports the LED stacks 23, 33, and 43. The support substrate 51 may have a circuit on a surface or in an inner part thereof, but the inventive concepts are not limited thereto. The support substrate 51 may include, for example, a Si substrate or a Ge substrate.

The first LED stack 23, the second LED stack 33, and the third LED stack 43 are similar to those described with reference to FIG. 1, and thus detailed descriptions thereof will be omitted to avoid redundancy. The light emitting diode stack 101 is different from that of FIG. 1 in that the lower surfaces of the first LED stack 23 and the second LED stack 33 are n-type, and the upper surfaces thereof are p-type. The lower surface of the third LED stack 43 is the p-type and the upper surface thereof is the n-type, which is substantially the same as that of FIG. 1.

Since the upper surface of the first LED stack 23 is p-type, the first-p transparent electrode 125 is in ohmic contact with the upper surface of the first LED stack 23. The first-p transparent electrode 125 transmits light generated in the first LED stack 23, for example, red light.

The first-n reflective electrode 129 is in ohmic contact with the lower surface of the first LED stack 23. The first-n reflective electrode 129 is in ohmic contact with the first LED stack 23 and reflects light generated in the first LED stack 23. The first-n reflective electrode 129 may be formed of, for example, Au—Ti, Au—Sn, or the like. Further, the first-n reflective electrode 129 may include a diffusion barrier layer.

The second-p transparent electrode 35 is in ohmic contact with the p-type semiconductor layer of the second LED stack 33. Since the upper surface of the second LED stack 33 is the p-type, the second-p transparent electrode 35 is disposed on the second LED stack 33. The second-p transparent electrode 35 may be formed of a metal layer or a conductive oxide layer, which is transparent to red light and green light.

The second-n transparent electrode 139 is in ohmic contact with the lower surface of the second LED stack 33. The second-n transparent electrode 139 may also be formed of a metal layer or a conductive oxide layer, which is transparent to red light and green light. The second-n transparent electrode 139 is partially exposed by patterning the second LED stack 33 to provide a connection terminal for electrical connection to the n-type semiconductor layer of the second LED stack 33.

The third-p transparent electrode 45 is in ohmic contact with the p-type semiconductor layer of the third LED stack 43. The third-p transparent electrode 45 may be formed of a metal layer or a conductive oxide layer, which is transparent to red light, green light, and blue light.

The first color filter 137 is disposed between the first LED stack 23 and the second LED stack 33. Further, the second color filter 47 is disposed between the second LED stack 33 and the third LED stack 43. The first color filter 137 transmits light generated in the first LED stack 23 and reflects light generated in the second LED stack 33. The second color filter 47 transmits light generated in the first and second LED stacks 23 and 33 and reflects light generated in the third LED stack 43. Thus, light generated in the first LED stack 23 may be emitted to the outside through the second LED stack 33 and the third LED stack 43, and light generated in the second LED stack 33 may be emitted to the outside through the third LED stack 43. Further, it is possible to prevent light generated in the second LED stack 33 from being incident on the first LED stack 23 to be lost, or light generated in the third LED stack 43 from being incident on the second LED stack 33 to be lost.

According to some exemplary embodiments, the first color filter 137 may reflect light generated in the third LED stack 43.

Each of the first and second color filters 137 and 47 may be, for example, a low pass filter that passes through only a low frequency region, that is, a long wavelength region, a band pass filter that passes through only a predetermined wavelength band, or a band stop filter that blocks only the predetermined wavelength band. In particular, the first and second color filters 137 and 47 may be the band stop filter including a distributed Bragg reflector (DBR). The distributed Bragg reflector may be formed by alternately stacking insulating layers having different refractive indices, for example, by alternately stacking $TiO_2$ and $SiO_2$. In addition, the stop band of the distributed Bragg reflector may be controlled by adjusting the thicknesses of $TiO_2$ and $SiO_2$. The low pass filter and the band pass filter may also be formed by alternately stacking insulating layers having different refractive indices.

The first bonding layer 153 couples the first LED stack 23 to the support substrate 51. As shown in FIG. 11, the first-n reflective electrode 129 may be in contact with the first bonding layer 153. The first bonding layer 153 may be light transmissive or opaque. The first bonding layer 153 may be, for example, a transparent inorganic insulating film, a transparent organic insulating film, or a transparent conductive thin film.

The second bonding layer 155 couples the second LED stack 33 to the first LED stack 23. As shown in FIG. 11, the second bonding layer 155 may be disposed on the first color filter 137 and may be in contact with the second-n transparent electrode 139. The second bonding layer 155 transmits light generated in the first LED stack 23. The second bonding layer 155 may be, for example, a transparent inorganic insulating film, a transparent organic insulating film, or a transparent conductive thin film, and may be formed of, for example, light transmissive spin-on-glass.

The third bonding layer 157 couples the third LED stack 43 to the second LED stack 33. As shown in FIG. 11, the third bonding layer 157 may be in contact with the second-p transparent electrode 35 and in contact with the second color filter 47. The third bonding layer 157 transmits light generated in the first LED stack 23 and the second LED stack 33. The third bonding layer 157 may be, for example, a transparent inorganic insulating film, a transparent organic insulating film, or a transparent conductive thin film, and may be formed of, for example, light transmissive spin-on-glass.

FIGS. 12A to 12F are schematic cross-sectional views illustrating a manufacturing method of a light emitting diode stack for a display according to still another exemplary embodiment.

Figure 12A:
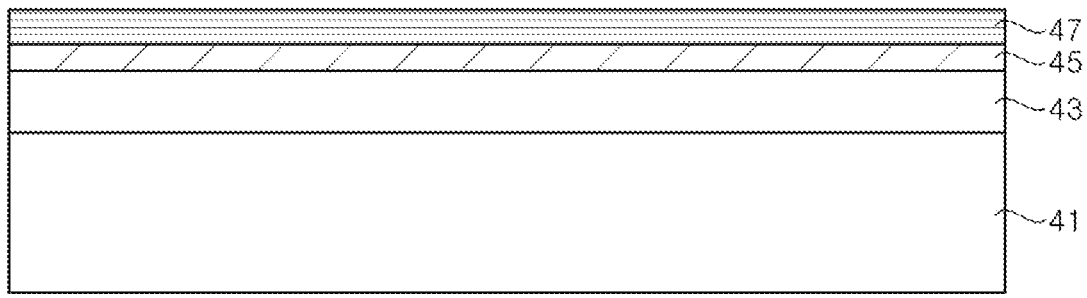
FIGS. 12A, 12B, 12C, 12D, 12E, and 12F are schematic cross-sectional views illustrating a manufacturing method of a light emitting diode stack for a display according to still another exemplary embodiment.

Referring to FIG. 12A, the third LED stack 43 is grown on the third substrate 41, and the third-p transparent electrode 45 and the second color filter 47 are formed on the third LED stack 43. The third LED stack 43 may be formed of gallium nitride-based semiconductor layers and may include a GaInN well layer. The third substrate 41 is a substrate on which the gallium nitride-based semiconductor layer may be grown, for example, a sapphire substrate. A composition ratio of GaInN may be determined so that the third LED stack 43 emits blue light. The third-p transparent electrode 45 is in ohmic contact with the p-type semiconductor layer of the third LED stack 43.

Figure 12B:
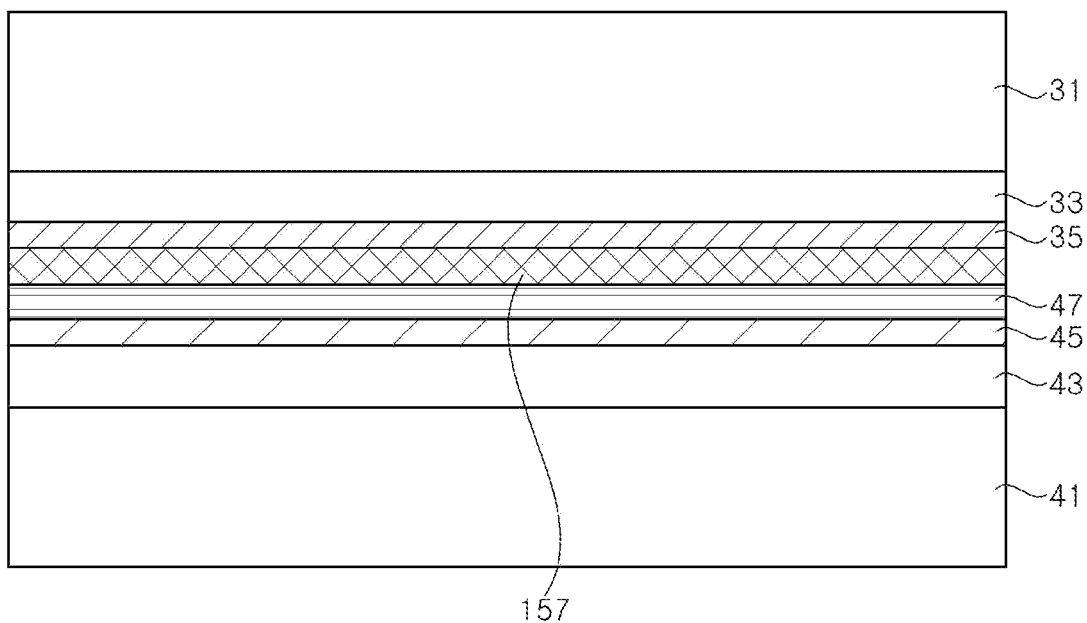

Referring to FIG. 12B, the second LED stack 33 is grown on a second substrate 31, and the second-p transparent electrode 35 is formed on the second LED stack 33. The second LED stack 33 may be formed of gallium nitride-based semiconductor layers and may include a GaInN well layer. The second substrate 31 is a substrate on which the gallium nitride-based semiconductor layer may be grown, and may be the same as the third substrate 41. A composition ratio of GaInN may be determined so that the second LED stack 33 emits green light. The second-p transparent electrode 35 is in ohmic contact with the p-type semiconductor layer of the second LED stack 33.

The third bonding layer 157 is provided on the second color filter 47, and the second substrate 31 is disposed so that the second-p transparent electrode 35 of the second substrate 31 is in contact with the third bonding layer 157. The third bonding layer 157 may be formed of, for example, a spin-on glass. In this manner, the second LED stack 33 is bonded to the third LED stack 43.

Figure 12C:
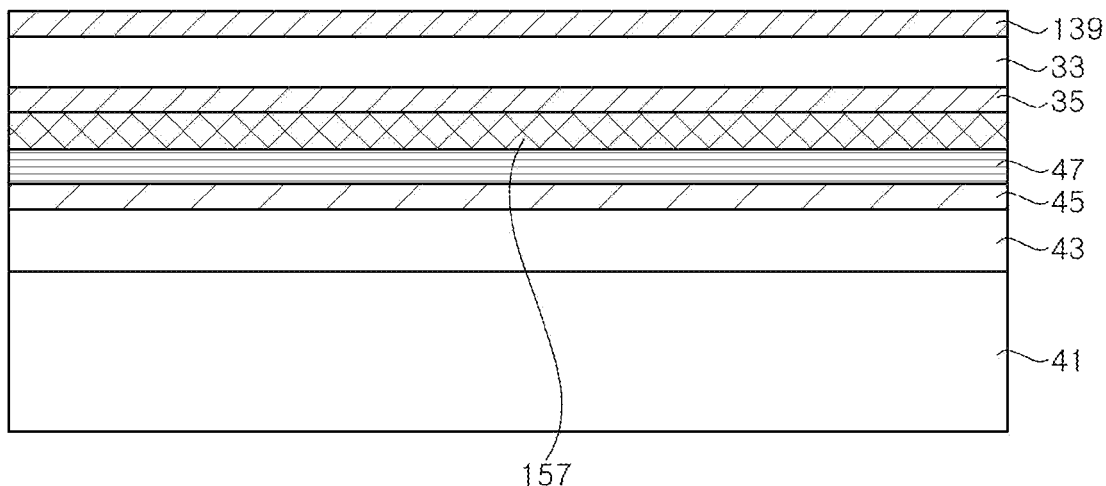

Referring to FIG. 12C, the second substrate 31 is then separated from the second LED stack 33. The second substrate 31 may be separated from the second LED stack 33 by using techniques, such as laser lift-off, chemical lift-off, or the like. As the second substrate 31 is separated, the second LED stack 33 is exposed. Then, the second-n transparent electrode 139 is formed on the exposed second LED stack 33. The second-n transparent electrode 139 may be formed of a metal or a conductive oxide layer. According to an exemplary embodiment, the second-n transparent electrode 139 may be omitted.

Figure 12D:
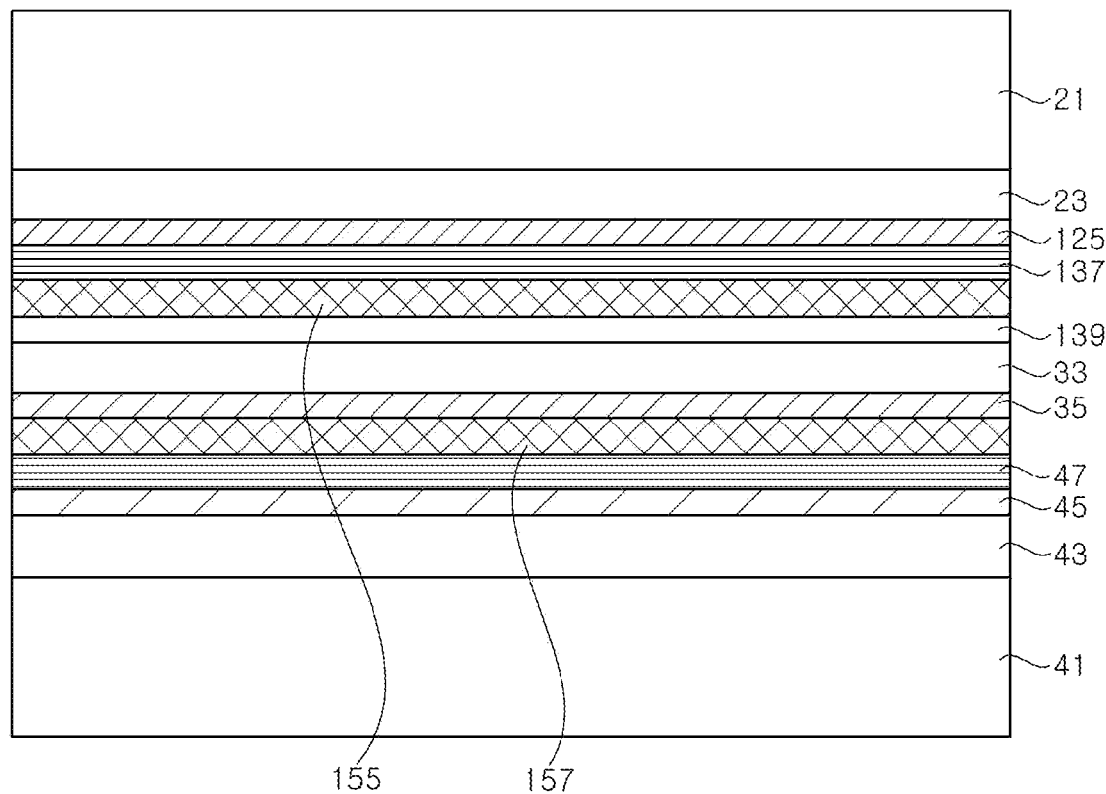

Referring to FIG. 12D, the first LED stack 23 is grown on the first substrate 21, the first-p transparent electrode 125 is formed on the first LED stack 23, and the first color filter u) 137 is formed on the first-p transparent electrode 125.

The first substrate 21 may be, for example, a GaAs substrate. Further, the first LED stack 23 is formed of AlGaInP-based semiconductor layers, and includes an n-type semiconductor layer, an active layer, and a p-type semiconductor layer. The first-p transparent electrode 125 is in ohmic contact with the p-type semiconductor layer of the first LED stack 23.

The first color filter 137 is substantially the same as that described with reference to FIG. 1, and thus, detailed descriptions thereof will be omitted to avoid redundancy.

The second bonding layer 155 is provided on the second-n transparent electrode 139, and the first substrate 21 is disposed so that the first color filter 137 of the first substrate 21 is in contact with the second bonding layer 155. The second bonding layer 155 may be formed of, for example, a spin-on glass. Thus, the first LED stack 23 is bonded to the second LED stack 33.

Figure 12E:
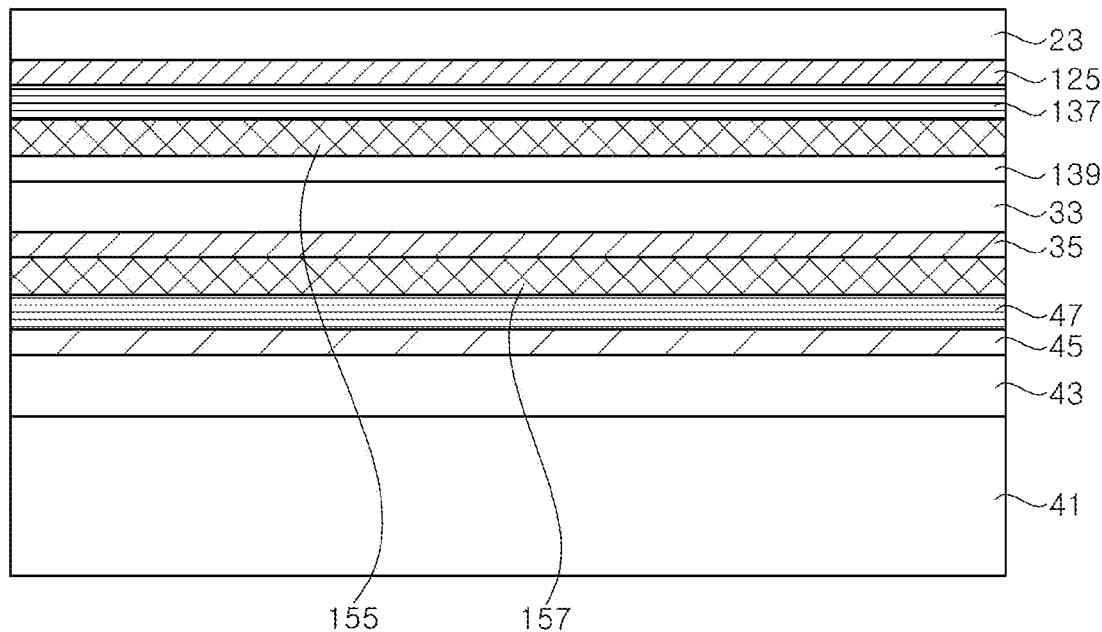

Referring to FIG. 12E, after the first LED stack 23 is bonded on the second LED stack 33, the first substrate 21 is removed from the first LED stack 23 by using a chemical etching technique. Thus, the first LED stack 23 is exposed.

Figure 12F:
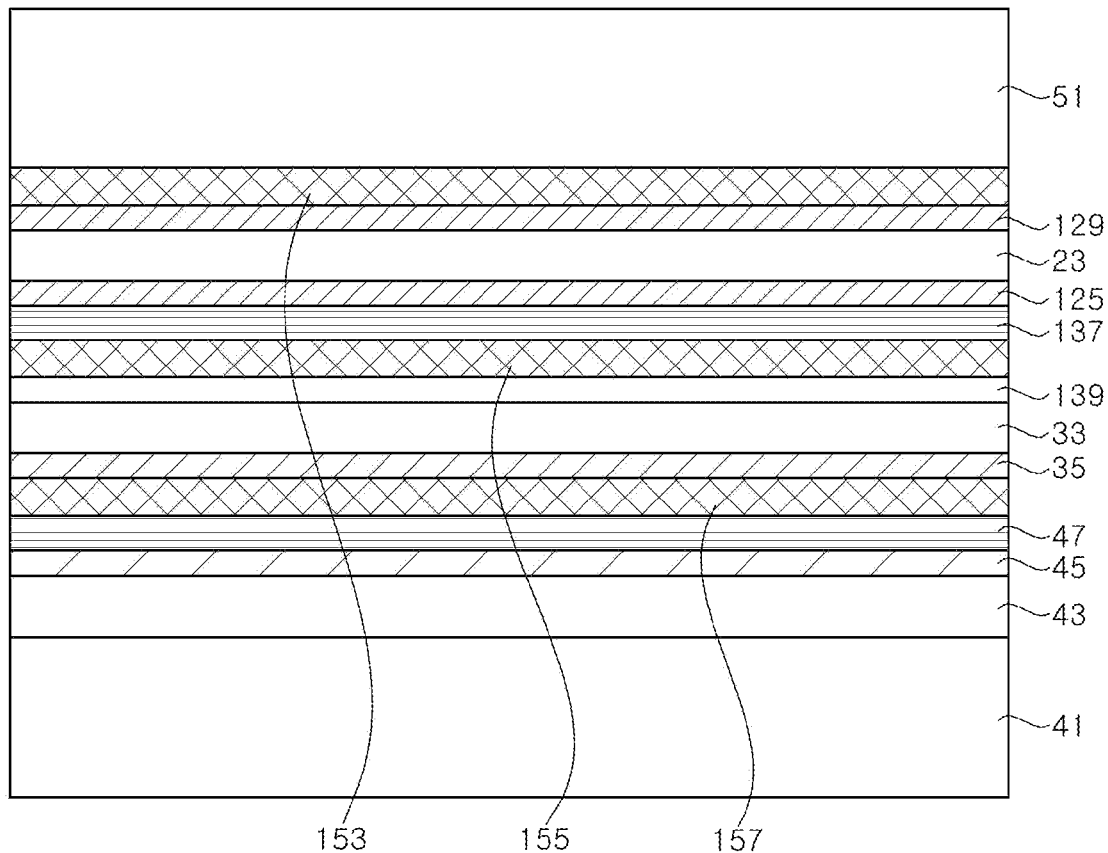

Referring to FIG. 12F, the first-n reflective electrode 129 is formed on the exposed first LED stack 23. The first-n reflective electrode 129 includes a metal layer reflecting light generated in the first LED stack 23. Then, the first bonding layer 153 is disposed on the first-n reflective electrode 129, and the support substrate 51 is bonded thereon. Then, the third substrate 41 may be separated from the third LED stack 43 by using techniques, such as laser lift-off, chemical lift-off, and the like. In this manner, a light emitting diode stack 101 for a display in which the n-type semiconductor layer of the third LED stack 43 is exposed as shown in FIG. 11 may be provided.

A display apparatus may be formed by patterning the light emitting diode stack 101 including the first to third LED stacks 23, 33 and 43 disposed on the support substrate 51 in pixel units, and connecting the first to third LED stacks 22, 33, and 43 by interconnection lines.

According to exemplary embodiments, the plurality of pixels may be formed at a wafer level by using the light emitting diode stack 100 or 101 for a display, which may obviate the process of individually mounting the light emitting diodes. Furthermore, since the first to third LED stacks 23, 33, and 43 have a vertically stacked structure, an area of the sub-pixel may be secured within a limited pixel area. In addition, since light generated in the first LED stack 23, the second LED stack 33, and the third LED stack 43 is transmitted through the second and third LED stacks 33 and 43, and emitted to the outside, it is possible to reduce light loss.

Figure 13:
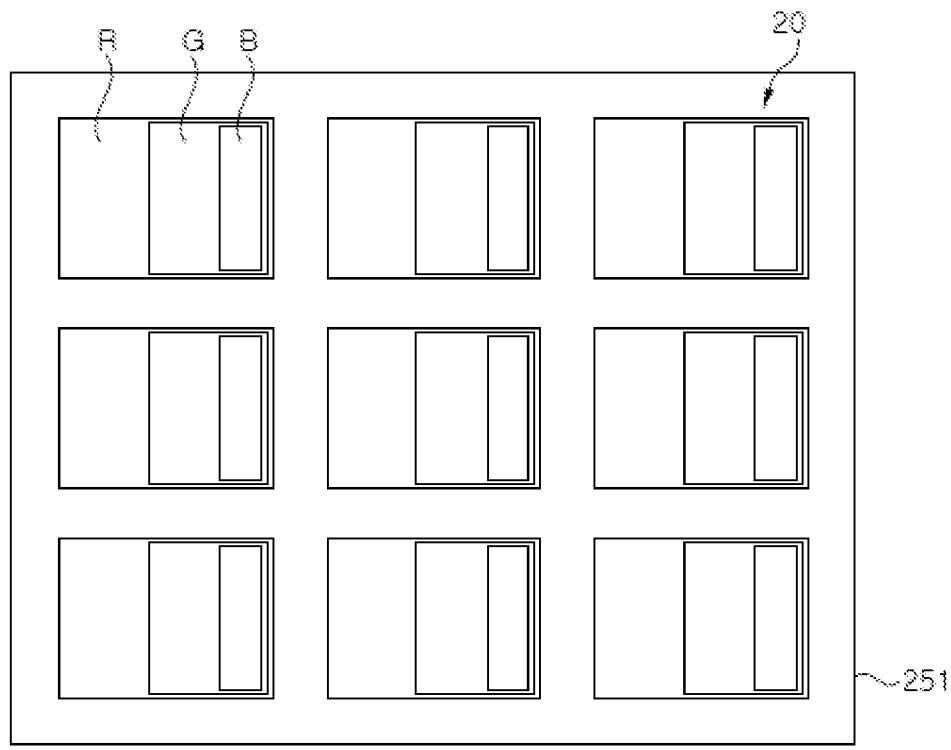
FIG. 13 is a schematic plan view of a display apparatus according to an exemplary embodiment.
Figure 14:
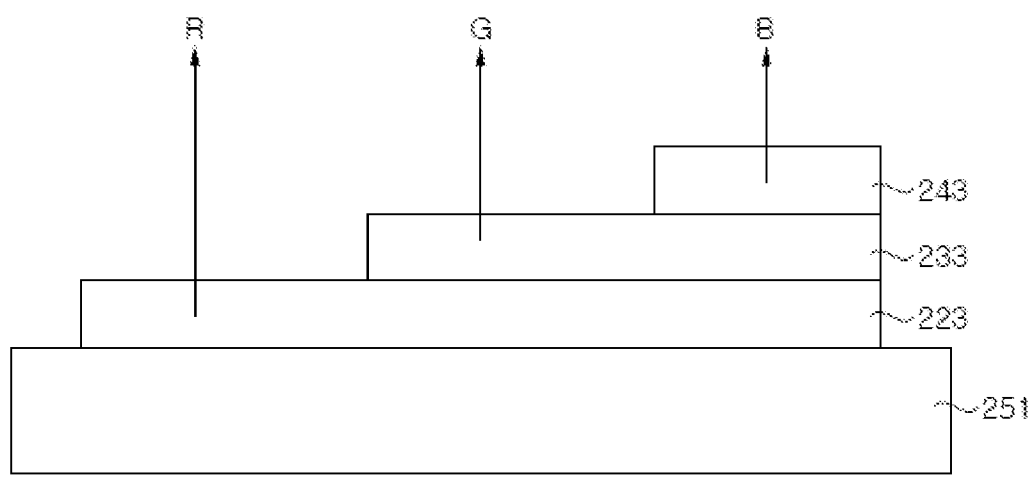
FIG. 14 is a schematic cross-sectional view of a light emitting diode pixel for a display according to an exemplary embodiment.

FIG. 13 is a schematic plan view of a display apparatus according to an exemplary embodiment, and FIG. 14 is a schematic cross-sectional view of a light emitting diode pixel for a display according to an exemplary embodiment.

Referring to FIG. 13, the display apparatus 200 includes a support substrate 251 and a plurality of pixels 20 arranged on the support substrate 251. Each pixel 20 includes first to third sub-pixels R, G, and B.

Referring to FIG. 14, the support substrate 251 supports the LED stacks 223, 233, and 243. The support substrate 251 may have a circuit on a surface or an inner part, but the inventive concepts are not limited thereto. The support substrate 251 may include, for example, a glass substrate, a sapphire substrate, a Si substrate, or a Ge substrate.

The first sub-pixel R includes the first LED stack 223, the second sub-pixel G includes the second LED stack 233, and the third sub-pixel B includes the third LED stack 243. The first sub-pixel R is configured to emit light in the first LED stack 223, the second sub-pixel G is configured to emit light in the second LED stack 233, and the third sub-pixel B is configured to emit light in the third LED stack 243. The first to third LED stacks 223, 233, and 243 may be driven independently of each other.

The first LED stack 223, the second LED stack 233, and the third LED stack 243 are stacked in a vertical direction and overlap with each other. In particular, the second LED stack 233 is disposed on a partial region of the first LED stack 223. The second LED stack 233 may be formed toward one side on the first LED stack 223. Further, the third LED stack 243 is disposed on a partial region of the second LED stack 233, and may be formed toward one side on the second LED stack 233. FIG. 14 shows that the third LED stack 243 is disposed adjacent to the right side of the second LED stack 233, but the inventive concepts are not limited thereto, and may be disposed adjacent toward the left side of the second LED stack 233.

A portion of light R generated in the first LED stack 223 may be emitted in a region not covered with the second LED stack 233, another portion of light R may be emitted through the second LED stack 233, and the other portion may be emitted through each of the second LED stack 233 and the third LED stack 243. A portion of light G generated in the second LED stack 233 may be emitted in a region not covered with the third LED stack 243, and the other portion may be emitted through the third LED stack 243. Light B generated in the third LED stack 243 may be emitted through a top surface thereof.

In general, in the first LED stack 223, a region covered with the second LED stack 233 may have light loss, and therefore, light with higher intensity per unit area may be emitted in a region not covered with the second LED stack 233. As such, an area of the region covered with the second LED stack 233 and an area of the region not covered with the second LED stack 233 in the first LED stack 223 may be adjusted to control the intensity of light emitted from the first LED stack 223. Likewise, an area of the region covered with the third LED stack 243 and an area of the region not covered with the third LED stack 243 in the second LED stack 233 may be adjusted to control the intensity of light emitted from the second LED stack 233.

For example, when the first LED stack 223 emits red light, the second LED stack 233 emits green light, and the third LED stack 243 emits blue light, since the green light has a high visibility, it may be necessary to decrease the intensity of green light. As such, the area of the region of the second LED stack 233 that is not covered with the third LED stack 243 may be smaller than the area of the third LED stack 243. In addition, since red light has a low visibility, it may be necessary to increase the intensity of red light. As such, the area of the region of the first LED stack 223 that is not covered with the second LED stack 233 may be larger than the area of the third LED stack 243.

The first LED stack 223, the second LED stack 233, and the third LED stack 243 each includes an n-type semiconductor layer, a p-type semiconductor layer, and an active layer interposed therebetween. The active layer may have a multiple quantum well structure. The first to third LED stacks 223, 233, and 243 may include different active layers, and thus may emit light at different wavelengths. For example, the first LED stack 223 may be an inorganic light emitting diode that emits red light, the second LED stack 233 may be an inorganic light emitting diode that emits green light, and the third LED stack 243 may be an inorganic light emitting diode that emits blue light. To this end, the first LED stack 223 may include a GaInP-based well layer, and the second LED stack 233 and the third LED stack 243 may include a GaInN-based well layer.

Figure 15:
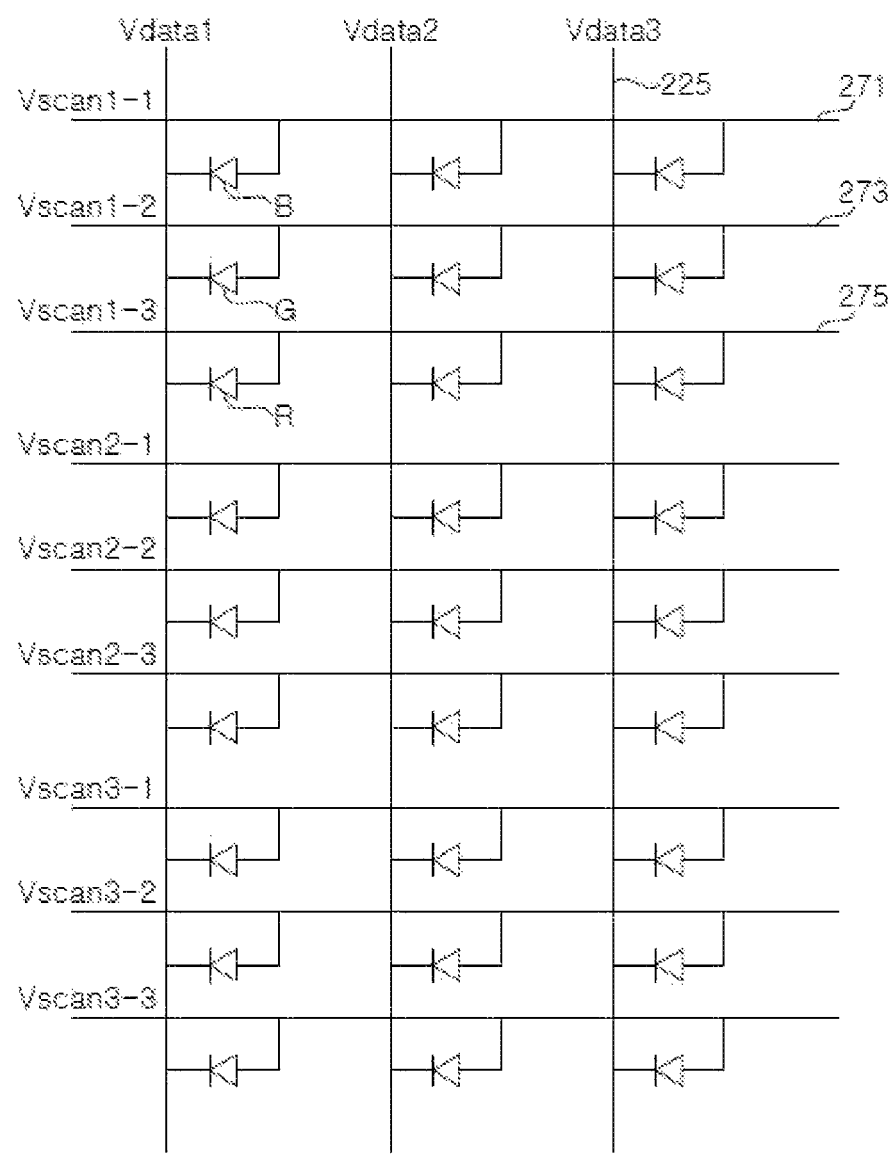
FIG. 15 is a schematic circuit diagram a display apparatus according to an exemplary embodiment.

FIG. 15 is a schematic circuit diagram of a display apparatus according to an exemplary embodiment.

Referring to FIG. 15, a display apparatus according to an exemplary embodiment may be implemented to be driven in a passive matrix manner. As described with reference to FIGS. 13 and 14, one pixel includes first to third sub-pixels R, G, and B. The first LED stack 223 of the first sub-pixel R emits light at a first wavelength, the second LED stack 233 of the second sub-pixel G emits light at a second wavelength, and the third LED stack 243 of the third sub-pixel B emits light at a third wavelength. Cathodes of the first to third sub-pixels R, G, and B may be connected to a common line, for example a data line Vdata 225, and the anodes thereof may be connected to different lines, for example scan lines Vscan 271, 273, and 275.

More particularly, the cathodes of the first to third sub-pixels R, G, and B of a first pixel are connected in common to the data line Vdata1, and the anodes thereof are connected to the scan lines Vscan1-1, Vscan1-2, and Vscan1-3. Thus, the sub-pixels R, G, and B in the same pixel may be driven individually.

Further, each of the LED stacks 223, 233, and 243 may be driven in a pulse width modulation scheme or by changing the intensity of the current, thereby adjusting luminance of each sub-pixel. Further, it is possible to adjust the luminance by adjusting an area of the first to third LED stacks 223, 233, and 243 and an area of a region where the LED stacks 223, 233, and 243 do not overlap as shown in FIG. 14.

Figure 16:
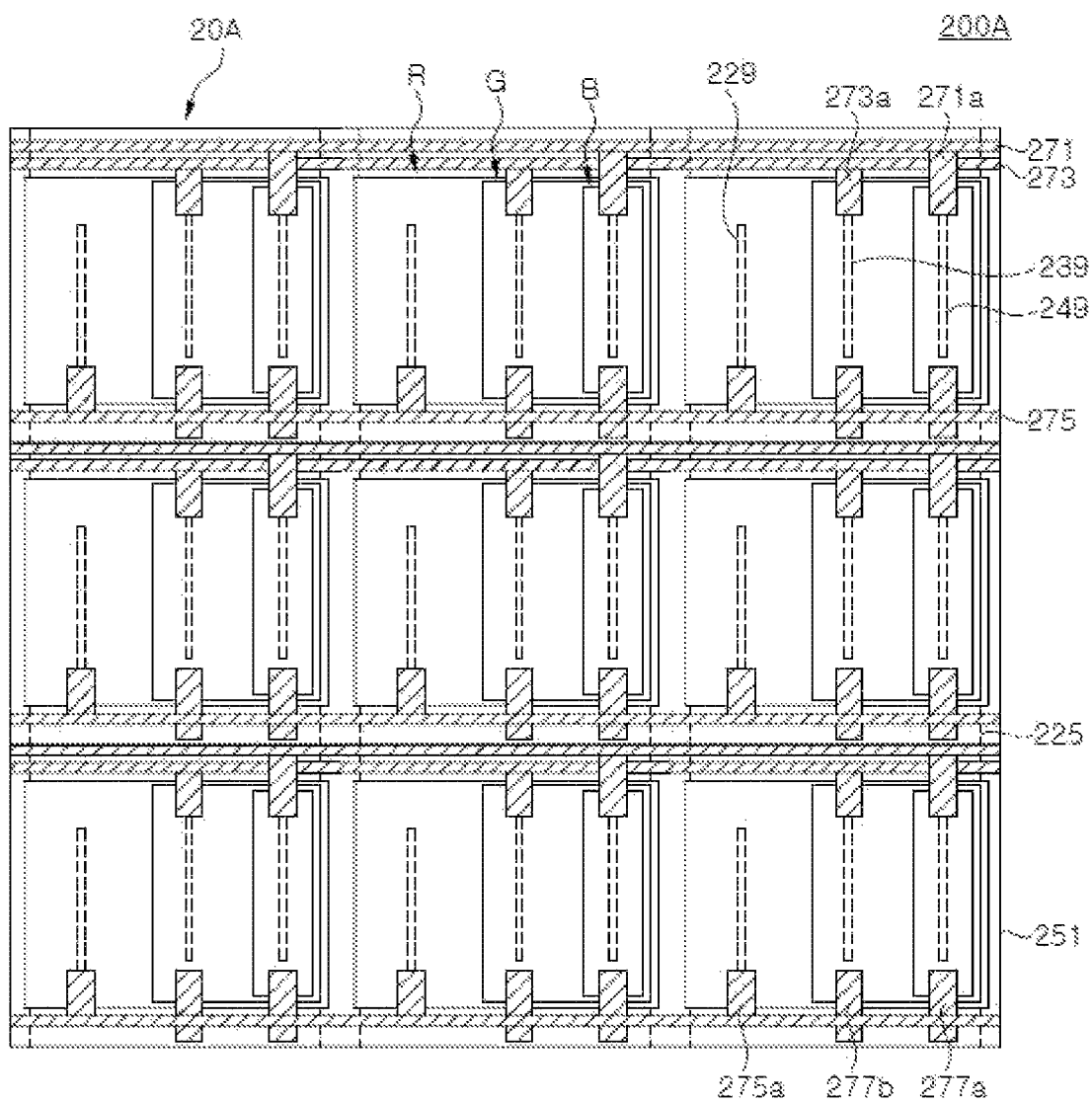
FIG. 16 is a schematic plan view of a display apparatus according to an exemplary embodiment.
Figure 17:
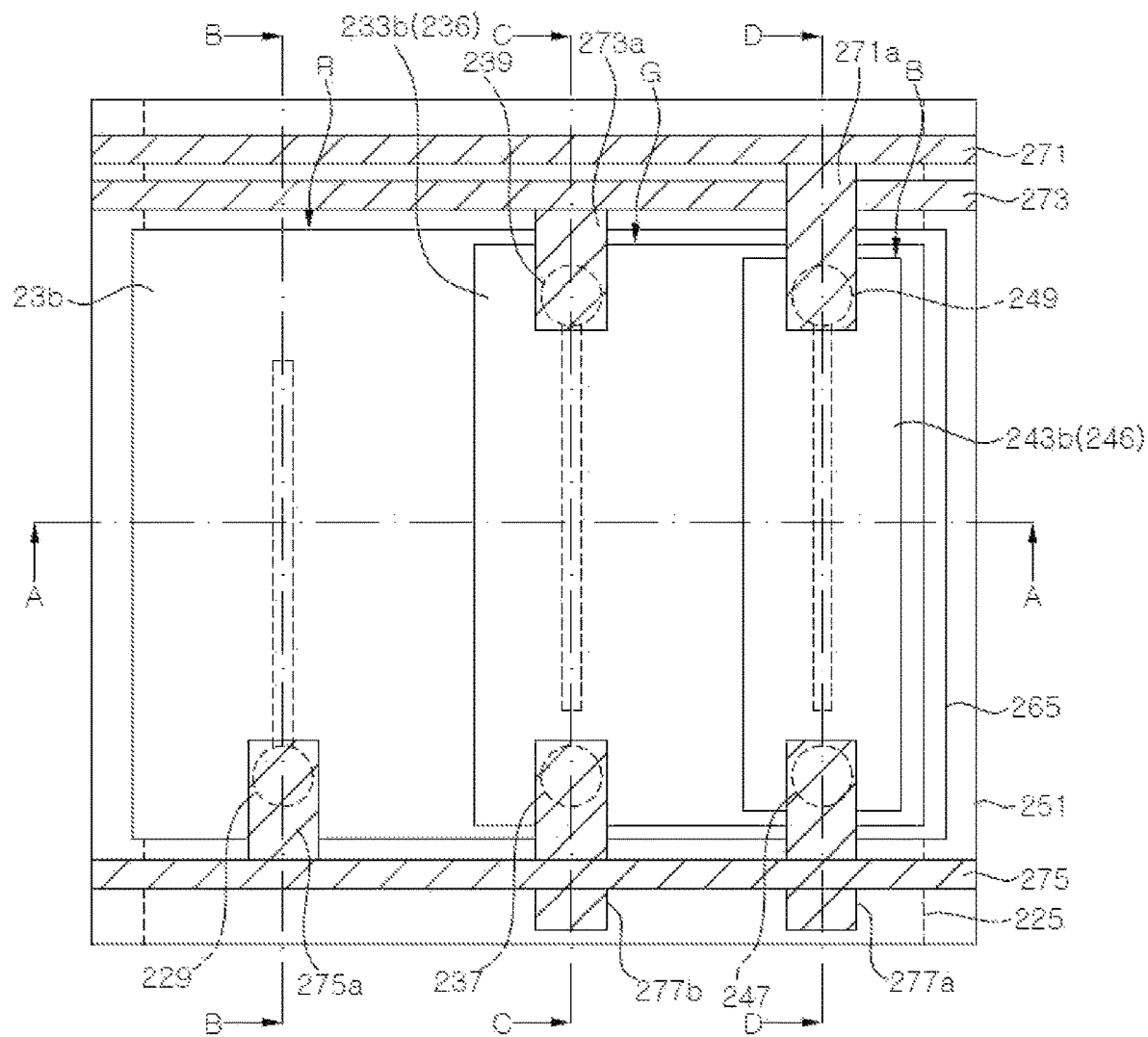
FIG. 17 is an enlarged plan view of one pixel of the display apparatus of FIG. 16 according to an exemplary embodiment.

FIG. 16 is a schematic plan view of a display apparatus according to an exemplary embodiment. The display apparatus 200A includes a plurality of pixels 20A aligned on a support substrate 251 in accordance to a circuit diagram of FIG. 15. FIG. 17 is an enlarged plan view of one pixel 20A region of the display apparatus of FIG. 16. FIGS. 18A to 18D are schematic cross-sectional views taken along lines A-A, B-B, C-C, and D-D of FIG. 17, respectively.

Referring to FIGS. 16, 17, 18A, 18B, 18C and 18D, the display apparatus 200A may include the support substrate 251, and a plurality of pixels 20A disposed on the support substrate 251. Each pixel 20A includes first to third subpixels R, G, and B. More particularly, the pixel 20A includes the first LED stack 223, the second LED stack 233, the third LED stack 243, a reflective electrode 225, a first ohmic electrode 229, a second transparent electrode 236, a second ohmic electrode 237, a second current spreading layer 239, a third transparent electrode 246, a third ohmic electrode 247, a third current spreading layer 249, a first color filter 235, a second color filter 245, a first bonding layer 253, a second bonding layer 255, a third bonding layer 257, an insulating layer 227, a lower insulating layer 261, an upper insulating layer 263, interconnection lines 271, 273, and 275, and connectors 271a, 273a, 275a, 277a, and 277b.

Each sub-pixel R, G, and B is connected to the reflective electrodes 225 and the interconnection lines 271, 273, and 275. As shown in FIG. 15, the reflective electrode 225 may be used as the data line Vdata, and the interconnection lines 271, 273, and 275 may be used as the scan line Vscan.

As shown in FIG. 16, the pixels 20A may be arranged in a matrix form, the cathodes of the sub-pixels R, G, and B of each pixel 20A are connected in common to the reflective electrode 225, and the anodes thereof are connected to the interconnection lines 271, 273, and 275, respectively, which are spaced apart from each other. The connectors 271a, 273a, and 275a may connect the interconnection lines 271, 273, and 275 with the sub-pixels R, G, and B, respectively.

The support substrate 251 supports the LED stacks 223, 233, and 243. The support substrate 251 may have a circuit on the surface or in the inner part thereof, but the inventive concepts are not limited thereto. The support substrate 251 may include, for example, a glass substrate, a sapphire substrate, a Si substrate, or a Ge substrate.

The first LED stack 223 includes a first conductivity type semiconductor layer 223a and a second conductivity type semiconductor layer 223b, the second LED stack 233 includes a first conductivity type semiconductor layer 233a and a second conductivity type semiconductor layer 233b, and the third LED stack 243 includes a first conductivity type semiconductor layer 243a and a second conductivity type semiconductor layer 243b. In addition, although not shown, an active layer may be interposed between the first conductivity type semiconductor layers 223a, 233a, and 243a and the second conductivity type semiconductor layers 223b, 233b, and 243b, respectively.

According to an exemplary embodiment, the first conductivity type semiconductor layers 223a, 233a, and 243a are n-type semiconductor layers, and the second conductivity type semiconductor layers 223b, 233b, and 243b are p-type semiconductor layers, respectively. A roughened surface may be formed on at least one surface of the first conductivity type semiconductor layers 223a, 233a, and 243a by surface texturing.

The first LED stack 223 is disposed closer to the support substrate 251, the second LED stack 233 is disposed on the first LED stack 223, and the third LED stack 243 is disposed on the second LED stack 233. Further, the second LED stack 233 is disposed on a partial region of the first LED stack 223, and thus, the first LED stack 223 partially overlaps the second LED stack 233. In addition, the third LED stack 243 is disposed on a partial region of the second LED stack 233, and thus, the first and second LED stacks 223 and 233 partially overlap the third LED stack 243. As such, at least a portion of light generated in the first LED stack 223 may be emitted to the outside without passing through the second and third LED stacks 233 and 243. In addition, at least a portion of light generated in the second LED stack 233 may be emitted to the outside without passing through the third LED stack 243.

The first LED stack 223, the second LED stack 233, and the third LED stack 243 may include substantially the same material as those of the LED stacks 223, 233, and 243 of FIG. 14, and thus, detailed descriptions thereof will be omitted to avoid redundancy.

The reflective electrode 225 is in ohmic contact with a lower surface of the first LED stack 223, more particularly, the first conductivity type semiconductor layer 223a. The reflective electrode 225 includes a reflective layer to reflect light emitted from the first LED stack 223. The reflective electrode 225 may overlap substantially the entire lower surface of the first LED stack 223. Further, the reflective electrode 225 may be connected in common to the plurality of pixels 20A, and used as the data line Vdata.

The reflective electrode 225 may be formed of a material layer forms an ohmic contact with the first conductivity type semiconductor layer 223a of the first LED stack 223, and further may include a reflective layer that reflects light generated in the first LED stack 223, for example, red light.

The reflective electrode 225 may include an ohmic reflective layer, and may be formed of, for example, an Au—Te alloy, an Au—Ge alloy, or the like. These alloys have high reflectance with respect to light in a red region, and forms an ohmic contact with the first conductivity type semiconductor layer 223a.

Figure 18A:
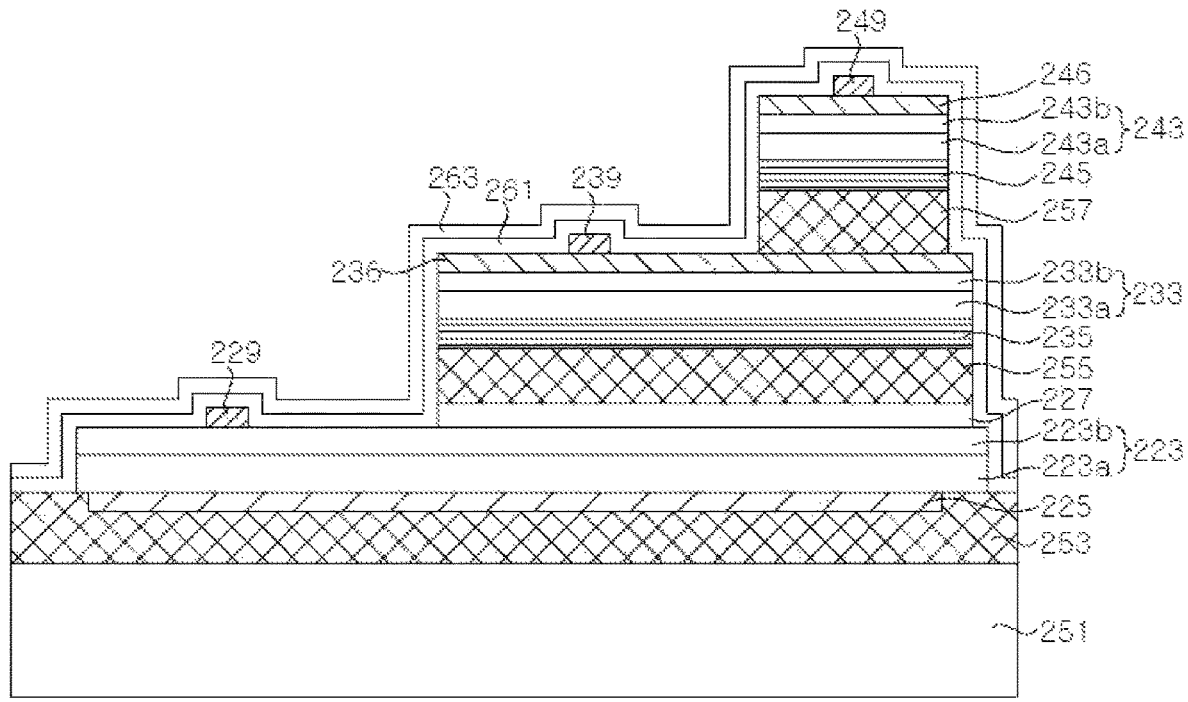
FIG. 18A is a schematic cross-sectional view taken along line A-A of FIG. 17 according to an exemplary embodiment.
Figure 18B:
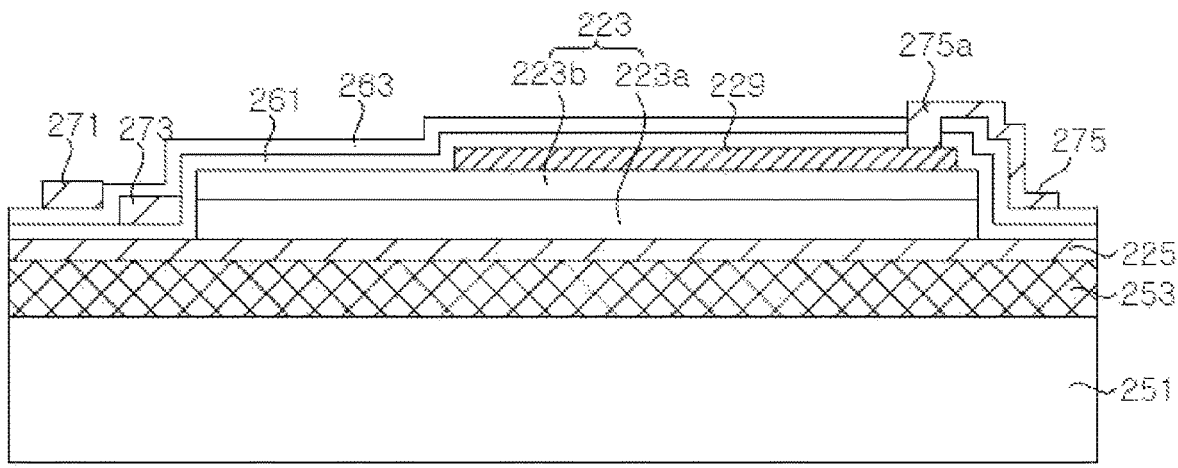
FIG. 18B is a schematic cross-sectional view taken along line B-B of FIG. 17 according to an exemplary embodiment.

The first ohmic electrode 229 is in ohmic contact with the second conductivity type semiconductor layer 223b of the first sub-pixel R. The first ohmic electrode 229 may be formed of, for example, an Au—Zn alloy, an Au—Be alloy, or the like. The first ohmic electrode 229 may include a pad region and an extension part. As shown in FIG. 18B, a connector 275a may be connected to the pad region of the first ohmic electrode 229. The first ohmic electrode 229 may be spaced apart from the second LED stack 233.

The second ohmic electrode 237 is in ohmic contact with the first conductivity type semiconductor layer 233a of the second LED stack 233. The second ohmic electrode 237 may be disposed on the first conductivity type semiconductor layer 233a. For example, the second conductivity type semiconductor layer 233b and the active layer disposed on the first conductivity type semiconductor layer 233a may be partially removed to expose the first conductivity type semiconductor layer 233a, and the second ohmic electrode 237 may be disposed on the exposed first conductivity type semiconductor layer 233a.

Figure 18C:
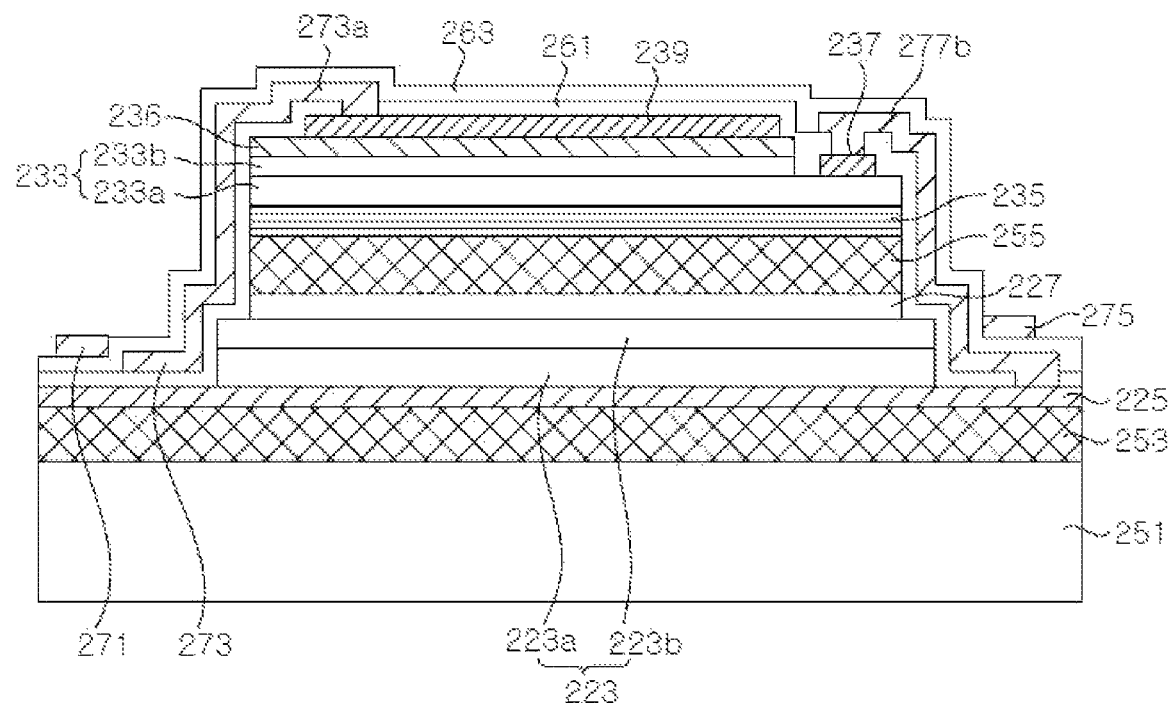
FIG. 18C is a schematic cross-sectional view taken along line C-C of FIG. 17 according to an exemplary embodiment.

As shown in FIG. 18C, the connector 277b may electrically connect the second ohmic electrode 237 to the reflective electrode 225. The second ohmic electrode 237 may be spaced apart from the third LED stack 243.

The second transparent electrode 236 is in ohmic contact with the second conductivity type semiconductor layer 233b on an upper surface of the second LED stack 233. The second transparent electrode 236 may cover substantially the entire regions of the second conductivity type semiconductor layer 233b. As such, the second transparent electrode 236 may surround the third LED stack 243 in a plan view, while being interposed between the second LED stack 233 and the third LED stack 243. The second transparent electrode 236 may be formed of a transparent oxide layer or a transparent metal layer.

The second transparent electrode 236 according to an exemplary embodiment is disposed on the upper surface side of the second LED stack 233, which is relatively spaced further away from the support substrate 251. In this manner, the second transparent electrode 236 may be formed on the second LED stack 233 after a growth substrate of the second LED stack 233 is removed. As such, the second transparent electrode 236 is prevented from being damaged during removal of the growth substrate.

The second current spreading layer 239 may be disposed on the second transparent electrode 236, and may be electrically connected to the second conductivity type semiconductor layer 233b through the second transparent electrode 236. The second current spreading layer 239 may be spaced apart from the third LED stack 243. The second current spreading layer 239 may include a pad region and an extension part as shown in FIG. 17, and a connector 273a may be connected to the pad region of the second current spreading layer 239.

The second ohmic electrode 237 and the second current spreading layer 239 may be formed together with the same material layer during the same process. Accordingly, the second ohmic electrode 237 and the second current spreading layer 239 may have substantially the same layer structure.

Figure 18D:
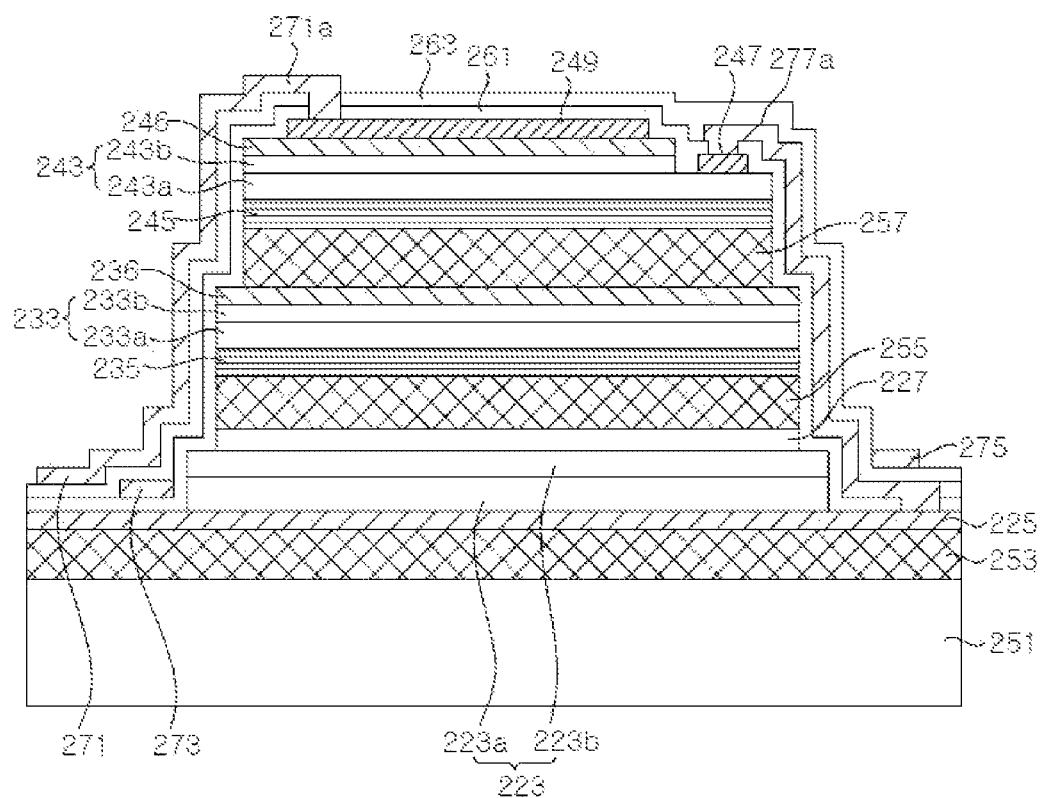
FIG. 18D is a schematic cross-sectional view taken along line D-D of FIG. 17 according to an exemplary embodiment.

The third ohmic electrode 247 is in ohmic contact with the first conductivity type semiconductor layer 243a of the third LED stack 243. The third ohmic electrode 247 may be disposed on the first conductivity type semiconductor layer 243a. For example, the second conductivity type semiconductor layer 243b and the active layer disposed on the first conductivity type semiconductor layer 243a may be partially removed to expose the first conductivity type semiconductor layer 243a, and the third ohmic electrode 247 may be disposed on the exposed first conductivity type semiconductor layer 243a. As shown in FIG. 18D, the connector 277a may electrically connect the third ohmic electrode 247 to the reflective electrode 225.

The third transparent electrode 246 may be in ohmic contact with the second conductivity type semiconductor layer 243b of the third LED stack 243. The third transparent electrode 246 may cover substantially the entire regions of the second conductivity type semiconductor layer 243b. The third transparent electrode 246 may be formed of a transparent oxide layer or a transparent metal layer.

The third transparent electrode 246 according to an exemplary embodiment is disposed on an upper surface side of the third LED stack 243, which is relatively spaced further away from the support substrate 251. In this manner, the third transparent electrode 246 may be formed on the third LED stack 243 after a growth substrate of the third LED stack 243 is removed. Therefore, the third transparent electrode 246 is prevented from being damaged during removal of the growth substrate.

The third current spreading layer 249 may be disposed on the third transparent electrode 246, and may be electrically connected to the second conductivity type semiconductor layer 243b through the third transparent electrode 246. The third current spreading layer 249 may include a pad region and an extension part, and as shown in FIG. 18D, the connector 271a may be connected to the pad region of the third current spreading layer 249.

Each of the first ohmic electrode 229, the second current spreading layer 239, and the third current spreading layer 249 may include an extension part to assist in current dispersion within each LED stack.

The third ohmic electrode 247 and the third current spreading layer 249 may be formed together with the same material layer during the same process. Accordingly, the third ohmic electrode 247 and the third current spreading layer 249 may have substantially the same layer structure. Further, all of the second ohmic electrode 237, the second current spreading layer 239, the third ohmic electrode 247, and the third current spreading layer 249 may be formed in the same process and have substantially the same layer structure.

The first color filter 235 may be disposed between the first LED stack 223 and the second LED stack 233. In addition, the second color filter 245 may be disposed between the second LED stack 233 and the third LED stack 243. The first color filter 235 transmits light generated in the first LED stack 223 and reflects light generated in the second LED stack 233. Meanwhile, the second color filter 245 transmits light generated in the first and second LED stacks 223 and 233 and reflects light generated in the third LED stack 243. Thus, light generated in the first LED stack 223 may be emitted to the outside through the second LED stack 233 and the third LED stack 243, and light generated in the second LED stack 233 may be emitted to the outside through the third LED stack 243. Further, it is possible to prevent light generated in the second LED stack 233 from being incident on the first LED stack 223 to be lost, or light generated in the third LED stack 243 from being incident on the second LED stack 233 to be lost.

According to some exemplary embodiments, the first color filter 235 may reflect light generated in the third LED stack 243.

Each of the first and second color filters 235 and 245 may be, for example, a low pass filter that passes through only a low frequency region, that is, a long wavelength region, a band pass filter that passes through only a predetermined wavelength band, or a band stop filter that blocks only the predetermined wavelength band. In particular, the first and second color filters 235 and 245 may be formed by alternately stacking the insulating layers having different refractive indices. For example, the first and second color filters 235 and 245 may be formed by alternately stacking $TiO_2$ and $SiO_2$. In particular, the first and second color filters 235 and 245 may include a distributed Bragg reflector (DBR). The stop band of the distributed Bragg reflector may be controlled by adjusting the thicknesses of $TiO_2$ and $SiO_2$. The low pass filter and the band pass filter may also be formed by alternately stacking the insulating layers having different refractive indices.

The first bonding layer 253 couples the first LED stack 223 to the support substrate 251. The reflective electrode 225 may be in contact with the first bonding layer 253. The first bonding layer 253 may be light transmissive or non-transmissive. The first bonding layer 253 may be formed of an organic material layer or an inorganic material layer. Examples of the organic material layer may include SUB, poly(methylmethacrylate) (PMMA), polyimide, parylene, benzocyclobutene (BCB), or the like. Examples of the inorganic material layer may include $Al_2O_3$, $SiO_2$, $SiN_x$, or the like. The organic material layer may be bonded at a high vacuum and high pressure. The inorganic material layers may be surface-planarized by, for example, a chemical mechanical polishing process, then surface energy may be controlled by using plasma, or the like, and may be bonded at high vacuum using the surface energy. In particular, by using an adhesive layer that absorbs light, such as black epoxy, as in the first bonding layer 253, a contrast ratio of the display apparatus may be improved. The first bonding layer 253 may also be formed of spin-on-glass.

The second bonding layer 255 couples the first LED stack 223 to the second LED stack 233. The second bonding layer 255 may be disposed between the first LED stack 223 and the first color filter 235. The second bonding layer 255 may transmit light generated in the first LED stack 223 and may be formed of the light transmissive bonding material described above with reference to the first bonding layer 253.

The insulating layer 227 may be interposed between the second bonding layer 255 and the first LED stack 223. The insulating layer 227 may be in contact with the second conductivity type semiconductor layer 223b. The insulating layer 227 may be formed of, for example, SiO$_2$, thereby improving bonding strength of the second bonding layer 255.

The third bonding layer 257 couples the second LED stack 233 and the third LED stack 243. The third bonding layer 257 may be disposed between the second LED stack 233 and the second color filter 245 to bond the second LED stack 233 and the second color filter 245. The third bonding layer 257 may transmit light generated in the first and second LED stacks 223 and 233, and may be formed of the light transmissive bonding material described above with reference to the first bonding layer 253.

The lower insulating layer 261 may cover the first to third LED stacks 223, 233, and 243. In particular, the lower insulating layer 261 covers the reflective electrode 225 exposed around the first LED stack 223. Meanwhile, the lower insulating layer 261 may have openings for providing an electrical connection path.

The upper insulating layer 263 covers the lower insulating layer 261. The upper insulating layer 263 may also have openings for providing an electrical connection path.

The lower insulating layer 261 and the upper insulating layer 263 are not particularly limited as long as they have insulating properties, and may be formed of, for example, silicon oxide or silicon nitride.

As shown in FIGS. 16 and 17, the interconnection lines 271, 273, and 275 may be arranged to be orthogonal to the exposed reflective electrode 225 in plan view. The interconnection line 271 and the interconnection line 275 may be disposed on the upper insulating layer 263 and may be connected to the third current spreading layer 249 and the first ohmic electrode 229 through the connectors 271a and 275a, respectively. To this end, the upper insulating layer 263 and the lower insulating layer 261 may have openings exposing the third ohmic electrode 247 and the first ohmic electrode 229.

The interconnection line 273 is disposed on the lower insulating layer 261 and is insulated from the reflective electrode 225. The interconnection line 273 may be disposed between the lower insulating layer 261 and the upper insulating layer 263, and may be connected to the second current spreading layer 239 through the connector 273a. To this end, the lower insulating layer 261 has an opening exposing the second current spreading layer 239.

The connectors 277a and 277b are disposed between the lower insulating layer 261 and the upper insulating layer 263, respectively. As such, the third ohmic electrode 247 and the second ohmic electrode 237 are electrically connected to the reflective electrode 225. To this end, the lower insulating layer 261 may have openings exposing the third ohmic electrode 247 and the second ohmic electrode 237.

The interconnection line 271 and the interconnection line 273 may be insulated from each other by the upper insulating layer 263, and thus the interconnection lines 271 and 273 may be arranged to overlap each other in the vertical direction.

The display apparatus 200A of FIGS. 16 to 18D has a structure in which the electrodes of each pixel are connected to the data lines and the scan lines. In particular, the interconnection lines 271 and 275 of FIG. 16 are disposed on the upper insulating layer 263, and the interconnection line 273 is disposed between the lower insulating layer 261 and the upper insulating layer 263. However, the inventive concepts are not limited thereto. For example, the interconnection lines 271 and 275 may be formed on the lower insulating layer 261 together with the interconnection line 273 and may be covered with the upper insulating layer 263, and the connectors 271a and 275a may be formed on the upper insulating layer 263.

Hereinafter, a manufacturing method of a display apparatus 200A according to the above-described exemplary embodiment will be described.

FIGS. 19A to 33 are schematic plan views and cross-sectional views illustrating a manufacturing method of a display apparatus according to exemplary embodiments. In FIGS. 19A to 33, various cross-sectional views are taken along line A-A of the corresponding plan view.

Figure 19A:
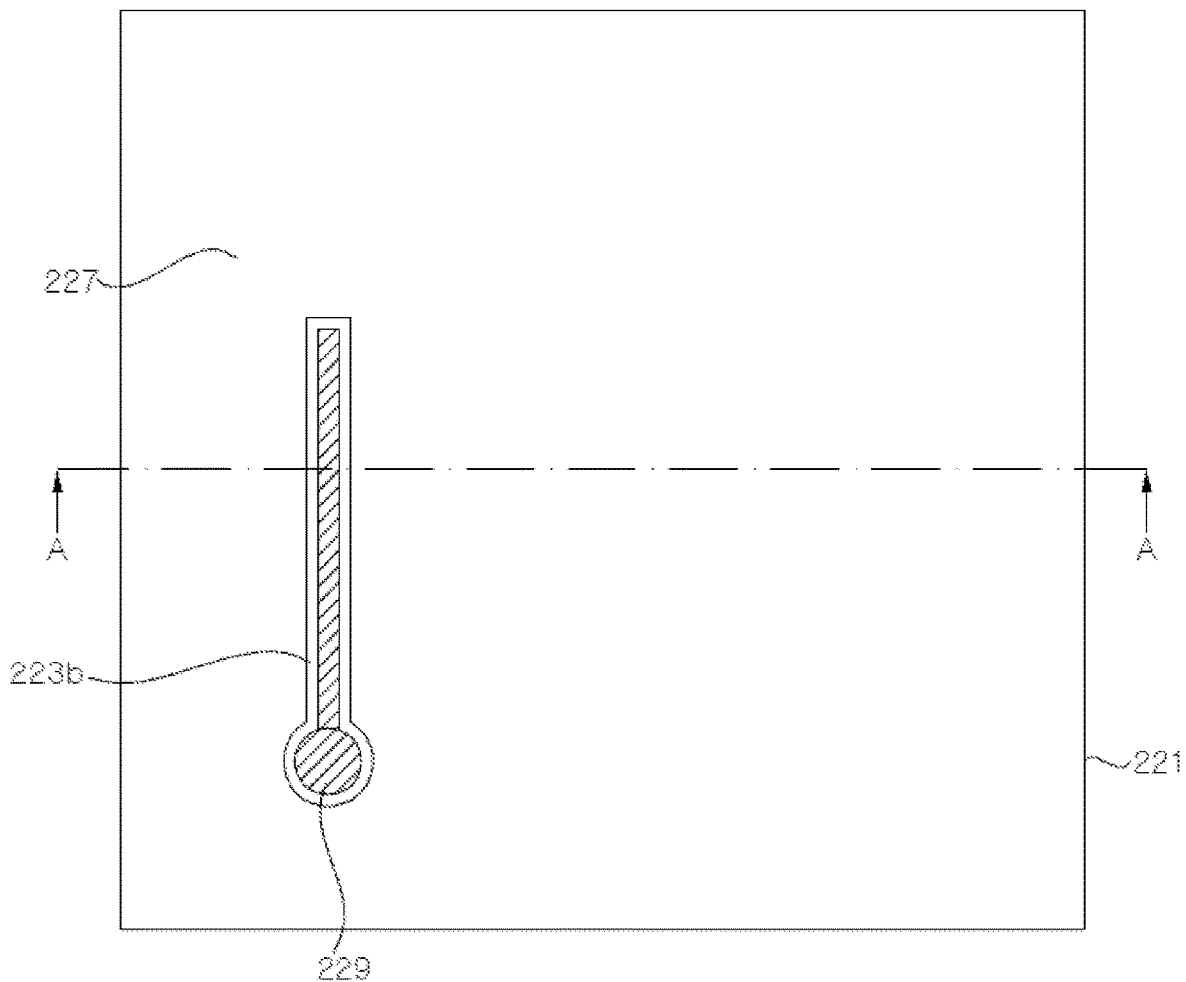
FIGS. 19A, 19B, 20A, 20B, 21A, 21B, 21C, 22A, 22B, 22C, 23A, 23B, 24A, 24B, 25A, 25B, 26A, 26B, 27A, 27B, 28A, 28B, 29A, 29B, 30A, 30B, 31, 32A, 32B, and 33 are schematic plan views and cross-sectional view illustrating a manufacturing method of a display apparatus according an exemplary embodiment.
Figure 19B:
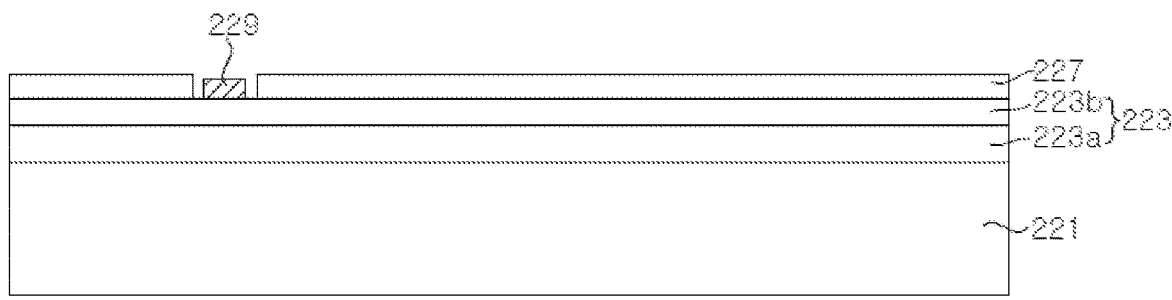

Referring to FIGS. 19A and 19B, the first LED stack 223 is grown on the first substrate 221. The first substrate 21 may be, for example, a GaAs substrate. The first LED stack 223 is formed with AlGaInP-based semiconductor layers and includes a first conductivity type semiconductor layer 223a, an active layer, and a second conductivity type semiconductor layer 223b.

The insulating layer 227 may be formed on the first LED stack 223. The insulating layer 227 may be patterned to have openings exposing the second conductivity type semiconductor layer 223b. The insulating layer 227 may be formed of a hydrophilic material layer, for example, SiO$_2$. According to an exemplary embodiment, the insulating layer 227 may be omitted.

The first ohmic electrode 229 may be formed in the opening of the insulating layer 227. The first ohmic electrode 229 may be formed of, for example, an Au—Zn alloy, an Au—Be alloy, or the like. The first ohmic electrode 229 may be formed to have a pad region and an extension part. The first ohmic electrode 229 may be formed by a lift-off technique, and be formed in each pixel region. The first ohmic electrode 229 may be disposed toward one side of a pixel region as shown in FIG. 19A.

Figure 20A:
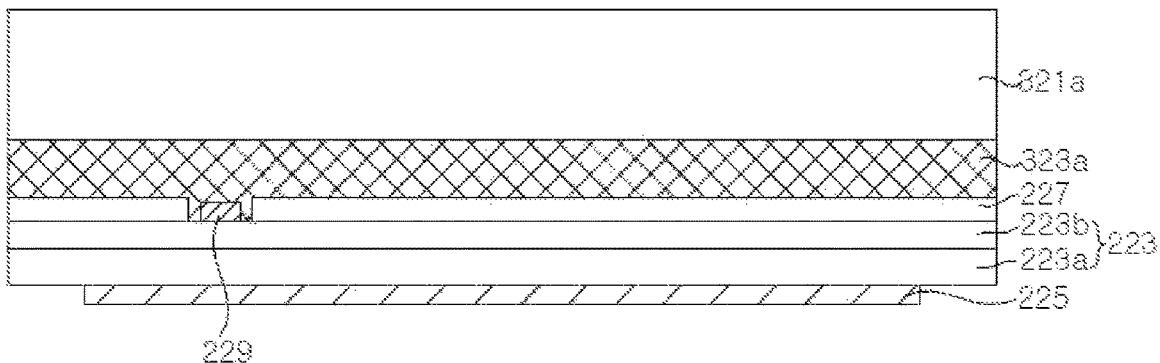

Next, referring to FIG. 20A, a preliminary substrate 321a may be attached to the first LED stack 223 through the bonding layer 323a. The preliminary substrate 321a is not particularly limited, and may be any substrate capable of supporting the first LED stack 223. Meanwhile, the first substrate 221 is removed from the first LED stack 223 using a chemical etching technique to expose the first conductivity type semiconductor layer 223a of the first LED stack 223. The exposed surface of the first conductivity type semiconductor layer 223a may be roughened by surface texturing.

The reflective electrode 225 is formed on the exposed first LED stack 223. The reflective electrode 225 may be formed of, for example, an Au—Te alloy, an Au—Ge alloy, or the like. The reflective electrode 225 may be formed by using a lift-off technique, and may be patterned to have a specific shape. For example, the reflective electrode 225 may be patterned to have a shape that longitudinally connects a plurality of pixels. However, the inventive concepts are not limited thereto, and the reflective electrode 225 may be formed on substantially the entire surface of the first LED stack 223 without patterning, and then patterned at later steps. The reflective electrode 225 may be in ohmic contact with the first conductivity type semiconductor layer 223a of the first LED stack 223, which may be the n-type semiconductor layer.

Figure 20B:
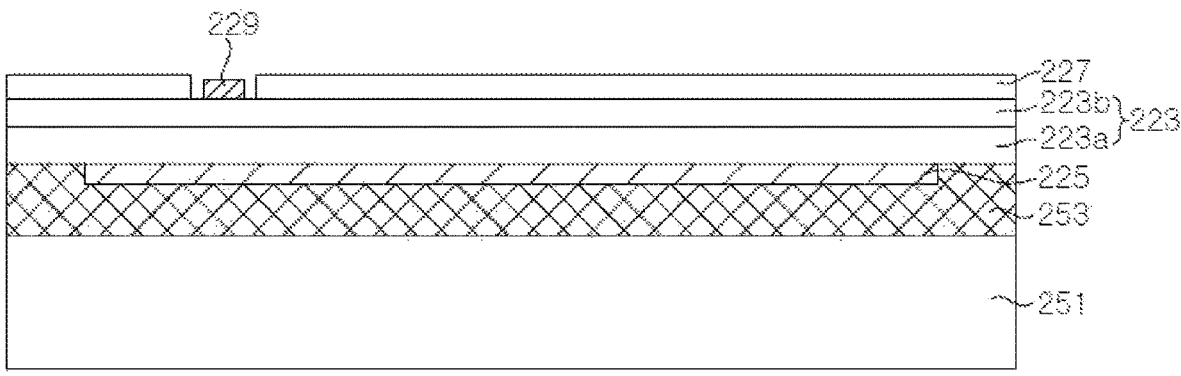

Referring to FIG. 20B, the support substrate 251 is bonded to the first LED stack 223 via the first bonding layer 253. The reflective electrode 225 on the first LED stack 223 may be disposed to face the support substrate 251 to be bonded to the support substrate 251. Thus, the first bonding layer 253 may be in contact with the reflective electrode 225 and the first conductivity type semiconductor layer 223a.

After the support substrate 251 is bonded, the preliminary substrate 321a and the bonding layer 323a may be removed. Thus, the insulating layer 227 and the first ohmic electrode 229 may be exposed.

Figure 21A:
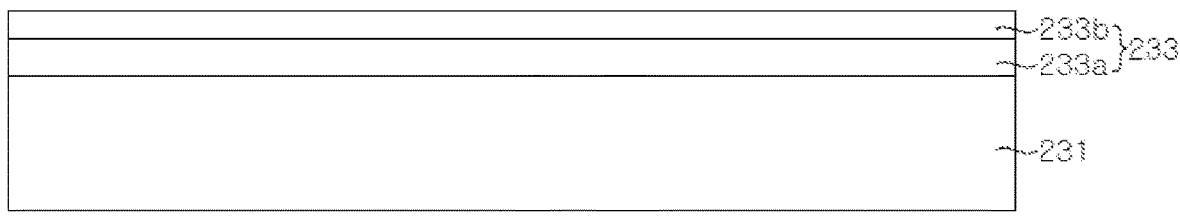

Referring to FIG. 21A, the second LED stack 233 is grown on the second substrate 231. The second LED stack 233 may be formed of gallium nitride-based semiconductor layers and may include a first conductivity type semiconductor layer 233a, a GaInN well layer, and a second conductivity type semiconductor layer 233b. The second substrate 231 is a substrate on which the gallium nitride-based semiconductor layer may be grown, and may be different from the first substrate 221. A composition ratio of GaInN may be determined so that the second LED stack 233 emits green light.

Figure 21B:
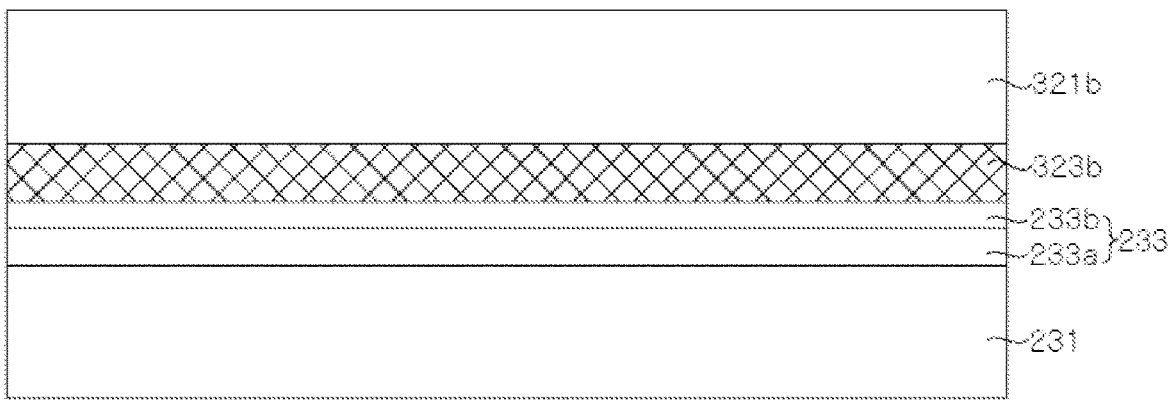

Referring to FIG. 21B, a preliminary substrate 321b is attached onto the second LED stack 233 via the bonding layer 323b. The preliminary substrate 321b is not particularly limited, and may be any substrate capable of supporting the second LED stack 233.

Figure 21C:
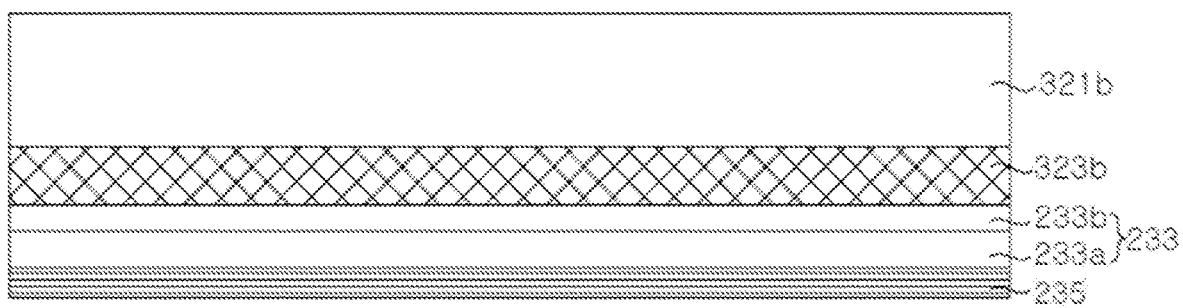

Referring to FIG. 21C, the second substrate 231 is then removed. The second substrate 231 may be separated from the second LED stack 233 by using techniques, such as laser lift-off, chemical lift-off, or the like, to expose the first conductivity type semiconductor layer 233a of the second LED stack 233. The exposed surface of the first conductivity type semiconductor layer 233a may be roughened by surface texturing.

The first color filter 235 may be formed on the exposed first conductivity type semiconductor layer 233a. The first color filter 235 may be in contact with the first conductivity type semiconductor layer 233a. The material of the first color filter 235 is substantially the same as that of FIG. 18A, detailed descriptions thereof will be omitted to avoid redundancy.

Figure 22A:
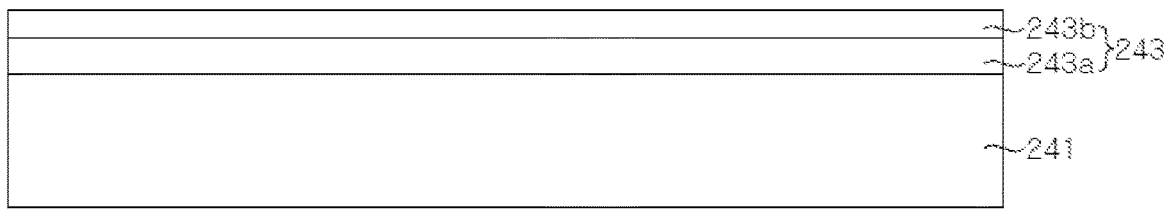

Referring to FIG. 22A, the third LED stack 243 is grown on the third substrate 241. The third LED stack 243 may be formed of gallium nitride-based semiconductor layers and may include a first conductivity type semiconductor layer 243a, a GaInN well layer, and a second conductivity type semiconductor layer 243b. The third substrate 241 is a substrate on which the gallium nitride-based semiconductor layer may be grown, and may be different from the first substrate 221. A composition ratio of GaInN may be determined so that the third LED stack 243 emits blue light.

Figure 22B:
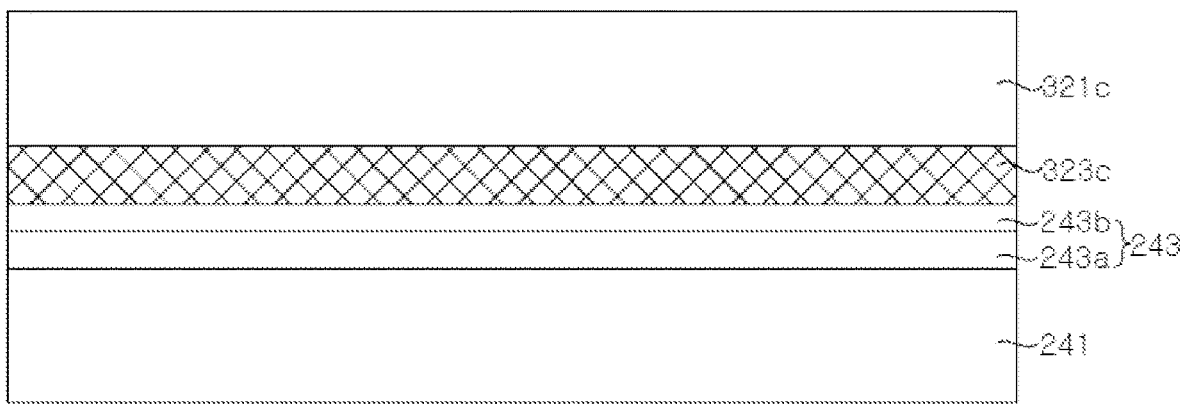

Referring to FIG. 22B, a preliminary substrate 321c is attached onto the third LED stack 243 via the bonding layer 323c. The preliminary substrate 321c is not particularly limited, and may be any substrate capable of supporting the third LED stack 243.

Figure 22C:
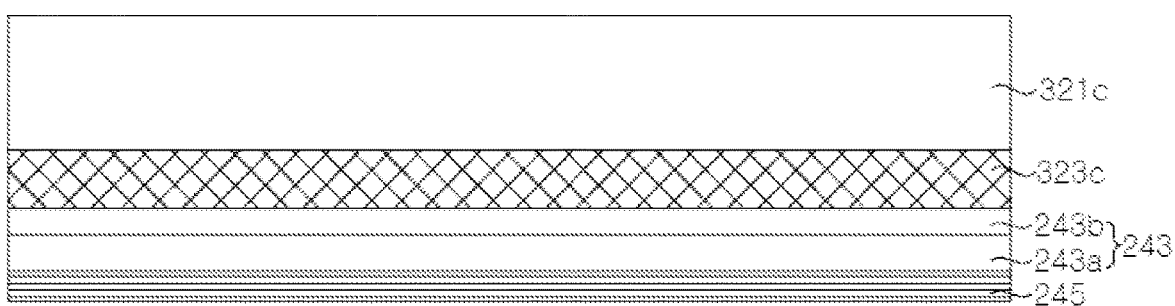

Referring to FIG. 22C, the third substrate 41 is then removed. The third substrate 241 may be separated from the third LED stack 243 by using techniques such as laser lift-off, chemical lift-off, or the like, to expose the first conductivity type semiconductor layer 243a of the third LED stack 243. The exposed surface of the first conductivity type semiconductor layer 243a may be roughened by surface texturing.

The second color filter 245 may be formed on the exposed first conductivity type semiconductor layer 243a. The second color filter 245 may be in contact with the first conductivity type semiconductor layer 243a. The material of the second color filter 245 is substantially the same as that of FIG. 18A, and thus, detailed descriptions thereof will be omitted to avoid redundancy.

Meanwhile, since the first LED stack 223, the second LED stack 233, and the third LED stack 243 are grown on different substrates, the order of formation of the LED stacks are not particularly limited.

Figure 23A:
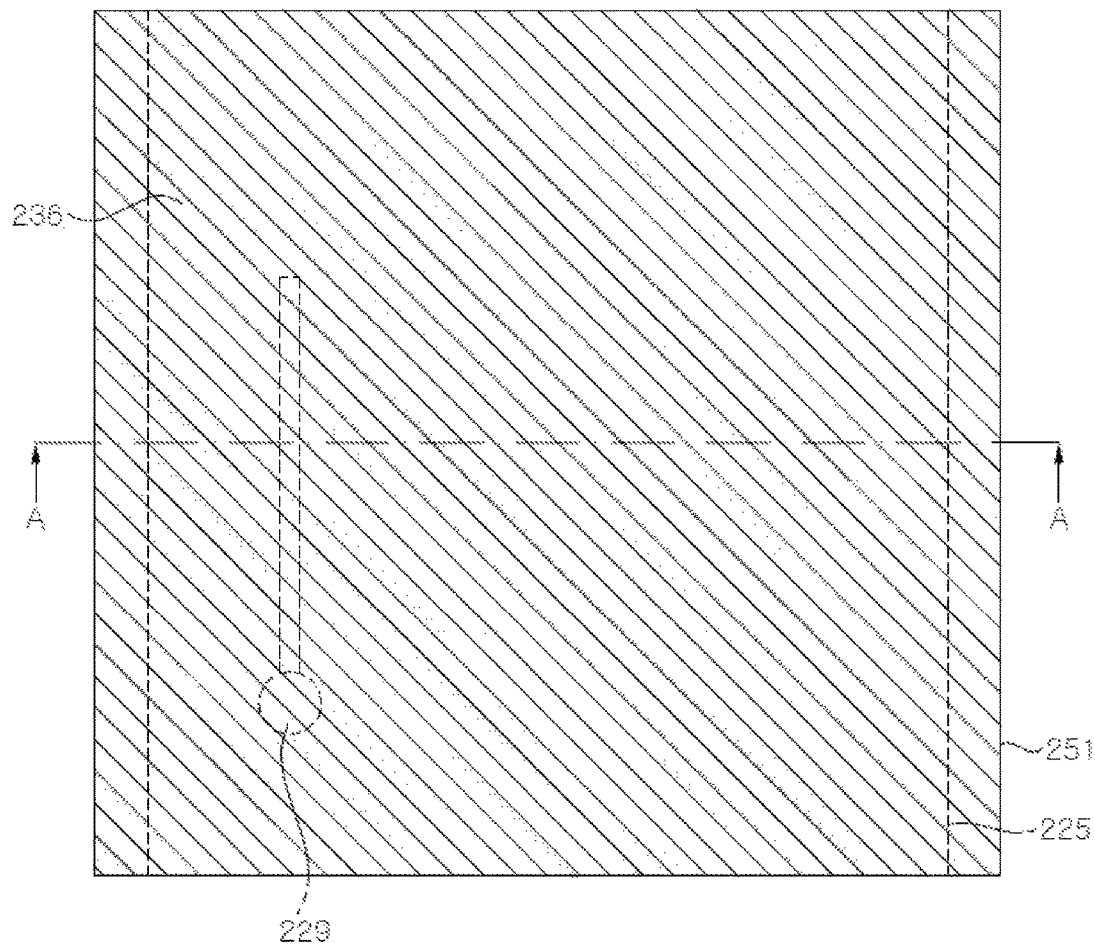
Figure 23B:
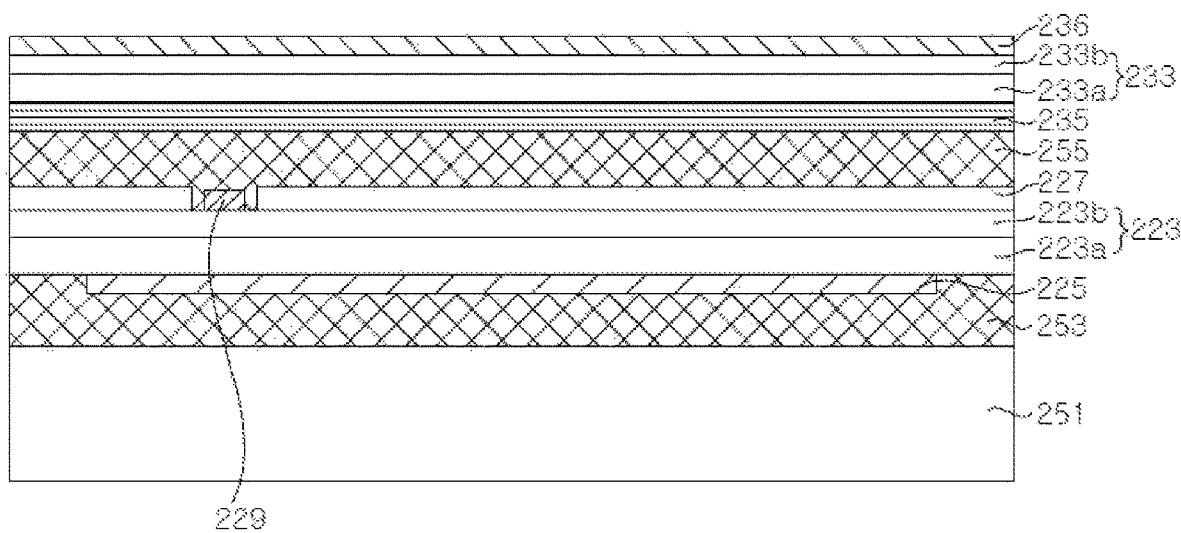

Referring to FIGS. 23A and 23B, first, the second LED stack 233 of FIG. 21C is bonded to the exposed insulating layer 227 and the first ohmic electrode 229 of FIG. 20B via the second bonding layer 255.

The first color filter 235 may be disposed to face the support substrate 251 and bonded to the insulating layer 227 through the second bonding layer 255. The second bonding layer 255 may be formed of a light transmissive material.

Subsequently, the preliminary substrate 321b and the bonding layer 323b are removed to expose the second conductivity type semiconductor layer 233b, and the second transparent electrode 236 is formed on the exposed second conductivity type semiconductor layer 233b. The second transparent electrode 236 is in ohmic contact with the second conductivity type semiconductor layer 233b. The second transparent electrode 236 may cover substantially the entire regions of the second conductivity type semiconductor layer 233b.

Since the second transparent electrode 236 is formed after the second substrate 31 is removed from the second LED stack 233, the second transparent electrode 236 may be prevented from being damaged during a removing process of the second substrate 231.

Figure 24A:
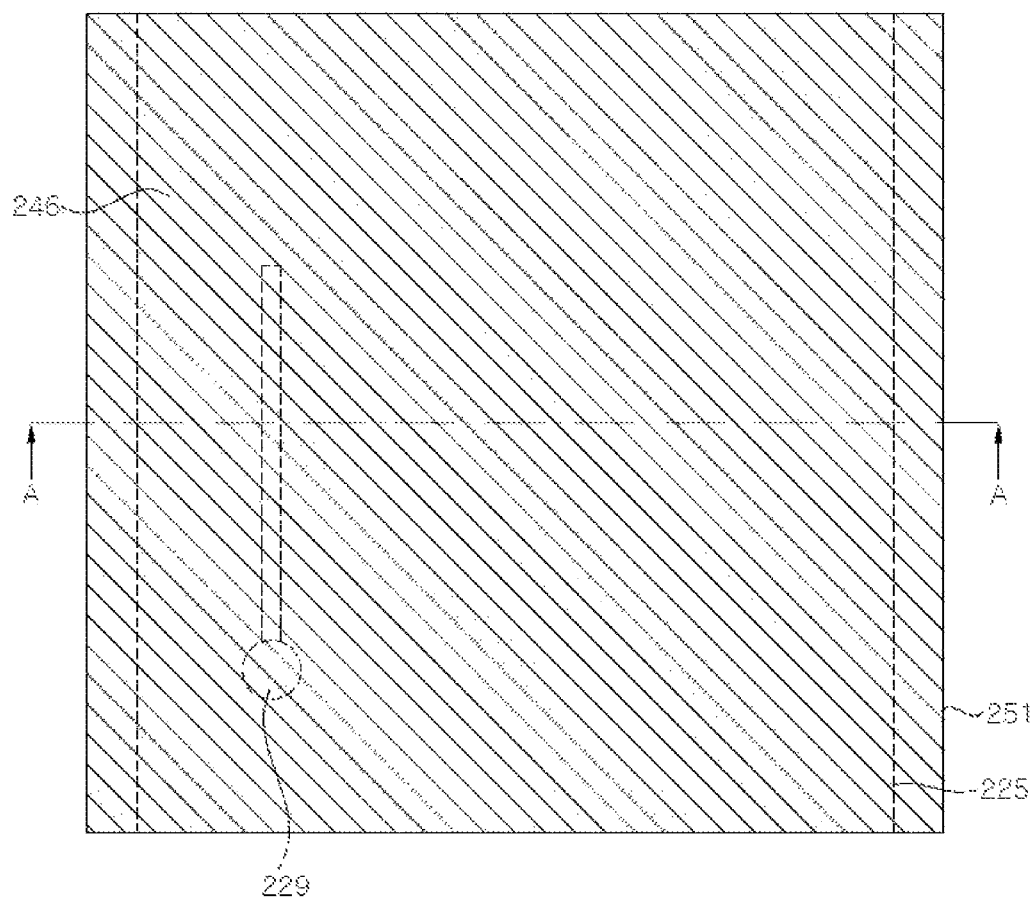
Figure 24B:
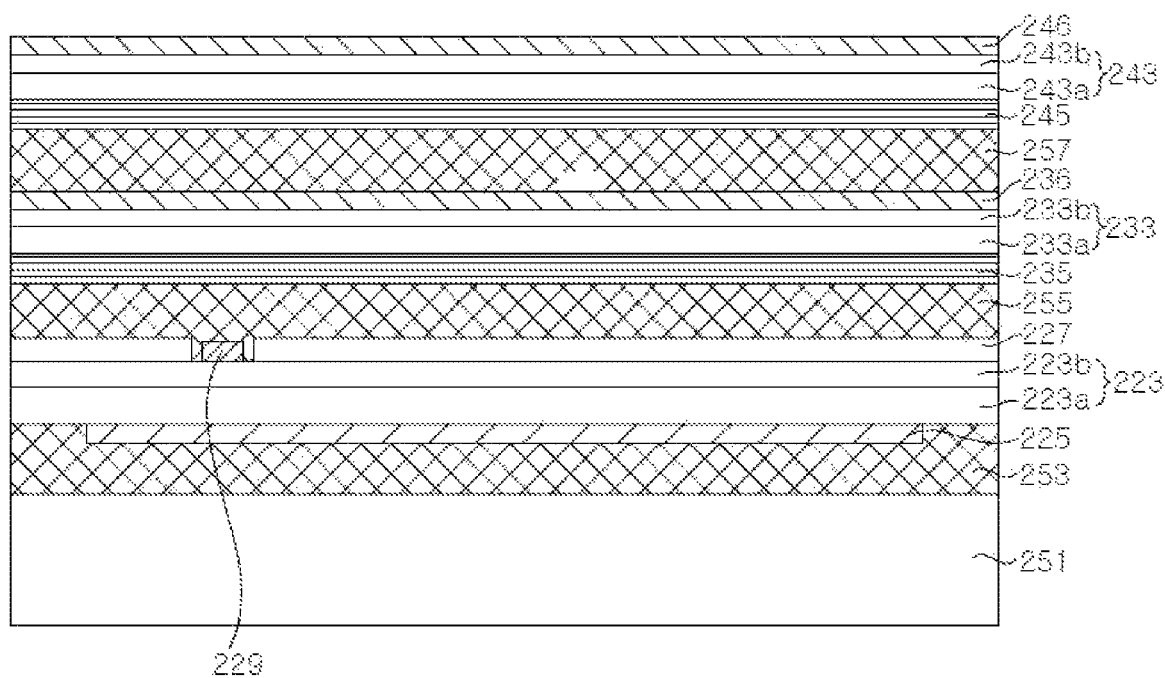

Referring to FIGS. 24A and 24B, the third LED stack 243 of FIG. 22C is bonded to the second LED stack 233, on which the second transparent electrode 236 is formed, via the third bonding layer 257.

The second color filter 245 may be disposed to face the second LED stack 233 and bonded to the second transparent electrode 236 through the third bonding layer 257. The third bonding layer 257 may be formed of a light transmissive material.

Subsequently, the preliminary substrate 321c and the bonding layer 323c are removed to expose the second conductivity type semiconductor layer 243b, and the third transparent electrode 246 is formed on the exposed second conductivity type semiconductor layer 243b. The third transparent electrode 246 is in ohmic contact with the second conductivity type semiconductor layer 243b. The third transparent electrode 246 may cover substantially the entire regions of the second conductivity type semiconductor layer 243b.

Figure 25A:
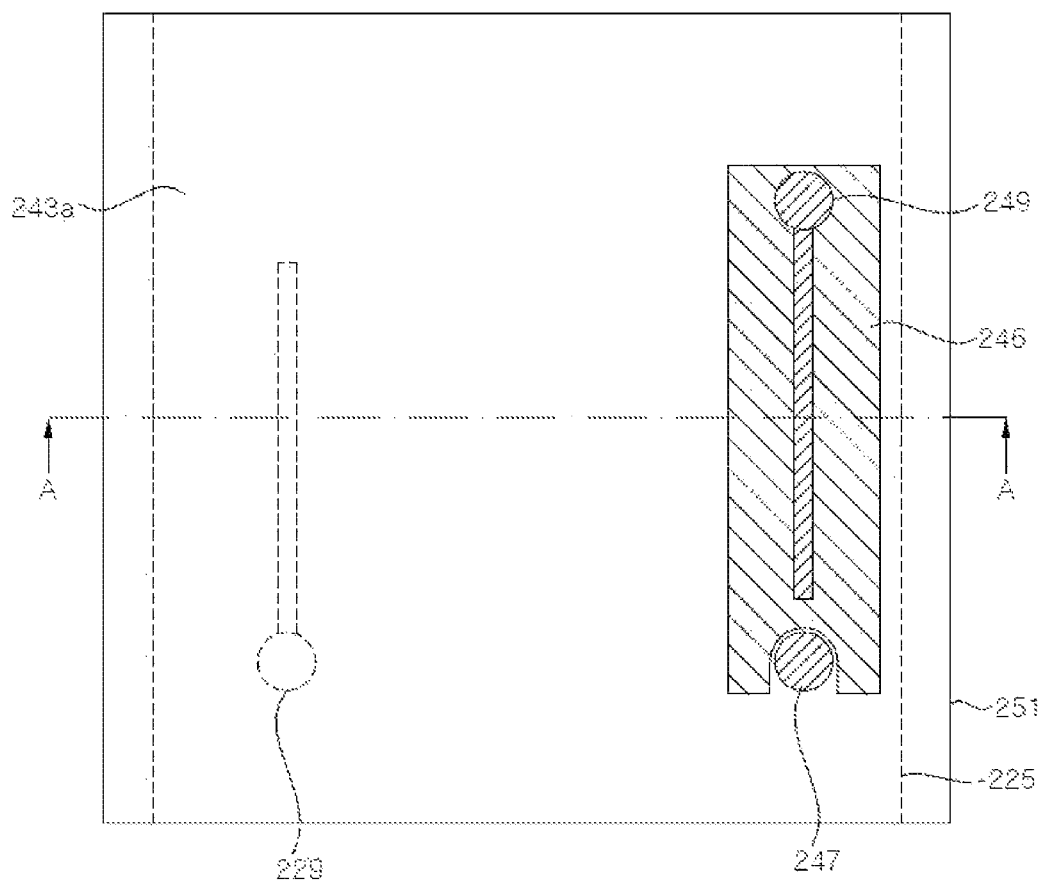
Figure 25B:
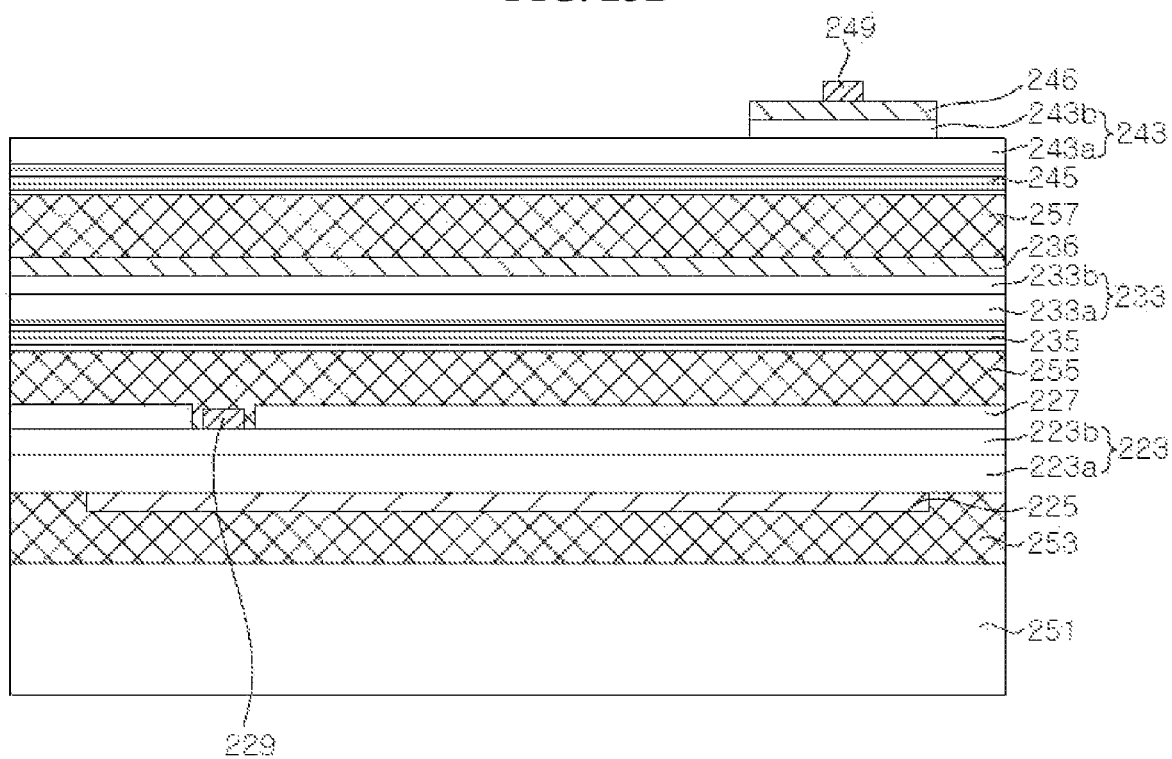

Referring to FIGS. 25A and 25B, the third transparent electrode 246, the second conductivity type semiconductor layer 243b, and the active layer are patterned to expose the first conductivity type semiconductor layer 243a in each pixel region. The third transparent electrode 246 may be remained while being defined within a third sub-pixel region, and may include a recessed part as shown in FIG. 25A.

Then, the third ohmic electrode 247 and the third current spreading layer 249 are formed on the third transparent electrode 246 and the first conductivity type semiconductor layer 243a, respectively. The third ohmic electrode 247 may be formed in the recessed part. The third ohmic electrode 247 and the third current spreading layer 249 may be formed with the same material layer during the same process, and thus, the third ohmic electrode 247 and the third current spreading layer 249 may have substantially the same structure. However, the inventive concepts are not limited thereto, and the third ohmic electrode 247 and the third current spreading layer 249 may be formed in separate processes. For example, the third current spreading layer 249 may be formed before the third transparent electrode 246 is patterned, and the third ohmic electrode 247 may be formed after the first conductivity type semiconductor layer 243a is exposed, or vice versa. Further, the third ohmic electrode 247 and the third current spreading layer 249 may be formed together with the second current spreading layer 239 to be described below.

Figure 26A:
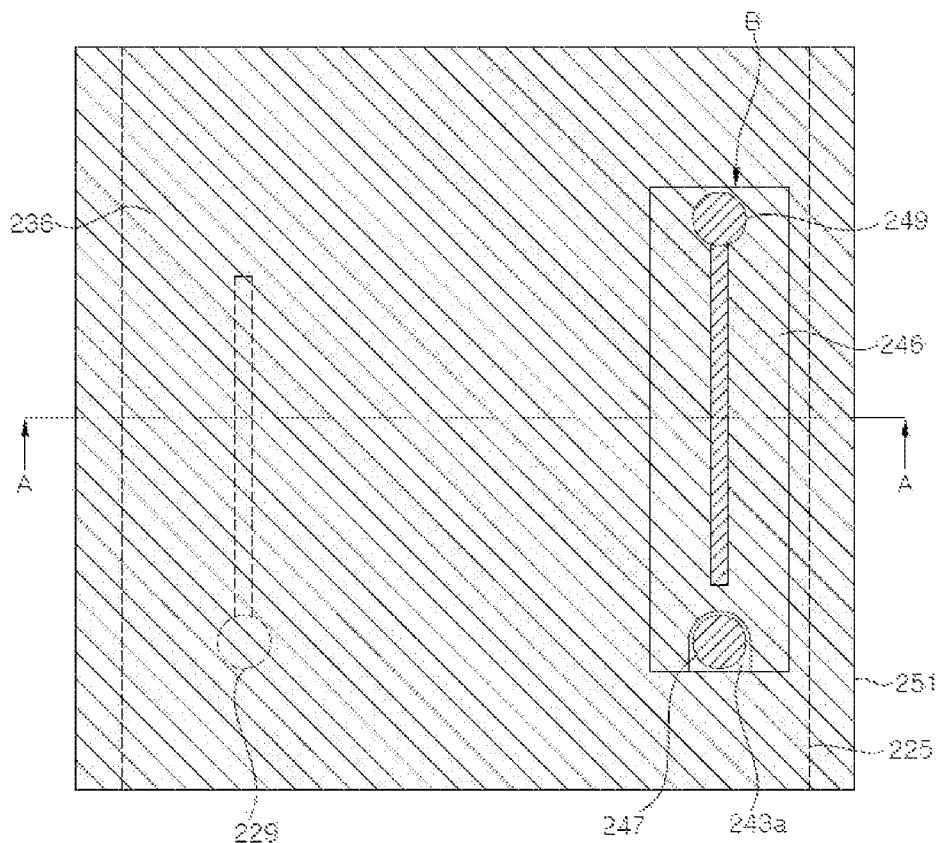
Figure 26B:
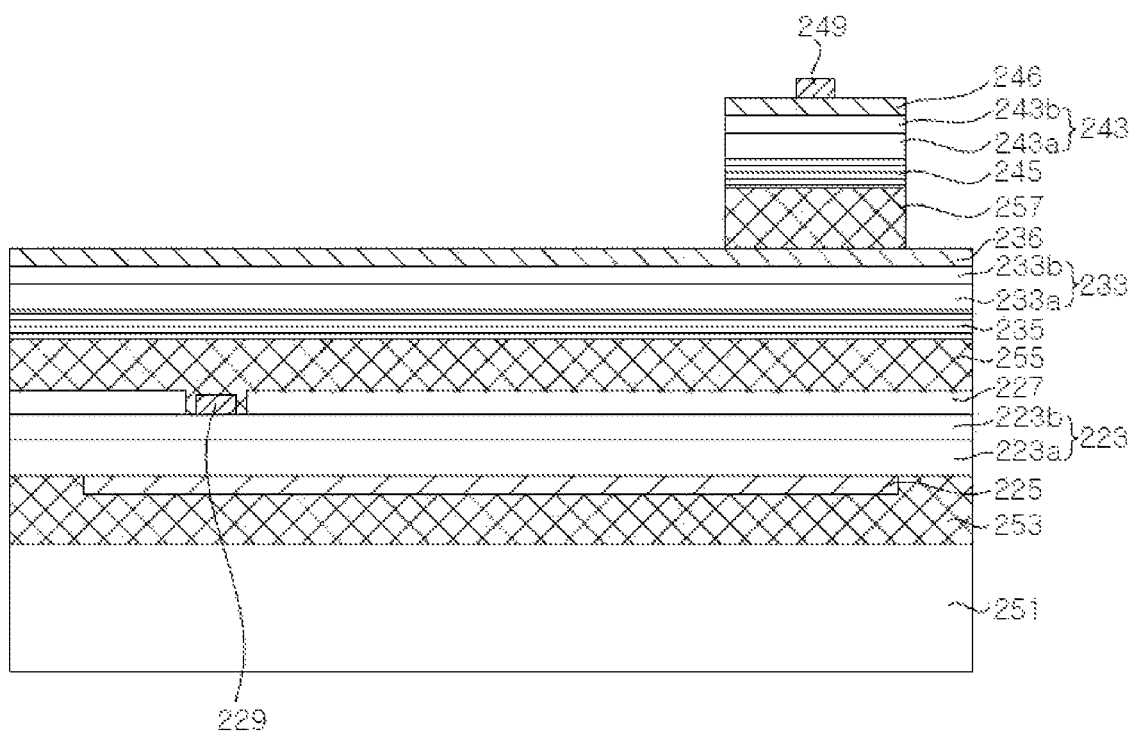

Referring to FIGS. 26A and 26B, the second transparent electrode 236 is exposed by sequentially patterning the first conductivity type semiconductor layer 243a, the second color filter 245, and the third bonding layer 257. In this manner, the third sub-pixel region B is defined, and the second transparent electrode 236 is exposed around the third sub-pixel region B.

Figure 27A:
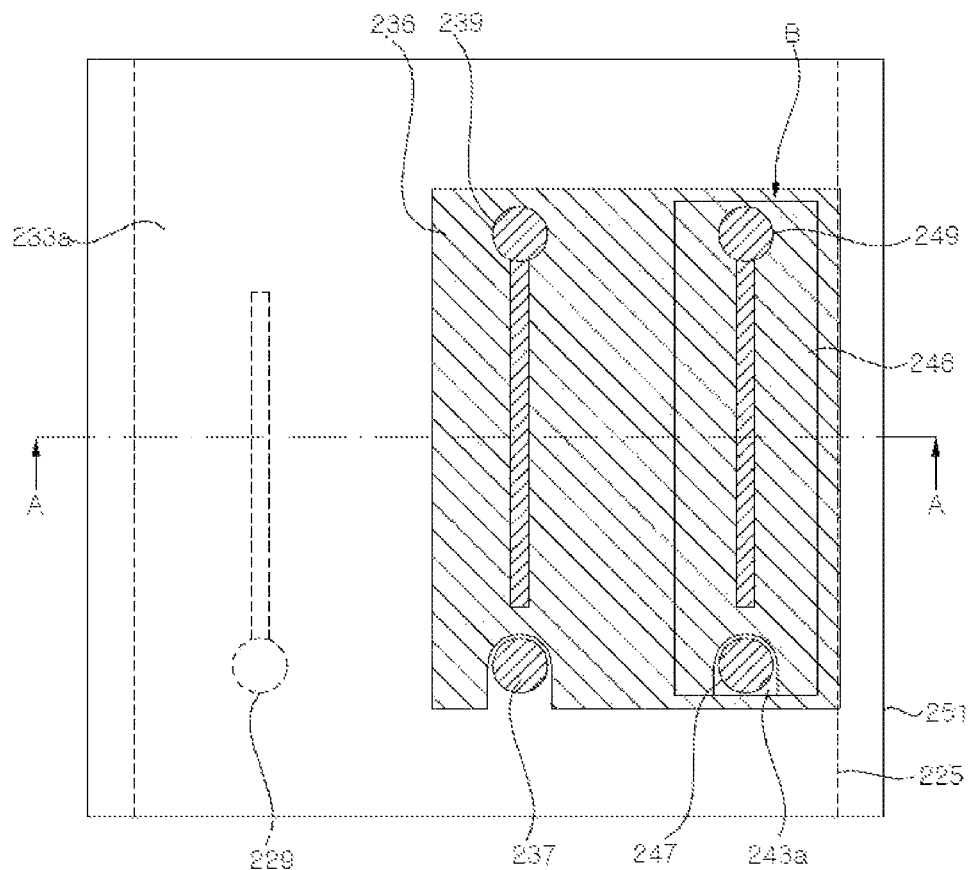
Figure 27B:
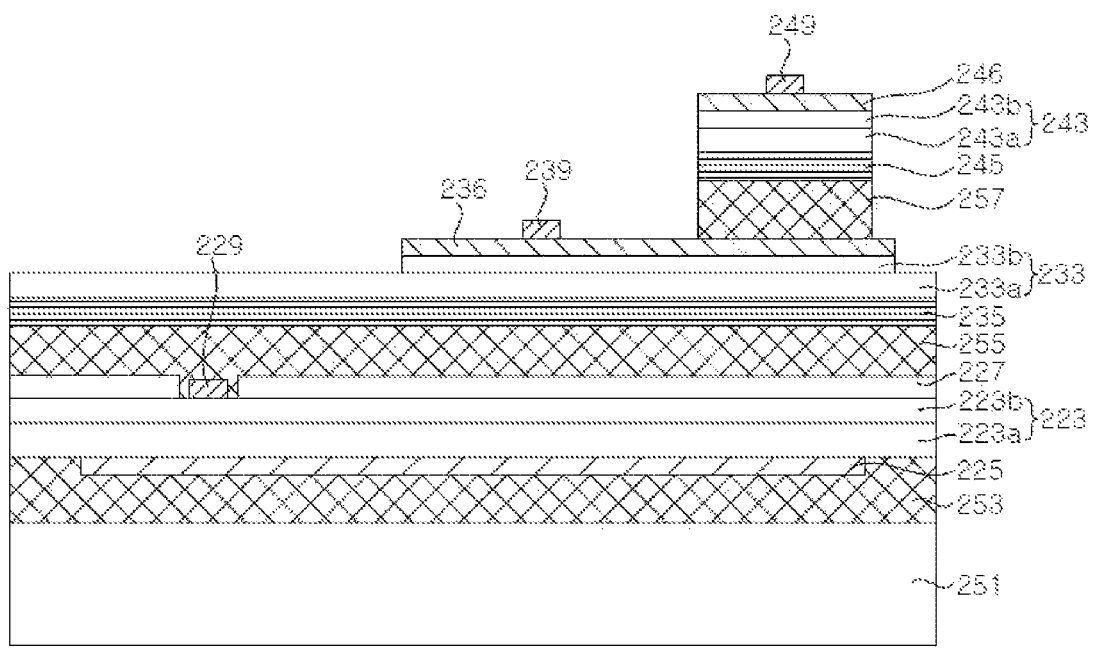

Referring to FIGS. 27A and 27B, the second transparent electrode 236, the second conductivity type semiconductor layer 233b, and the active layer are patterned to expose the first conductivity type semiconductor layer 233a. The second transparent electrode 236 may be remained while being defined within a second sub-pixel region, and may include a recessed part as shown in FIG. 27A.

Then, the second ohmic electrode 237 and the second current spreading layer 239 are formed on the second transparent electrode 236 and the first conductivity type semiconductor layer 233a, respectively. The second ohmic electrode 237 may be formed in the recessed part. The second ohmic electrode 237 and the second current spreading layer 239 may be formed with the same material layer during the same process, and thus, the second ohmic electrode 237 and the second current spreading layer 239 may have substantially the same structure.

Further, the third ohmic electrode 247 and the third current spreading layer 249 may also be formed together with the second ohmic electrode 237 and the second current spreading layer 239 with the same material layer during the same process.

However, the inventive concepts are not limited thereto, and the second ohmic electrode 237 and the second current spreading layer 239 may be formed in separate processes. For example, the second current spreading layer 239 may be formed first before the second transparent electrode 236 is patterned, and the second ohmic electrode 237 may be formed after the first conductivity type semiconductor layer 233a is exposed, or vice versa.

Figure 28A:
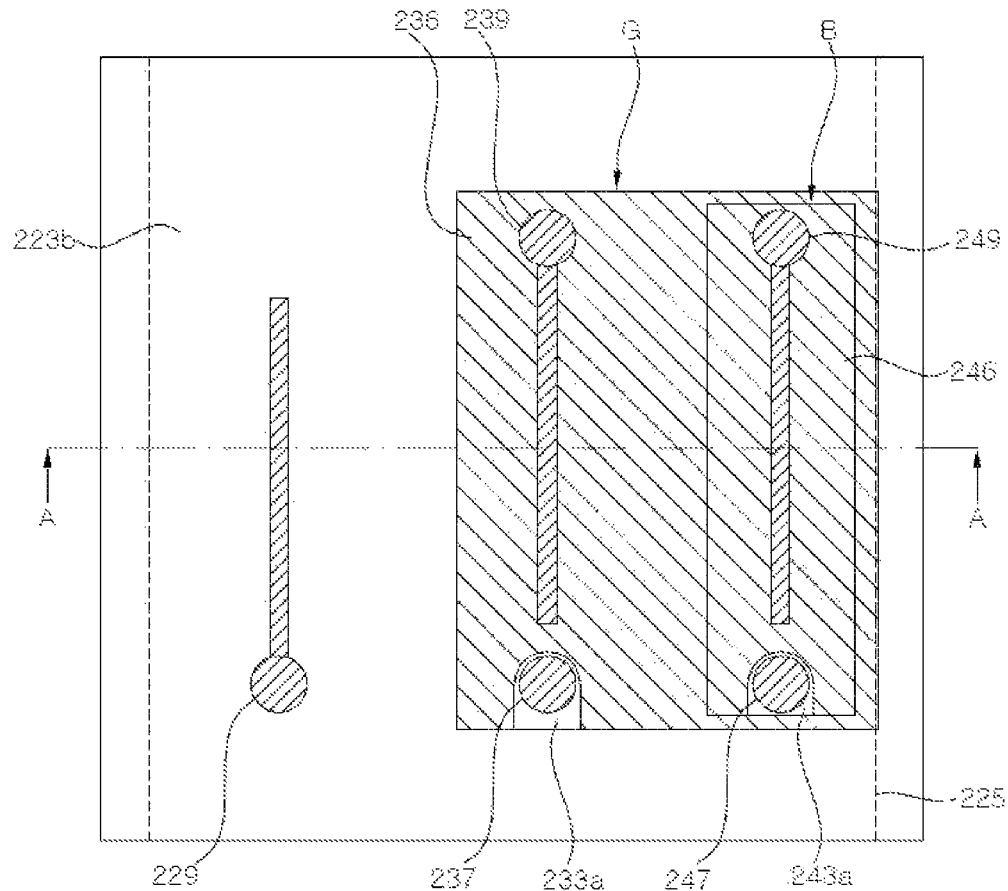
Figure 28B:
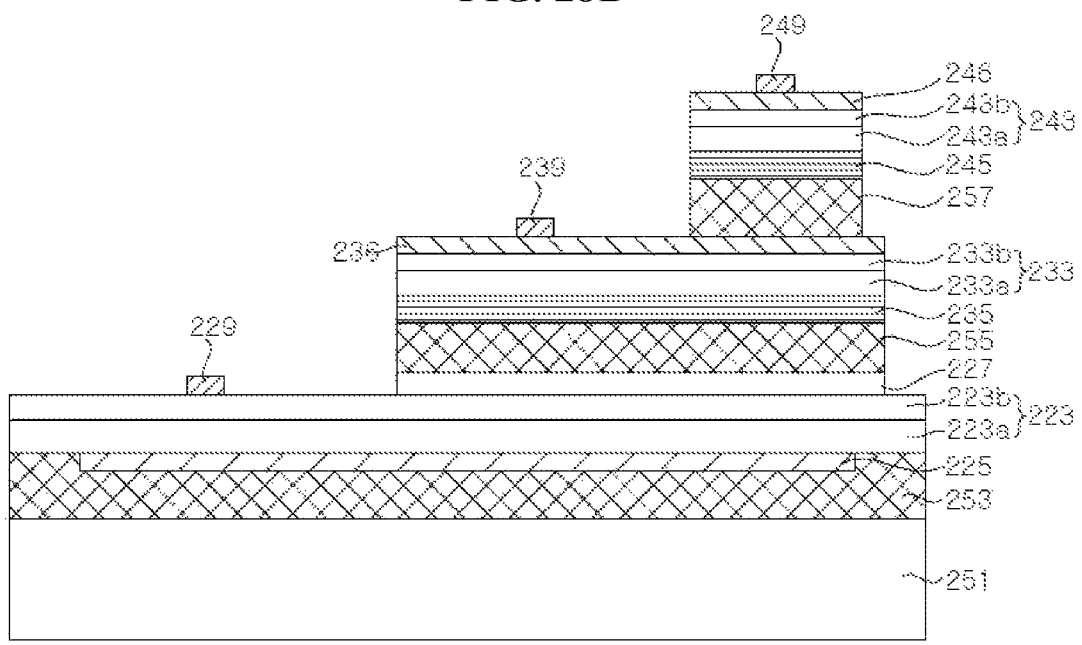

Referring to FIGS. 28A and 28B, the second conductivity type semiconductor layer 2 23b is exposed by sequentially patterning the first conductivity type semiconductor layer 233a, the first color filter 235, the second bonding layer 255, and the insulating layer 227. In this manner, the second sub-pixel region B is defined, and the second conductivity type semiconductor layer 223b is exposed around the second sub-pixel region G. In addition, the first ohmic electrode 229 is exposed on the outer side of the second LED stack 233, and the second LED stack 233 partially overlaps with the third LED stack 243. In particular, the third LED stack 243 is disposed to be defined within a region of the second LED stack 233.

Figure 29A:
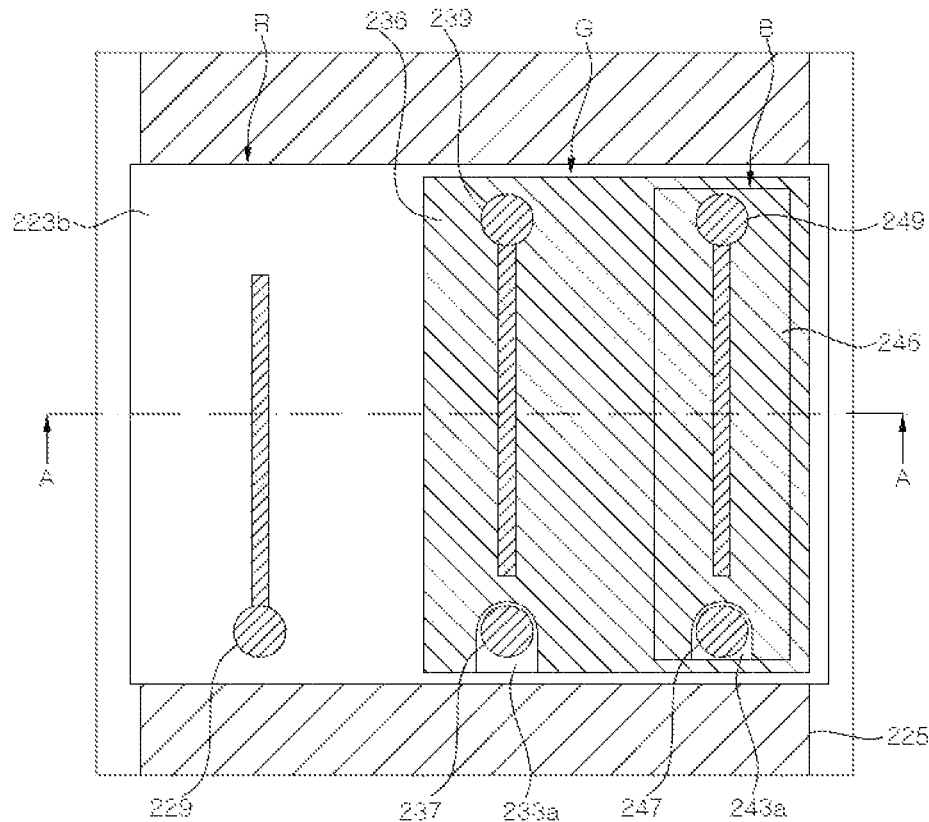
Figure 29B:
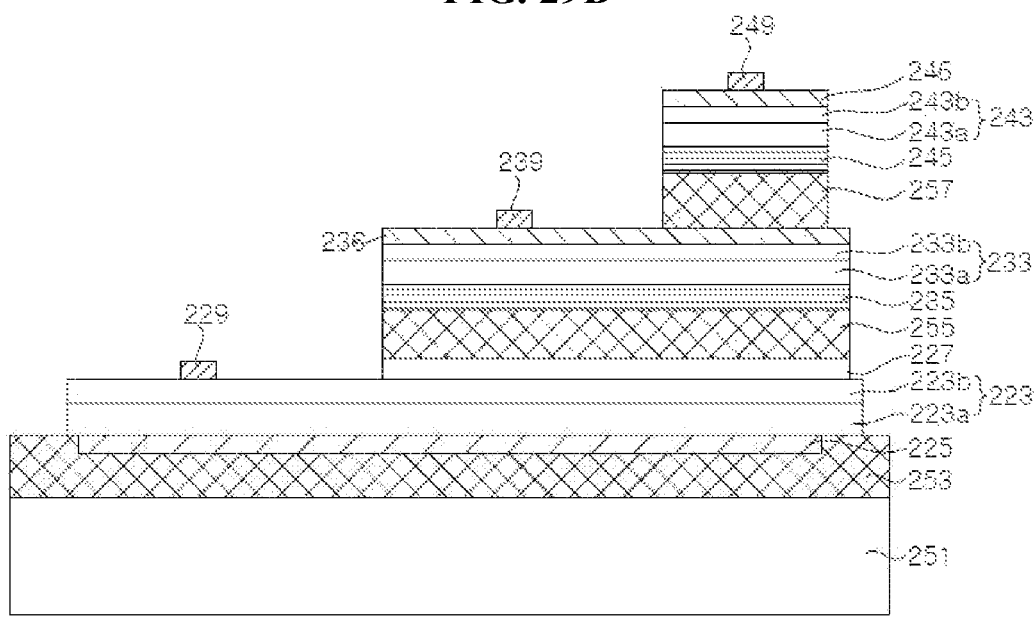

Referring to FIGS. 29A and 29B, the first LED stack 223 is patterned to remove the first LED stack 223 at a portion other than the first sub-pixel R region. Meanwhile, the first ohmic electrode 229 may be remained in the first sub-pixel R region. The first LED stack 223 partially overlaps the second LED stack 233 and the third LED stack 243. In particular, the second LED stack 233 and the third LED stack 243 are disposed to be defined within a region of the first LED stack 223.

Meanwhile, by patterning the first LED stack 223, the reflective electrode 225 may be exposed and the surface of the first bonding layer 253 may also be partially exposed. According to another exemplary embodiment, an insulating layer may be disposed on the first bonding layer 253, and thus, the insulating layer may be exposed rather than the first bonding layer 253.

According to an exemplary embodiment, each of the first ohmic electrode 229, the second current spreading layer 239, and the third current spreading layer 249 may include a pad region and an extension part, and the extension part may extend along a length direction of the exposed reflective electrode 225. However, the inventive concepts are not limited thereto.

Figure 30A:
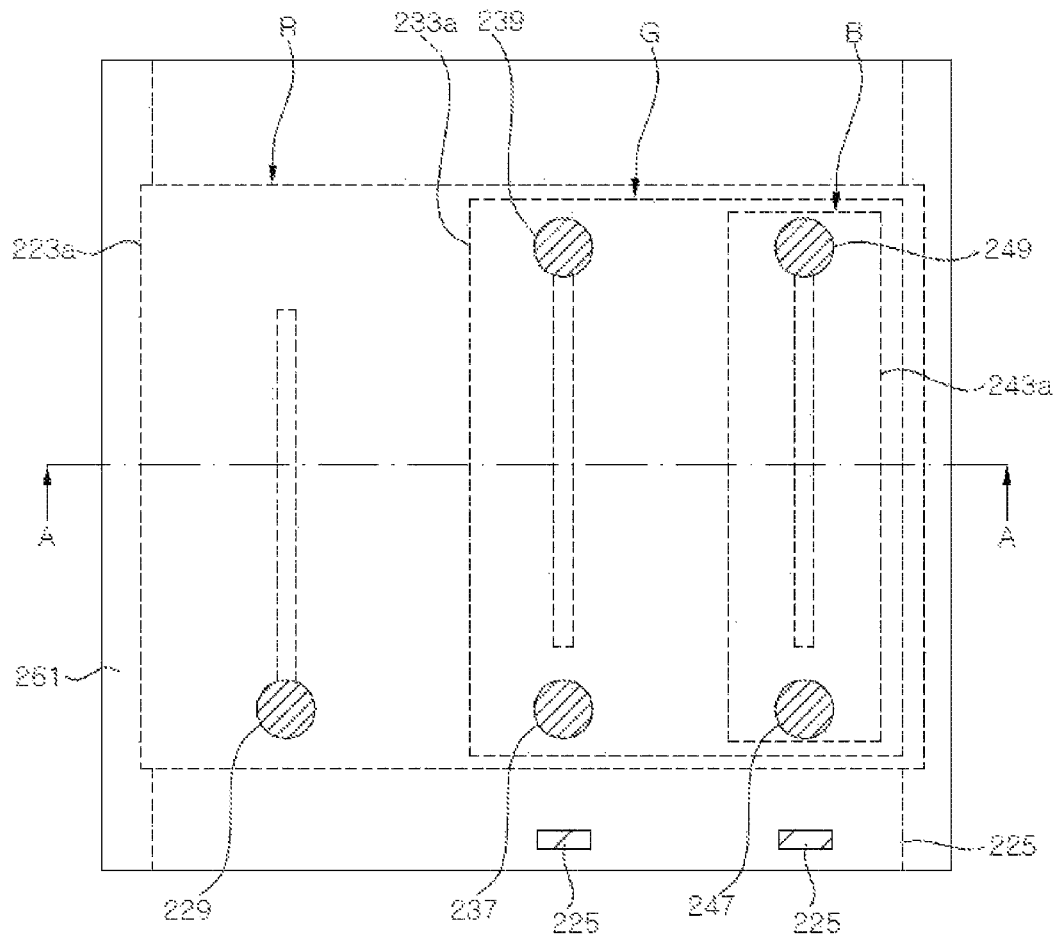
Figure 30B:
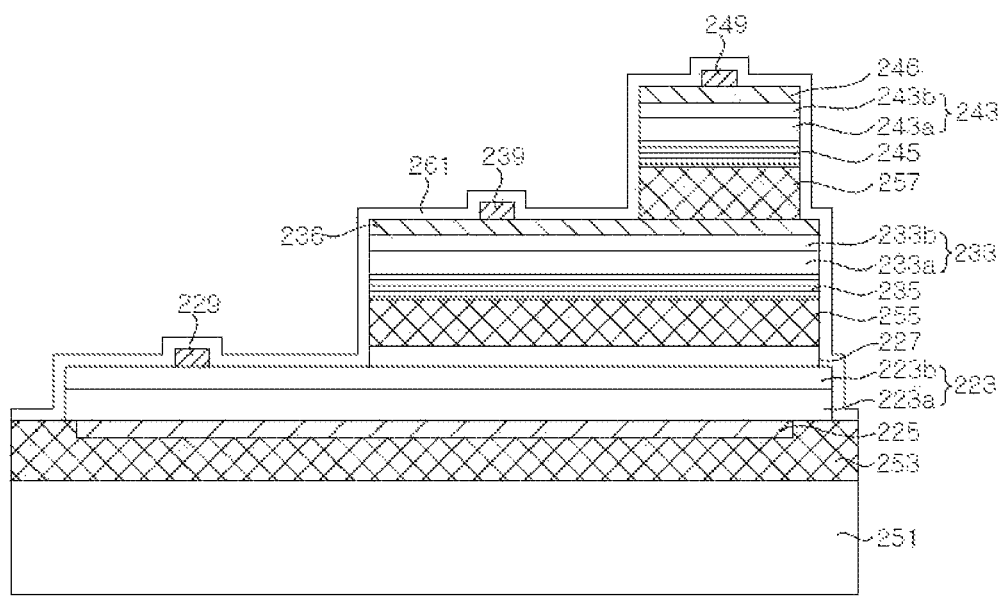

Referring to FIGS. 30A and 30B, the lower insulating layer 261 is then formed to cover the first to third LED stacks 223, 233, and 243, and the reflective electrode 225 and the first bonding layer 253. The second transparent electrode 236 and the third transparent electrode 246 are also covered by the lower insulating layer 261. The lower insulating layer 261 may be patterned to form openings exposing the first ohmic electrode 229, the second ohmic electrode 237, the second current spreading layer 239, the third ohmic electrode 247, the third current spreading layer 249, and the reflective electrode 225.

Figure 31:
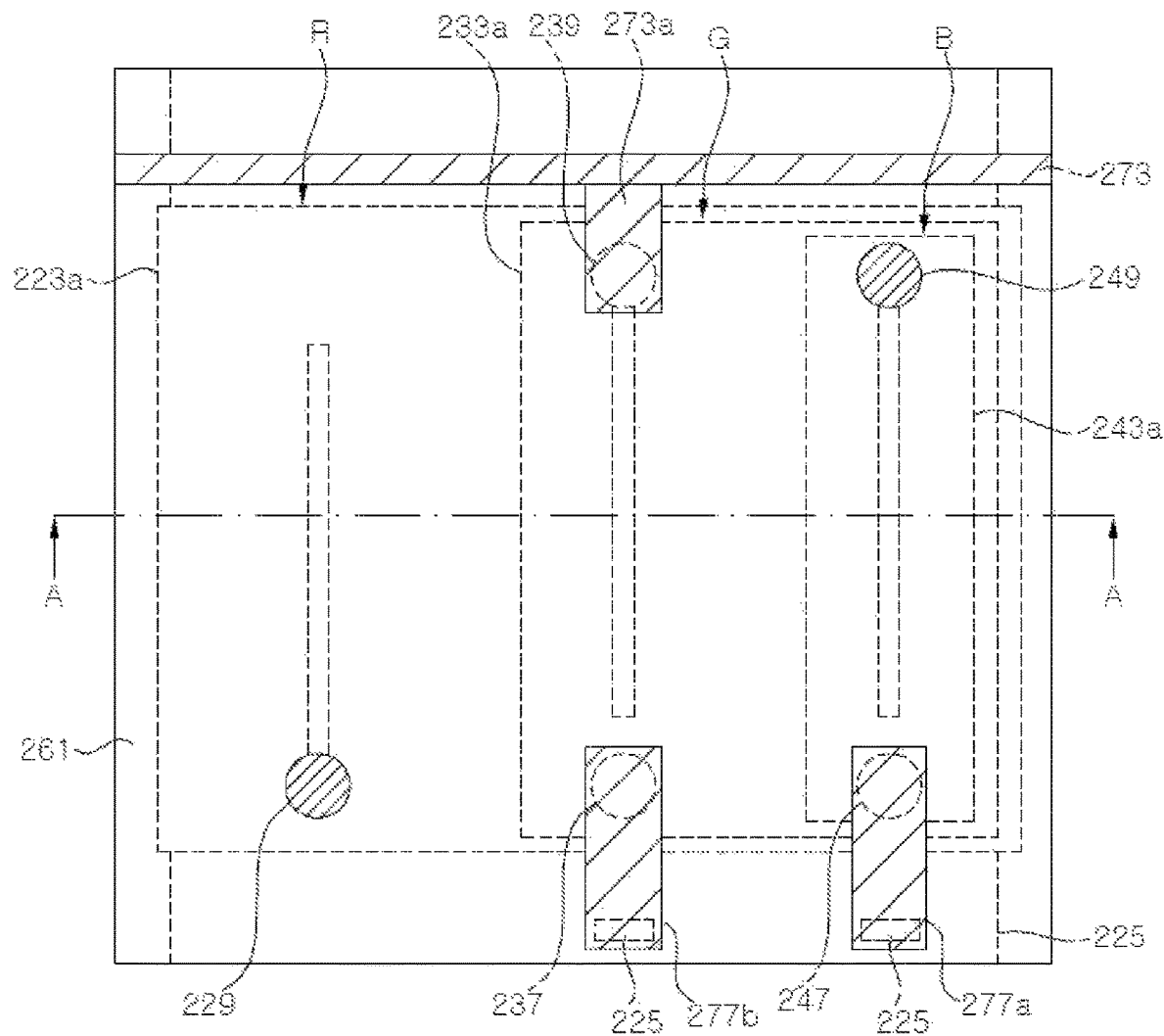

Referring to FIG. 31, the interconnection line 273 and connectors 273a, 277a, and 277b are formed on the lower insulating layer 261. The connector 273a connects the second current spreading layer 239 to the interconnection line 273, the connector 277a connects the third ohmic electrode 247 to the reflective electrode 225, and the connector 277b connects the second ohmic electrode 237 to the reflective electrode 225. A cross-sectional view taken along line A-A of FIG. 31 is the same as FIG. 30B.

Figure 32A:
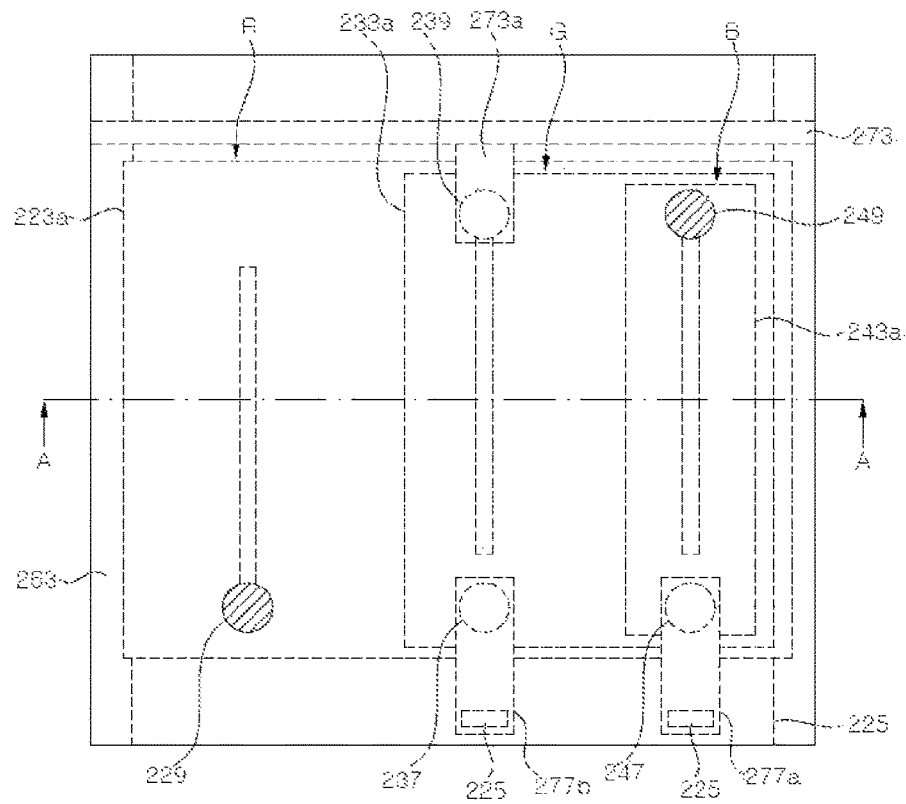
Figure 32B:
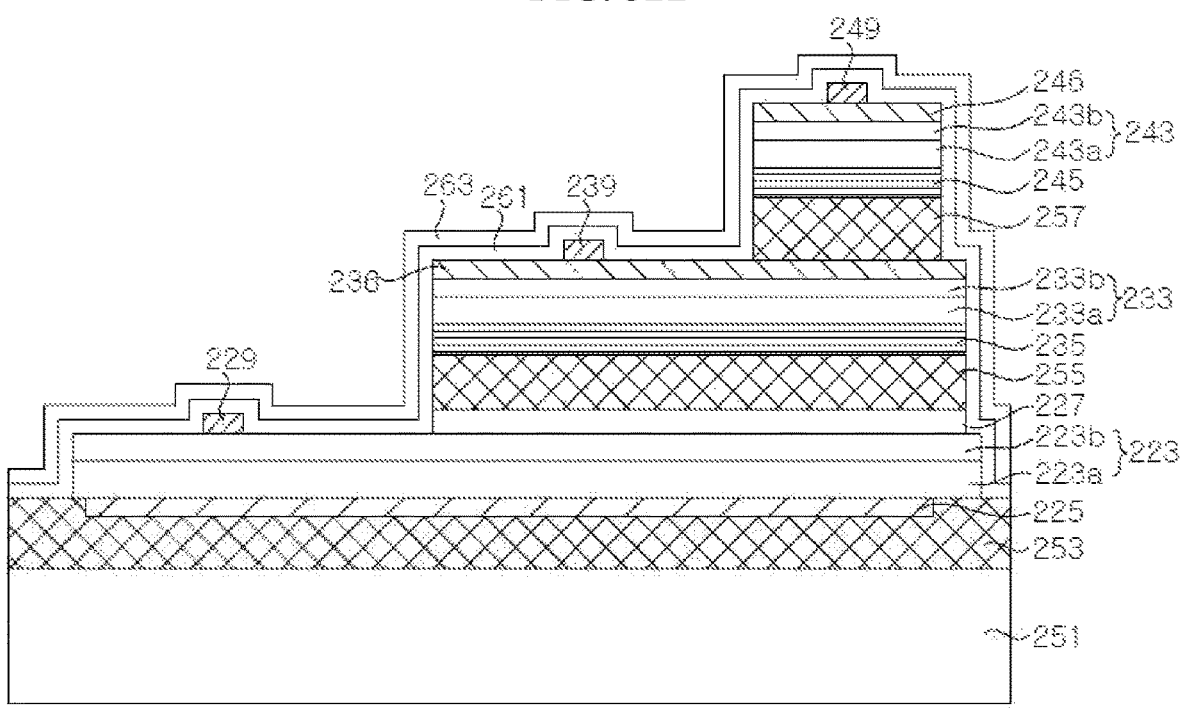

Referring to FIGS. 32A and 32B, the upper insulating layer 263 is then formed to cover the interconnection line 273 and the connectors 273a, 277a and 277b. The upper insulating layer 263 may be patterned to expose the pad regions of the first ohmic electrode 229 and the third current spreading layer 249.

Figure 33:
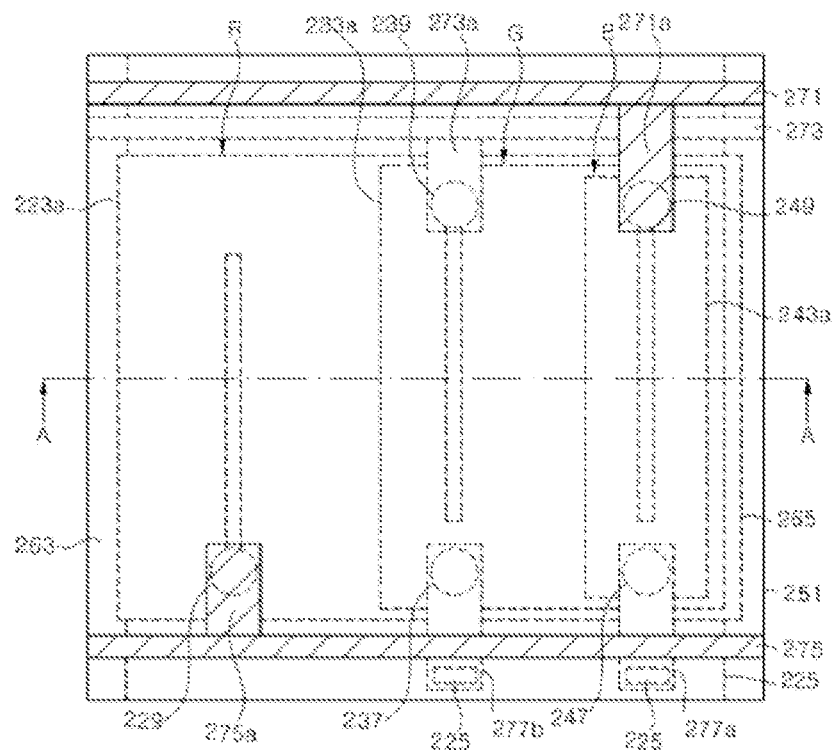

Referring to FIG. 33, interconnection lines 271 and 275 and connectors 271a and 275a are then formed on the upper insulating layer 263. The connector 271a connects the interconnection line 271 to the third current spreading layer 249, and the connector 275a connects the interconnection line 275 to the first ohmic electrode 229.

As such, the display apparatus 200A described with reference to FIGS. 16 and 17 is manufactured.

Figure 34:
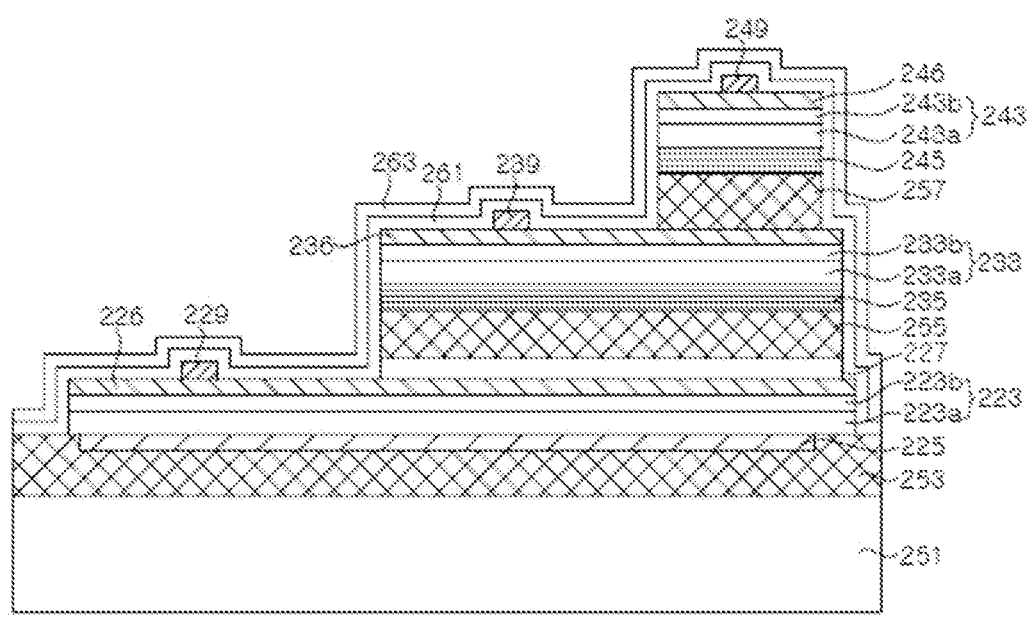
FIG. 34 is a schematic cross-sectional view of a display apparatus according to still another exemplary embodiment.

FIG. 34 is a schematic cross-sectional view of a display apparatus according to another exemplary embodiment.

Referring to FIG. 34, the display apparatus according to an exemplary substantially similar to the display apparatus of FIGS. 16 and 17, except that the transparent electrode 226 is disposed on the upper surface of the first LED stack 223, and the first current spreading layer 229 is disposed on the transparent electrode 226. In particular, the transparent electrode 226 is disposed on the second conductivity type semiconductor layer 223b to be in ohmic contact with the second conductivity type semiconductor layer 223b. The transparent electrode 226 may cover substantially the entire upper surface of the first LED stack 223, and thus, may be interposed between the first LED stack 223 and the second LED stack 233 as well as the outer side of the second LED stack 233.

The transparent electrode 226 may be formed to cover most of the region of the second conductivity type semiconductor layer 223*b* before forming the insulating layer 227 described with reference to FIG. 19A. In addition, the insulating layer 227 may be omitted. Meanwhile, the first current spreading layer 229 may be formed directly on the transparent electrode 226. Alternatively, the first current spreading layer 229 may be formed after the first conductivity type semiconductor layer 233*a*, the first color filter 235, the second bonding layer 255, and the insulating layer 227 are patterned to expose the transparent electrode 226 so as to define the second sub-pixel region G, as described with reference to FIGS. 28A and 28B.

In this manner, since the first current spreading layer 229 may not need to be in ohmic contact with the second conductivity type semiconductor layer 223*b* by forming the transparent electrode 226, the first current spreading layer 229 may be formed with the second current spreading layer 239 or the third current spreading layer 249 with the same material layer. Thus, the first current spreading layer 229 may also be formed together with the same material layer during the same process when forming the second ohmic electrode 237, the second current spreading layer 239, the third ohmic electrode 247, and the third current spreading layer 249.

Meanwhile, the display apparatus of FIG. 34 is described as including pixels driven in a passive matrix driving manner, however the inventive concepts are not limited thereto, and the pixels may be driven in the active matrix driving manner.

Figure 35:
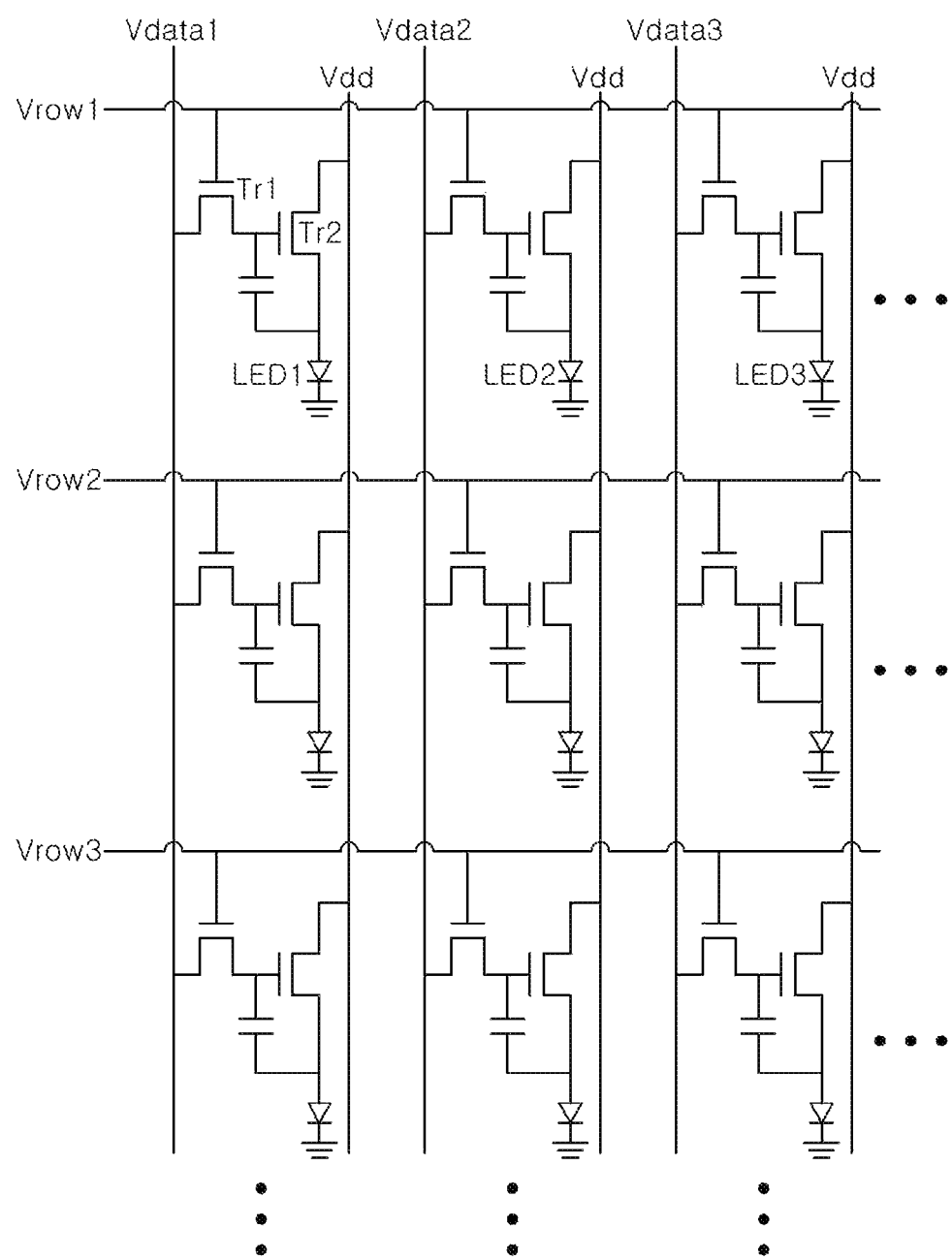
FIG. 35 is a schematic circuit diagram of a display apparatus according to still another exemplary embodiment.

FIG. 35 is a schematic circuit diagram of a display apparatus according to still another exemplary embodiment. Here, the circuit diagram of the display apparatus is driven in the active matrix manner.

Referring to FIG. 35, a driving circuit according to an exemplary embodiment includes two or more transistors Tr1 and Tr2 and a capacitor. When power is connected to selection lines Vrow1 to Vrow3, and a data voltage is applied to the data lines Vdata1 to Vdata3, a voltage is applied to the corresponding light emitting diode. Further, charges are charged in the corresponding capacitor in accordance with the values of Vdata1 to Vdata3. The transistor Tr2 may maintain a turn-on state by the charged voltage of the capacitor, and thus, even when power supply is cut off to the selection line Vrow1, voltage of the capacitor may be maintained, and the voltage may be applied to the light emitting diodes LED1 to LED3. Further, currents flowing through the LED1 to the LED3 may be changed according to values of Vdata1 to Vdata3. Since the current may always be supplied through Vdd, light may be emitted continuously.

The transistors Tr1 and Tr2 and the capacitor may be formed in the support substrate 251. The support substrate 251 may also have connection pads on its surface to connect the transistors to the capacitors. In addition, the selection line and the data line may be provided in or on the support substrate 251, and thus, the interconnection lines 271, 273, and 275 described above may be omitted.

The light emitting diodes LED1 to LED3 may correspond to the first to third LED stacks 223, 233, and 243, respectively, in one pixel. The anodes of the first to third LED stacks 223, 233, and 243 are connected to the transistor Tr2, and the cathodes thereof are grounded. The first ohmic electrode 229, the second current spreading layer 239, and the third current spreading layer 249 may be connected to the connection pads on the support substrate 251, respectively, via the connectors to be connected to the transistor Tr2, and the reflective electrode 225 may be connected to the connection pad of the support substrate 251 and grounded.

The first to third LED stacks 223, 233, and 243 may be connected in common to the reflective electrode 225 and grounded. Further, the reflective electrode 225 may be disposed continuously in two or more pixels, or in all pixels. Thus, the reflective electrode 225 may be connected in common to all the LED stacks in the display apparatus. In this manner, noise of an active matrix drive circuit may be eliminated by disposing the reflective electrode 225 between the pixels and the support substrate 251.

While FIG. 35 illustrates a circuit diagram for an active matrix according to an exemplary embodiment, but the inventive concepts are not limited thereto, and other circuits may be used.

According to exemplary embodiments, a plurality of pixels may be formed at a wafer level by using wafer bonding, and thus, a display apparatus may be formed without individually mounting the light emitting diodes.

Figure 36:
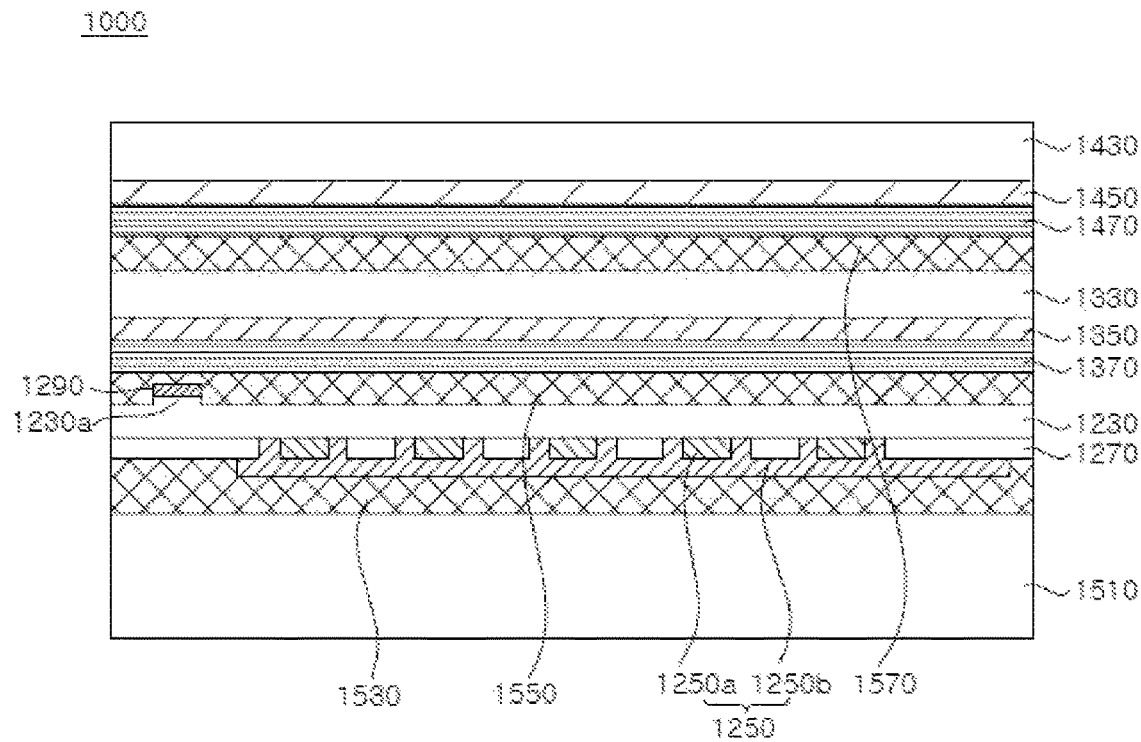
FIG. 36 is a schematic cross-sectional view of a light emitting diode stack for a display according to an exemplary embodiment.

FIG. 36 is a schematic cross-sectional view of a light emitting diode stack for a display according to an exemplary embodiment.

Referring to FIG. 36, the light emitting diode stack 1000 includes a support substrate 1510, a first LED stack 1230, a second LED stack 1330, a third LED stack 1430, a reflective electrode 1250, an ohmic electrode 1290, a second-p transparent electrode 1350, a third-p transparent electrode 1450, an insulation layer 1270, a first color filter 1370, a second color filter 1470, a first bonding layer 1530, a second bonding layer 1550, and a third bonding layer 1570. In addition, the first LED stack 1230 may include an ohmic contact portion 1230*a* for ohmic contact.

The support substrate 1510 supports the LED stacks 1230, 1330, and 1430. The support substrate 1510 may include a circuit on a surface thereof or therein, but the inventive concepts are not limited thereto. The support substrate 1510 may include, for example, a Si substrate or a Ge substrate.

Each of the first LED stack 1230, the second LED stack 1330, and the third LED stack 1430 includes an n-type semiconductor layer, a p-type semiconductor layer, and an active layer interposed therebetween. The active layer may have a multi-quantum well structure.

For example, the first LED stack 1230 may be an inorganic light emitting diode configured to emit red light, the second LED stack 1330 may be an inorganic light emitting diode configured to emit green light, and the third LED stack 1430 may be an inorganic light emitting diode configured to emit blue light. The first LED stack 1230 may include a GaInP-based well layer, and each of the second LED stack 1330 and the third LED stack 1430 may include a GaInN-based well layer. However, the inventive concepts are not limited thereto, and when the light emitting diode stack 1000 includes micro LEDs, the first LED stack 1230 may emit any one of red, green, and blue light, and the second and third LED stacks 1330 and 1430 may emit a different one of the red, green, and blue light without adversely affecting operation or requiring color filters due to its small form factor.

In addition, both surfaces of each of the first to third LED stacks 1230, 1330, 1430 are an n-type semiconductor layer and a p-type semiconductor layer, respectively. In the illustrated exemplary embodiment, each of the first to third LED stacks 1230, 1330, and 1430 has an n-type upper surface and a p-type lower surface. Since the third LED stack 1430 has an n-type upper surface, a roughened surface may be formed on the upper surface of the third LED stack 1430 through chemical etching. However, the inventive concepts are not limited thereto, and the semiconductor types of the upper and lower surfaces of each of the LED stacks can be alternatively arranged.

The first LED stack 1230 is disposed near the support substrate 1510, the second LED stack 1330 is disposed on the first LED stack 1230, and the third LED stack 1430 is disposed on the second LED stack 1330. Since the first LED stack 1230 emits light having a longer wavelength than the second and third LED stacks 1330 and 1430, light generated from the first LED stack 1230 can be emitted outside through the second and third LED stacks 1330 and 1430. In addition, since the second LED stack 1330 emits light having a longer wavelength than the third LED stack 1430, light generated from the second LED stack 1330 can be emitted outside through the third LED stack 1430.

The reflective electrode 1250 forms ohmic contact with the p-type semiconductor layer of the first LED stack 1230, and reflects light generated from the first LED stack 1230. For example, the reflective electrode 1250 may include an ohmic contact layer 1250a and a reflective layer 1250b.

The ohmic contact layer 1250a partially contacts the p-type semiconductor layer of the first LED stack 1230. In order to prevent absorption of light by the ohmic contact layer 1250a, a region in which the ohmic contact layer 1250a contacts the p-type semiconductor layer may not exceed 50% of the total area of the p-type semiconductor layer. The reflective layer 1250b covers the ohmic contact layer 1250a and the insulation layer 1270. As shown in FIG. 36, the reflective layer 1250b may cover substantially the entire ohmic contact layer 1250a, without being limited thereto. Alternatively, the reflective layer 1250b may cover a portion of the ohmic contact layer 1250a.

Since the reflective layer 1250b covers the insulation layer 1270, an omnidirectional reflector can be formed by the stacked structure of the first LED stack 1230 having a relatively high index of refraction, and the insulation layer 1270 and the reflective layer 1250b having a relatively low index of refraction. The reflective layer 1250b may cover 50% or more of the area of the first LED stack 1230, or most of the first LED stack 1230, thereby improving luminous efficacy.

The ohmic contact layer 1250a and the reflective layer 1250b may be metal layers, which may include Au. The reflective layer 1250b may be formed of a metal having relatively high reflectance with respect to light generated from the first LED stack 1230, for example, red light. On the other hand, the reflective layer 1250b may be formed of a metal having relatively low reflectance with respect to light generated from the second LED stack 1330 and the third LED stack 1430, for example, green light or blue light, to reduce interference of light having been generated from the second and third LED stacks 1330 and 1430 and traveling toward the support substrate 1510.

The insulation layer 1270 is interposed between the support substrate 1510 and the first LED stack 1230 and has openings that expose the first LED stack 1230. The ohmic contact layer 1250a is connected to the first LED stack 1230 in the openings of the insulation layer 1270.

The ohmic electrode 1290 is disposed on the upper surface of the first LED stack 1230. In order to reduce ohmic contact resistance of the ohmic electrode 1290, the ohmic contact portion 1230a may protrude from the upper surface of the first LED stack 1230. The ohmic electrode 1290 may be disposed on the ohmic contact portion 1230a.

The second-p transparent electrode 1350 forms ohmic contact with the p-type semiconductor layer of the second LED stack 1330. The second-p transparent electrode 1350 may include a metal layer or a conducive oxide layer that is transparent to red light and green light.

The third-p transparent electrode 1450 forms ohmic contact with the p-type semiconductor layer of the third LED stack 1430. The third-p transparent electrode 1450 may include a metal layer or a conducive oxide layer that is transparent to red light, green light, and blue light.

The reflective electrode 1250, the second-p transparent electrode 1350, and the third-p transparent electrode 1450 may assist in current spreading through ohmic contact with the p-type semiconductor layer of corresponding LED stack.

The first color filter 1370 may be interposed between the first LED stack 1230 and the second LED stack 1330. The second color filter 1470 may be interposed between the second LED stack 1330 and the third LED stack 1430. The first color filter 1370 transmits light generated from the first LED stack 1230 while reflecting light generated from the second LED stack 1330. The second color filter 1470 transmits light generated from the first and second LED stacks 1230 and 1330, while reflecting light generated from the third LED stack 1430. As such, light generated from the first LED stack 1230 can be emitted outside through the second LED stack 1330 and the third LED stack 1430, and light generated from the second LED stack 1330 can be emitted outside through the third LED stack 1430. Further, light generated from the second LED stack 1330 may be prevented from entering the first LED stack 1230, and light generated from the third LED stack 1430 may be prevented from entering the second LED stack 1330, thereby preventing light loss.

In some exemplary embodiments, the first color filter 1370 may reflect light generated from the third LED stack 1430.

The first and second color filters 1370 and 1470 may be, for example, a low pass filter that transmits light in a low frequency band, that is, in a long wavelength band, a band pass filter that transmits light in a predetermined wavelength band, or a band stop filter that prevents light in a predetermined wavelength band from passing therethrough. In particular, each of the first and second color filters 1370 and 1470 may include a distributed Bragg reflector (DBR). The distributed Bragg reflector may be formed by alternately stacking insulation layers having different indices of refraction one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different indices of refraction one above another.

The first bonding layer 1530 couples the first LED stack 1230 to the support substrate 1510. As shown in FIG. 36, the reflective electrode 1250 may adjoin the first bonding layer 1530. The first bonding layer 1530 may be a light transmissive or opaque layer.

The second bonding layer 1550 couples the second LED stack 1330 to the first LED stack 1230. As shown in FIG. 36, the second bonding layer 1550 may adjoin the first LED stack 1230 and the first color filter 1370. The ohmic electrode 1290 may be covered by the second bonding layer 1550. The second bonding layer 1550 transmits light generated from the first LED stack 1230. The second bonding layer 1550 may be formed of, for example, light transmissive spin-on-glass.

The third bonding layer 1570 couples the third LED stack 1430 to the second LED stack 1330. As shown in FIG. 36, the third bonding layer 1570 may adjoin the second LED stack 1330 and the second color filter 1470. However, the inventive concepts are not limited thereto. For example, a transparent conductive layer may be disposed on the second LED stack 1330. The third bonding layer 1570 transmits light generated from the first LED stack 1230 and the second LED stack 1330. The third bonding layer 1570 may be formed of, for example, light transmissive spin-on-glass.

FIGS. 37A, 37B, 37C, 37D, and 37E are schematic cross-sectional views illustrating a method of manufacturing a light emitting diode stack for a display according to an exemplary embodiment.

Figure 37A:
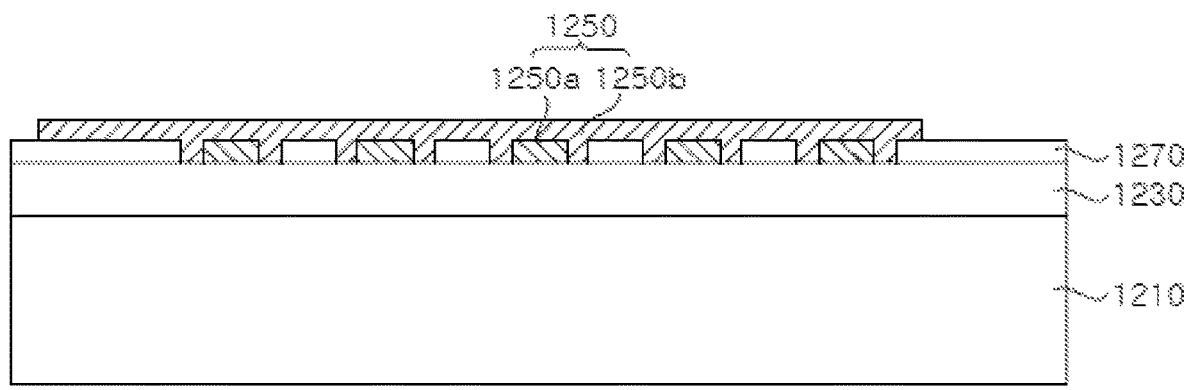
FIGS. 37A, 37B, 37C, 37D, and 37E are schematic cross-sectional views illustrating a method of manufacturing a light emitting diode stack for a display according to an exemplary embodiment.

Referring to FIG. 37A, a first LED stack 1230 is grown on a first substrate 1210. The first substrate 1210 may be, for example, a GaAs substrate. The first LED stack 1230 may be formed of AlGaInP-based semiconductor layers and includes an n-type semiconductor layer, an active layer, and a p-type semiconductor layer.

An insulation layer 1270 is formed on the first LED stack 1230, and is patterned to form opening(s). For example, a $SiO_2$ layer is formed on the first LED stack 1230 and a photoresist is deposited onto the $SiO_2$ layer, followed by photolithography and development to form a photoresist pattern. Then, the $SiO_2$ layer is patterned through the photoresist pattern used as an etching mask, thereby forming the insulation layer 1270.

Then, an ohmic contact layer 1250a is formed in the opening(s) of the insulation layer 1270. The ohmic contact layer 1250a may be formed by a lift-off process or the like. After the ohmic contact layer 1250a is formed, a reflective layer 1250b is formed to cover the ohmic contact layer 1250a and the insulation layer 1270. The reflective layer 1250b may be formed by a lift-off process or the like. The reflective layer 1250b may cover a portion of the ohmic contact layer 1250a or the entirety thereof, as shown in FIG. 37A. The ohmic contact layer 1250a and the reflective layer 1250b form a reflective electrode 1250.

The reflective electrode 1250 forms ohmic contact with the p-type semiconductor layer of the first LED stack 1230, and thus, will hereinafter be referred to as a first-p reflective electrode 1250.

Figure 37B:
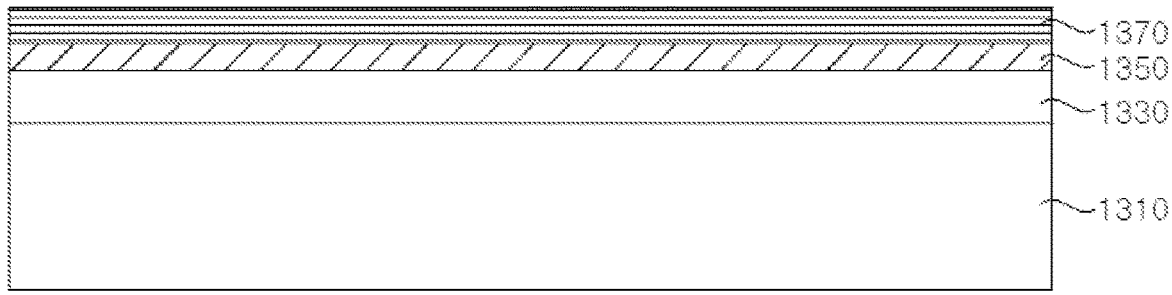

Referring to FIG. 37B, a second LED stack 1330 is grown on a second substrate 1310, and a second-p transparent electrode 1350 and a first color filter 1370 are formed on the second LED stack 1330. The second LED stack 1330 may be formed of GaN-based semiconductor layers and include a GaInN well layer. The second substrate 1310 is a substrate on which GaN-based semiconductor layers may be grown thereon, and is different from the first substrate 1210. The composition ratio of GaInN for the second LED stack 1330 may be determined such that the second LED stack 1330 emits green light. The second-p transparent electrode 1350 forms ohmic contact with the p-type semiconductor layer of the second LED stack 1330.

Figure 37C:
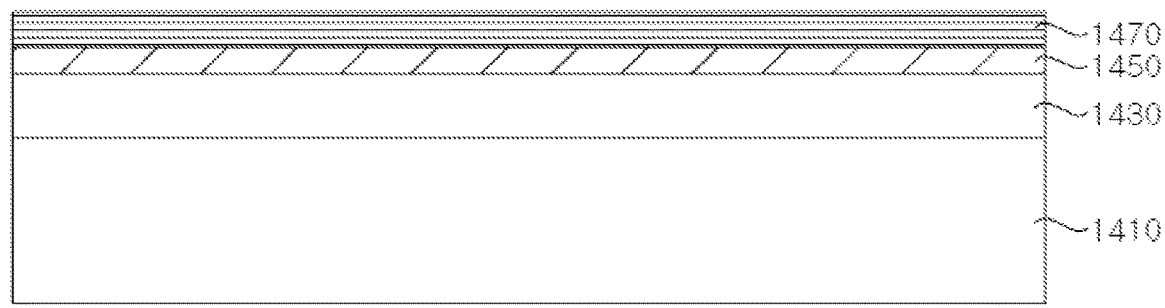

Referring to FIG. 37C, a third LED stack 1430 is grown on a third substrate 1410, and a third-p transparent electrode 1450 and a second color filter 1470 are formed on the third LED stack 1430. The third LED stack 1430 may be formed of GaN-based semiconductor layers and include a GaInN well layer. The third substrate 1410 is a substrate on which GaN-based semiconductor layers may be grown thereon, and is different from the first substrate 1210. The composition ratio of GaInN for the third LED stack 1430 may be determined such that the third LED stack 1430 emits blue light. The third-p transparent electrode 1450 forms ohmic contact with the p-type semiconductor layer of the third LED stack 1430.

The first color filter 1370 and the second color filter 1470 are substantially the same as those described with reference to FIG. 36, and thus, repeated descriptions thereof will be omitted to avoid redundancy.

As such, the first LED stack 1230, the second LED stack 1330 and the third LED stack 1430 may be grown on different substrates, and the formation sequence thereof is not limited to a particular sequence.

Figure 37D:
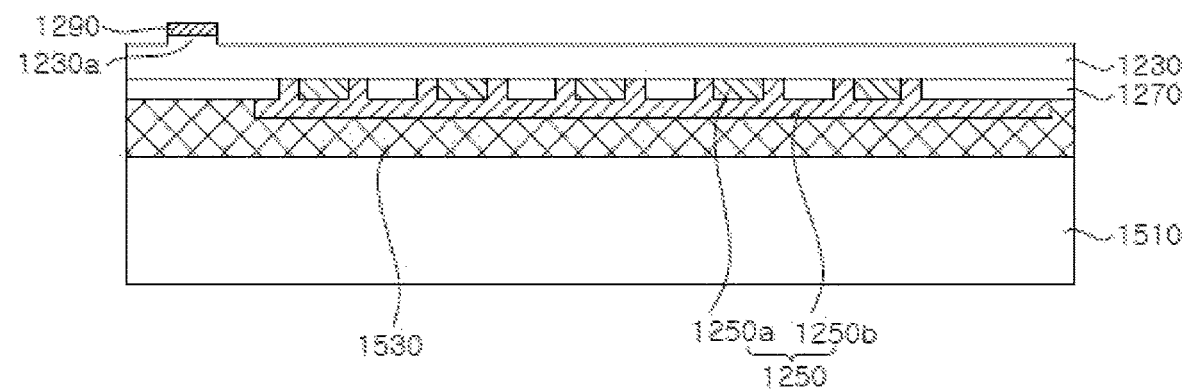

Referring to FIG. 37D, the first LED stack 1230 is coupled to the support substrate 1510 via a first bonding layer 1530. The first bonding layer 1530 may be previously formed on the support substrate 1510, and the reflective electrode 1250 may be bonded to the first bonding layer 1530 to face the support substrate 1510. The first substrate 1210 is removed from the first LED stack 1230 by chemical etching or the like. Accordingly, the upper surface of the n-type semiconductor layer of the first LED stack 1230 is exposed.

Then, an ohmic electrode 1290 is formed in the exposed region of the first LED stack 1230. In order to reduce ohmic contact resistance of the ohmic electrode 1290, the ohmic electrode 1290 may be subjected to heat treatment. The ohmic electrode 1290 may be formed in each pixel region so as to correspond to the pixel regions.

Figure 37E:
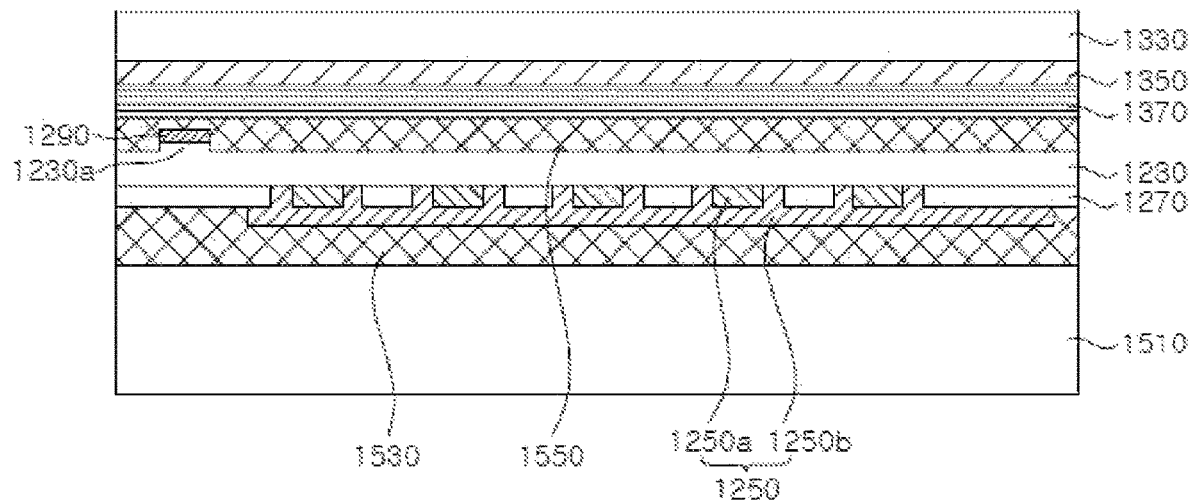

Referring to FIG. 37E, the second LED stack 1330 is coupled to the first LED stack 1230, on which the ohmic electrode 1290 is formed, via a second bonding layer 1550. The first color filter 1370 is bonded to the second bonding layer 1550 to face the first LED stack 1230. The second bonding layer 1550 may be previously formed on the first LED stack 1230 so that the first color filter 1370 may face and be bonded to the second bonding layer 1550. The second substrate 1310 may be separated from the second LED stack 1330 by a laser lift-off or chemical lift-off process.

Then, referring to FIG. 36 and FIG. 37C, the third LED stack 1430 is coupled to the second LED stack 1330 via a third bonding layer 1570. The second color filter 1470 is bonded to the third bonding layer 1570 to face the second LED stack 1330. The third bonding layer 1570 may be previously disposed on the second LED stack 1330 so that the second color filter 1470 may face and be bonded to the third bonding layer 1570. The third substrate 1410 may be separated from the third LED stack 1430 by a laser lift-off or chemical lift-off process. As such a light emitting diode stack for a display may be formed as shown in FIG. 36, which has the n-type semiconductor layer of the third LED stack 1430 exposed to the outside.

A display apparatus according to an exemplary embodiment may be provided by patterning the stack of the first to third LED stacks 1230, 1330, and 1430 on the support substrate 1510 in pixel units, followed by connecting the first to third LED stacks to one another through interconnections. Hereinafter, a display apparatus according to exemplary embodiments will be described.

Figure 38:
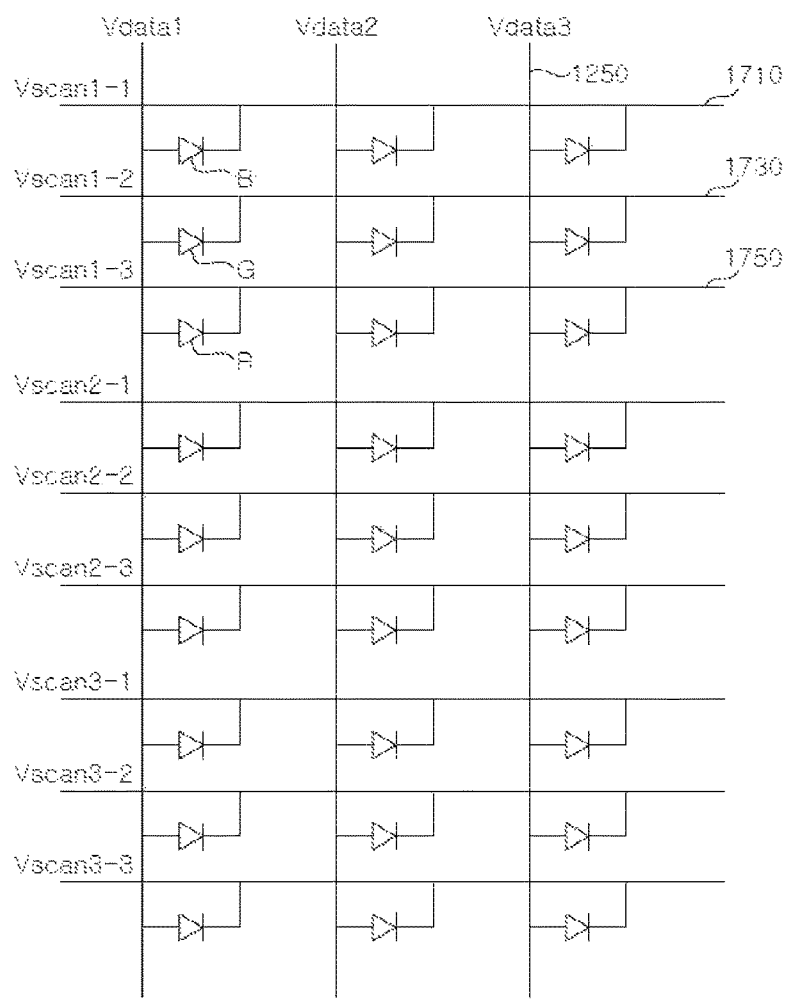
FIG. 38 is a schematic circuit diagram of a display apparatus according to an exemplary embodiment.
Figure 39:
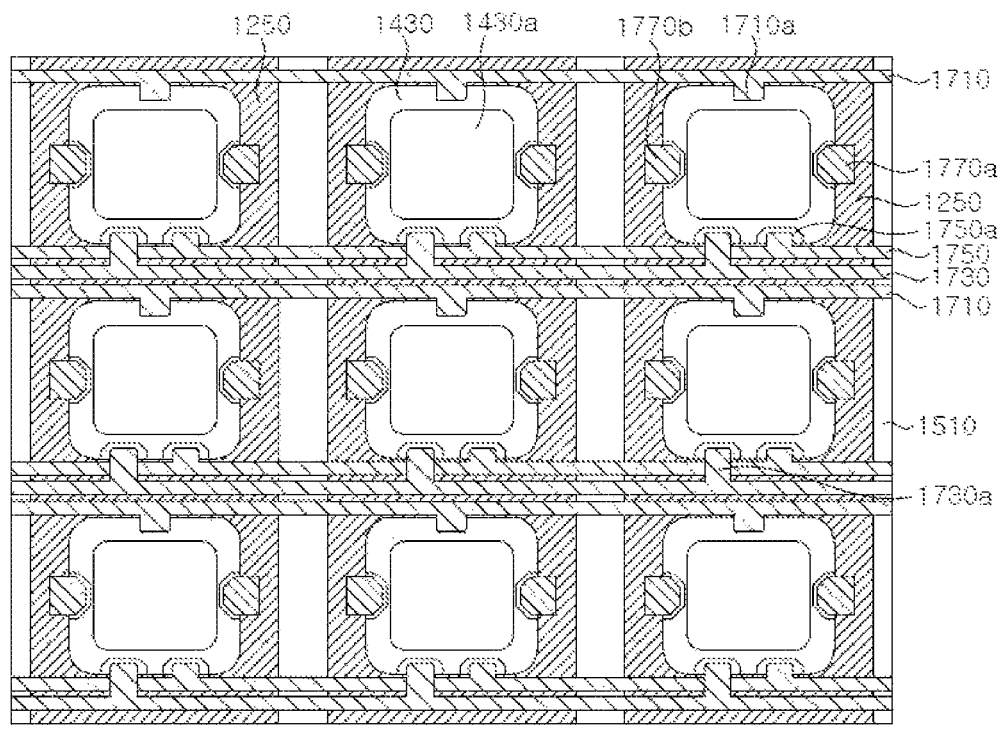
FIG. 39 is a schematic plan view of the display apparatus according to an exemplary embodiment.

FIG. 38 is a schematic circuit diagram of a display apparatus according to an exemplary embodiment, and FIG. 39 is a schematic plan view of the display apparatus according to an exemplary embodiment.

Referring to FIG. 38 and FIG. 39, a display apparatus according to an exemplary embodiment may be operated in a passive matrix manner.

For example, since the light emitting diode stack for a display of FIG. 36 includes the first to third LED stacks 1230, 1330, and 1430 stacked in the vertical direction, one pixel may include three light emitting diodes R, G, and B. A first light emitting diode R may correspond to the first LED stack 1230, a second light emitting diode G may correspond to the second LED stack 1330, and a third light emitting diode B may correspond to the third LED stack 1430.

In FIGS. 38 and 39, one pixel includes the first to third light emitting diodes R, G, and B, each of which corresponds to a subpixel. Anodes of the first to third light emitting diodes R, G, and B are connected to a common line, for example, a data line, and cathodes thereof are connected to different lines, for example, scan lines. More particularly, in a first pixel, the anodes of the first to third light emitting diodes R, G, and B are commonly connected to a data line Vdata1 and the cathodes thereof are connected to scan lines Vscan1-1, Vscan1-2, and Vscan1-3, respectively. As such, the light emitting diodes R, G, and B in each pixel can be driven independently.

In addition, each of the light emitting diodes R, G, and B may be driven by a pulse width modulation or by changing the magnitude of electric current, thereby controlling the brightness of each subpixel.

Referring to FIG. 39, a plurality of pixels is formed by patterning the light emitting diode stack 1000 of FIG. 36, and each of the pixels is connected to the reflective electrodes 1250 and interconnection lines 1710, 1730, and 1750. As shown in FIG. 38, the reflective electrode 1250 may be used as the data line Vdata and the interconnection lines 1710, 1730, and 1750 may be formed as the scan lines.

The pixels may be arranged in a matrix form, in which the anodes of the light emitting diodes R, G, and B of each pixel are commonly connected to the reflective electrode 1250, and the cathodes thereof are connected to the interconnection lines 1710, 1730, and 1750 separated from one another. Here, the interconnection lines 1710, 1730, and 1750 may be used as the scan lines Vscan.

Figure 40:
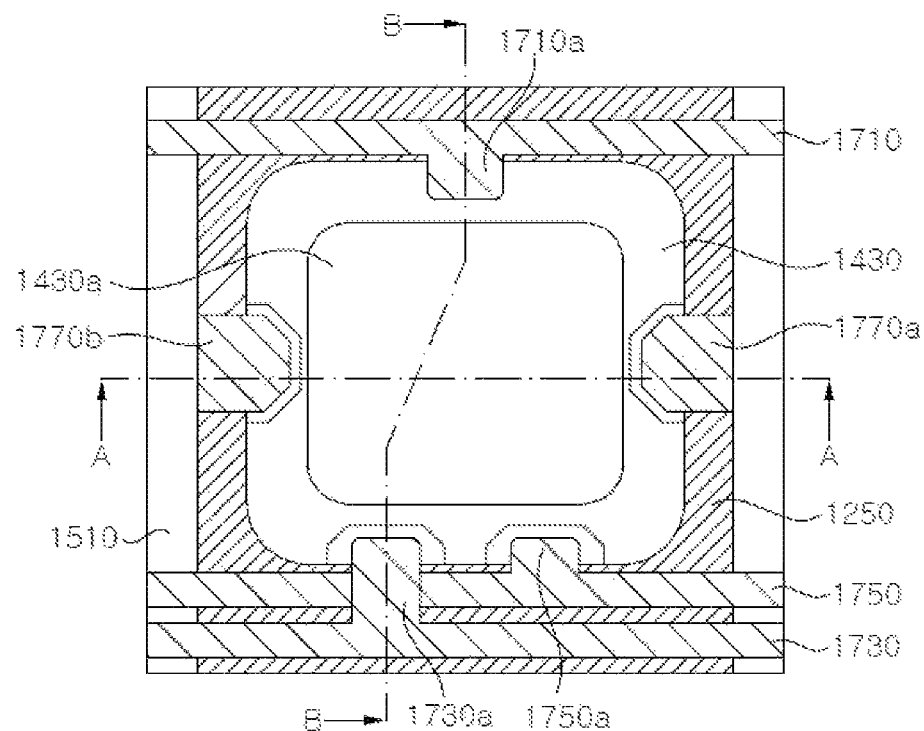
FIG. 40 is an enlarged plan view of one pixel of the display apparatus of FIG. 39 according to an exemplary embodiment.
Figure 41:
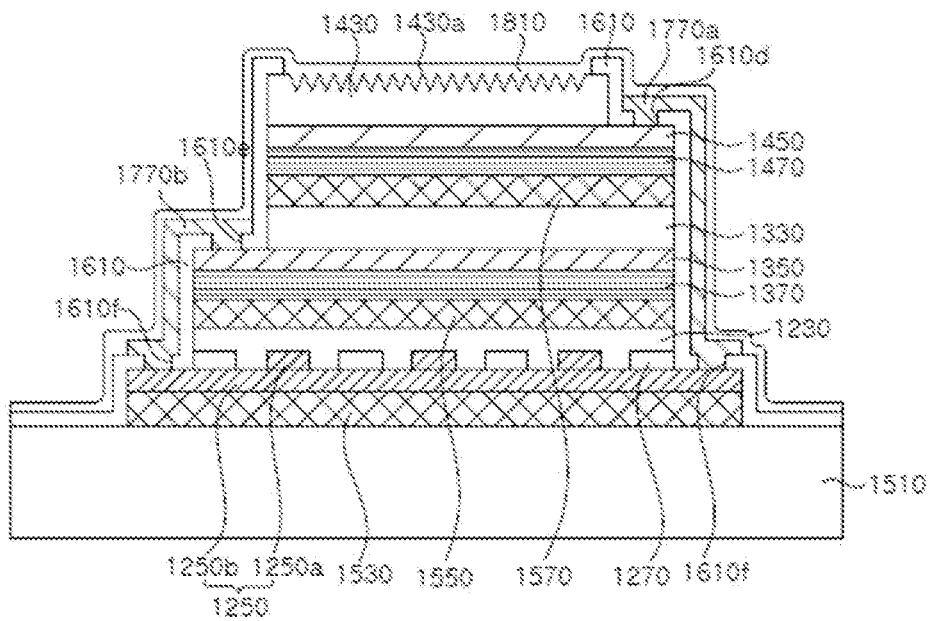
FIG. 41 is a schematic cross-sectional view taken along line A-A of FIG. 40.
Figure 42:
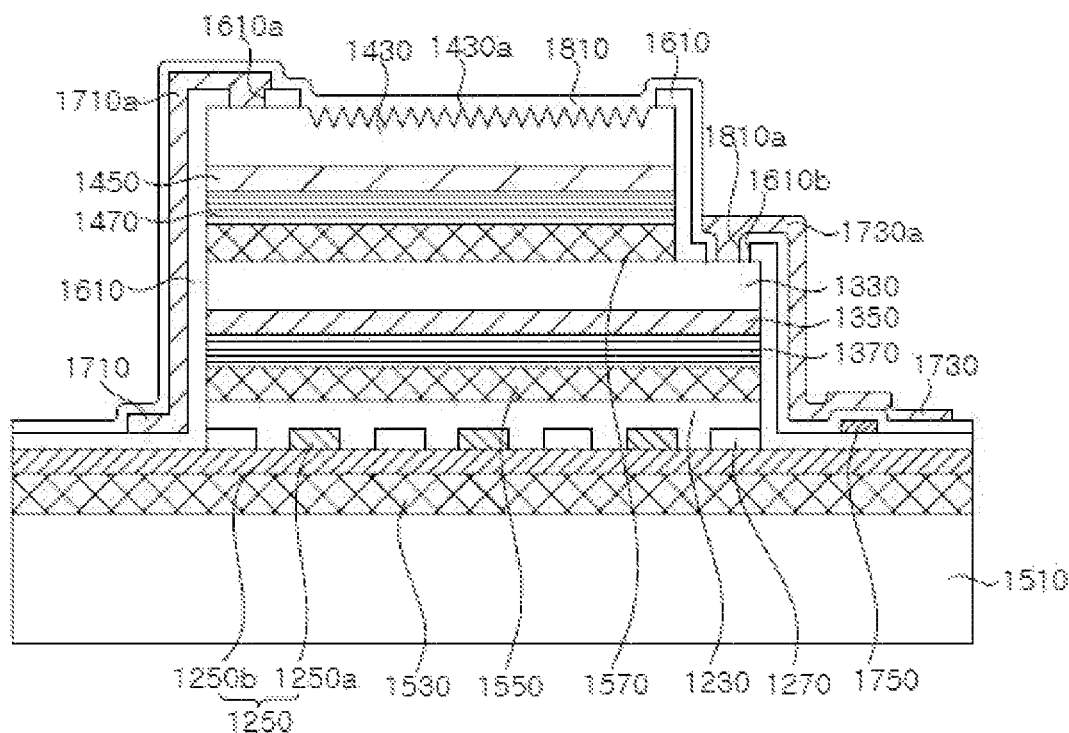
FIG. 42 is a schematic cross-sectional view taken along line B-B of FIG. 40.

FIG. 40 is an enlarged plan view of one pixel of the display apparatus of FIG. 39, FIG. 41 is a schematic cross-sectional view taken along line A-A of FIG. 40, and FIG. 42 is a schematic cross-sectional view taken along line B-B of FIG. 40.

Referring to FIG. 39, FIG. 40, FIG. 41, and FIG. 42, in each pixel, a portion of the reflective electrode 1250, the ohmic electrode 1290 formed on the upper surface of the first LED stack 1230 (see FIG. 43H), a portion of the second-p transparent electrode 1350 (see also FIG. 43H), a portion of the upper surface of the second LED stack 1330 (see FIG. 43J), a portion of the third-p transparent electrode 1450 (see FIG. 43H), and the upper surface of the third LED stack 1430 are exposed to the outside.

The third LED stack 1430 may have a roughened surface 1430a on the upper surface thereof. The roughened surface 1430a may be formed over the entirety of the upper surface of the third LED stack 1430 or may be formed in some regions thereof, as shown in FIG. 41.

A lower insulation layer 1610 may cover a side surface of each pixel. The lower insulation layer 1610 may be formed of a light transmissive material, such as $SiO_2$. In this case, the lower insulation layer 1610 may cover the entire upper surface of the third LED stack 1430. Alternatively, the lower insulation layer 1610 may include a distributed Bragg reflector to reflect light traveling towards the side surfaces of the first to third LED stacks 1230, 1330, and 1430. In this case, the lower insulation layer 1610 partially exposes the upper surface of the third LED stack 1430.

The lower insulation layer 1610 may include an opening 1610a which exposes the upper surface of the third LED stack 1430, an opening 1610b which exposes the upper surface of the second LED stack 1330, an opening 1610c (see FIG. 43H) which exposes the ohmic electrode 1290 of the first LED stack 1230, an opening 1610d which exposes the third-p transparent electrode 1450, an opening 1610e which exposes the second-p transparent electrode 1350, and openings 1610f which expose the first-p reflective electrode 1250.

The interconnection lines 1710 and 1750 may be formed near the first to third LED stacks 1230, 1330, and 1430 on the support substrate 1510, and may be disposed on the lower insulation layer 1610 to be insulated from the first-p reflective electrode 1250. A connecting portion 1770a connects the third-p transparent electrode 1450 to the reflective electrode 1250, and a connecting portion 1770b connects the second-p transparent electrode 1350 to the reflective electrode 1250, such that the anodes of the first LED stack 1230, the second LED stack 1330, and the third LED stack 1430 are commonly connected to the reflective electrode 1250.

A connecting portion 1710a connects the upper surface of the third LED stack 1430 to the interconnection line 1710, and a connecting portion 1750a connects the ohmic electrode 1290 on the first LED stack 1230 to the interconnection line 1750.

An upper insulation layer 1810 may be disposed on the interconnection lines 1710 and 1750 and the lower insulation layer 1610 to cover the upper surface of the third LED stack 1430. The upper insulation layer 1810 may have an opening 1810a which partially exposes the upper surface of the second LED stack 1330.

The interconnection line 1730 may be disposed on the upper insulation layer 1810, and the connecting portion 1730a may connect the upper surface of the second LED stack 1330 to the interconnection line 1730. The connecting portion 1730a may pass through an upper portion of the interconnection line 1750, and is insulated from the interconnection line 1750 by the upper insulation layer 1810.

Although the electrodes of each pixel according to the illustrated exemplary embodiment are described as being connected to the data line and the scan lines, various implementations are possible. In addition, although the interconnection lines 1710 and 1750 are described as being formed on the lower insulation layer 1610, and the interconnection line 1730 is formed on the upper insulation layer 1810, the inventive concepts are not limited thereto. For example, each of the interconnection lines 1710, 1730, and 1750 may be formed on the lower insulation layer 1610, and covered by the upper insulation layer 1810, which may have openings to expose the interconnection line 1730. In this structure, the connecting portion 1730a may connect the upper surface of the second LED stack 1330 to the interconnection line 1730 through the openings of the upper insulation layer 1810.

Alternatively, the interconnection lines 1710, 1730, and 1750 may be formed inside the support substrate 1510, and the connecting portions 1710a, 1730a, and 1750a on the lower insulation layer 1610 may connect the ohmic electrode 1290, the upper surface of the second LED stack 1330, and the upper surface of the third LED stack 1430 to the interconnection lines 1710, 1730, and 1750.

FIG. 43A to FIG. 43K are schematic plan views illustrating a method of manufacturing a display apparatus including the pixel of FIG. 40 according to an exemplary embodiment.

First, the light emitting diode stack 1000 described in FIG. 36 is prepared.

Figure 43A:
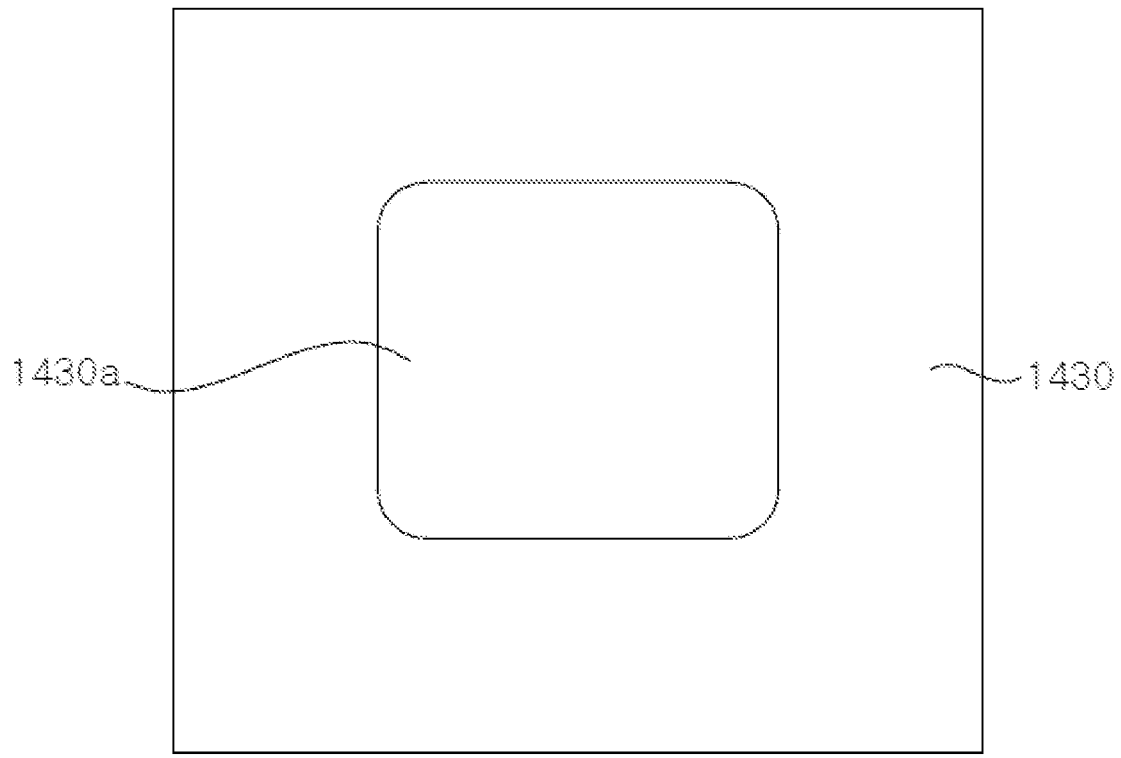
FIGS. 43A, 43B, 43C, 43D, 43E, 43F, 43G, 43H, 43I, 43J, and 43K are schematic plan views illustrating a method of manufacturing a display apparatus according to an exemplary embodiment.

Then, referring to FIG. 43A, a roughened surface 1430a may be formed on the upper surface of the third LED stack 1430. The roughened surface 1430a may be formed on the upper surface of the third LED stack 1430 so as to correspond to each pixel region. The roughened surface 1430a may be formed by chemical etching, for example, photo-enhanced chemical etching (PEC) or the like.

The roughened surface 1430a may be partially formed in each pixel region by taking into account a region of the third LED stack 1430 to be etched in the subsequent process, without being limited thereto. Alternatively, the roughened surface 1430a may be formed over the entire upper surface of the third LED stack 1430.

Figure 43B:
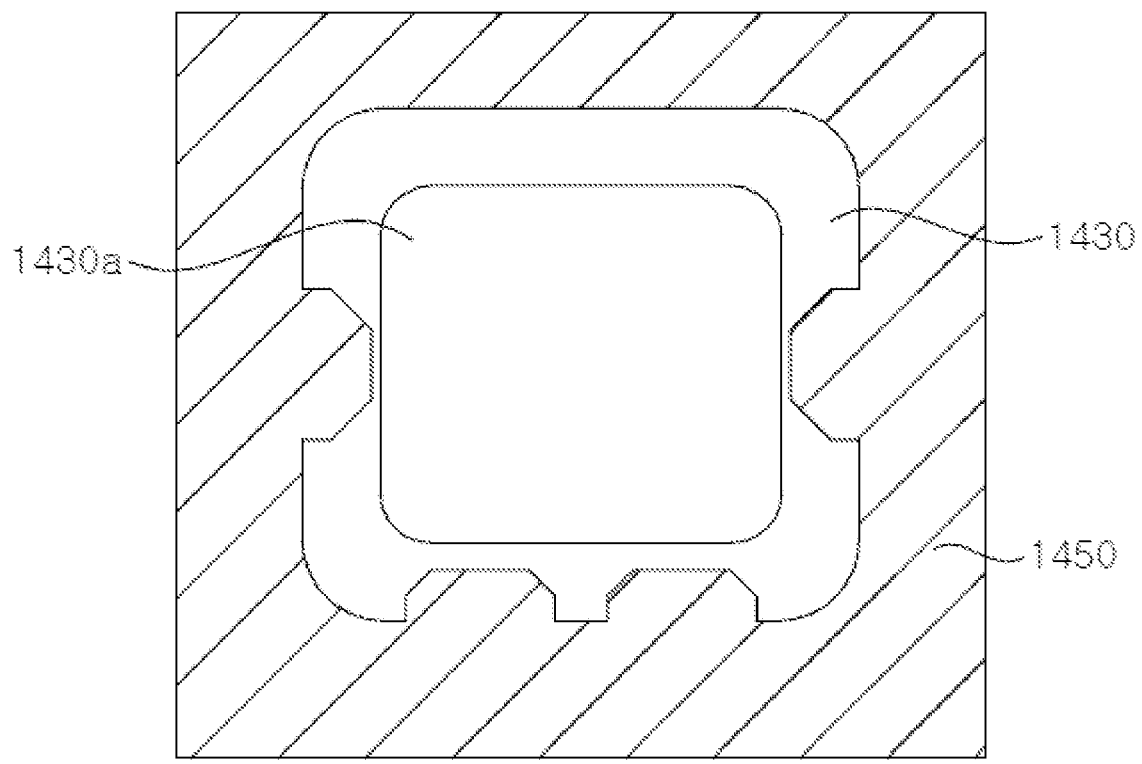

Referring to FIG. 43B, a surrounding region of the third LED stack 1430 in each pixel is removed by etching to expose the third-p transparent electrode 1450. As shown in FIG. 43B, the third LED stack 1430 may be remained to have a rectangular shape or a square shape. The third LED stack 1430 may have a plurality of depressions along edges thereof.

Figure 43C:
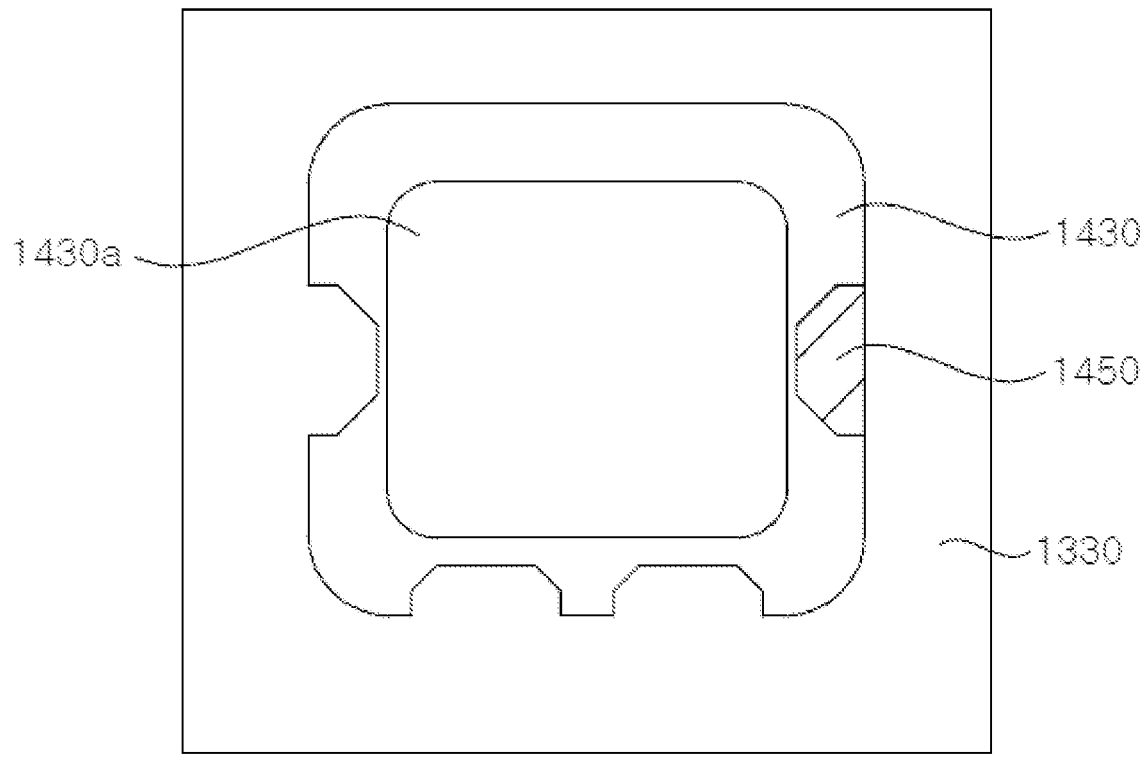

Referring to FIG. 43C, the upper surface of the second LED stack 1330 is exposed by removing the exposed third-p transparent electrode 1450 in areas other than one depression of the third LED stack 1430. Accordingly, the upper surface of the second LED stack 1330 is exposed around the third LED stack 1430 and in other depressions excluding the depression in which the third-p transparent electrode 1450 partially remains.

Figure 43D:
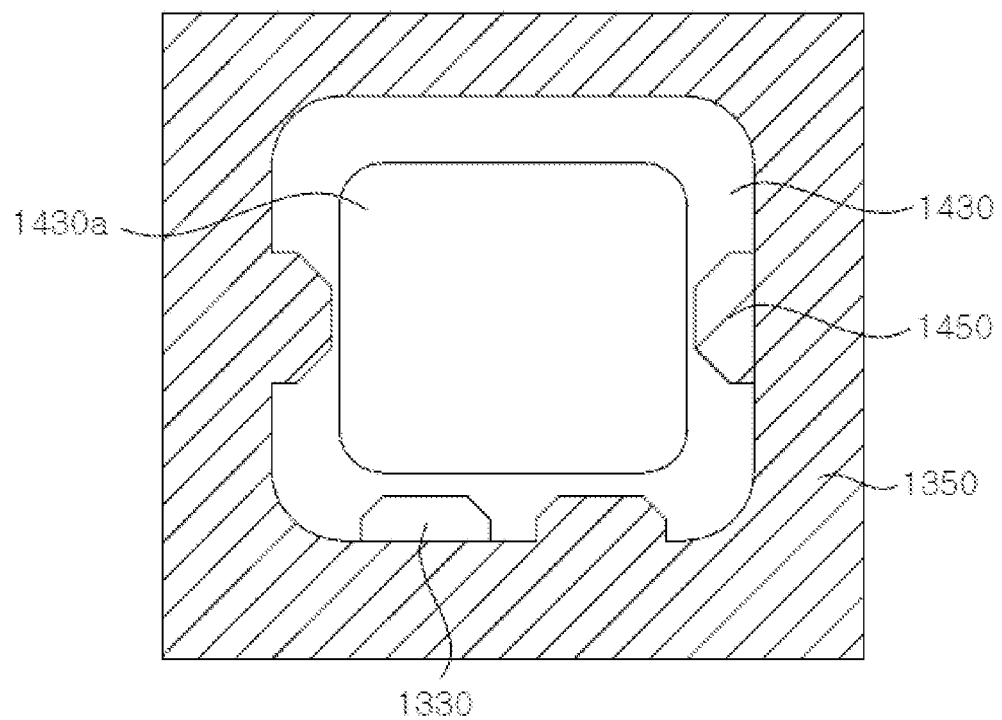

Referring to FIG. 43D, the second-p transparent electrode 1350 is exposed by removing the exposed second LED stack 1330 in areas other than another depression of the third LED stack 1430.

Figure 43E:
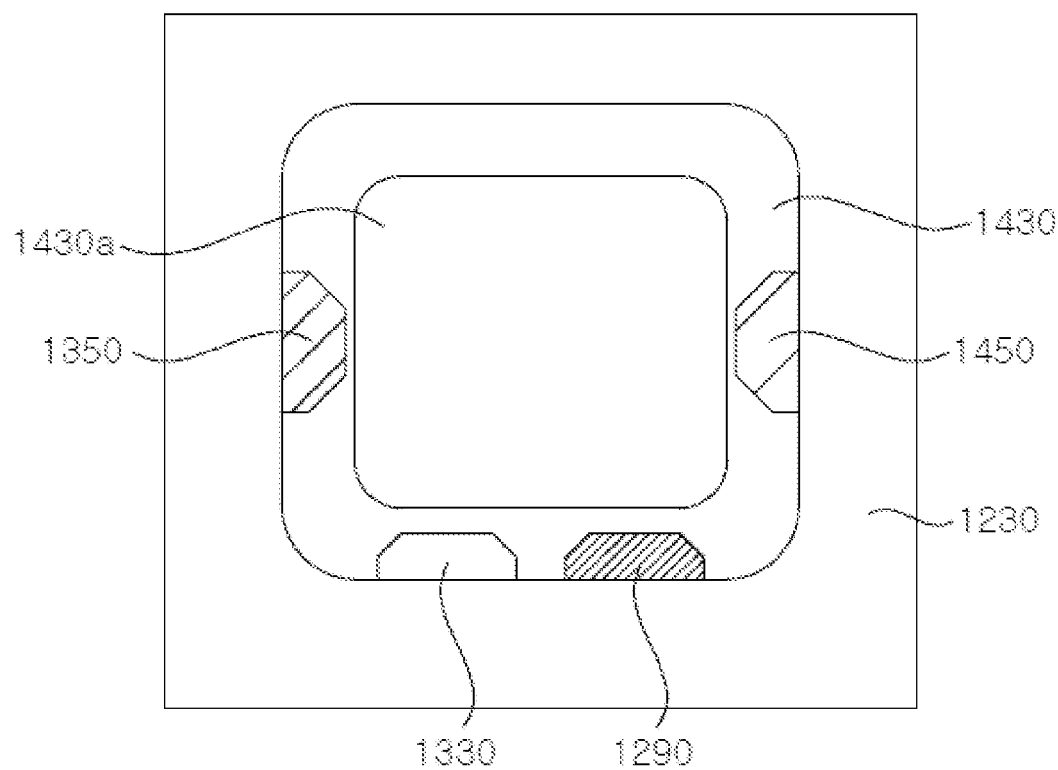

Referring to FIG. 43E, the ohmic electrode 1290 is exposed together with the upper surface of the first LED stack 1230 by removing the exposed second-p transparent electrode 1350 in areas other than still another depression of the third LED stack 1430. In this case, the ohmic electrode 1290 may be exposed in one depression. Accordingly, the upper surface of the first LED stack 1230 is exposed around the third LED stack 1430, and an upper surface of the ohmic electrode 1290 is exposed in at least one of the depressions formed in the third LED stack 1430.

Figure 43F:
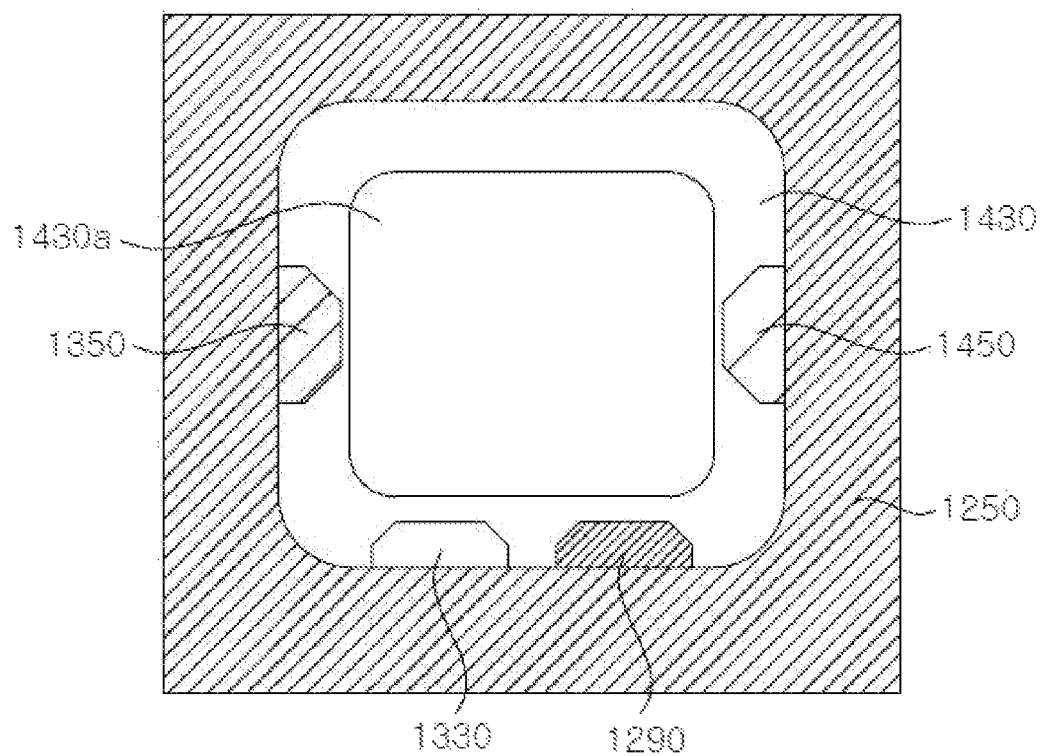

Referring to FIG. 43F, the reflective electrode 1250 is exposed by removing an exposed portion of the first LED stack 1230 other than the ohmic electrode 1290 exposed in one depression. The reflective electrode 1250 is exposed around the third LED stack 1430.

Figure 43G:
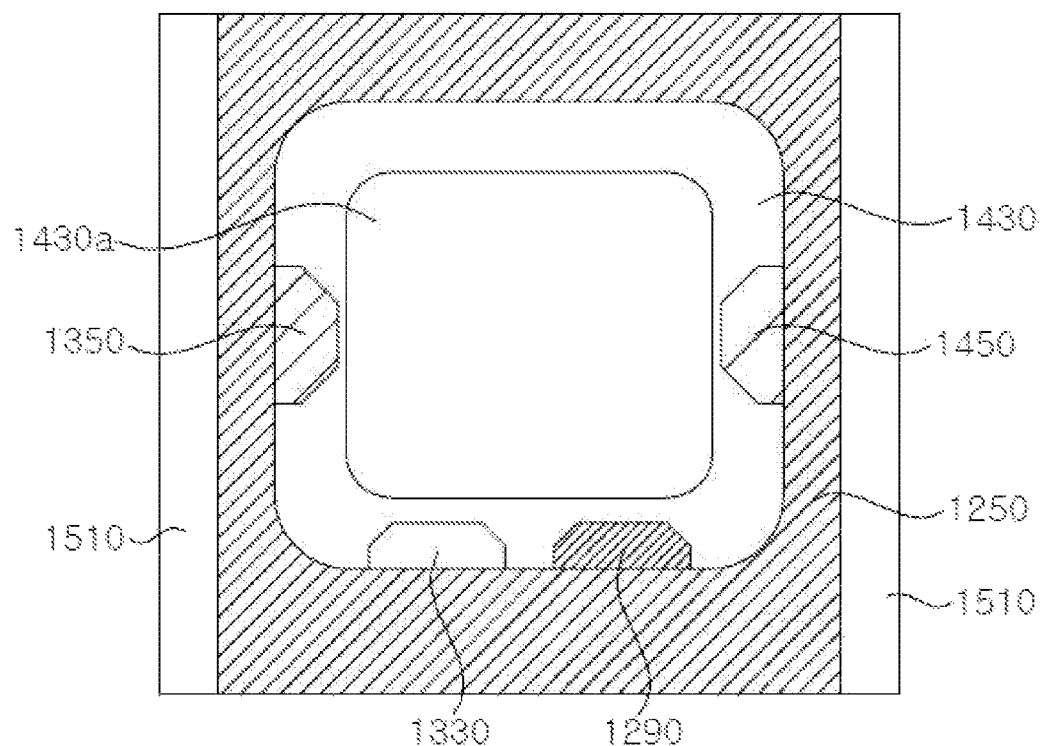

Referring to FIG. 43G, linear interconnection lines are formed by patterning the reflective electrode 1250. Here, the support substrate 1510 may be exposed. The reflective electrode 1250 may connect pixels arranged in one row to each other among pixels arranged in a matrix (see FIG. 39).

Figure 43H:
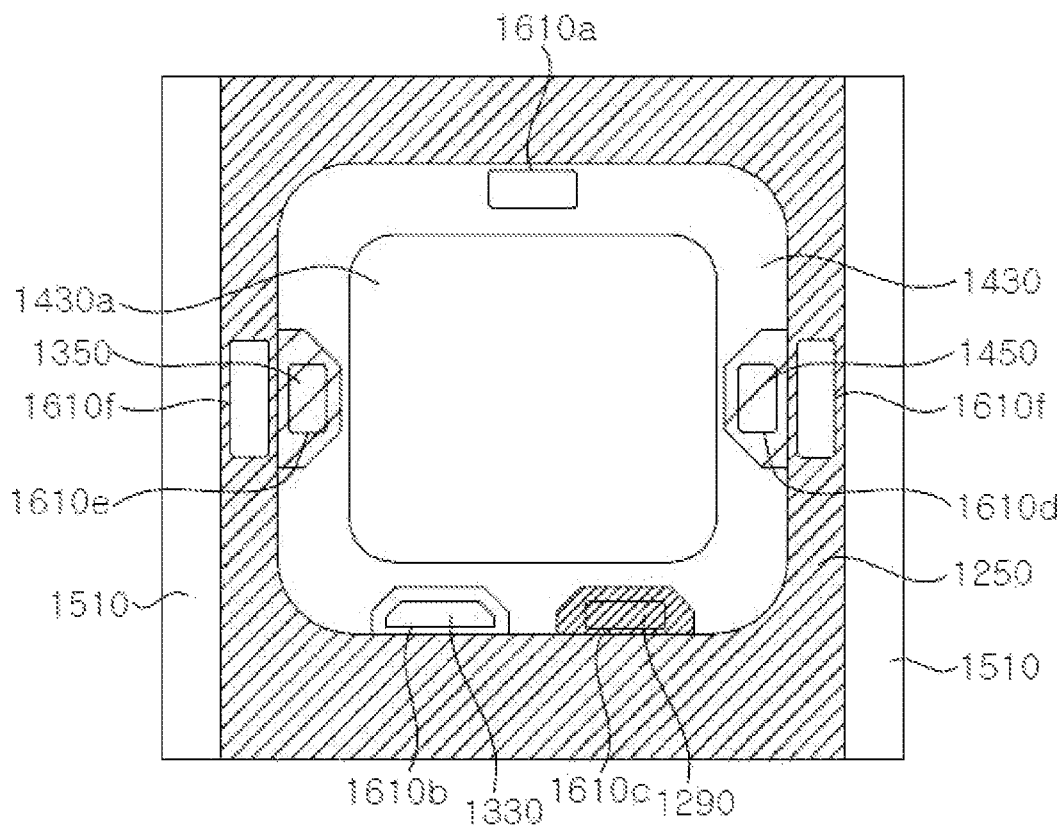

Referring to FIG. 43H, a lower insulation layer 1610 (see FIG. 41 and FIG. 42) is formed to cover the pixels. The lower insulation layer 1610 covers the reflective electrode 1250 and side surfaces of the first to third LED stacks 1230, 1330, and 1430. In addition, the lower insulation layer 1610 may at least partially cover the upper surface of the third LED stack 1430. If the lower insulation layer 1610 is a transparent layer such as a SiO$_2$ layer, the lower insulation layer 1610 may cover the entire upper surface of the third LED stack 1430. Alternatively, when the lower insulation layer 1610 includes a distributed Bragg reflector, the lower insulation layer 1610 may at least partially expose the upper surface of the third LED stack 1430 such that light may be emitted to the outside.

The lower insulation layer 1610 may include an opening 1610a which exposes the third LED stack 1430, an opening 1610b which exposes the second LED stack 1330, an opening 1610c which exposes the ohmic electrode 1290, an opening 1610d which exposes the third-p transparent electrode 1450, an opening 1610e which exposes the second-p transparent electrode 1350, and an opening 1610f which exposes the reflective electrode 1250. One or more openings 1610f may be formed to expose the reflective electrode 1250.

Figure 43I:
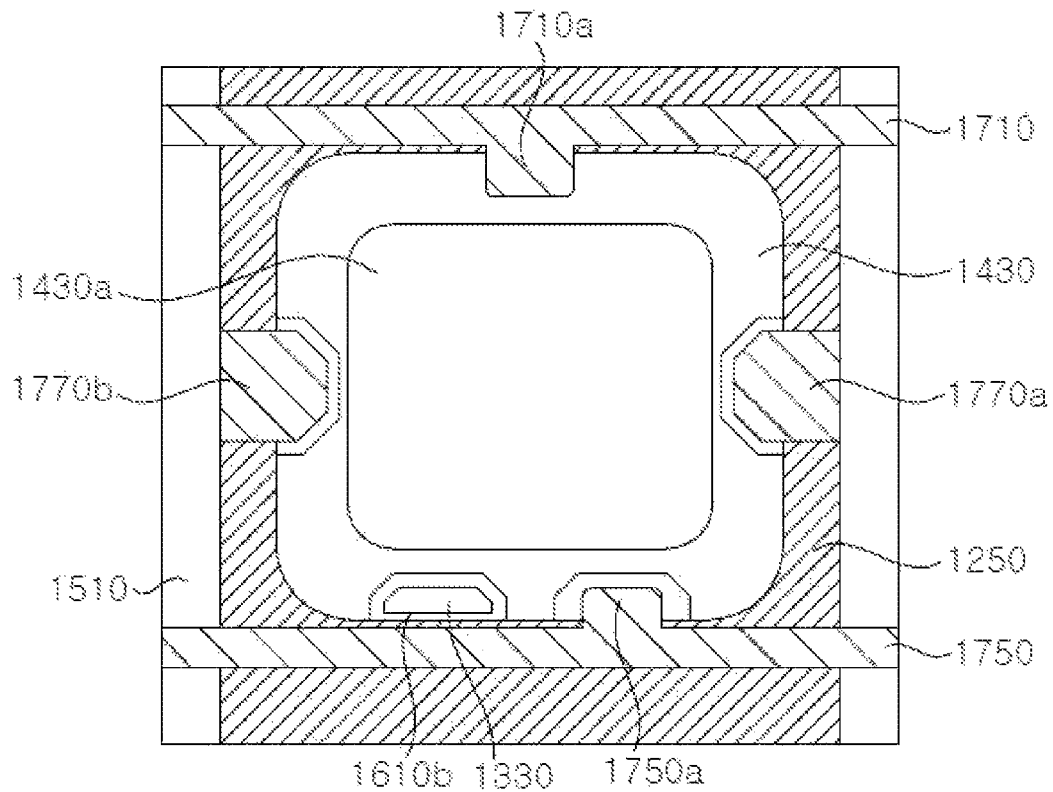

Referring to FIG. 43I, interconnection lines 1710, 1750 and connecting portions 1710a, 1750a, 1770a, and 1770b are formed. These may be formed by a lift-off process or the like. The interconnection lines 1710 and 1750 are insulated from the reflective electrode 1250 by the lower insulation layer 1610. The connecting portion 1710a electrically connects the third LED stack 1430 to the interconnection line 1710, and the connecting portion 1750a electrically connects the ohmic electrode 1290 to the interconnection line 1750 such that the first LED stack 1230 is electrically connected to the interconnection line 1750. The connecting portion 1770a electrically connects the third-p transparent electrode 1450 to the first-p reflective electrode 1250, and the connecting portion 1770b electrically connects the second-p transparent electrode 1350 to the first-p reflective electrode 1250.

Figure 43J:
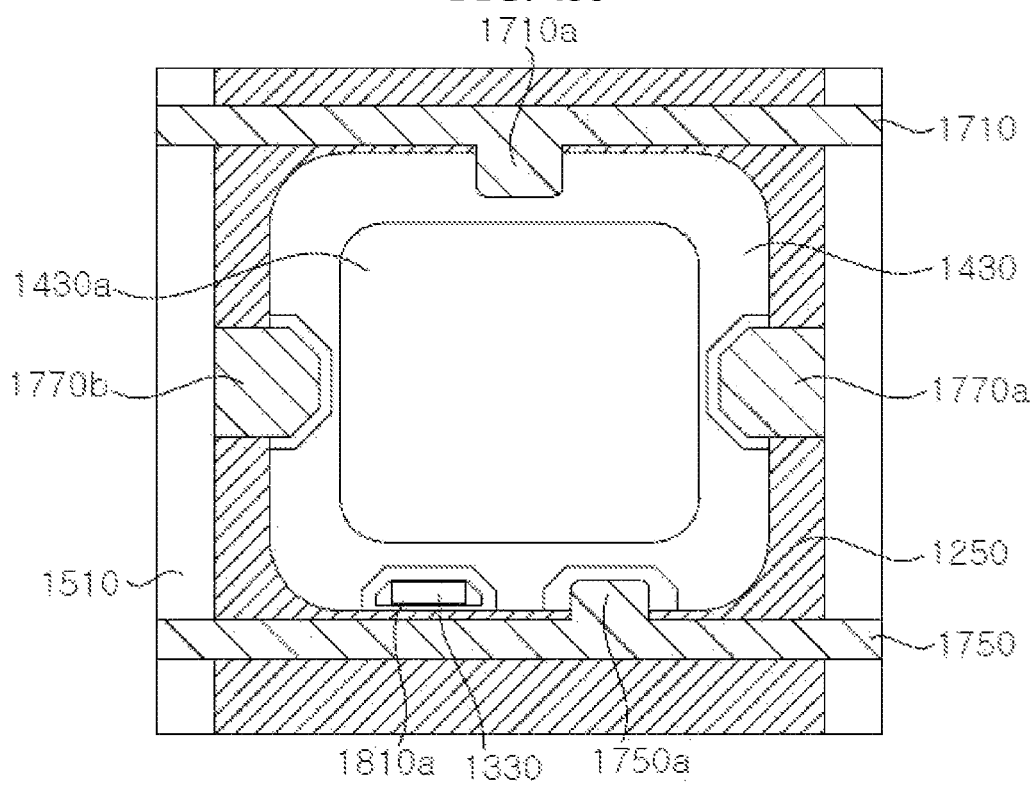

Referring to FIG. 43J, an upper insulation layer 1810 (see FIG. 41 and FIG. 42) covers the interconnection lines 1710 and 1750 and the connecting portions 1710a, 1750a, 1770a, and 1770b. The upper insulation layer 1810 may also cover the entire upper surface of the third LED stack 1430. The upper insulation layer 1810 has an opening 1810a which exposes the upper surface of the second LED stack 1330. The upper insulation layer 1810 may be formed of, for example, silicon oxide or silicon nitride, and may include a distributed Bragg reflector. When the upper insulation layer 1810 includes the distributed Bragg reflector, the upper insulation layer 1810 may expose at least part of the upper surface of the third LED stack 1430 such that light may be emitted to the outside.

Figure 43K:
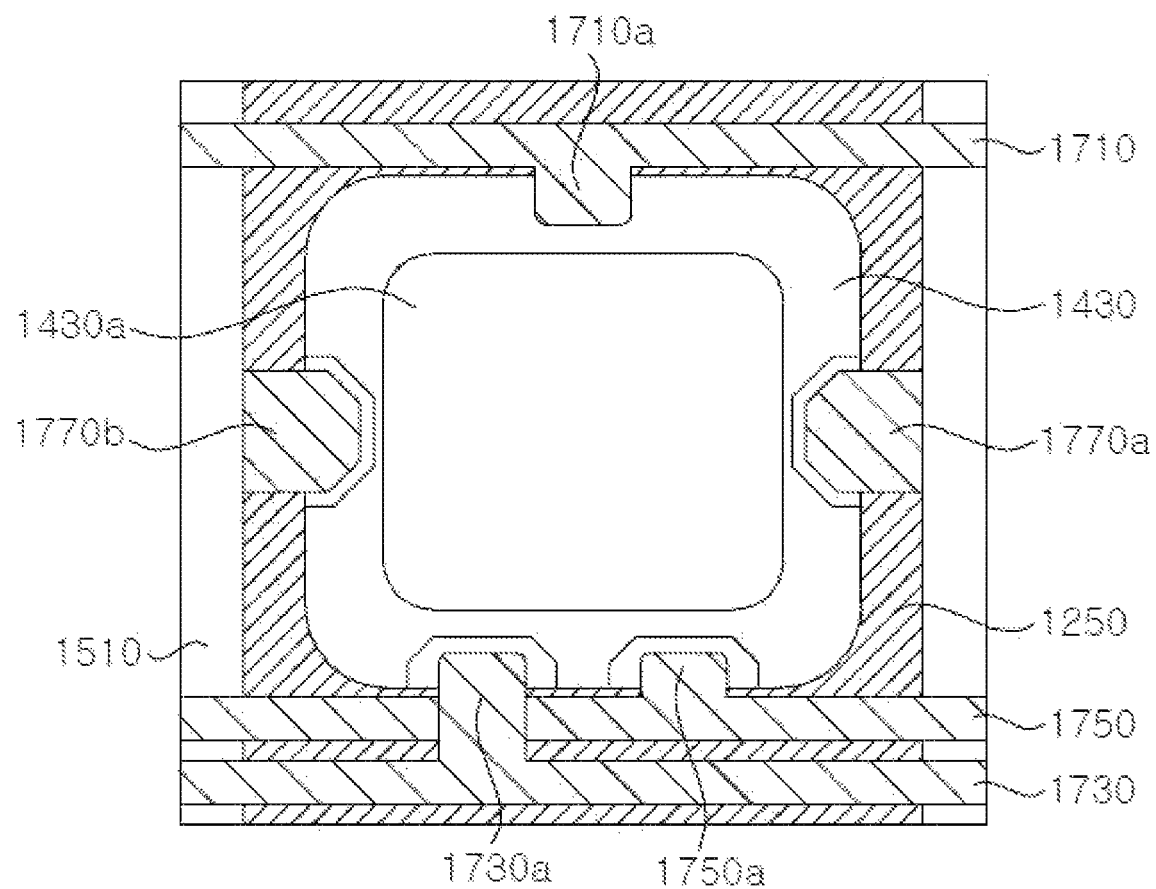

Referring to FIG. 43K, an interconnection line 1730 and a connecting portion 1730a are formed. The interconnection line 1730 and the connecting portion 1730a may be formed by a lift-off process or the like. The interconnection line 1730 is disposed on the upper insulation layer 1810, and is insulated from the reflective electrode 1250 and the interconnection lines 1710 and 1750. The connecting portion 1730a electrically connects the second LED stack 1330 to the interconnection line 1730. The connecting portion 1730a may pass through an upper portion of the interconnection line 1750 and is insulated from the interconnection line 1750 by the upper insulation layer 1810.

As such, a pixel region as shown in FIG. 40 may be formed. In addition, as shown in FIG. 39, a plurality of pixels may be formed on the support substrate 1510 and may be connected to one another by the first-p the reflective electrode 1250 and the interconnection lines 1710, 1730, and 1750 to be operated in a passive matrix manner.

Although the display apparatus above has been described as being configured to be operated in the passive matrix manner, the inventive concepts are not limited thereto. More particularly, a display apparatus according to some exemplary embodiments may be manufactured in various ways so as to be operated in the passive matrix manner using the light emitting diode stack shown in FIG. 36.

For example, although the interconnection line 1730 is illustrated as being formed on the upper insulation layer 1810, the interconnection line 1730 may be formed together with the interconnection lines 1710 and 1750 on the lower insulation layer 1610, and the connecting portion 1730a may be formed on the lower insulation layer 1610 to connect the second LED stack 1330 to the interconnection line 1730.

Alternatively, the interconnection lines 1710, 1730, and 1750 may be disposed inside the support substrate 1510.

Figure 44:
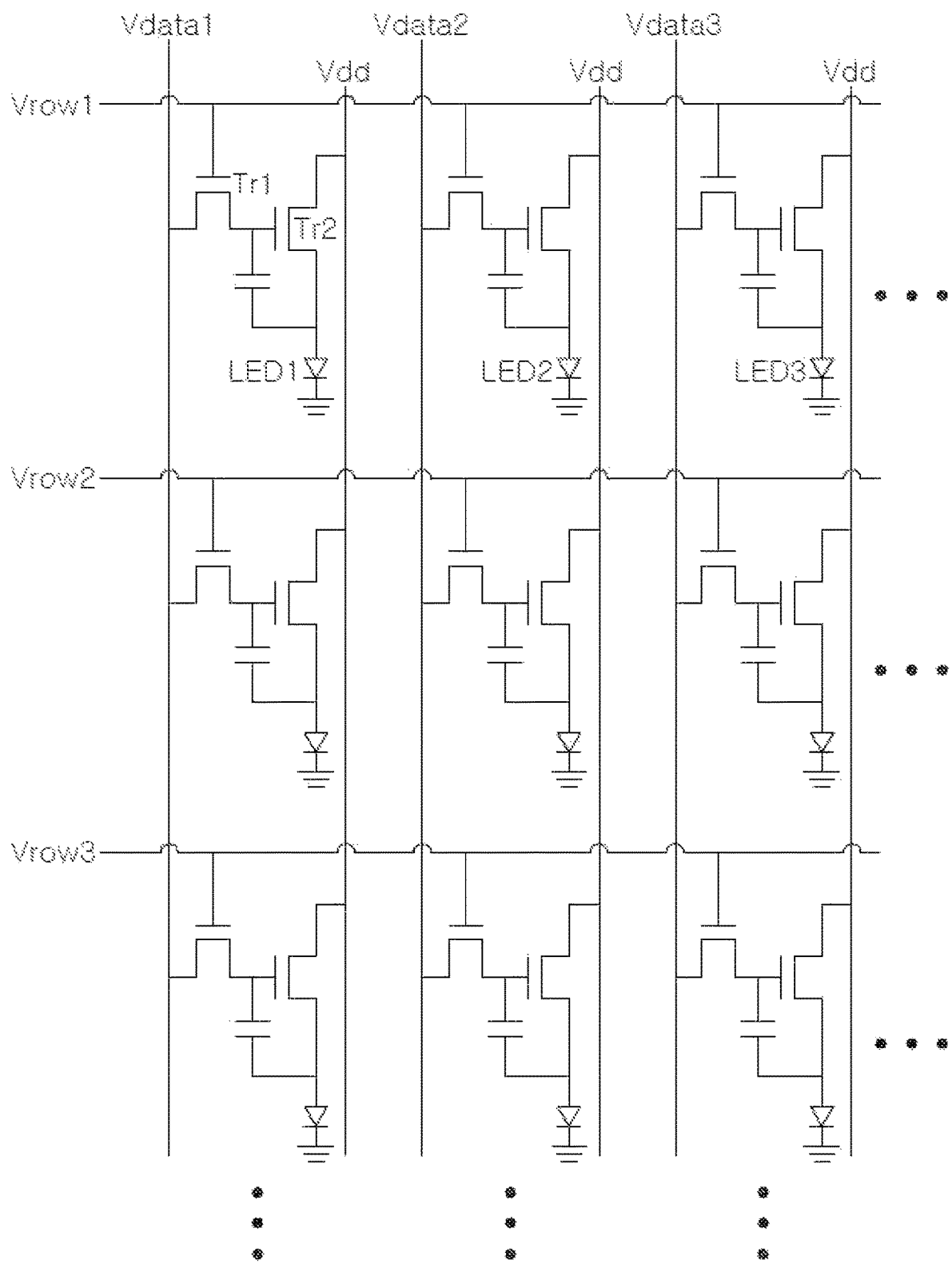
FIG. 44 is a schematic circuit diagram of a display apparatus according to another exemplary embodiment.

FIG. 44 is a schematic circuit diagram of a display apparatus according to another exemplary embodiment. The display apparatus according to the illustrated exemplary embodiment may be driven in an active matrix manner.

Referring to FIG. 44, the drive circuit according to an exemplary embodiment includes at least two transistors Tr1, Tr2 and a capacitor. When a power source is connected to selection lines Vrow1 to Vrow3, and voltage is applied to data lines Vdata1 to Vdata3, the voltage is applied to the corresponding light emitting diode. In addition, the corresponding capacitor is charged according to the values of Vdata1 to Vdata3. Since a turned-on state of a transistor Tr2 can be maintained by the charged voltage of the capacitor, the voltage of the capacitor can be maintained and applied to the light emitting diodes LED1 to LED3 even when power supplied to Vrow1 is cut off. In addition, electric current flowing in the light emitting diodes LED1 to LED3 can be changed depending upon the values of Vdata1 to Vdata3. Electric current can be continuously supplied through Vdd, such that light may be emitted continuously.

The transistors Tr1, Tr2 and the capacitor may be formed inside the support substrate 1510. For example, thin film transistors formed on a silicon substrate may be used for active matrix driving.

The light emitting diodes LED1 to LED3 may correspond to the first to third LED stacks 1230, 1330, and 1430 stacked in one pixel, respectively. The anodes of the first to third LED stacks are connected to the transistor Tr2 and the cathodes thereof are connected to the ground.

Although FIG. 44 shows the circuit for active matrix driving according to an exemplary embodiment, other various types of circuits may be used. In addition, although the anodes of the light emitting diodes LED1 to LED3 are described as being connected to different transistors Tr2, and the cathodes thereof are described as being connected to the ground, the inventive concepts are not limited thereto, and the anodes of the light emitting diodes may be connected to current supplies Vdd and the cathodes thereof may be connected to different transistors.

Figure 45:
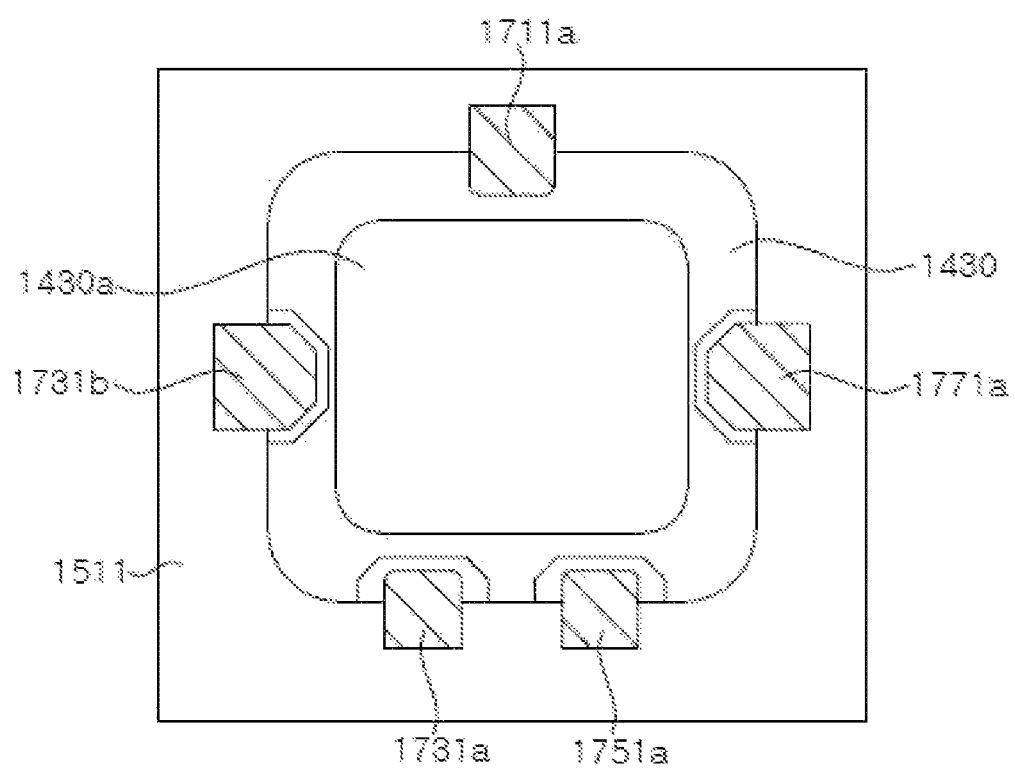
FIG. 45 is a schematic plan view of a display apparatus according to another exemplary embodiment.

FIG. 45 is a schematic plan view of a pixel of a display apparatus according to another exemplary embodiment. The pixel described herein may be one of a plurality of pixels arranged on the support substrate 1511.

Referring to FIG. 45, the pixels according to the illustrated exemplary embodiment are substantially similar to the pixels described with reference to FIG. 39 to FIG. 42, except that the support substrate 1511 is a thin film transistor panel including transistors and capacitors, and the reflective electrode is disposed in a lower region of the first LED stack.

The cathode of the third LED stack is connected to the support substrate 1511 through the connecting portion 1711*a*. For example, as shown in FIG. 45, the cathode of the third LED stack may be connected to the ground through electrical connection to the support substrate 1511. The cathodes of the second LED stack and the first LED stack may also be connected to the ground through electrical connection to the support substrate 1511 via the connecting portions 1731*a* and 1751*a*.

The reflective electrode is connected to the transistors Tr2 (see FIG. 44) inside the support substrate 1511. The third-p transparent electrode and the second-p transparent electrode are also connected to the transistors Tr2 (see FIG. 44) inside the support substrate 1511 through the connecting portions 1771*a* and 1731*b*.

In this manner, the first to third LED stacks are connected to one another, thereby constituting a circuit for active matrix driving, as shown in FIG. 44.

Although FIG. 45 shows electrical connection of a pixel for active matrix driving according to an exemplary embodiment, the inventive concepts are not limited thereto, and the circuit for the display apparatus can be modified into various circuits for active matrix driving in various ways.

In addition, while the reflective electrode 1250, the second-p transparent electrode 1350, and the third-p transparent electrode 1450 of FIG. 36 are described as forming ohmic contact with the corresponding p-type semiconductor layer of each of the first LED stack 1230, the second LED stack 1330, and the third LED stack 1430, and the ohmic electrode 1290 forms ohmic contact with the n-type semiconductor layer of the first LED stack 1230, the n-type semiconductor layer of each of the second LED stack 1330 and the third LED stack 1430 is not provided with a separate ohmic contact layer. When the pixels have a small size of 200 μm or less, there is less difficulty in current spreading even without formation of a separate ohmic contact layer in the n-type semiconductor layer. However, according to some exemplary embodiments, a transparent electrode layer may be disposed on the n-type semiconductor layer of each of the LED stacks in order to secure current spreading.

In addition, although the first to third LED stacks 1230, 1330, and 1430 are coupled to each other via bonding layers 1530, 1550, and 1570, the inventive concepts are not limited thereto, and the first to third LED stacks 1230, 1330, and 1430 may be connected to one another in various sequences and using various structures.

According to exemplary embodiments, since it is possible to form a plurality of pixels at the wafer level using the light emitting diode stack 1000 for a display, individual mounting of light emitting diodes may be obviated. In addition, the light emitting diode stack according to the exemplary embodiments has the structure in which the first to third LED stacks 1230, 1330, and 1430 are stacked in the vertical direction, thereby securing an area for subpixels in a limited pixel area. Furthermore, the light emitting diode stack according to the exemplary embodiments allows light generated from the first LED stack 1230, the second LED stack 1330, and the third LED stack 1430 to be emitted outside therethrough, thereby reducing light loss.

Figure 46:
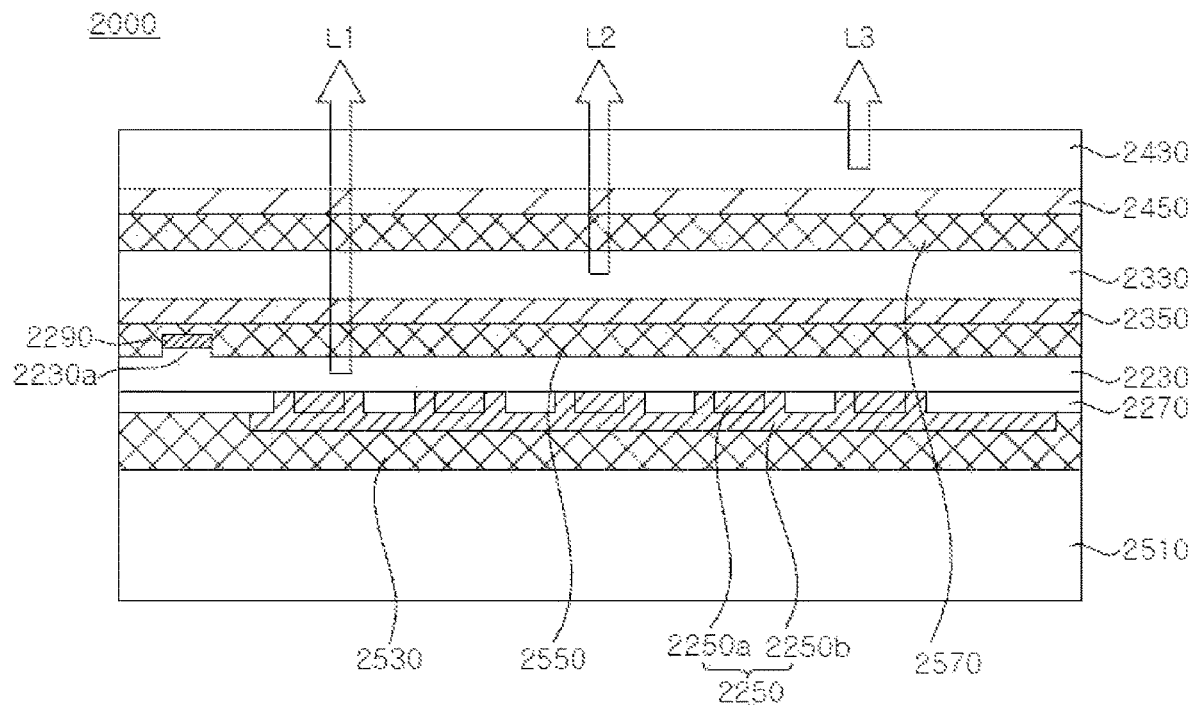
FIG. 46 is a schematic cross-sectional view of a light emitting diode stack for a display according to an exemplary embodiment.

FIG. 46 is a schematic cross-sectional view of a light emitting diode stack for a display according to an exemplary embodiment.

Referring to FIG. 46, the light emitting diode stack 2000 includes a support substrate 2510, a first LED stack 2230, a second LED stack 2330, a third LED stack 2430, a reflective electrode 2250, an ohmic electrode 2290, a second-p transparent electrode 2350, a third-p transparent electrode 2450, an insulation layer 2270, a first bonding layer 2530, a second bonding layer 2550, and a third bonding layer 2570. In addition, the first LED stack 2230 may include an ohmic contact portion 2230*a* for ohmic contact.

In general, light may be generated from the first LED stack by the light emitted from the second LED stack, and light may be generated from the second LED stack by the light emitted from the third LED stack. As such, a color filter may be interposed between the second LED stack and the first LED stack, and between the third LED stack and the second LED stack.

However, while the color filters may prevent interference of light, forming color filters increases manufacturing complexity. A display apparatus according to exemplary embodiments may suppress generation of secondary light between the LED stacks without arrangement of the color filters therebetween.

Accordingly, in some exemplary embodiments, interference of light between the LED stacks can be reduced by controlling the bandgap of each of the LED stacks, which will be described in more detail below.

The support substrate 2510 supports the LED stacks 2230, 2330, and 2430. The support substrate 2510 may include a circuit on a surface thereof or therein, but the inventive concepts are not limited thereto. The support substrate 2510 may include, for example, a Si substrate, a Ge substrate, a sapphire substrate, a patterned sapphire substrate, a glass substrate, or a patterned glass substrate.

Each of the first LED stack 2230, the second LED stack 2330, and the third LED stack 2430 includes an n-type semiconductor layer, a p-type semiconductor layer, and an active layer interposed therebetween. The active layer may have a multi-quantum well structure.

Light L1 generated from the first LED stack 2230 has a longer wavelength than light L2 generated from the second LED stack 2330, which has a longer wavelength than light L3 generated from the third LED stack 2430. However, the inventive concepts are not limited thereto, and when the light emitting diode stack includes micro LEDs, light generated from the first, second, and third LED stacks 2230, 2330, and 2440 may have any wavelength range without adversely affecting operation due to its small form factor.

The first LED stack 2230 may be an inorganic light emitting diode configured to emit red light, the second LED stack 2330 may be an inorganic light emitting diode configured to emit green light, and the third LED stack 2430 may be an inorganic light emitting diode configured to emit blue light. The first LED stack 2230 may include a GaInP-based well layer, and each of the second LED stack 2330 and the third LED stack 2430 may include a GaInN-based well layer.

Although the light emitting diode stack 2000 of FIG. 46 is illustrated as including three LED stacks 2230, 2330, and 2430, the inventive concepts are not limited to a particular number of LED stacks one over the other. For example, an LED stack for emitting yellow light may be further added between the first LED stack 2230 and the second LED stack 2330.

Both surfaces of each of the first to third LED stacks 2230, 2330, and 2430 are an n-type semiconductor layer and a p-type semiconductor layer, respectively. In FIG. 46, each of the first to third LED stacks 2230, 2330, and 2430 is described as having an n-type upper surface and a p-type lower surface. Since the third LED stack 2430 has an n-type upper surface, a roughened surface may be formed on the upper surface of the third LED stack 2430 through chemical etching or the like. However, the inventive concepts are not limited thereto, and the semiconductor types of the upper and lower surfaces of each of the LED stacks can be formed alternatively.

The first LED stack 2230 is disposed near the support substrate 2510, the second LED stack 2330 is disposed on the first LED stack 2230, and the third LED stack 2430 is disposed on the second LED stack. Since the first LED stack 2230 emits light having a longer wavelength than the second and third LED stacks 2330 and 2430, light L1 generated from the first LED stack 2230 can be emitted to the outside through the second and third LED stacks 2330 and 2430. In addition, since the second LED stack 2330 emits light having a longer wavelength than the third LED stack 2430, light L2 generated from the second LED stack 2330 can be emitted to the outside through the third LED stack 2430. Light L3 generated in the third LED stack 2430 is directly emitted outside from the third LED stack 2430.

In an exemplary embodiment, the n-type semiconductor layer of the first LED stack 2230 may have a bandgap wider than the bandgap of the active layer of the first LED stack 2230, and narrower than the bandgap of the active layer of the second LED stack 2330. Accordingly, a portion of light generated from the second LED stack 2330 may be absorbed by the n-type semiconductor layer of the first LED stack 2230 before reaching the active layer of the first LED stack 2230. As such, the intensity of light generated in the active layer of the first LED stack 2230 may be reduced by the light generated from the second LED stack 2330.

In addition, the n-type semiconductor layer of the second LED stack 2330 has a bandgap wider than the bandgap of the active layer of each of the first LED stack 2230 and the second LED stack 2330, and narrower than the bandgap of the active layer of the third LED stack 2430. Accordingly, a portion of light generated from the third LED stack 2430 may be absorbed by the n-type semiconductor layer of the second LED stack 2330 before reaching the active layer of the second LED stack 2330. As such, the intensity of light generated in the second LED stack 2330 or the first LED stack 2230 may be reduced by the light generated from the third LED stack 2430.

The p-type semiconductor layer and the n-type semiconductor layer of the third LED stack 2430 has wider bandgaps than the active layers of the first LED stack 2230 and the second LED stack 2330, thereby transmitting light generated from the first and second LED stacks 2230 and 2330 therethrough.

According to an exemplary embodiment, it is possible to reduce interference of light between the LED stacks 2230, 2330, and 2430 by adjusting the bandgaps of the n-type semiconductor layers or the p-type semiconductor layers of the first and second LED stacks 2230 and 2330, which may obviate the need for other components, such as color filters. For example, the intensity of light generated from the second LED stack 2330 and emitted to the outside may be about 10 times or more than the intensity of the light generated from the first LED stack 2230 by the light generated from the second LED stack 2330. Likewise, the intensity of light generated from the third LED stack 2430 and emitted to the outside may be about 10 times or more the intensity of the light generated from the second LED stack 2330 caused by the light generated from the third LED stack 2430. In this case, the intensity of the light generated from the third LED stack 2430 and emitted to the outside may be about 10 times or more the intensity of the light generated from the first LED stack 2230 caused by the light generated from the third LED stack 2430. Accordingly, it is possible to realize a display apparatus free from color contamination caused by interference of light.

The reflective electrode 2250 forms ohmic contact with the p-type semiconductor layer of the first LED stack 2230 and reflects light generated from the first LED stack 2230. For example, the reflective electrode 2250 may include an ohmic contact layer 2250a and a reflective layer 2250b.

The ohmic contact layer 2250a partially contacts the p-type semiconductor layer of the first LED stack 2230. In order to prevent absorption of light by the ohmic contact layer 2250a, a region in which the ohmic contact layer 2250a contacts the p-type semiconductor layer may not exceed about 50% of the total area of the p-type semiconductor layer. The reflective layer 2250b covers the ohmic contact layer 2250a and the insulation layer 2270. As shown in FIG. 46, the reflective layer 2250b may cover substantially the entire ohmic contact layer 2250a, without being limited thereto. Alternatively, the reflective layer 2250b may cover a portion of the ohmic contact layer 2250a.

Since the reflective layer 2250b covers the insulation layer 2270, an omnidirectional reflector can be formed by the stacked structure of the first LED stack 2230 having a relatively high index of refraction and the insulation layer 2270 having a relatively low index of refraction, and the reflective layer 2250b. The reflective layer 2250b may cover about 50% or more of the area of the first LED stack 2230 or most of the first LED stack 2230, thereby improving luminous efficacy.

The ohmic contact layer 2250a and the reflective layer 2250b may be formed of metal layers, which may include Au. The reflective layer 2250b may include metal having relatively high reflectance with respect to light generated from the first LED stack 2230, for example, red light. On the other hand, the reflective layer 2250b may include metal having relatively low reflectance with respect to light generated from the second LED stack 2330 and the third LED stack 2430, for example, green light or blue light, to reduce interference of light having been generated from the second and third LED stacks 2330, 2430 and traveling toward the support substrate 2510.

The insulation layer 2270 is interposed between the support substrate 2510 and the first LED stack 2230, and has openings that expose the first LED stack 2230. The ohmic contact layer 2250a is connected to the first LED stack 2230 in the openings of the insulation layer 2270.

The ohmic electrode 2290 is disposed on the upper surface of the first LED stack 2230. In order to reduce ohmic contact resistance of the ohmic electrode 2290, the ohmic contact portion 2230a may protrude from the upper surface of the first LED stack 2230. The ohmic electrode 2290 may be disposed on the ohmic contact portion 2230a.

The second-p transparent electrode 2350 forms ohmic contact with the p-type semiconductor layer of the second LED stack 2330. The second-p transparent electrode 2350 may be formed of a metal layer or a conducive oxide layer that is transparent to red light and green light.

The third-p transparent electrode 2450 forms ohmic contact with the p-type semiconductor layer of the third LED stack 2430. The third-p transparent electrode 2450 may be formed of a metal layer or a conducive oxide layer that is transparent to red light, green light, and blue light.

The reflective electrode 2250, the second-p transparent electrode 2350, and the third-p transparent electrode 2450 may assist in current spreading through ohmic contact with the p-type semiconductor layer of corresponding LED stacks.

The first bonding layer 2530 couples the first LED stack 2230 to the support substrate 2510. As shown in FIG. 46, the reflective electrode 2250 may adjoin the first bonding layer 2530. The first bonding layer 2530 may be a light transmissive or opaque layer.

The second bonding layer 2550 couples the second LED stack 2330 to the first LED stack 2230. As shown in FIG. 46, the second bonding layer 2550 may adjoin the first LED stack 2230 and the second-p transparent electrode 2350. The ohmic electrode 2290 may be covered by the second bonding layer 2550. The second bonding layer 2550 transmits light generated from the first LED stack 2230. The second bonding layer 2550 may be formed of a light transmissive bonding material, for example, a light transmissive organic bonding agent or light transmissive spin-on-glass. Examples of the light transmissive organic bonding agent may include SU8, poly(methyl methacrylate) (PMMA), polyimide, Parylene, benzocyclobutene (BCB), and the like. In addition, the second LED stack 2330 may be bonded to the first LED stack 2230 by plasma bonding or the like.

The third bonding layer 2570 couples the third LED stack 2430 to the second LED stack 2330. As shown in FIG. 46, the third bonding layer 2570 may adjoin the second LED stack 2330 and the third-p transparent electrode 2450. However, the inventive concepts are not limited thereto. For example, a transparent conductive layer may be disposed on the second LED stack 2330. The third bonding layer 2570 transmits light generated from the first LED stack 2230 and the second LED stack 2330, and may be formed of, for example, light transmissive spin-on-glass.

Each of the second bonding layer 2550 and the third bonding layer 2570 may transmit light generated from the third LED stack 2430 and light generated from the second LED stack 2330.

FIG. 47A to FIG. 47E are schematic cross-sectional views illustrating a method of manufacturing a light emitting diode stack for a display according to an exemplary embodiment.

Figure 47A:
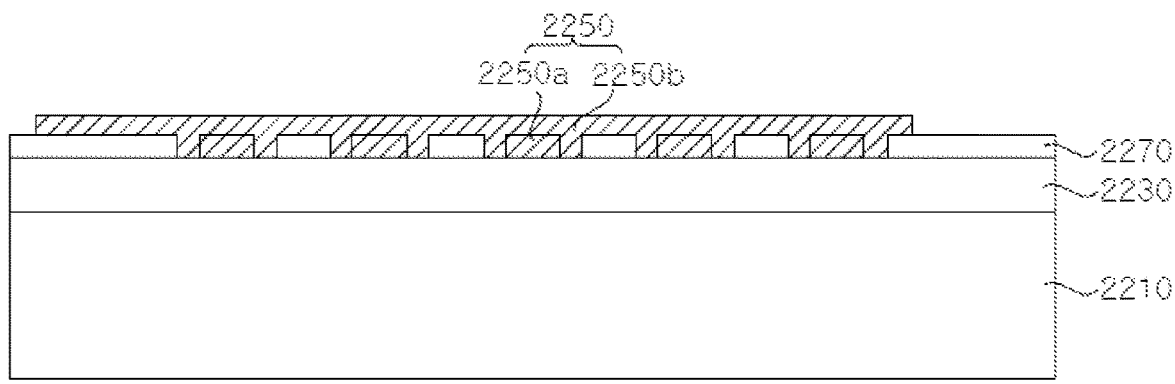
FIGS. 47A, 47B, 47C, 47D, and 47E are schematic cross-sectional views illustrating a method of manufacturing a light emitting diode stack for a display according to an exemplary embodiment.

Referring to FIG. 47A, a first LED stack 2230 is grown on a first substrate 2210. The first substrate 2210 may be, for example, a GaAs substrate. The first LED stack 2230 is formed of AlGaInP-based semiconductor layers, and includes an n-type semiconductor layer, an active layer, and a p-type semiconductor layer. In some exemplary embodiments, the n-type semiconductor layer may have an energy bandgap capable absorbing light generated from the second LED stack 2330, and the p-type semiconductor layer may have an energy bandgap capable absorbing light generated from the second LED stack 2330.

An insulation layer 2270 is formed on the first LED stack 2230 and patterned to form opening(s) therein. For example, a $SiO_2$ layer is formed on the first LED stack 2230, and a photoresist is deposited onto the $SiO_2$ layer, followed by photolithography and development to form a photoresist pattern. Then, the $SiO_2$ layer is patterned through the photoresist pattern used as an etching mask, thereby forming the insulation layer 2270 having the opening(s).

Then, an ohmic contact layer 2250a is formed in the opening(s) of the insulation layer 2270. The ohmic contact layer 2250a may be formed by a lift-off process or the like. After the ohmic contact layer 2250a is formed, a reflective layer 2250b is formed to cover the ohmic contact layer 2250a and the insulation layer 2270. The reflective layer 2250b may be formed by a lift-off process or the like. The reflective layer 2250b may cover a portion of the ohmic contact layer 2250a or the entirety thereof. The ohmic contact layer 2250a and the reflective layer 2250b form a reflective electrode 2250.

The reflective electrode 2250 forms ohmic contact with the p-type semiconductor layer of the first LED stack 2230, and thus, will hereinafter be referred to as a first-p reflective electrode 2250.

Figure 47B:
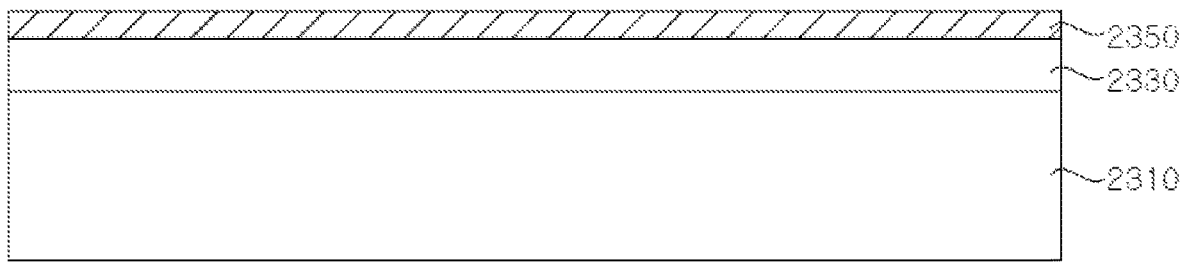

Referring to FIG. 47B, a second LED stack 2330 is grown on a second substrate 2310, and a second-p transparent electrode 2350 is formed on the second LED stack 2330. The second LED stack 2330 may be formed of GaN-based semiconductor layers and may include a GaInN well layer. The second substrate 2310 is a substrate on which GaN-based semiconductor layers may be grown thereon, and is different from the first substrate 2210. The composition ratio of GaInN for the second LED stack 2330 may be determined such that the second LED stack 2330 emits green light. The second-p transparent electrode 2350 forms ohmic contact with the p-type semiconductor layer of the second LED stack 2330. The second LED stack 2330 may include an n-type semiconductor layer, an active layer, and a p-type semiconductor layer. In some exemplary embodiments, the n-type semiconductor layer of the second LED stack 2330 may have an energy bandgap capable of absorbing light generated from the third LED stack 2430, and the p-type semiconductor layer of the second LED stack 2330 may have an energy bandgap capable of absorbing light generated from the third LED stack 2430.

Figure 47C:
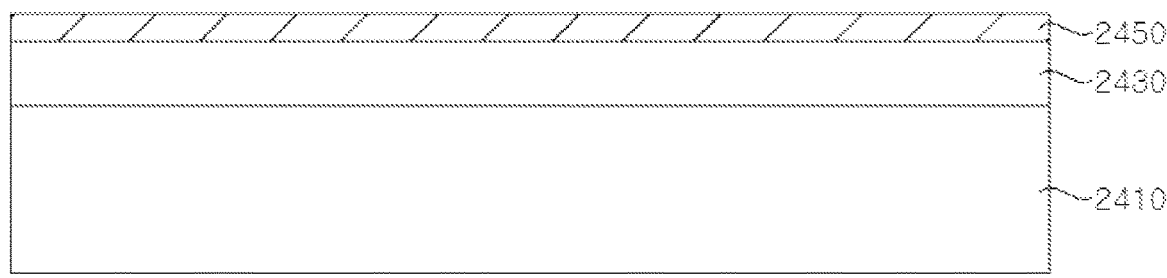

Referring to FIG. 47C, a third LED stack 2430 is grown on a third substrate 2410, and a third-p transparent electrode 2450 is formed on the third LED stack 2430. The third LED stack 2430 may be formed of GaN-based semiconductor layers and may include a GaInN well layer. The third substrate 2410 is a substrate on which GaN-based semiconductor layers may be grown thereon, and is different from the first substrate 2210. The composition ratio of GaInN for the third LED stack 2430 may be determined such that the third LED stack 2430 emits blue light. The third-p transparent electrode 2450 forms ohmic contact with the p-type semiconductor layer of the third LED stack 2430.

As such, the first LED stack 2230, the second LED stack 2330, and the third LED stack 2430 are grown on different substrates, and the formation sequence thereof is not limited to a particular sequence.

Figure 47D:
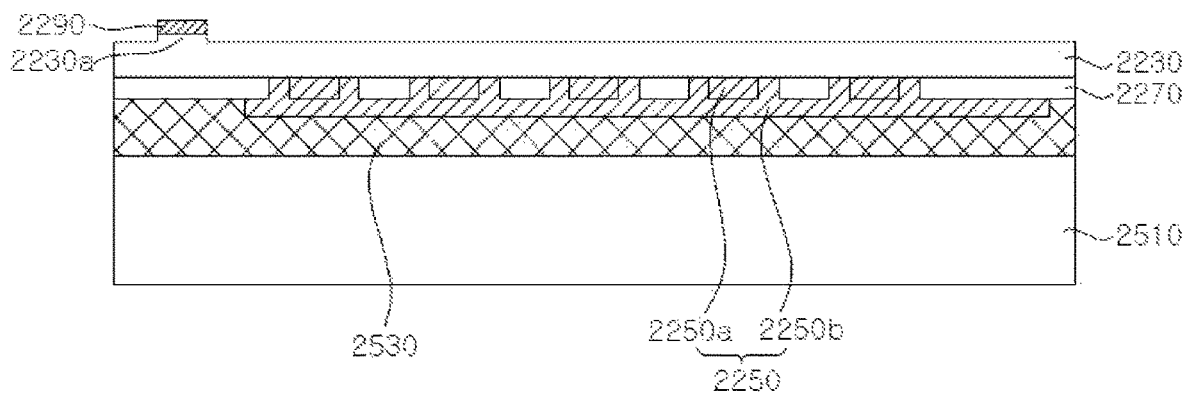

Referring to FIG. 47D, the first LED stack 2230 is coupled to the support substrate 2510 via a first bonding layer 2530. The first bonding layer 2530 may be previously formed on the support substrate 2510 and the reflective electrode 2250 may be bonded to the first bonding layer 2530 to face the support substrate 2510. The first substrate 2210 is removed from the first LED stack 2230 by chemical etching or the like. Accordingly, the upper surface of the n-type semiconductor layer of the first LED stack 2230 is exposed.

Then, an ohmic electrode 2290 is formed in the exposed region of the first LED stack 2230. In order to reduce ohmic contact resistance of the ohmic electrode 2290, the ohmic electrode 2290 may be subjected to heat treatment. The ohmic electrode 2290 may be formed in each pixel region so as to correspond to the pixel regions.

Figure 47E:
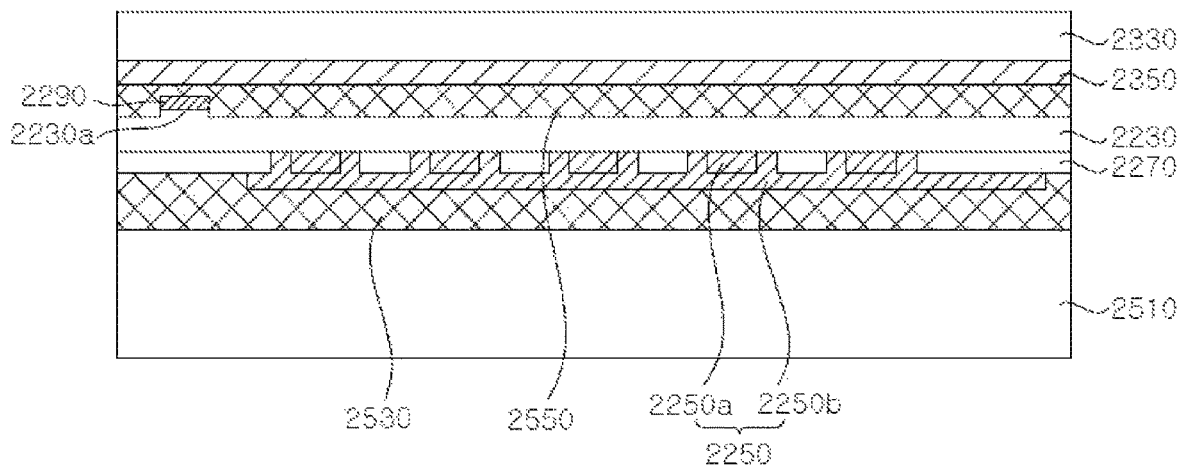

Referring to FIG. 47E, the second LED stack 2330 is coupled to the first LED stack 2230, on which the ohmic electrode 2290 is formed, via a second bonding layer 2550. The second-p transparent electrode 2350 is bonded to the second bonding layer 2550 to face the first LED stack 2230. The second bonding layer 2550 may be previously formed on the first LED stack 2230 such that the second-p transparent electrode 2350 may face and be bonded to the second bonding layer 2550. The second substrate 2310 may be separated from the second LED stack 2330 by a laser lift-off or chemical lift-off process.

Then, referring to FIG. 46 and FIG. 47C, the third LED stack 2430 is coupled to the second LED stack 2330 via a third bonding layer 2570. The third-p transparent electrode 2450 is bonded to the third bonding layer 2570 to face the second LED stack 2330. The third bonding layer 2570 may be previously formed on the second LED stack 2330 such that the third-p transparent electrode 2450 may face and be bonded to the third bonding layer 2570. The third substrate 2410 may be separated from the third LED stack 2430 by a laser lift-off or chemical lift-off process. As such, the light emitting diode stack for a display as shown in FIG. 46 may be formed, which has the n-type semiconductor layer of the third LED stack 2430 exposed to the outside.

A display apparatus may be formed by patterning the stack of the first to third LED stacks 2230, 2330, and 2430 disposed on the support substrate 2510 in pixel units, followed by connecting the first to third LED stacks 2230, 2330, and 2430 to one another through interconnections. However, the inventive concepts are not limited thereto. For example, a display apparatus may be manufactured by dividing the stack of the first to third LED stacks 2230, 2330, and 2430 into individual units, and transferring the first to third LED stacks 2230, 2330, and 2430 to other support substrates, such as a printed circuit board.

Figure 48:
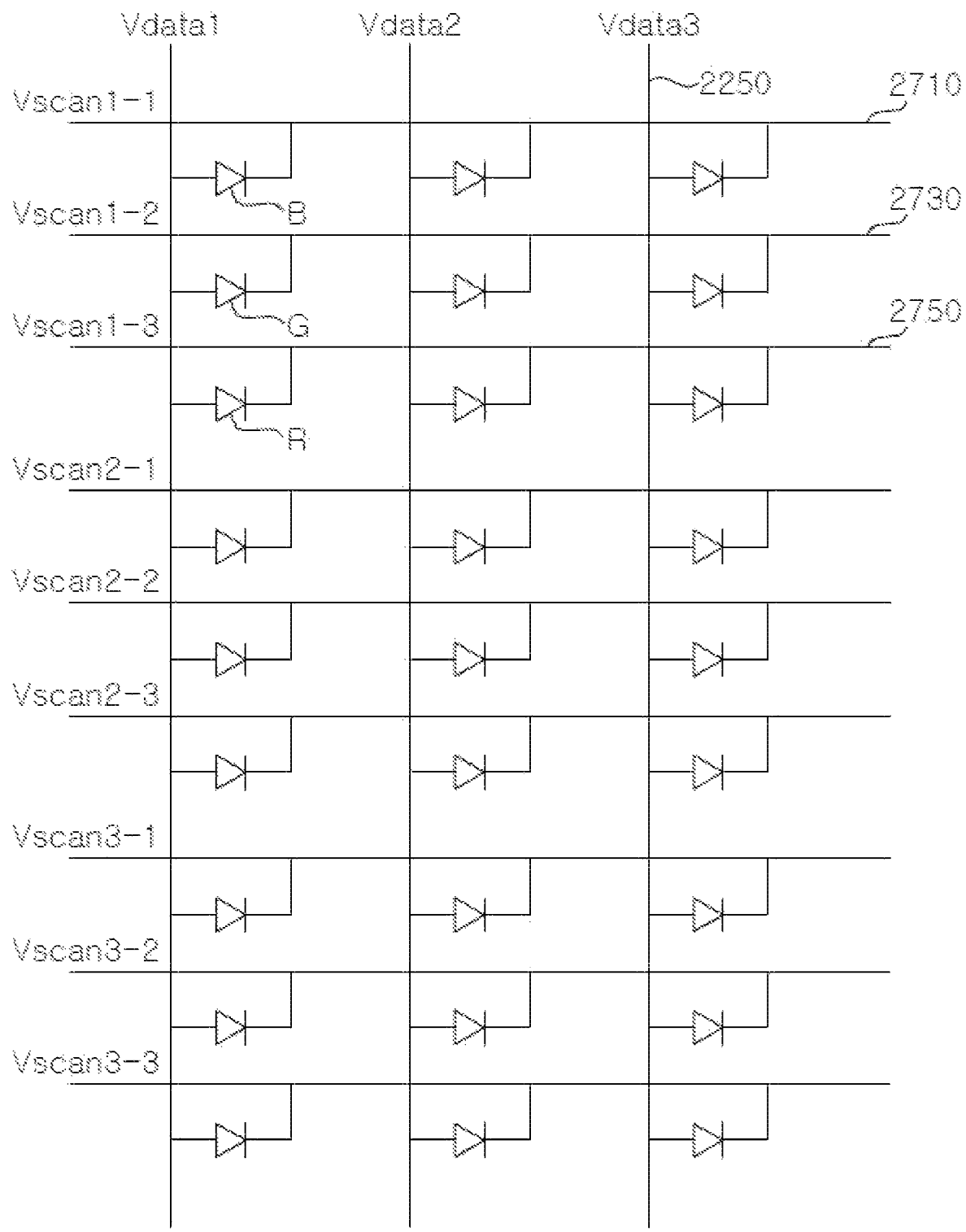
FIG. 48 is a schematic circuit diagram of a display apparatus according to an exemplary embodiment.
Figure 49:
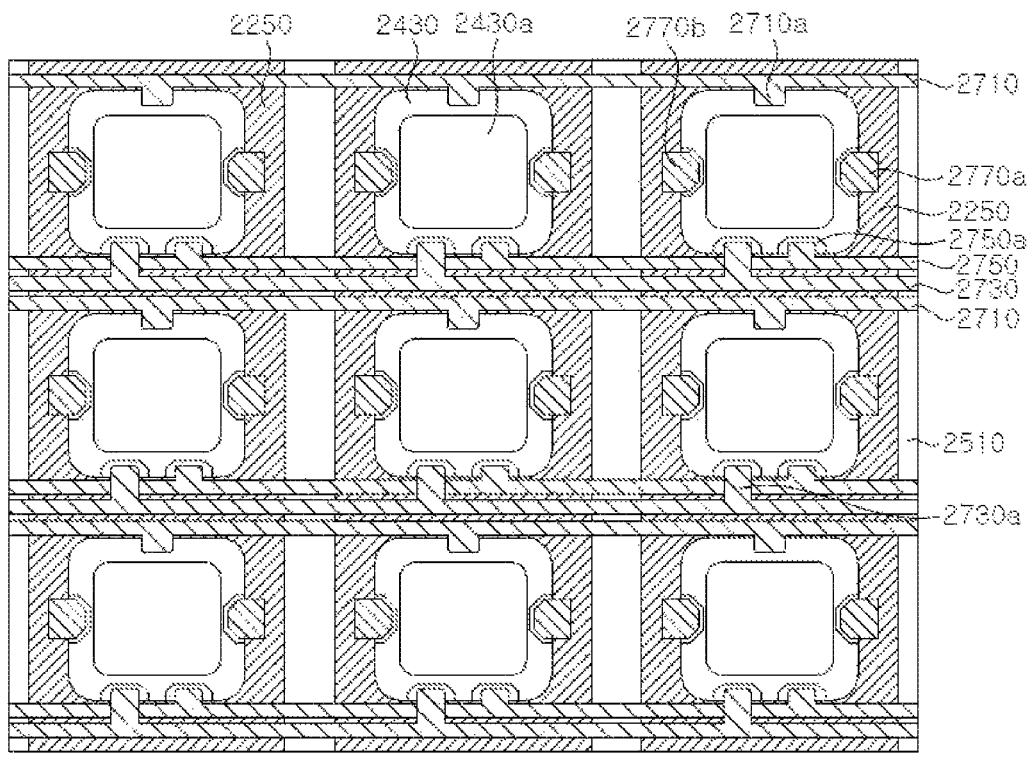
FIG. 49 is a schematic plan view of a display apparatus according to an exemplary embodiment.

FIG. 48 is a schematic circuit diagram of a display apparatus according to an exemplary embodiment. FIG. 49 is a schematic plan view of the display apparatus according to an exemplary embodiment.

Referring to FIG. 48 and FIG. 49, the display apparatus according to an exemplary embodiment may be implemented to be driven in a passive matrix manner.

The light emitting diode stack for a display shown in FIG. 46 has the structure including the first to third LED stacks 2230, 2330, and 2430 stacked in the vertical direction. Since one pixel includes three light emitting diodes R, G, and B, a first light emitting diode R may correspond to the first LED stack 2230, a second light emitting diode G may correspond to the second LED stack 2330, and a third light emitting diode B may correspond to the third LED stack 2430.

Referring to FIGS. 48 and 49, one pixel includes the first to third light emitting diodes R, G, and B, each of which may correspond to a subpixel. Anodes of the first to third light emitting diodes R, G, and B are connected to a common line, for example, a data line, and cathodes thereof are connected to different lines, for example, scan lines. For example, in a first pixel, the anodes of the first to third light emitting diodes R, G, and B are commonly connected to a data line Vdata1, and the cathodes thereof are connected to scan lines Vscan1-1, Vscan1-2, and Vscan1-3, respectively. As such, the light emitting diodes R, G, and B in each pixel can be driven independently.

In addition, each of the light emitting diodes R, G, and B may be driven by a pulse width modulation or by changing the magnitude of electric current to control the brightness of each subpixel.

Referring to FIG. 49, a plurality of pixels is formed by patterning the stack of FIG. 46, and each of the pixels is connected to the reflective electrodes 2250 and interconnection lines 2710, 2730, and 2750. As shown in FIG. 48, the reflective electrode 2250 may be used as the data line Vdata and the interconnection lines 2710, 2730, and 2750 may be formed as the scan lines.

The pixels may be arranged in a matrix form, in which the anodes of the light emitting diodes R, G, and B of each pixel are commonly connected to the reflective electrode 2250, and the cathodes thereof are connected to the interconnection lines 2710, 2730, and 2750 separated from one another. Here, the interconnection lines 2710, 2730, and 2750 may be used as the scan lines Vscan.

Figure 50:
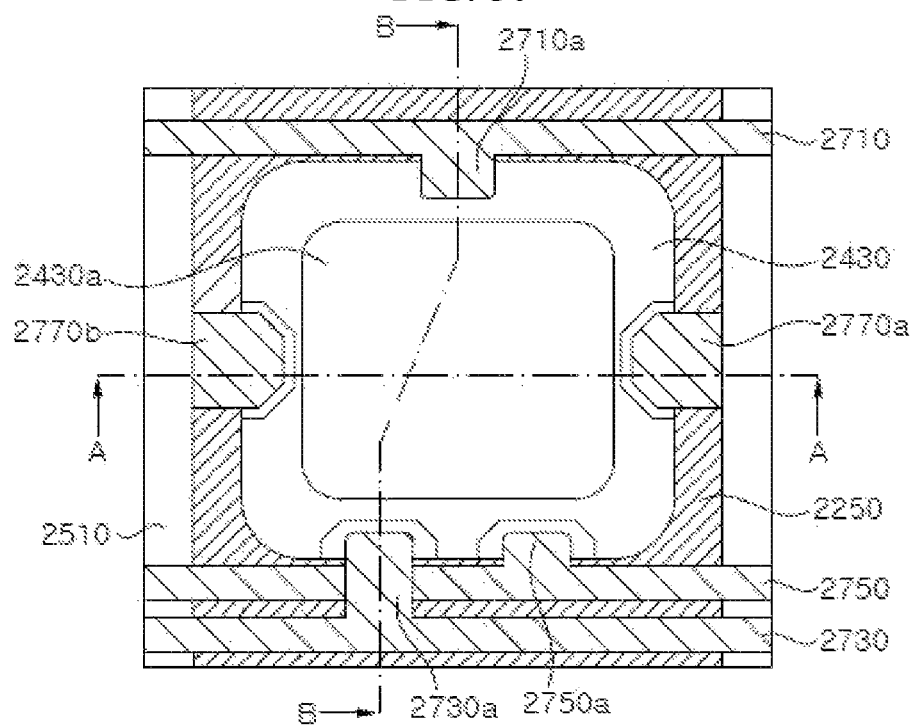
FIG. 50 is an enlarged plan view of one pixel of the display apparatus of FIG. 49 according to an exemplary embodiment.
Figure 51:
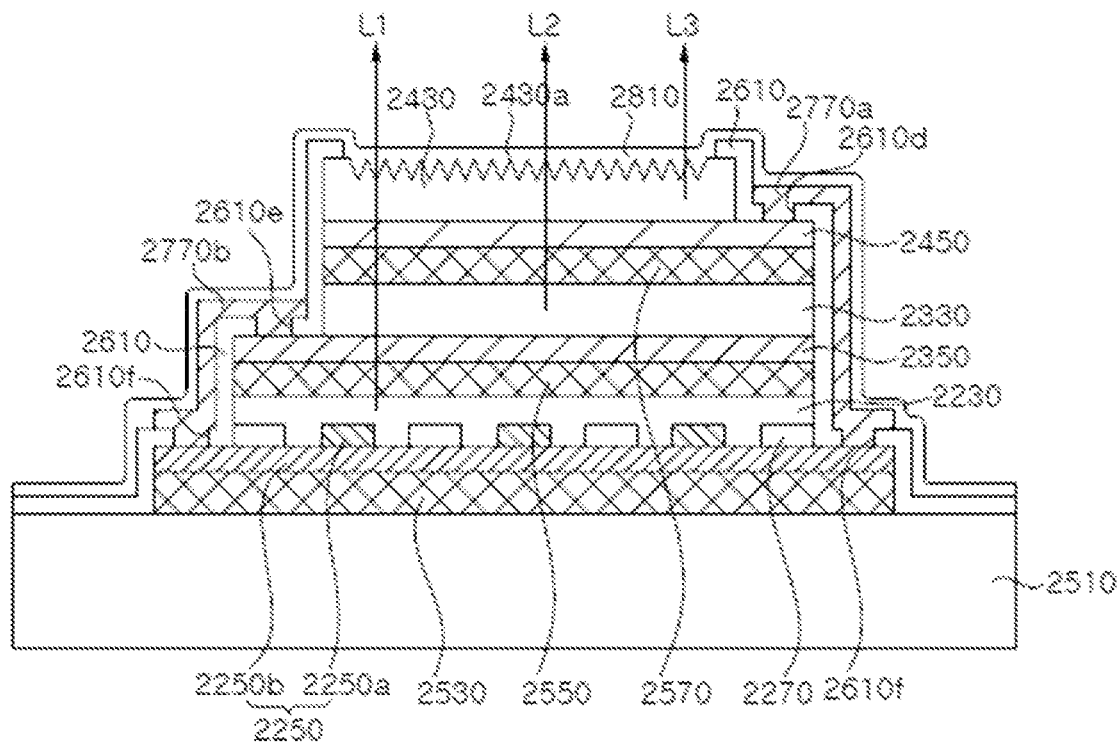
FIG. 51 is a schematic cross-sectional view taken along line A-A of FIG. 50 according to an exemplary embodiment.
Figure 52:
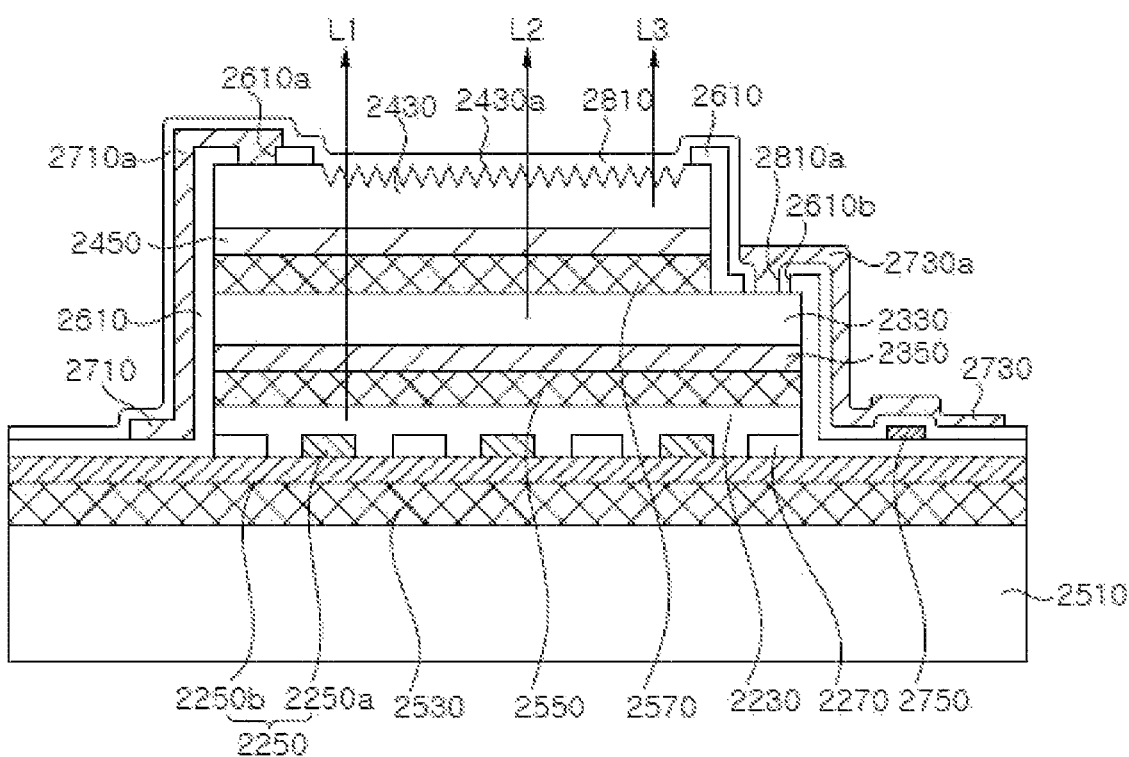
FIG. 52 is a schematic cross-sectional view taken along line B-B of FIG. 50 according to an exemplary embodiment.

FIG. 50 is an enlarged plan view of one pixel of the display apparatus of FIG. 49. FIG. 51 is a schematic cross-sectional view taken along line A-A of FIG. 50, and FIG. 52 is a schematic cross-sectional view taken along line B-B of FIG. 50.

Referring to FIGS. 49 to 52, in each pixel, a portion of the reflective electrode 2250, the ohmic electrode 2290 formed on the upper surface of the first LED stack 2230 (see FIG. 53H), a portion of the second-p transparent electrode 2350 (see FIG. 53H), a portion of the upper surface of the second LED stack 2330 (see FIG. 53J), a portion of the third-p transparent electrode 2450 (see FIG. 53H), and the upper surface of the third LED stack 2430 are exposed to the outside.

The third LED stack 2430 may have a roughened surface 2430a on the upper surface thereof. The roughened surface 2430a may be formed over the entirety of the upper surface of the third LED stack 2430 or may be formed in some regions thereof.

A lower insulation layer 2610 may cover a side surface of each pixel. The lower insulation layer 2610 may be formed of a light transmissive material, such as $SiO_2$. In this case, the lower insulation layer 2610 may cover substantially the entire upper surface of the third LED stack 2430. Alternatively, the lower insulation layer 2610 may include a distributed Bragg reflector to reflect light traveling towards the side surfaces of the first to third LED stacks 2230, 2330, and 2430. In this case, the lower insulation layer 2610 may partially expose the upper surface of the third LED stack 2430. Still alternatively, the lower insulation layer 2610 may be a black-based insulation layer that absorbs light. Furthermore, an electrically floating metallic reflective layer may be further formed on the lower insulation layer 2610 to reflect light emitted through the side surfaces of the first to third LED stacks 2230, 2330, and 2430.

The lower insulation layer 2610 may include an opening 2610a which exposes the upper surface of the third LED stack 2430, an opening 2610b which exposes the upper surface of the second LED stack 2330, an opening 2610c (see FIG. 53H) which exposes the ohmic electrode 2290 of the first LED stack 2230, an opening 2610d which exposes the third-p transparent electrode 2450, an opening 2610e which exposes the second-p transparent electrode 2350, and openings 2610f which expose the first-p reflective electrode 2250.

The interconnection lines 2710 and 2750 may be formed near the first to third LED stacks 2230, 2330, and 2430 on the support substrate 2510, and may be disposed on the lower insulation layer 2610 to be insulated from the first-p reflective electrode 2250. A connecting portion 2770a connects the third-p transparent electrode 2450 to the reflective electrode 2250, and a connecting portion 2770b connects the second-p transparent electrode 2350 to the reflective electrode 2250, such that the anodes of the first LED stack 2230, the second LED stack 2330, and the third LED stack 2430 are commonly connected to the reflective electrode 2250.

A connecting portion 2710a connects the upper surface of the third LED stack 2430 to the interconnection line 2710, and a connecting portion 2750a connects the ohmic electrode 2290 on the first LED stack 2230 to the interconnection line 2750.

An upper insulation layer 2810 may be disposed on the interconnection lines 2710 and 2750 and the lower insulation layer 2610 to cover the upper surface of the third LED stack 2430. The upper insulation layer 2810 may have an opening 2810a which partially exposes the upper surface of the second LED stack 2330.

The interconnection line 2730 may be disposed on the upper insulation layer 2810, and the connecting portion 2730a may connect the upper surface of the second LED stack 2330 to the interconnection line 2730. The connecting portion 2730a may pass through an upper portion of the interconnection line 2750 and is insulated from the interconnection line 2750 by the upper insulation layer 2810.

Although the electrodes of each pixel are described as being connected to the data line and the scan lines, the inventive concepts are not limited thereto. Further, while the interconnection lines 2710 and 2750 are described as being formed on the lower insulation layer 2610 and the interconnection line 2730 is described as being formed on the upper insulation layer 2810, the inventive concepts are not limited thereto. For example, all of the interconnection lines 2710, 2730, and 2750 may be formed on the lower insulation layer 2610, and may be covered by the upper insulation layer 2810, which may have openings that expose the interconnection line 2730. In this manner, the connecting portion 2730a may connect the upper surface of the second LED stack 2330 to the interconnection line 2730 through the openings of the upper insulation layer 2810.

Alternatively, the interconnection lines 2710, 2730, and 2750 may be formed inside the support substrate 2510, and the connecting portions 2710a, 2730a, and 2750a on the lower insulation layer 2610 may connect the ohmic electrode 2290, the upper surface of the first LED stack 2230, and the upper surface of the third LED stack 2430 to the interconnection lines 2710, 2730, and 2750.

According to an exemplary embodiment, light L1 generated from the first LED stack 2230 is emitted to the outside through the second and third LED stacks 2330 and 2430, and light L2 generated from the second LED stack 2330 is emitted to the outside through the third LED stack 2430. Furthermore, a portion of light L3 generated from the third LED stack 2430 may enter the second LED stack 2330, and a portion of light L2 generated from the second LED stack 2330 may enter the first LED stack 2230. Furthermore, a secondary light may be generated from the second LED stack 2330 by the light L3, and a secondary light may also be generated from the first LED stack 2230 by the light L2. However, such secondary light may have a low intensity.

FIG. 53A to FIG. 53K are schematic plan views illustrating a method of manufacturing a display apparatus according to an exemplary embodiment. Hereinafter, the following descriptions will be given with reference to the pixel of FIG. 50.

First, the light emitting diode stack 2000 described in FIG. 46 is prepared.

Figure 53A:
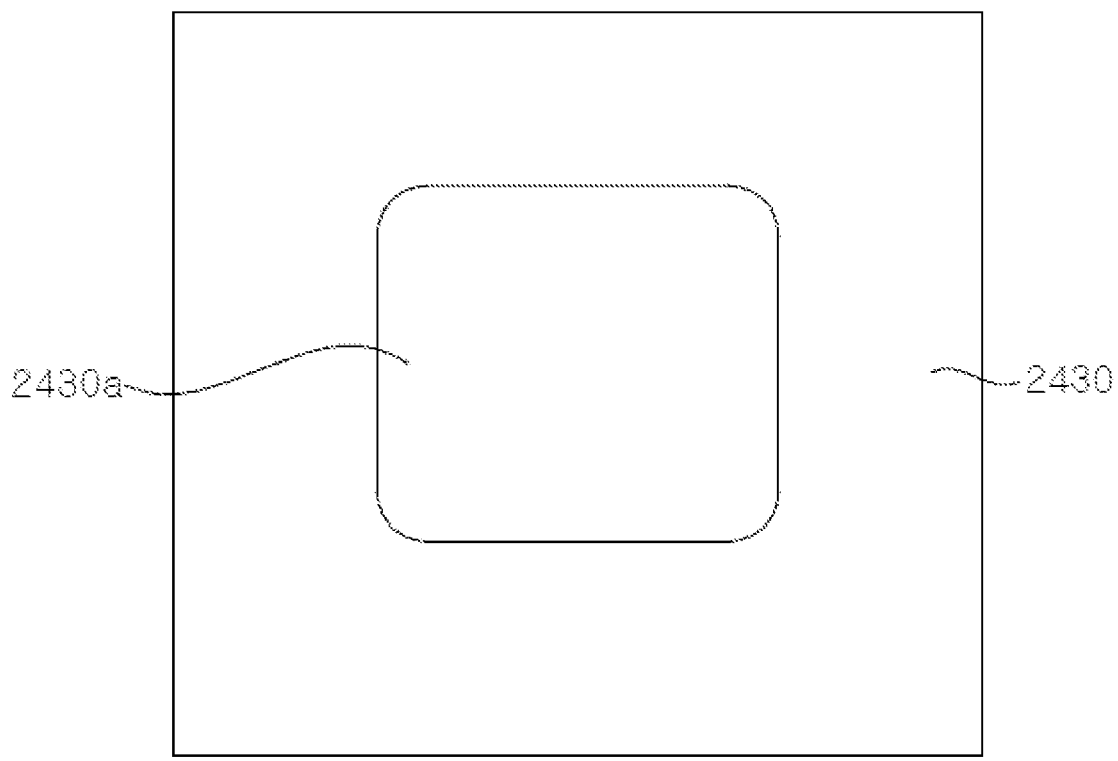
FIGS. 53A, 53B, 53C, 53D, 53E, 53F, 53G, 53H, 53I, 53J, and 53K are schematic plan views illustrating a method of manufacturing a display apparatus according to an exemplary embodiment.

Referring to FIG. 53A, a roughened surface 2430a may be formed on the upper surface of the third LED stack 2430. The roughened surface 2430a may be formed on the upper surface of the third LED stack 2430 to correspond to each pixel region. The roughened surface 2430a may be formed by chemical etching, for example, photo-enhanced chemical etching (PEC) or the like.

The roughened surface 2430a may be partially formed in each pixel region by taking into account a region of the third LED stack 2430 to be etched in the subsequent process, without being limited thereto. Alternatively, the roughened surface 2430a may be formed over the entire upper surface of the third LED stack 2430.

Figure 53B:
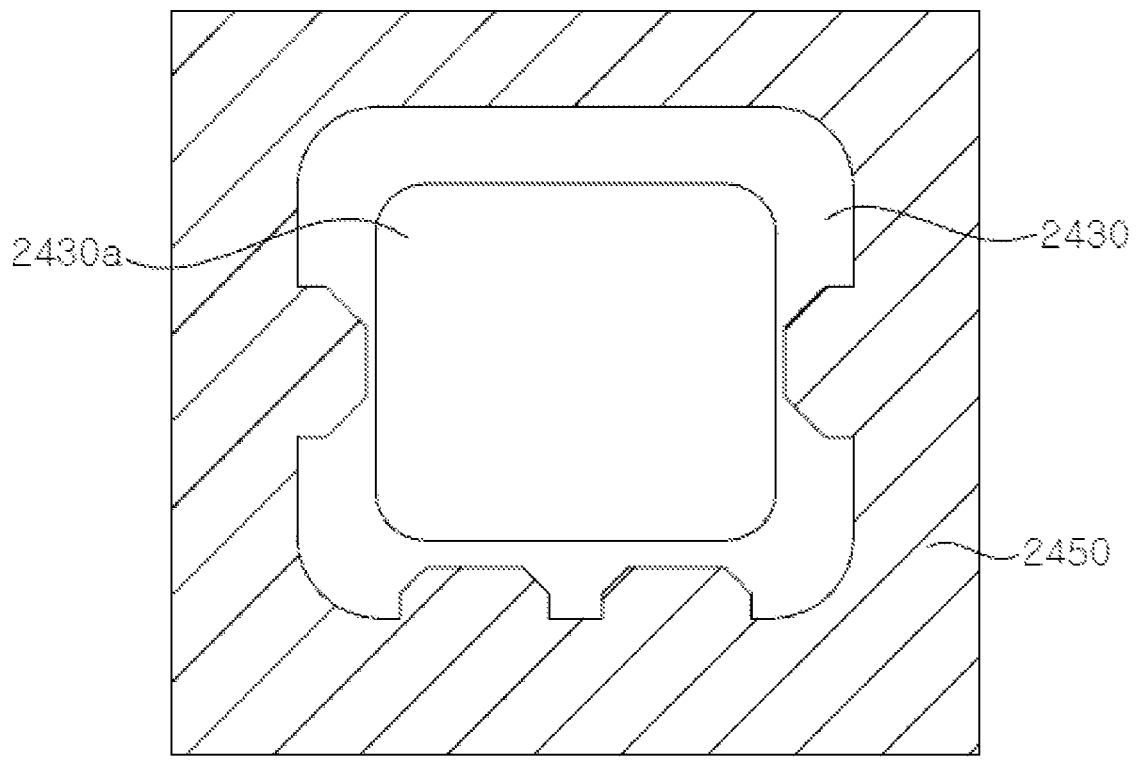

Referring to FIG. 53B, a surrounding region of the third LED stack 2430 in each pixel is removed by etching to expose the third-p transparent electrode 2450. As shown in FIG. 53B, the third LED stack 2430 may be remained to have a rectangular shape or a square shape. The third LED stack 2430 may have a plurality of depressions formed along edges thereof.

Figure 53C:
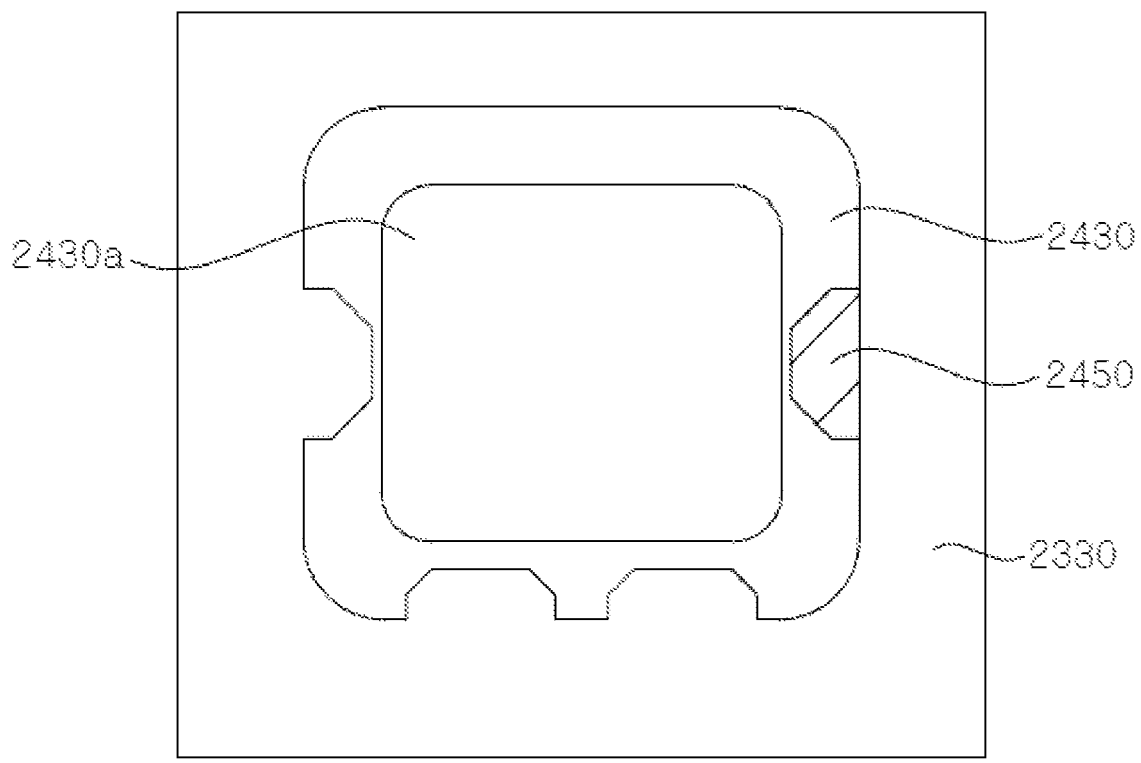

Referring to FIG. 53C, the upper surface of the second LED stack 2330 is exposed by removing the exposed third-p transparent electrode 2450 in areas other than in one depression. Accordingly, the upper surface of the second LED stack 2330 is exposed around the third LED stack 2430 and in other depressions other than the depression where the third-p transparent electrode 2450 is partially remained.

Figure 53D:
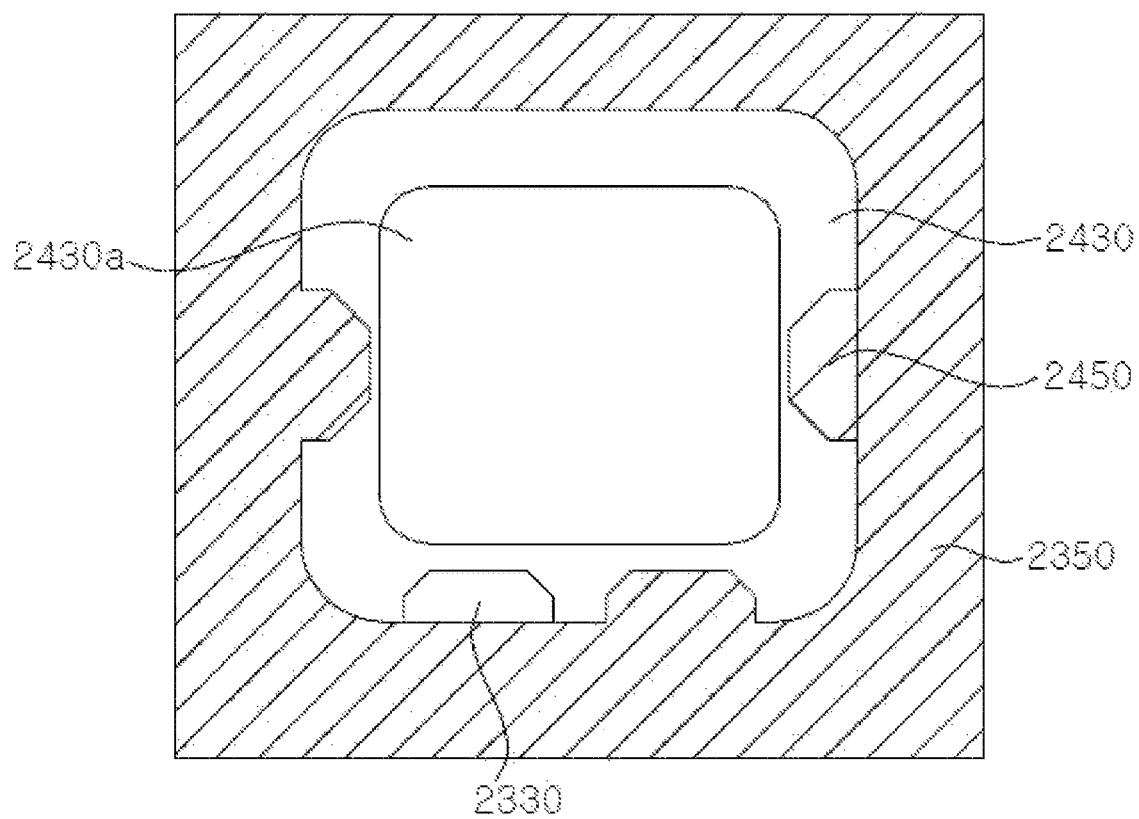

Referring to FIG. 53D, the second-p transparent electrode 2350 is exposed by removing the exposed second LED stack 2330 exposed in areas other than one depression.

Figure 53E:
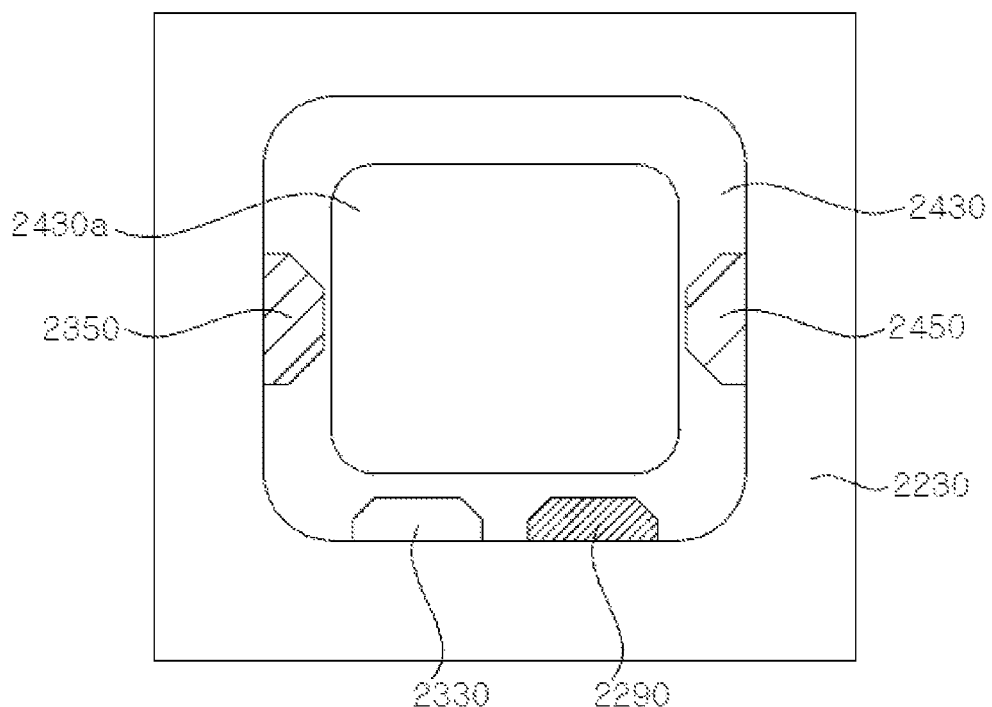

Referring to FIG. 53E, the ohmic electrode 2290 is exposed together with the upper surface of the first LED stack 2230 by removing the exposed second-p transparent electrode 2350 in areas other than in one depression. Here, the ohmic electrode 2290 may be exposed in one depression. Accordingly, the upper surface of the first LED stack 2230 is exposed around the third LED stack 2430, and an upper surface of the ohmic electrode 2290 is exposed in at least one of the depressions formed in the third LED stack 2430.

Figure 53F:
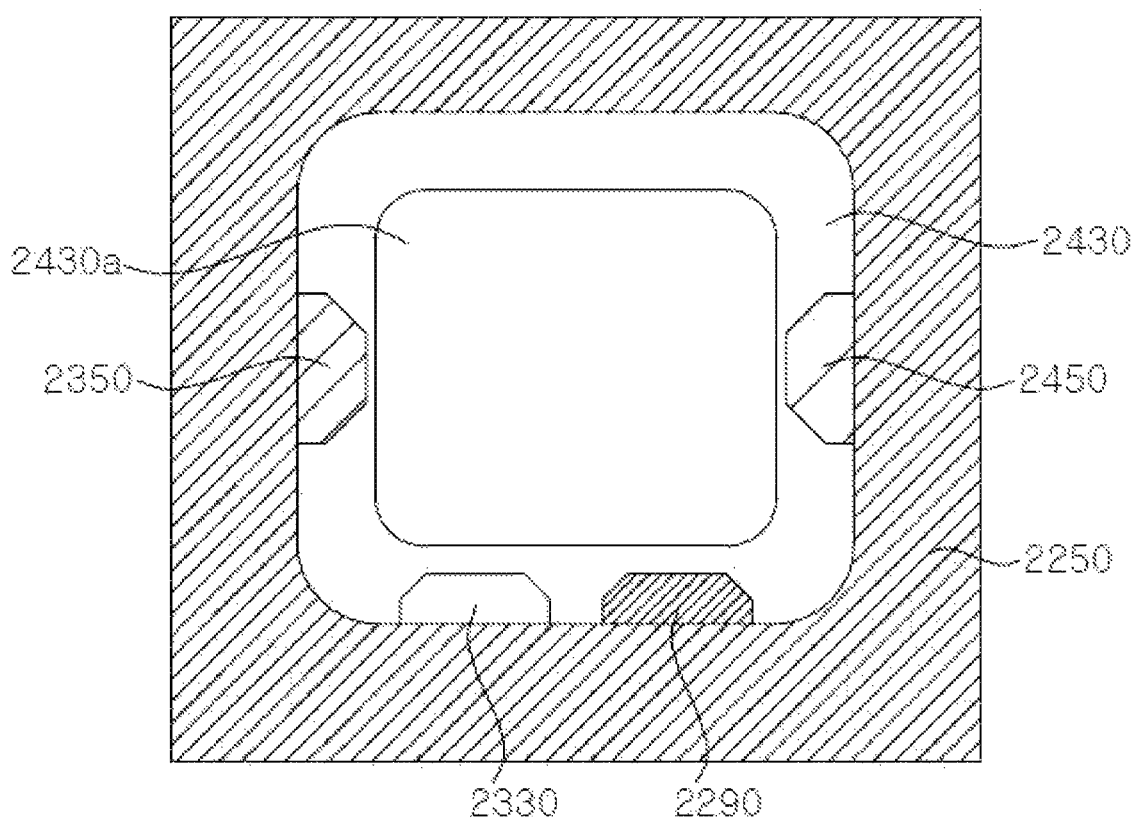

Referring to FIG. 53F, the reflective electrode 2250 is exposed by removing an exposed portion of the first LED stack 2230 in areas other than in one depression. As such, the reflective electrode 2250 is exposed around the third LED stack 2430.

Figure 53G:
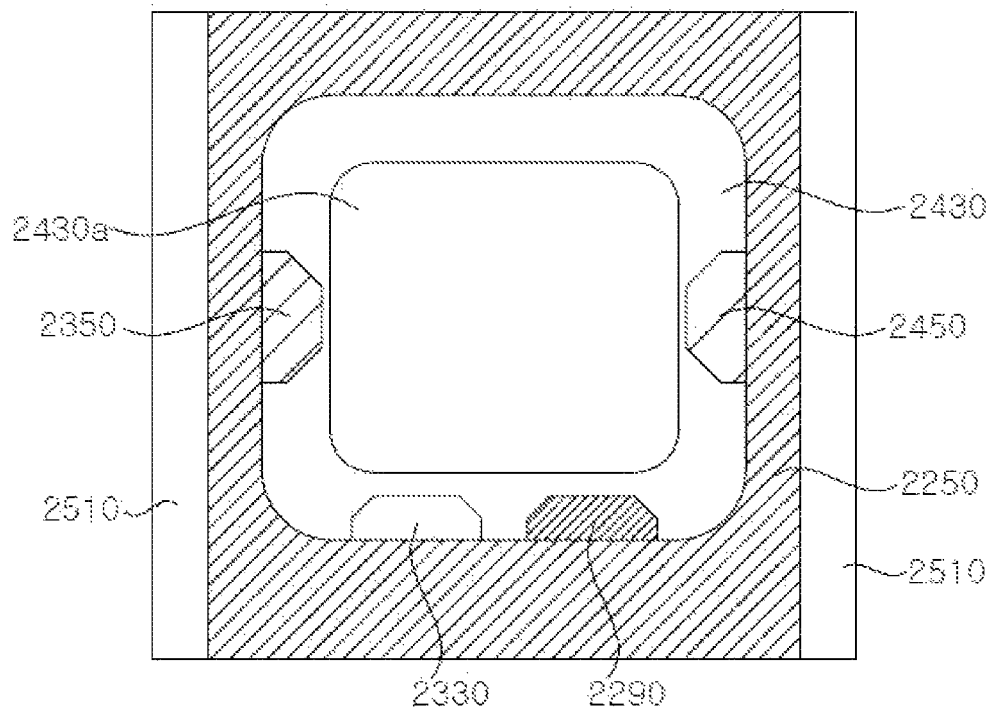

Referring to FIG. 53G, linear interconnection lines are formed by patterning the reflective electrode 2250. Here, the support substrate 2510 may be exposed. The reflective electrode 2250 may connect pixels arranged in one row to each other among pixels arranged in a matrix (see FIG. 49).

Figure 53H:
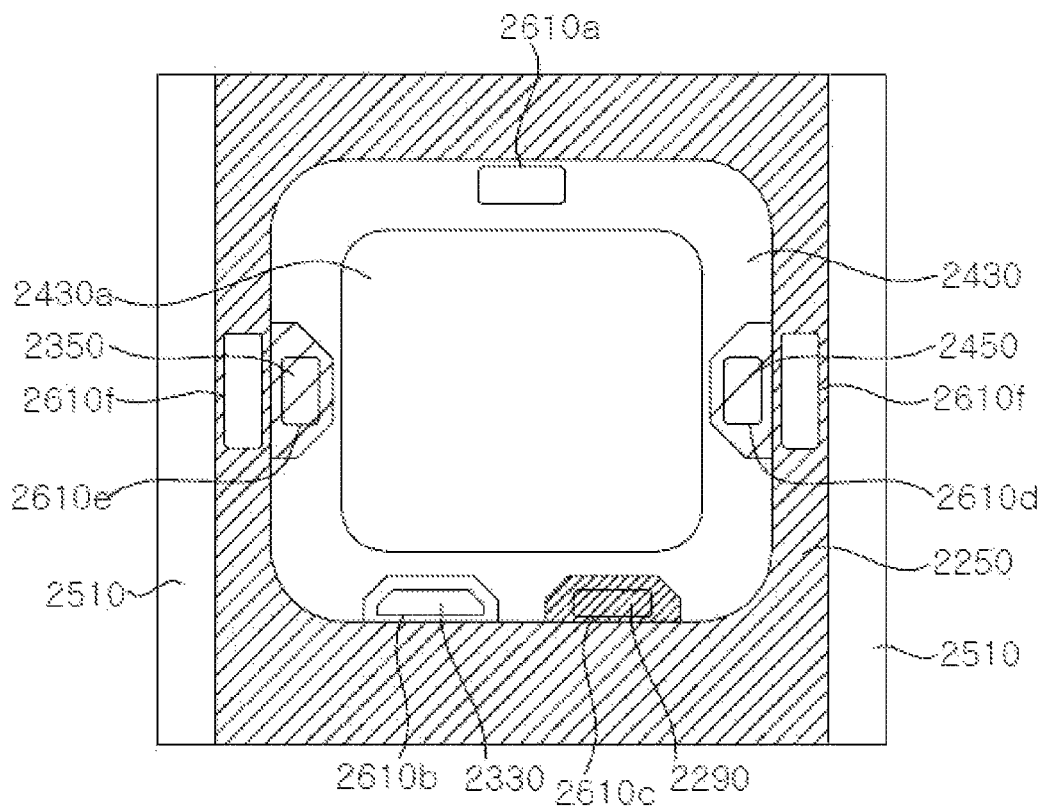

Referring to FIG. 53H, a lower insulation layer 2610 (see FIG. 51 and FIG. 52) is formed to cover the pixels. The lower insulation layer 2610 covers the reflective electrode 2250 and side surfaces of the first to third LED stacks 2230, 2330, and 2430. In addition, the lower insulation layer 2610 may partially cover the upper surface of the third LED stack 2430. If the lower insulation layer 2610 is a transparent layer such as a SiO$_2$ layer, the lower insulation layer 2610 may cover substantially the entire upper surface of the third LED stack 2430. Alternatively, the lower insulation layer 2610 may include a distributed Bragg reflector. In this case, the lower insulation layer 2610 may partially expose the upper surface of the third LED stack 2430 to allow light to be emitted to the outside.

The lower insulation layer 2610 may include an opening 2610a which exposes the third LED stack 2430, an opening 2610b which exposes the second LED stack 2330, an opening 2610c which exposes the ohmic electrode 2290, an opening 2610d which exposes the third-p transparent electrode 2450, an opening 2610e which exposes the second-p transparent electrode 2350, and an opening 2610f which exposes the reflective electrode 2250. The opening 2610f that exposes the reflective electrode 2250 may be formed singularly or in plural.

Figure 53I:
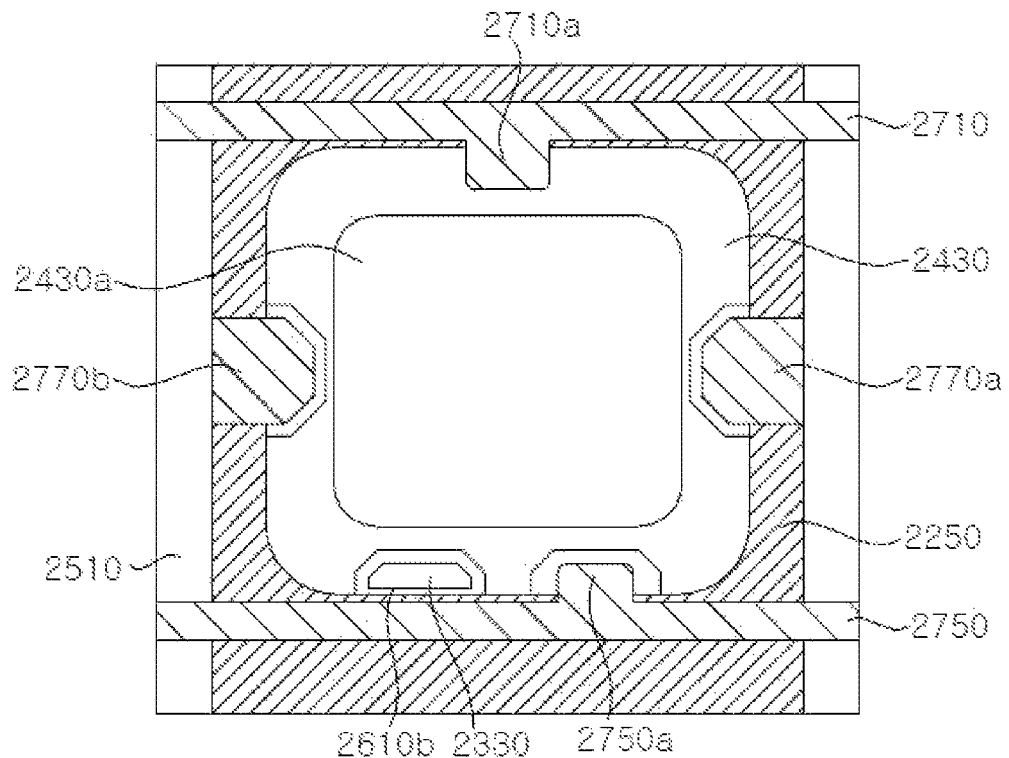

Referring to FIG. 53I, interconnection lines 2710 and 2750, and connecting portions 2710a, 2750a, 2770a, and 2770b are formed by a lift-off process or the like. The interconnection lines 2710 and 2750 are insulated from the reflective electrode 2250 by the lower insulation layer 2610. The connecting portion 2710a electrically connects the third LED stack 2430 to the interconnection line 2710, and the connecting portion 2750a electrically connects the ohmic electrode 2290 to the interconnection line 2750 such that the first LED stack 2230 is electrically connected to the interconnection line 2750. The connecting portion 2770a electrically connects the third-p transparent electrode 2450 to the first-p reflective electrode 2250, and the connecting portion 2770b electrically connects the second-p transparent electrode 2350 to the first-p reflective electrode 2250.

Figure 53J:
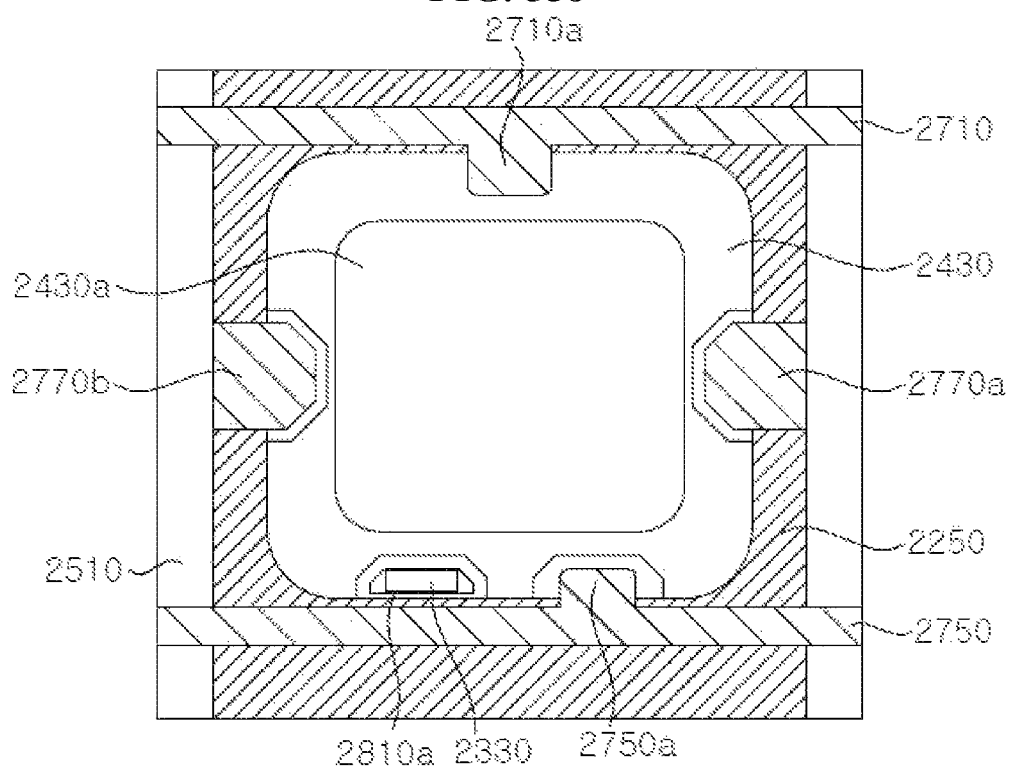

Referring to FIG. 53J, an upper insulation layer 2810 (see FIG. 51 and FIG. 52) covers the interconnection lines 2710, 2750 and the connecting portions 2710a, 2750a, 2770a, and 2770b. The upper insulation layer 2810 may also cover substantially the entire upper surface of the third LED stack 2430. The upper insulation layer 2810 has an opening 2810a which exposes the upper surface of the second LED stack 2330. The upper insulation layer 2810 may be formed of, for example, silicon oxide or silicon nitride, and may include a distributed Bragg reflector. When the upper insulation layer 2810 includes the distributed Bragg reflector, the upper insulation layer 2810 may expose at least a part of the upper surface of the third LED stack 2430 to allow light to be emitted to the outside.

Figure 53K:
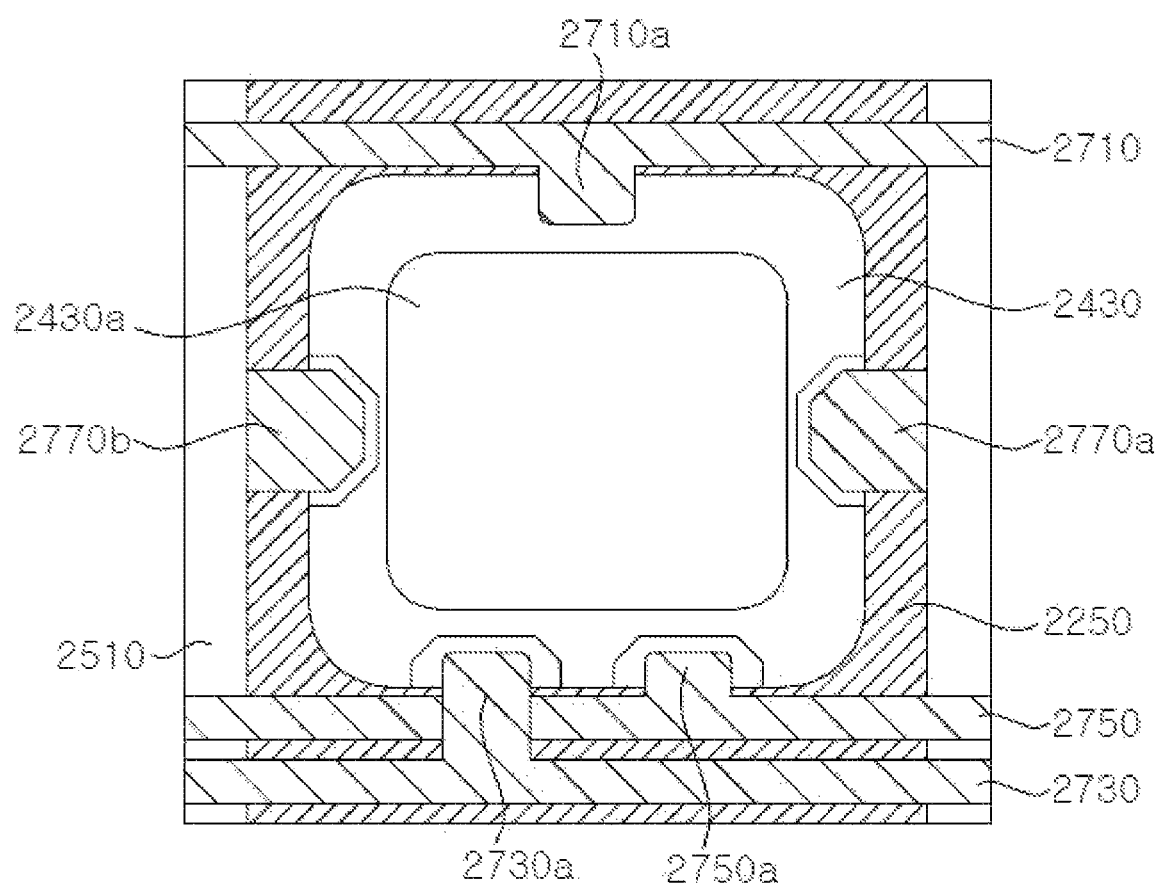

Referring to FIG. 53K, an interconnection line 2730 and a connecting portion 2730a are formed. The interconnection line 2730 and the connecting portion 2730a may be formed by a lift-off process or the like. The interconnection line 2730 is disposed on the upper insulation layer 2810, and is insulated from the reflective electrode 2250 and the interconnection lines 2710 and 2750. The connecting portion 2730a electrically connects the second LED stack 2330 to the interconnection line 2730. The connecting portion 2730a may pass through an upper portion of the interconnection line 2750, and is insulated from the interconnection line 2750 by the upper insulation layer 2810.

As such, a pixel region shown in FIG. 50 may be formed. In addition, as shown in FIG. 49, a plurality of pixels may be formed on the support substrate 2510 and may be connected to one another by the first-p the reflective electrode 2250 and the interconnection lines 2710, 2730 and 2750, to be operated in a passive matrix manner.

Although the above describes a method of manufacturing a display apparatus that may be operated in the passive matrix manner, the inventive concepts are not limited thereto. More particularly, the display apparatus according to exemplary embodiments may be manufactured in various ways so as to be operated in the passive matrix manner using the light emitting diode stack shown in FIG. 46.

For example, while the interconnection line 2730 is described as being formed on the upper insulation layer 2810, the interconnection line 2730 may be formed together with the interconnection lines 2710 and 2750 on the lower insulation layer 2610, and the connecting portion 2730a may be formed on the lower insulation layer 2610 to connect the second LED stack 2330 to the interconnection line 2730. Alternatively, the interconnection lines 2710, 2730, 2750 may be disposed inside the support substrate 2510.

Figure 54:
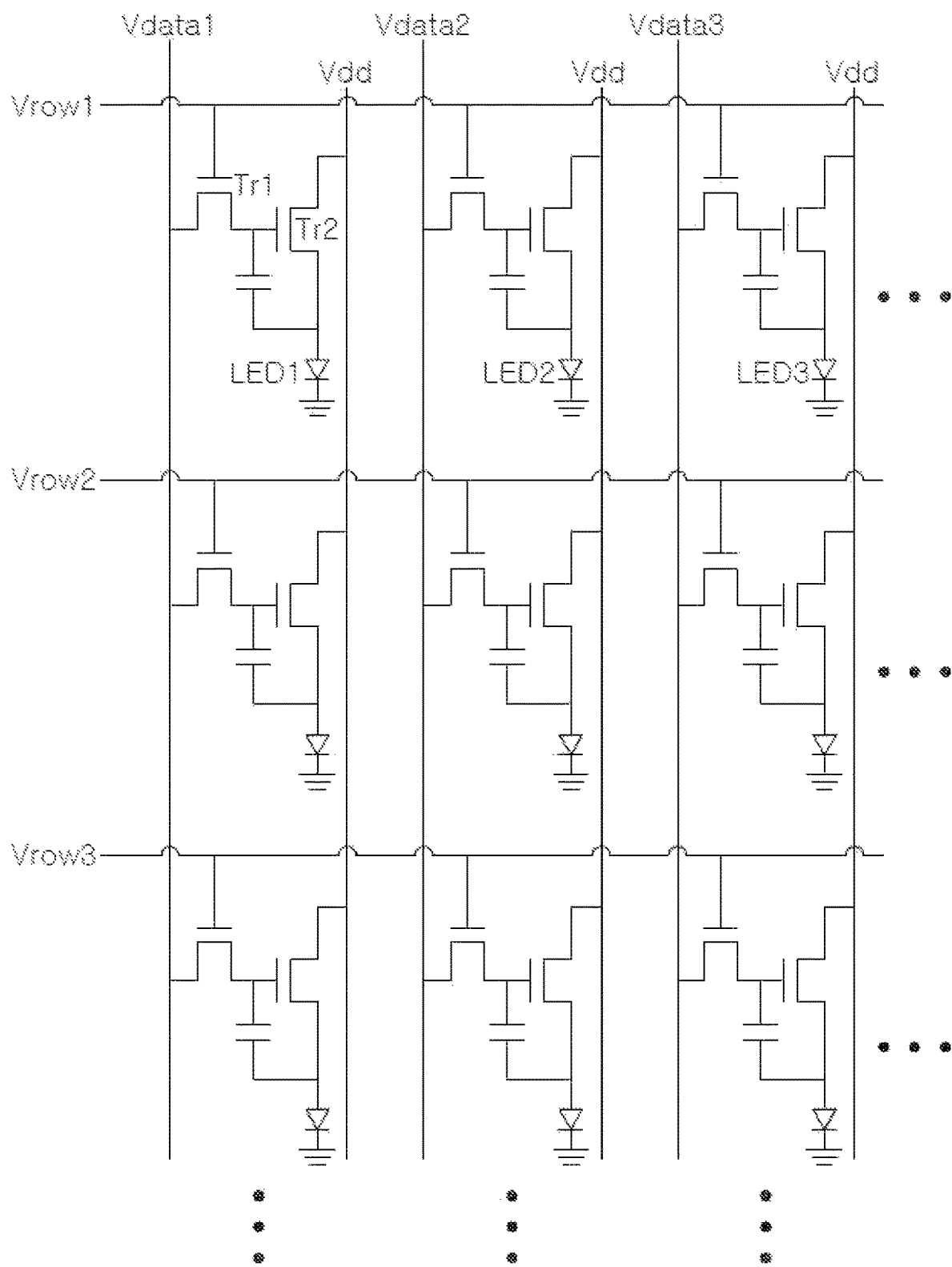
FIG. 54 is a schematic circuit diagram of a display apparatus according to another exemplary embodiment.

FIG. 54 is a schematic circuit diagram of a display apparatus according to another exemplary embodiment. The circuit diagram of FIG. 54 relates to a display apparatus driven in an active matrix manner.

Referring to FIG. 54, the drive circuit according to an exemplary embodiment includes at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitors are charged according to the values of Vdata1 to Vdata3. Since a turned-on state of the transistor Tr2 can be maintained by the charged voltage of the capacitor, the voltage of the capacitor can be maintained and applied to the light emitting diodes LED1 to LED3, even when power supplied to Vrow1 is cut off. In addition, electric current flowing in the light emitting diodes LED1 to LED3 can be changed depending upon the values of Vdata1 to Vdata3. Electric current can be continuously supplied through Vdd, and thus, light may be emitted continuously.

The transistors Tr1, Tr2 and the capacitor may be formed inside the support substrate 2510. For example, thin film transistors formed on a silicon substrate may be used for active matrix driving.

Here, the light emitting diodes LED1 to LED3 may correspond to the first to third LED stacks 2230, 2330, and 2430 stacked in one pixel, respectively. The anodes of the first to third LED stacks 2230, 2330, and 2430 are connected to the transistor Tr2 and the cathodes thereof are connected to the ground.

Although FIG. 54 shows the circuit for active matrix driving according to an exemplary embodiment, other types of circuits may be variously used. In addition, although the anodes of the light emitting diodes LED1 to LED3 are described as being connected to different transistors Tr2 and the cathodes thereof are described as being connected to the ground, the anodes of the light emitting diodes may be connected to current supplies Vdd and the cathodes thereof may be connected to different transistors in some exemplary embodiments.

Figure 55:
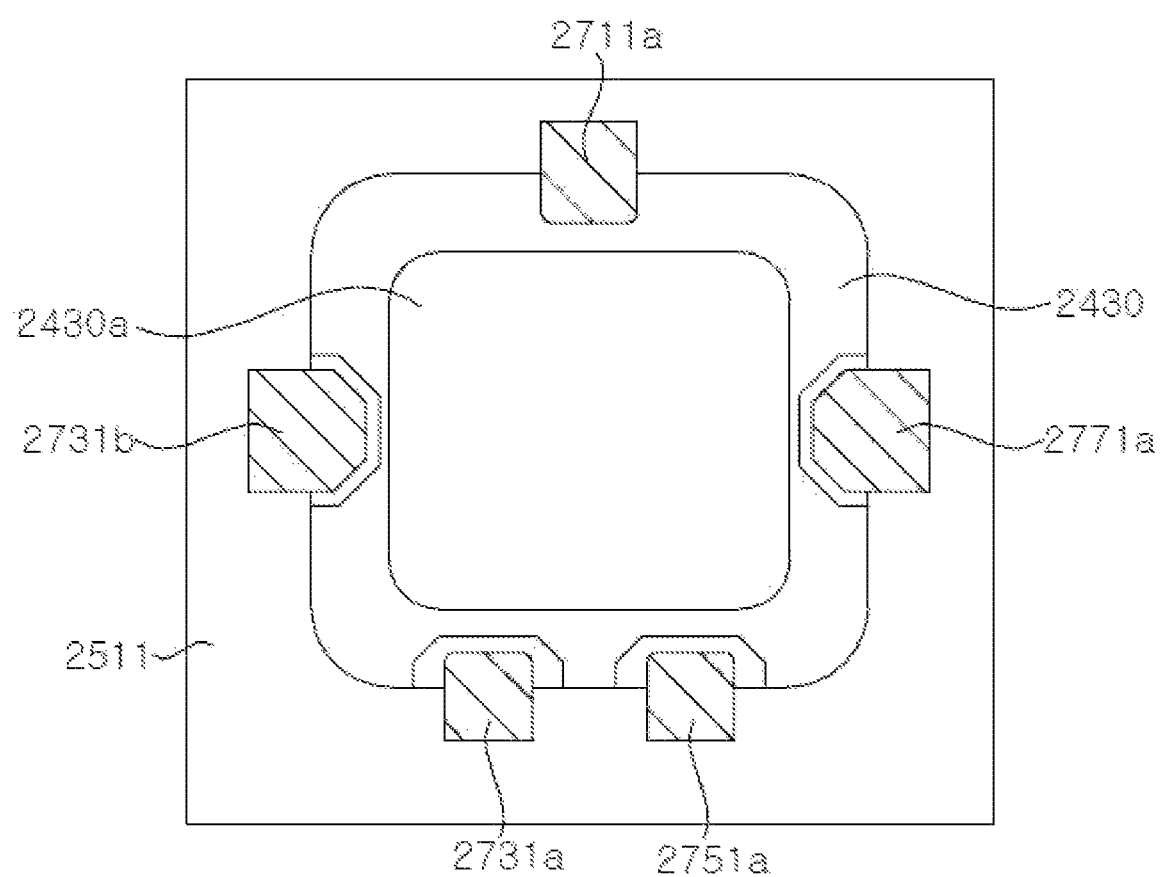
FIG. 55 is a schematic plan view of a display apparatus according to another exemplary embodiment.

FIG. 55 is a schematic plan view of a display apparatus according to another exemplary embodiment. Hereinafter, the following description will be given with reference to one pixel among a plurality of pixels arranged on the support substrate 2511.

Referring to FIG. 55, the pixel according to an exemplary embodiment are substantially similar to the pixel described with reference to FIG. 49 to FIG. 52, except that the support substrate 2511 is a thin film transistor panel including transistors and capacitors and the reflective electrode 2250 is disposed in a lower region of the first LED stack 2230.

The cathode of the third LED stack 2430 is connected to the support substrate 2511 through the connecting portion 2711a. For example, as shown in FIG. 54, the cathode of the third LED stack 2430 may be connected to the ground through electrical connection to the support substrate 2511. The cathodes of the second LED stack 2330 and the first LED stack 2230 may also be connected to the ground through electrical connection to the support substrate 2511 via the connecting portions 2731a and 2751a.

The reflective electrode is connected to the transistors Tr2 (see FIG. 54) inside the support substrate 2511. The third-p transparent electrode and the second-p transparent electrode are also connected to the transistors Tr2 (see FIG. 54) inside the support substrate 2511 through the connecting portions 2711b and 2731b.

In this manner, the first to third LED stacks are connected to one another, thereby forming a circuit for active matrix driving, as shown in FIG. 54.

Although FIG. 55 shows a pixel having an electrical connection for active matrix driving according to an exemplary embodiment, the inventive concepts are not limited thereto, and the circuit for the display apparatus can be modified into various circuits for active matrix driving in various ways.

In addition, the reflective electrode 2250, the second-p transparent electrode 2350, and the third-p transparent electrode 2450 of FIG. 46 are described as forming ohmic contact with the p-type semiconductor layer of each of the first LED stack 2230, the second LED stack 2330, and the third LED stack 2430, and the ohmic electrode 2290 is described as forming ohmic contact with the n-type semiconductor layer of the first LED stack 2230, the n-type semiconductor layer of each of the second LED stack 2330, and the third LED stack 2430 is not provided with a separate ohmic contact layer. Although there is less difficulty in current spreading even without formation of a separate ohmic contact layer in the n-type semiconductor layer when the pixels have a small size of 200 µm or less, however, a transparent electrode layer may be disposed on the n-type semiconductor layer of each of the LED stacks in order to secure current spreading according to some exemplary embodiments.

In addition, although FIG. 46 shows the coupling of the first to third LED stacks 2230, 2330, and 2430 to one another via a bonding layers, the inventive concepts are not limited thereto, and the first to third LED stacks 2230, 2330, and 2430 may be connected to one another in various sequences and using various structures.

According to exemplary embodiments, since it is possible to form a plurality of pixels at the wafer level using the light emitting diode stack 2000 for a display, the need for individual mounting of light emitting diodes may be obviated. In addition, the light emitting diode stack according to exemplary embodiments has the structure in which the first to third LED stacks 2230, 2330, and 2430 are stacked in the vertical direction, and thus, an area for subpixels may be secured in a limited pixel area. Furthermore, the light emitting diode stack according to the exemplary embodiments allows light generated from the first LED stack 2230, the second LED stack 2330, and the third LED stack 2430 to be emitted outside therethrough, thereby reducing light loss.

Figure 56:
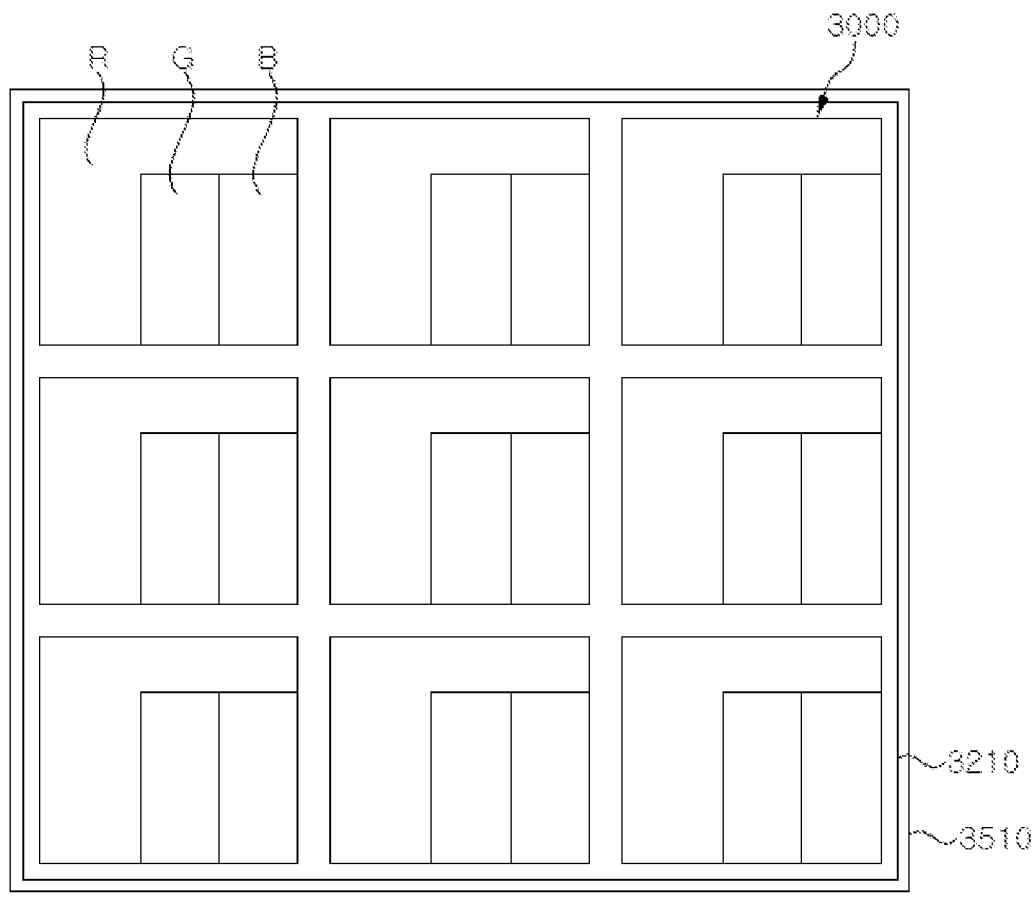
FIG. 56 is a schematic plan view of a display apparatus according to an exemplary embodiment.
Figure 57:
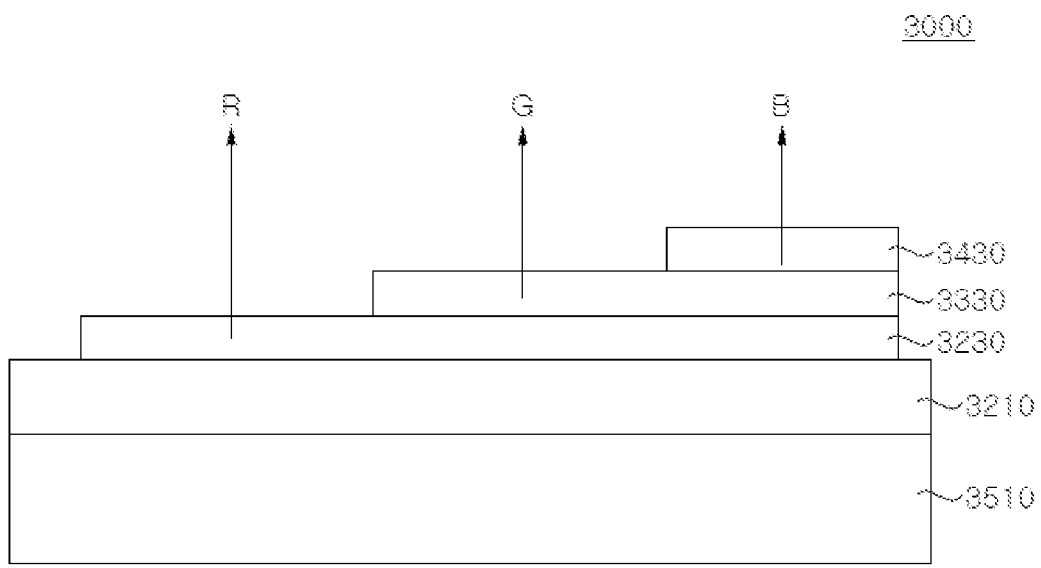
FIG. 57 is a cross-sectional view of a light emitting diode pixel for a display according to an exemplary embodiment.

FIG. 56 is a schematic plan view of a display apparatus according to an exemplary embodiment, and FIG. 57 is a schematic cross-sectional view of a light emitting diode pixel for a display according to an exemplary embodiment.

Referring to FIG. 56 and FIG. 57, the display apparatus includes a circuit board 3510 and a plurality of pixels 3000. Each of the pixels 3000 includes a substrate 3210 and first to third subpixels R, G, and B disposed on the substrate 3210.

The circuit board 3510 may include a passive circuit or an active circuit. The passive circuit may include, for example, data lines and scan lines. The active circuit may include, for example, a transistor and a capacitor. The circuit board 3510 may have a circuit on a surface thereof or therein. The circuit board 3510 may include, for example, a glass substrate, a sapphire substrate, a Si substrate, or a Ge substrate.

The substrate 3210 supports first to third subpixels R, G, and B. The substrate 3210 is continuous over the plurality of pixels 3000 and electrically connects the subpixels R, G, and B to the circuit board 3510. For example, the substrate 3210 may be a GaAs substrate.

The first subpixel R includes a first LED stack 3230, the second subpixel G includes a second LED stack 3330, and the third subpixel B includes a third LED stack 3430. The first subpixel R is configured to allow the first LED stack 3230 to emit light, the second subpixel G is configured to allow the second LED stack 3330 to emit light, and the third subpixel B is configured to allow the third LED stack 3430 to emit light. The first to third LED stacks 3230, 3330, and 3430 may be driven independently.

The first LED stack 3230, the second LED stack 3330, and the third LED stack 3430 are stacked to overlap one another in the vertical direction. Here, as shown in FIG. 57, the second LED stack 3330 may be disposed in a portion of the first LED stack 3230. For example, the second LED stack 3330 may be disposed towards one side on the first LED stack 3230. The third LED stack 3430 may be disposed in a portion of the second LED stack 3330. For example, the third LED stack 3430 may be disposed towards one side on the second LED stack 3330. Although FIG. 57 shows that the third LED stack 3430 is disposed towards right side, the inventive concepts are not limited thereto. Alternatively, the third LED stack 3430 may be disposed towards the left side of the second LED stack 3330.

Light R generated from the first LED stack 3230 may be emitted through a region not covered by the second LED stack 3330, and light G generated from the second LED stack 3330 may be emitted through a region not covered by the third LED stack 3430. More particularly, light generated from the first LED stack 3230 may be emitted to the outside without passing through the second LED stack 3330 and the third LED stack 3430, and light generated from the second LED stack 3330 may be emitted to the outside without passing through the third LED stack 3430.

The region of the first LED stack 3230 through which the light R is emitted, the region of the second LED stack 3330 through which the light G is emitted, and the region of the third LED stack 3430 may have different areas, and the intensity of light emitted from each of the LED stacks 3230, 3330, and 3430 may be adjusted by adjusting the areas thereof.

However, the inventive concepts are not limited thereto. Alternatively, light generated from the first LED stack 3230 may be emitted to the outside after passing through the second LED stack 3330 or after passing through the second LED stack 3330 and the third LED stack 3430, and light generated from the second LED stack 3330 may be emitted to the outside after passing through the third LED stack 3430.

Each of the first LED stack 3230, the second LED stack 3330, and the third LED stack 3430 may include a first conductivity type (for example, n-type) semiconductor layer, a second conductivity type (for example, p-type) semiconductor layer, and an active layer interposed therebetween. The active layer may have a multi-quantum well structure. The first to third LED stacks 3230, 3330, and 3430 may include different active layers to emit light having different wavelengths. For example, the first LED stack 3230 may be an inorganic light emitting diode configured to emit red light, the second LED stack 3330 may be an inorganic light emitting diode configured to emit green light, and the third LED stack 3430 may be an inorganic light emitting diode configured to emit blue light. To this end, the first LED stack 3230 may include an AlGaInP-based well layer, the second LED stack 3330 may include an AlGaInP or AlGaInN-based well layer, and the third LED stack 3430 may include an AlGaInN-based well layer. However, the inventive concepts are not limited thereto. The wavelengths of light generated from the first LED stack 3230, the second LED stack 3330, and the third LED stack 3430 may be varied. For example, the first LED stack 3230, the second LED stack 3330, and the third LED stack 3430 may emit green light, red light, and blue light, respectively, or may emit green light, blue light, and red light, respectively.

In addition, a distributed Bragg reflector may be interposed between the substrate 3210 and the first LED stack 3230 to prevent loss of light generated from the first LED stack 3230 through absorption by the substrate 3210. For example, a distributed Bragg reflector formed by alternately stacking AlAs and AlGaAs semiconductor layers one above another may be interposed therebetween.

Figure 58:
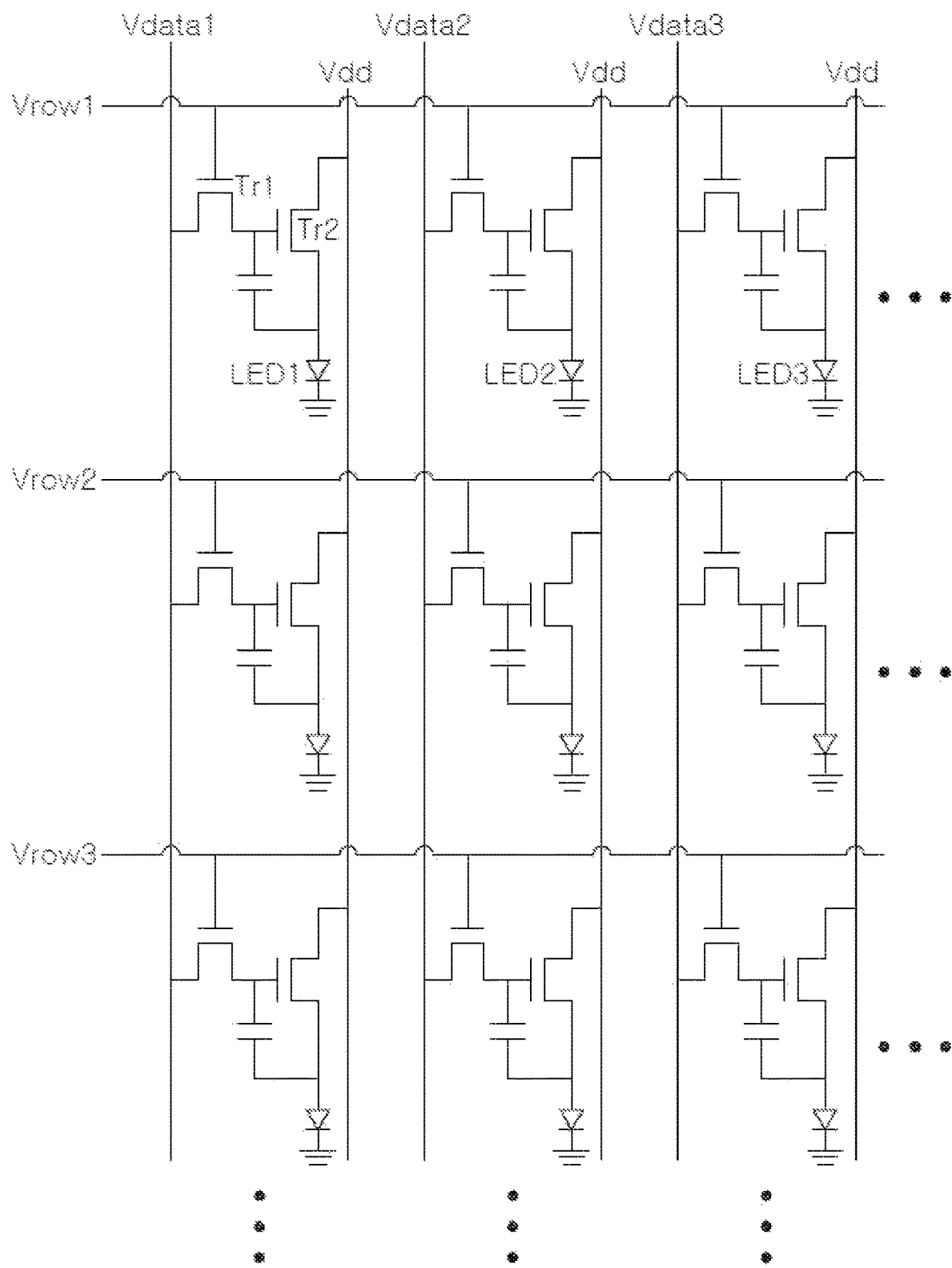
FIG. 58 is a schematic circuit diagram of a display apparatus according to an exemplary embodiment.

FIG. 58 is a schematic circuit diagram of a display apparatus according to an exemplary embodiment.

Referring to FIG. 58, the display apparatus according to an exemplary embodiment may be driven in an active matrix manner. As such, the circuit board may include an active circuit.

For example, the drive circuit may include at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitors are charged according to the values of Vdata1 to Vdata3. Since a turned-on state of the transistor Tr2 can be maintained by the charged voltage of the capacitor, the voltage of the capacitor can be maintained and applied to the light emitting diodes LED1 to LED3 even when power supplied to Vrow1 is cut off. In addition, electric current flowing in the light emitting diodes LED1 to LED3 can be changed depending upon the values of Vdata1 to Vdata3. Electric current can be continuously supplied through Vdd, and thus, light may be emitted continuously.

The transistors Tr1, Tr2 and the capacitor may be formed inside the support substrate 3510. Here, the light emitting diodes LED1 to LED3 may correspond to the first to third LED stacks 3230, 3330, and 3430 stacked in one pixel, respectively. The anodes of the first to third LED stacks 3230, 3330, and 3430 are connected to the transistor Tr2 and the cathodes thereof are connected to the ground. The cathodes of the first to third LED stacks 3230, 3330, and 3430, for example, may be commonly connected to the ground.

Although FIG. 58 shows the circuit for active matrix driving according to an exemplary embodiment, other types of circuits may also be used. In addition, although the anodes of the light emitting diodes LED1 to LED3 are described as being connected to different transistors Tr2 and the cathodes thereof are described as being connected to the ground, the anodes of the light emitting diodes may be commonly connected and the cathodes thereof may be connected to different transistors in some exemplary embodiments.

Although the active circuit for active matrix driving is illustrated above, the inventive concepts are not limited thereto, and the pixels according to an exemplary embodiment may be driven in a passive matrix manner. As such, the circuit board 3510 may include data lines and scan lines arranged thereon, and each of the subpixels may be connected to the data line and the scan line. In an exemplary embodiment, the anodes of the first to third LED stacks 3230, 3330, and 3430 may be connected to different data lines and the cathodes thereof may be commonly connected to a scan line. In another exemplary embodiments, the anodes of the first to third LED stacks 3230, 3330, and 3430 may be connected to different scan lines and the cathodes thereof may be commonly connected to a data line.

In addition, each of the LED stacks 3230, 3330, and 3430 may be driven by a pulse width modulation or by changing the magnitude of electric current, thereby controlling the brightness of each subpixel. Furthermore, the brightness may be adjusted by adjusting the areas of the first to third LED stacks 3230, 3330, and 3430, and the areas of the regions of the LED stacks 3230, 3330, and 3430 through which light R, G, and B is emitted. For example, an LED stack emitting light having low visibility, for example, the first LED stack 3230, has a larger area than the second LED stack 3330 or the third LED stack 3430, and thus, can emit light with a higher intensity under the same current density. In addition, since the area of the second LED stack 3330 is larger than the area of the third LED stack 3430, the second LED stack 3330 can emit light with a higher intensity under the same current density than the third LED stack 3430. In this manner, light output can be adjusted based on the visibility of light emitted from the first to third LED stacks 3230, 3330, and 3430 by adjusting the areas of the first LED stack 3230, the second LED stack 3330, and the third LED stack 3430.

Figure 59A:
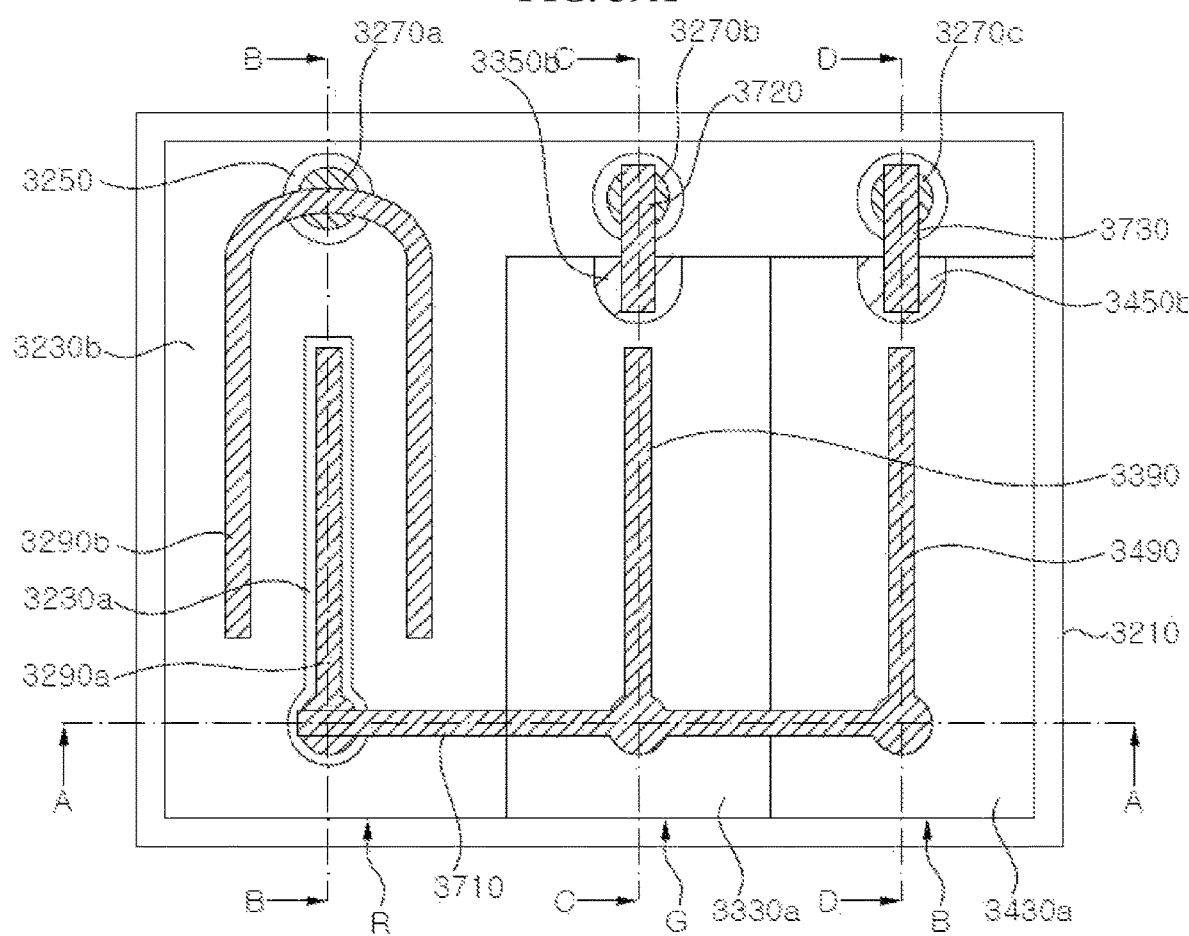
FIG. 59A and FIG. 59B are a top view and a bottom view of one pixel of a display apparatus according to exemplary embodiments, respectively.
Figure 59B:
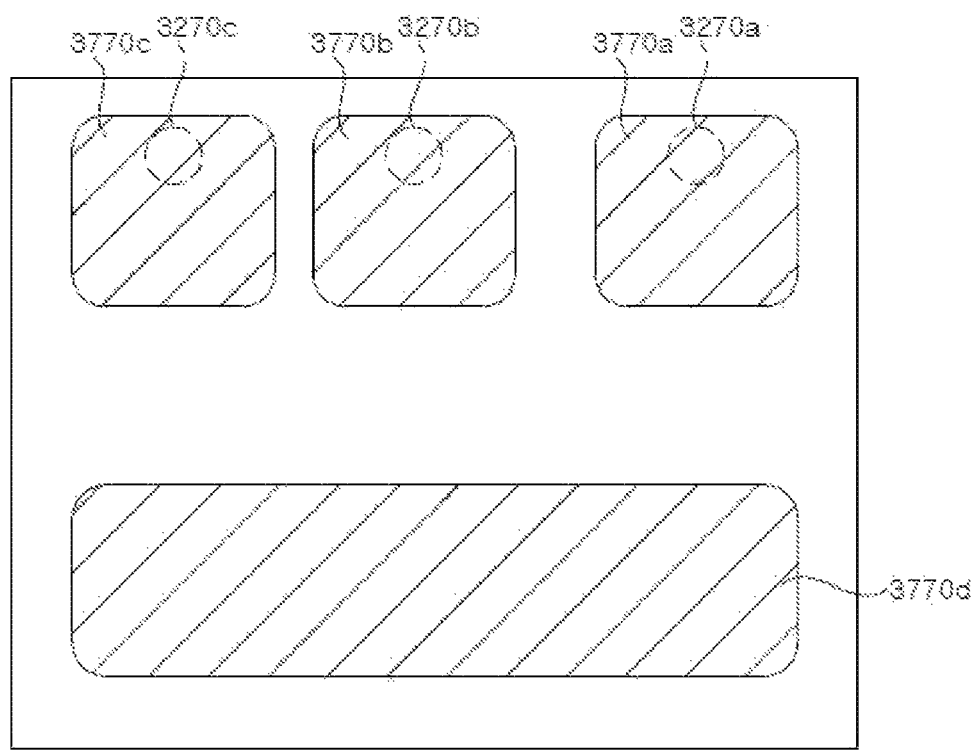
Figure 60A:
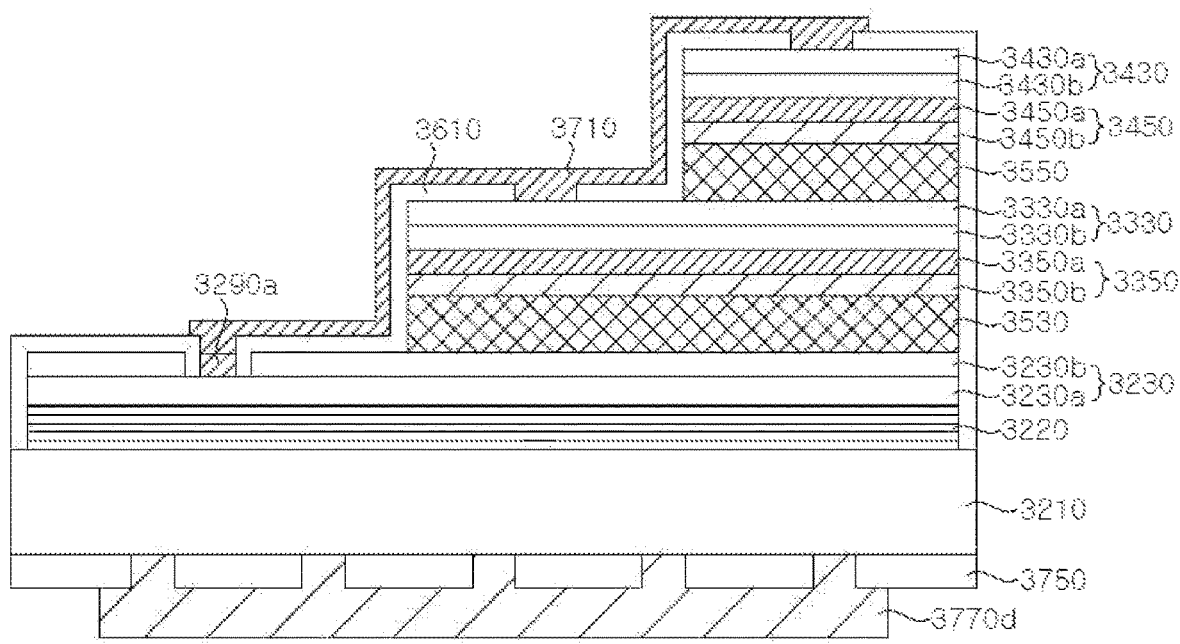
FIG. 60A is a schematic cross-sectional view taken along line A-A of FIG. 59A.
Figure 60B:
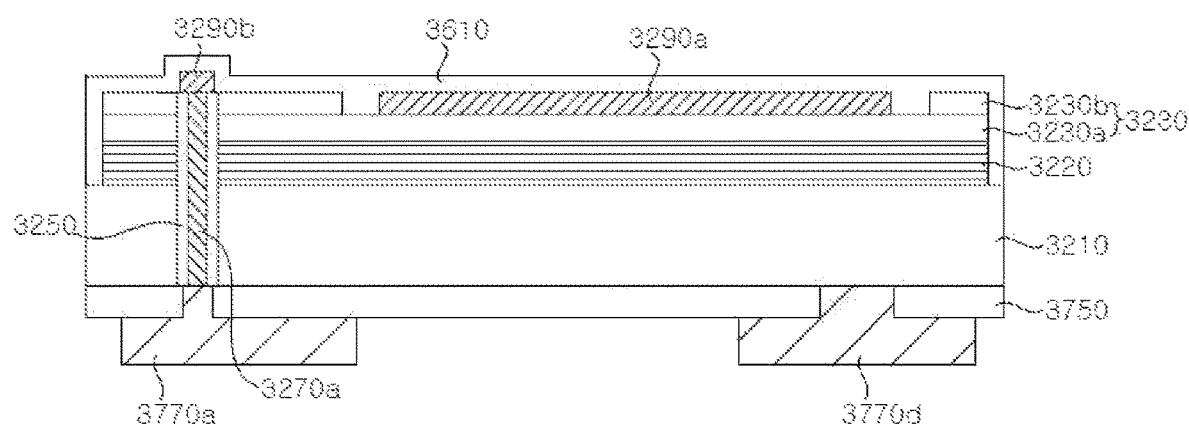
FIG. 60B is a schematic cross-sectional view taken along line B-B of FIG. 59A according to an exemplary embodiment.
Figure 60C:
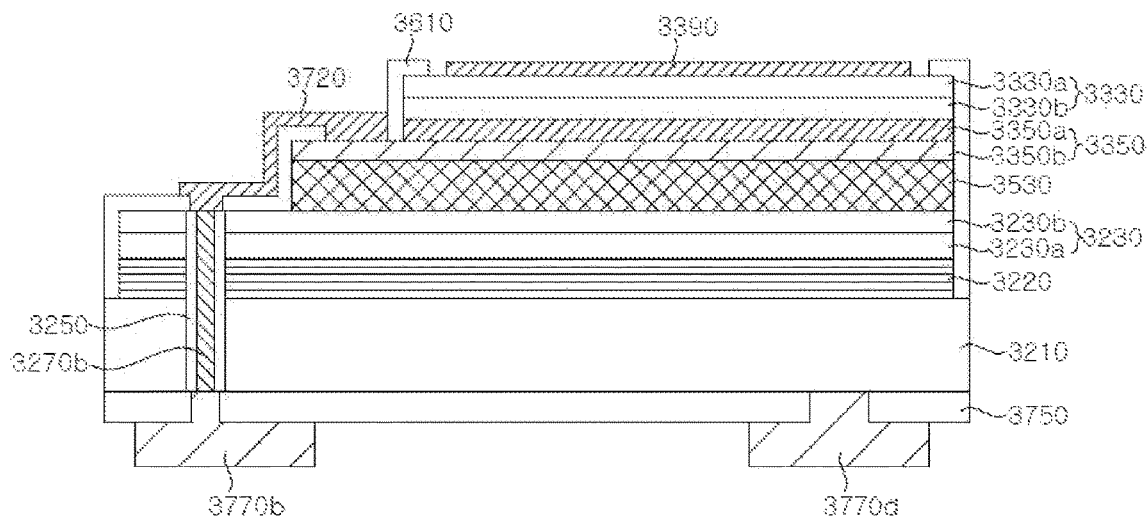
FIG. 60C is a schematic cross-sectional view taken along line C-C of FIG. 59A according to an exemplary embodiment.
Figure 60D:
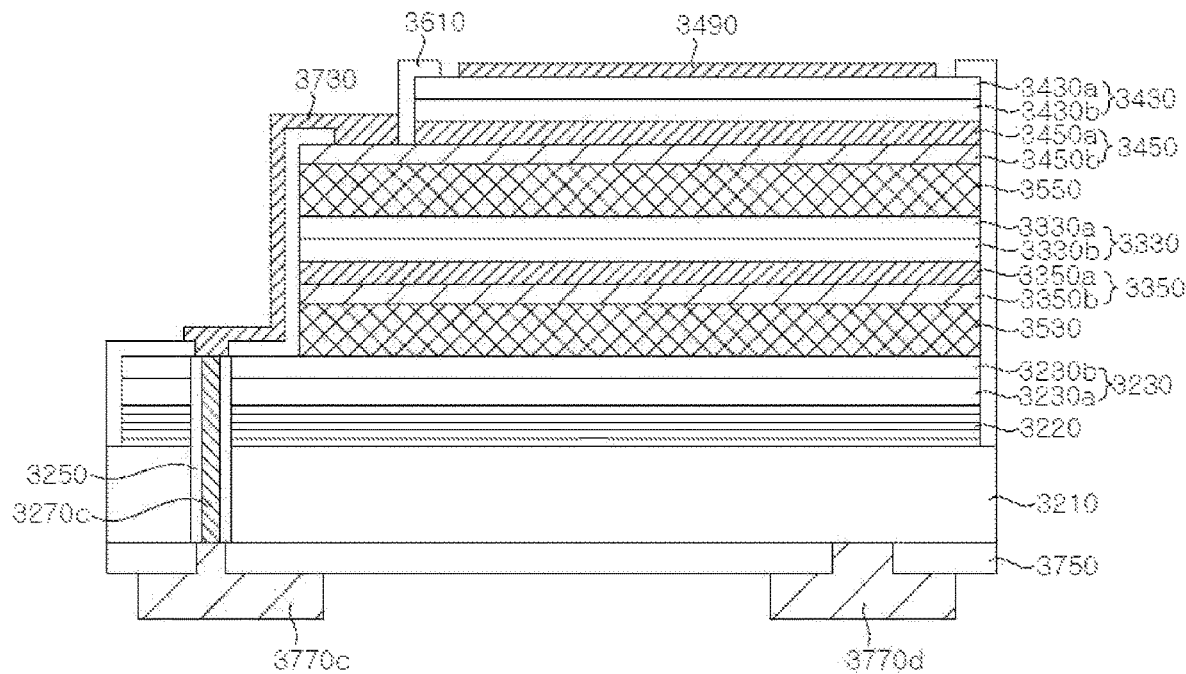
FIG. 60D is a schematic cross-sectional view taken along line D-D of FIG. 59A according to an exemplary embodiment.

FIG. 59A and FIG. 59B are a top view and a bottom view of one pixel of a display apparatus according to an exemplary embodiment, and FIG. 60A, FIG. 60B, FIG. 60C, and FIG. 60D are schematic cross-sectional views taken along lines A-A, B-B, C-C, and D-D of FIG. 59A, respectively.

In the display apparatus, pixels are arranged on a circuit board 3510 (see FIG. 56) and each of the pixel includes a substrate 3210 and subpixels R, G, and B. The substrate 3210 may be continuous over the plurality of pixels. Hereinafter, a configuration of a pixel according to an exemplary embodiment will be described.

Referring to FIG. 59A, FIG. 59B, FIG. 60A, FIG. 60B, FIG. 60C, and FIG. 60D, the pixel includes a substrate 3210, a distributed Bragg reflector 3220, an insulation layer 3250, through-hole vias 3270a, 3270b, 3270c, a first LED stack 3230, a second LED stack 3330, a third LED stack 3430, a first-1 ohmic electrode 3290a, a first-2 ohmic electrode 3290b, a second-1 ohmic electrode 3390, a second-2 ohmic electrode 3350, a third-1 ohmic electrode 3490, a third-2 ohmic electrode 3450, a first bonding layer 3530, a second bonding layer 3550, an upper insulation layer 3610, connectors 3710, 3720, 3730, a lower insulation layer 3750, and electrode pads 3770a, 3770b, 3770c, 3770d.

Each of subpixels R, G, and B includes the LED stacks 3230, 3330, and 3430 and ohmic electrodes. In addition, anodes of the first to third subpixels R, G, and B may be electrically connected to the electrode pads 3770a, 3770b, and 3770c, respectively, and cathodes thereof may be electrically connected to the electrode pad 3770d, thereby allowing the first to third subpixels R, G, and B to be driven independently.

The substrate 3210 supports the LED stacks 3230, 3330, and 3430. The substrate 3210 may be a growth substrate on which AlGaInP-based semiconductor layers may be grown thereon, for example, a GaAs substrate. In particular, the substrate 3210 may be a semiconductor substrate exhibiting n-type conductivity.

The first LED stack 3230 includes a first conductivity type semiconductor layer 3230a and a second conductivity type semiconductor layer 3230b, the second LED stack 3330 includes a first conductivity type semiconductor layer 3330a and a second conductivity type semiconductor layer 3330b, and the third LED stack 3430 includes a first conductivity type semiconductor layer 3430a and a second conductivity type semiconductor layer 3430b. An active layer may be interposed between the first conductivity type semiconductor layer 3230a, 3330a, or 3430a and the second conductivity type semiconductor layer 3230b, 3330b, or 3430b.

According to an exemplary embodiment, each of the first conductivity type semiconductor layers 3230a, 3330a, 3430a may be an n-type semiconductor layer, and each of the second conductivity type semiconductor layers 3230b, 3330b, 3430b may be a p-type semiconductor layer. A roughened surface may be formed on an upper surface of each of the first conductivity type semiconductor layers 3230a, 3330a, 3430a by surface texturing. However, the inventive concepts are not limited thereto and the first and second conductivity types can be changed vice versa.

The first LED stack 3230 is disposed near the substrate 3210, the second LED stack 3330 is disposed on the first LED stack 3230, and the third LED stack 3430 is disposed on the second LED stack 3330. The second LED stack 3330 is disposed in some region on the first LED stack 3230, so that the first LED stack 3230 partially overlaps the second LED stack 3330. The third LED stack 3430 is disposed in some region on the second LED stack 3330, so that the second LED stack 3330 partially overlaps the third LED stack 3430. Accordingly, light generated from the first LED stack 3230 can be emitted to the outside without passing through the second and third LED stacks 3330 and 3430. In addition, light generated from the second LED stack 3330 can be emitted to the outside without passing through the third LED stack 3430.

Materials for the first LED stack 3230, the second LED stack 3330, and the third LED stack 3430 are substantially the same as those described with reference to FIG. 57, and thus, detailed descriptions thereof will be omitted to avoid redundancy.

The distributed Bragg reflector 3220 is interposed between the substrate 3210 and the first LED stack 3230. The distributed Bragg reflector 3220 may include a semiconductor layer grown on the substrate 3210. For example, the distributed Bragg reflector 3220 may be formed by alternately stacking AlAs layers and AlGaAs layers. The distributed Bragg reflector 3220 may include a semiconductor layer that electrically connects the substrate 3210 to the first conductivity type semiconductor layer 3230a of the first LED stack 3230.

Through-hole vias 3270a, 3270b, 3270c are formed through the substrate 3210. The through-hole vias 3270a, 3270b, 3270c may be formed to pass through the first LED stack 3230. The through-hole vias 3270a, 3270b, 3270c may be formed of conductive pastes or by plating.

The insulation layer 3250 is disposed between the through-hole vias 3270a, 3270b, and 3270c and an inner wall of a through-hole formed through the substrate 3210 and the first LED stack 3230 to prevent short circuit between the first LED stack 3230 and the substrate 3210.

The first-1 ohmic electrode 3290a forms ohmic contact with the first conductivity type semiconductor layer 3230a of the first LED stack 3230. The first-1 ohmic electrode 3290a may be formed of, for example, Au—Te or Au—Ge alloys.

In order to form the first-1 ohmic electrode 3290a, the second conductivity type semiconductor layer 3230b and the active layer may be partially removed to expose the first conductivity type semiconductor layer 3230a. The first-1 ohmic electrode 3290a may be disposed apart from the region where the second LED stack 3330 is disposed. Furthermore, the first-1 ohmic electrode 3290a may include a pad region and an extension, and the connector 3710 may be connected to the pad region of the first-1 ohmic electrode 3290a, as shown in FIG. 59A.

The first-2 ohmic electrode 3290b forms ohmic contact with the second conductivity type semiconductor layer 3230b of the first LED stack 3230. As shown in FIG. 59A, the first-2 ohmic electrode 3290b may be formed to partially surround the first-1 ohmic electrode 3290a in order to assist in current spreading. The first-2 ohmic electrode 3290b may not include the extension. The first-2 ohmic electrode 3290b may be formed of, for example, Au—Zn or Au—Be alloys. Furthermore, the first-2 ohmic electrode 3290b may have a single layer or multiple layers structure.

The first-2 ohmic electrode 3290b may be connected to the through-hole via 3270a such that the through-hole via 3270a can be electrically connected to the second conductivity type semiconductor layer 3230b.

The second-1 ohmic electrode 3390 forms ohmic contact with the first conductivity type semiconductor layer 3330a of the second LED stack 3330. The second-1 ohmic electrode 3390 may also include a pad region and an extension. As shown in FIG. 59A, the connector 3710 may electrically connect the second-1 ohmic electrode 3390 to the first-1 ohmic electrode 3290a. The second-1 ohmic electrode 3390 may be disposed apart from the region where the third LED stack 3430 is disposed.

The second-2 ohmic electrode 3350 forms ohmic contact with the second conductivity type semiconductor layer 3330b of the second LED stack 3330. The second-2 ohmic electrode 3350 may include a reflective layer 3350a and a barrier layer 3350b. The reflective layer 3350a reflects light generated from the second LED stack 3330 to improve luminous efficacy of the second LED stack 3330. The barrier layer 3350b may act as a connection pad, which provides the reflective layer 3350a, and is connected to the connector 3720. Although the second-2 ohmic electrode 3350 is described as including a metal layer in this exemplary embodiment, the inventive concepts are not limited thereto. For example, the second-2 ohmic electrode 3350 may be formed of a transparent conductive oxide, such as a conducive oxide semiconductor layer.

The third-1 ohmic electrode 3490 forms ohmic contact with the first conductivity type semiconductor layer 3430a of the third LED stack 3430. The third-1 ohmic electrode 3490 may also include a pad region and an extension, and the connector 3710 may connect the third-1 ohmic electrode 3490 to the first-1 ohmic electrode 3290a, as shown in FIG. 59A.

The third-2 ohmic electrode 3450 may form ohmic contact with the second conductivity type semiconductor layer 3430b of the third LED stack 3430. The third-2 ohmic electrode 3450 may include a reflective layer 3450a and a barrier layer 3450b. The reflective layer 3450a reflects light generated from the third LED stack 3430 to improve luminous efficacy of the third LED stack 3430. The barrier layer 3450b may act as a connection pad, which provides the reflective layer 3450a, and is connected to the connector 3730. Although the third-2 ohmic electrode 3450 is described as including a metal layer, the inventive concepts are not limited thereto. Alternatively, the third-2 ohmic electrode 3450 may be formed of a transparent conductive oxide, such as a conducive oxide semiconductor layer.

The first-2 ohmic electrode 3290b, the second-2 ohmic electrode 3350, and the third-2 ohmic electrode 3450 may form ohmic contact with the p-type semiconductor layers of the corresponding LED stacks to assist in current spreading, and the first-1 ohmic electrode 3290a, the second-1 ohmic electrode 3390, and the third-1 ohmic electrode 3490 may form ohmic contact with the n-type semiconductor layers of the corresponding LED stacks to assist in current spreading.

The first bonding layer 3530 couples the second LED stack 3330 to the first LED stack 3230. As shown in the drawings, the second-2 ohmic electrode 3350 may adjoin the first bonding layer 3530. The first bonding layer 3530 may be a light transmissive layer or an opaque layer. The first bonding layer 3530 may be formed of an organic material or an inorganic material. Examples of the organic material may include SUB, poly(methyl methacrylate) (PMMA), polyimide, Parylene, benzocyclobutene (BCB), or others, and examples of the inorganic material may include $Al_2O_3$, $SiO_2$, $SiN_x$, or others. The organic material layer may be bonded under high vacuum, and the inorganic material layer may be bonded under high vacuum after flattening the surface of the first bonding layer by, for example, chemical mechanical polishing, followed by adjusting surface energy through plasma treatment. The first bonding layer 3530 may be formed of spin-on-glass or may be a metal bonding layer formed of AuSn or the like. For the metal bonding layer, an insulation layer may be disposed on the first LED stack 3230 to secure electrical insulation between the first LED stack 3230 and the metal bonding layer. Furthermore, a reflective layer may be further disposed between the first bonding layer 3530 and the first LED stack 3230 to prevent light generated from the first LED stack 3230 from entering the second LED stack 3330.

The second bonding layer 3550 couples the second LED stack 3330 to the third LED stack 3430. The second bonding layer 3550 may be interposed between the second LED stack 3330 and the third-2 ohmic electrode 3450 to bond the second LED stack 3330 to the third-2 ohmic electrode 3450. The second bonding layer 3550 may be formed of substantially the same bonding material as the first bonding layer 3530. Furthermore, an insulation layer and/or a reflective layer may be further disposed between the second LED stack 3330 and the second bonding layer 3550.

When the first bonding layer 3530 and the second bonding layer 3550 are formed of a light transmissive material, and the second-2 ohmic electrode 3350 and the third-2 ohmic electrode 3450 are formed of a transparent oxide material, some fractions of light generated from the first LED stack 3230 may be emitted through the second LED stack 3330 after passing through the first bonding layer 3530 and the second-2 ohmic electrode 3350, and may also be emitted through the third LED stack 3430 after passing through the second bonding layer 3550 and the third-2 ohmic electrode 3450. In addition, some fractions of light generated from the second LED stack 3330 may be emitted through the third LED stack 3430 after passing through the second bonding layer 3550 and the third-2 ohmic electrode 3450.

In this case, light generated from the first LED stack 3230 should be prevented from being absorbed by the second LED stack 3330 while passing through the second LED stack 3330. As such, light generated from the first LED stack 3230 may have a smaller bandgap than the second LED stack 3330, and thus, may have a longer wavelength than light generated from the second LED stack 3330.

In addition, in order to prevent light generated from the second LED stack 3330 from being absorbed by the third LED stack 3430 while passing through the third LED stack 3430, light generated from the second LED stack 3330 may have a longer wavelength than light generated from the third LED stack 3430.

When the first bonding layer 3530 and the second bonding layer 3550 are formed of opaque materials, the reflective layers are interposed between the first LED stack 3230 and the first bonding layer 3530, and between the second LED stack 3330 and the second bonding layer 3550, respectively, to reflect light having been generated from the first LED stack 3230 and entering the first bonding layer 3530, and light having been generated from the second LED stack 3330 and entering the second bonding layer 3550. The reflected light may be emitted through the first LED stack 3230 and the second LED stack 3330.

The upper insulation layer 3610 may cover the first to third LED stacks 3230, 3330, and 3430. In particular, the upper insulation layer 3610 may cover side surfaces of the second LED stack 3330 and the third LED stack 3430, and may also cover the side surface of the first LED stack 3230.

The upper insulation layer 3610 has openings that expose the first to third the through-hole vias 3270a, 3270b, 3270c, and openings that expose the first conductivity type semiconductor layer 3330a of the second LED stack 3330, the first conductivity type semiconductor layer 3430a of the third LED stack 3430, the second-2 ohmic electrode 3350, and the third-2 ohmic electrode 3450.

The upper insulation layer 3610 may be formed of any insulation material, for example, silicon oxide or silicon nitride, without being limited thereto.

The connector 3710 electrically connects the first-1 ohmic electrode 3290a, the second-1 ohmic electrode 3390, and the third-1 ohmic electrode 3490 to one another. The connector 3710 is formed on the upper insulation layer 3610, and is insulated from the second conductivity type semiconductor layer 3430b of the third LED stack 3430, the second conductivity type semiconductor layer 3330b of the second LED stack 3330, and the second conductivity type semiconductor layer 3230b of the first LED stack 3230.

The connector 3710 may be formed of substantially the same material as the second-1 ohmic electrode 3390 and the third-1 ohmic electrode 3490, and thus, may be formed together with the second-1 ohmic electrode 3390 and the third-1 ohmic electrode 3490. Alternatively, the connector 3710 may be formed of a different conductive material from the second-1 ohmic electrode 3390 or the third-1 ohmic electrode 3490, and thus, may be separately formed in a different process from the second-1 ohmic electrode 3390 and/or the third-1 ohmic electrode 3490.

The connector 3720 may electrically connect the second-2 ohmic electrode 3350, for example, the barrier layer 3350b, to the second through-hole via 3270b. The connector 3730 electrically connects the third-2 ohmic electrode, for example, the barrier layer 3450b, to the third through-hole via 3270c. The connector 3720 may be electrically insulated from the first LED stack 3230 by the upper insulation layer 3610. The connector 3730 may also be electrically insulated from the second LED stack 3330 and the first LED stack 3230 by the upper insulation layer 3610.

The connectors 3720, 3730 may be formed together by the same process. The connector 3720, 3730 may also be formed together with the connector 3710. Furthermore, the connectors 3720, 3730 may be formed of substantially the same material as the second-1 ohmic electrode 3390 and the third-1 ohmic electrode 3490, and may be formed together therewith. Alternatively, the connectors 3720, 3730 may be formed of a different conductive material from the second-1 ohmic electrode 3390 or the third-1 ohmic electrode 3490, and thus may be separately formed by a different process from the second-1 ohmic electrode 3390 and/or the third-1 ohmic electrode 3490.

The lower insulation layer 3750 covers a lower surface of the substrate 3210. The lower insulation layer 3750 may include openings which expose the first to third through-hole vias 3270a, 3270b, 3270c at a lower side of the substrate 3210, and may also include openings which expose the lower surface of the substrate 3210.

The electrode pads 3770a, 3770b, 3770c, and 3770d are disposed on the lower surface of the substrate 3210. The electrode pads 3770a, 3770b, and 3770c are connected to the through-hole vias 3270a, 3270b, and 3270c through the openings of the lower insulation layer 3750, and the electrode pad 3770d is connected to the substrate 3210.

The electrode pads 3770a, 3770b, and 3770c are provided to each pixel to be electrically connected to the first to third LED stacks 3230, 3330, and 3430 of each pixel, respectively. Although the electrode pad 3770d may also be provided to each pixel, the substrate 3210 is continuously disposed over a plurality of pixels, which may obviate the need for providing the electrode pad 3770d to each pixel.

The electrode pads 3770a, 3770b, 3770c, 3770d are bonded to the circuit board 3510, thereby providing a display apparatus.

Next, a method of manufacturing the display apparatus according to an exemplary embodiment will be described.

FIG. 61A to FIG. 68B are schematic plan views and cross-sectional views illustrating a method of manufacturing the display apparatus according to an exemplary embodiment. Each of the cross-sectional views is taken along a line shown in each corresponding plan view.

Figure 61A:
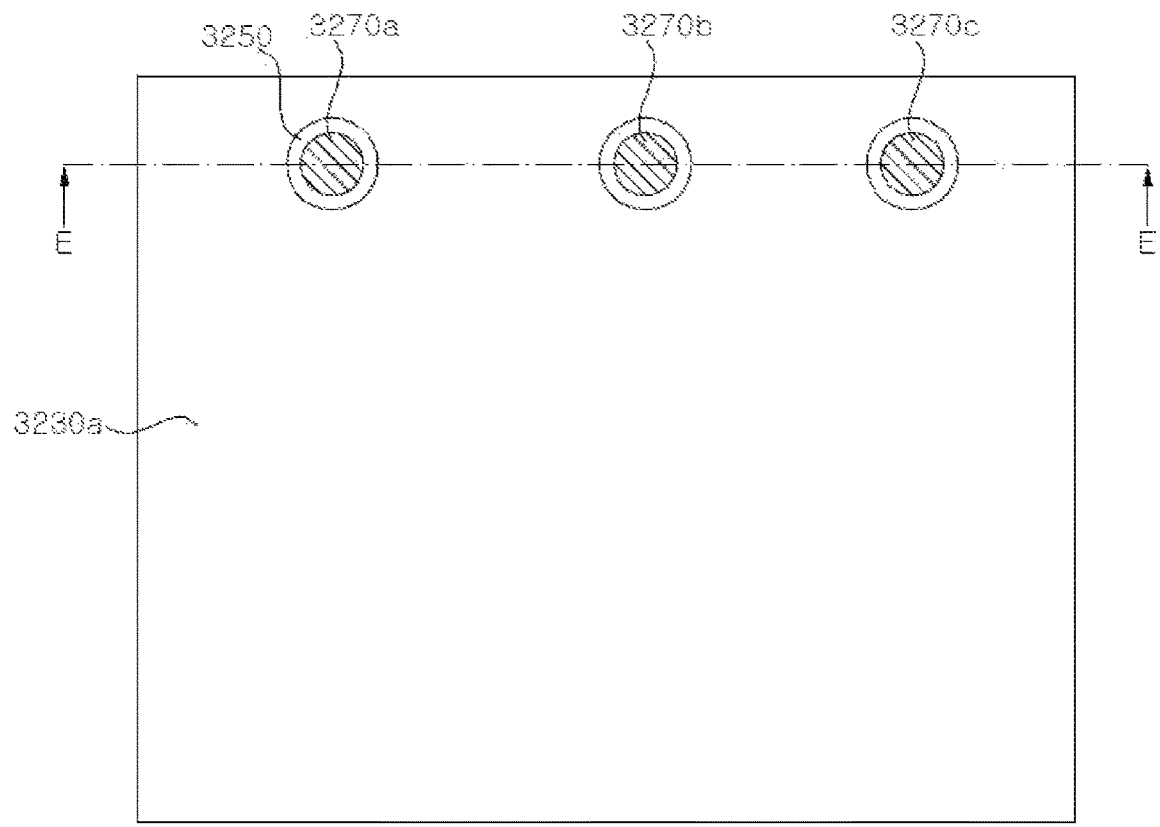
FIGS. 61A, 61B, 62A, 62B, 63A, 63B, 64A, 64B, 65A, 65B, 66A, 66B, 67A, 67B, 68A, and 68B are schematic plan views and cross-sectional views illustrating a method of manufacturing a display apparatus according to an exemplary embodiment.
Figure 61B:
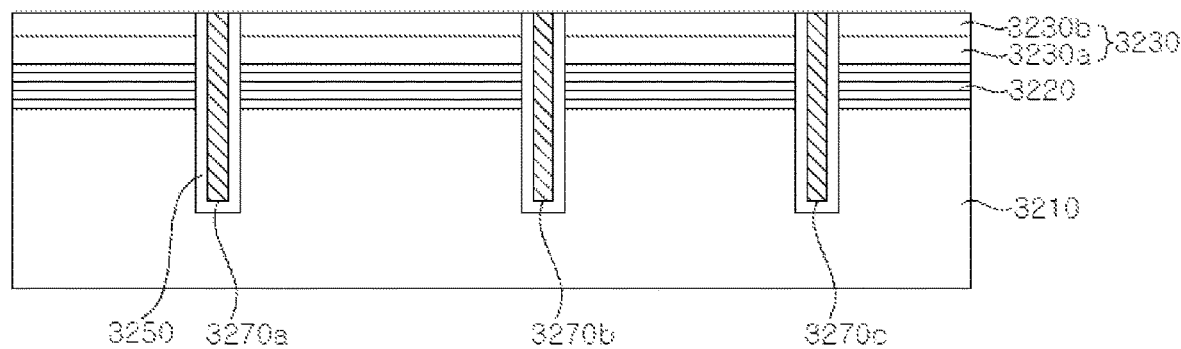

Referring to FIGS. 61A and 61B, a first LED stack 3230 is grown on a substrate 3210. The substrate 3210 may be, for example, a GaAs substrate. The first LED stack 3230 is formed of AlGaInP-based semiconductor layers, and includes a first conductivity type semiconductor layer 3230a, an active layer, and a second conductivity type semiconductor layer 3230b. A distributed Bragg reflector 3220 may be formed prior to growth of the first LED stack 3230. The distributed Bragg reflector 3220 may have a stack structure formed by repeatedly stacking, for example, AlAs/AlGaAs layers.

Then, grooves are formed on the first LED stack 3230 and the substrate 3210 through photolithography and etching. The grooves may be formed to pass through the substrate 3210 or may be formed to a predetermined depth in the substrate 3210, as shown in FIG. 61B.

Then, an insulation layer 3250 is formed to cover sidewalls of the grooves and through-hole vias 3270a, 3270b, 3270c are formed to fill the grooves. The through-hole vias 3270a, 3270b, and 3270c may be formed by, for example, forming an insulation layer to cover the sidewalls of the grooves, filling the groove with a conductive material layer or conductive pastes through plating, and removing the insulation and the conductive material layer from an upper surface of the first LED stack 3230 through chemical mechanical polishing.

Figure 62A:
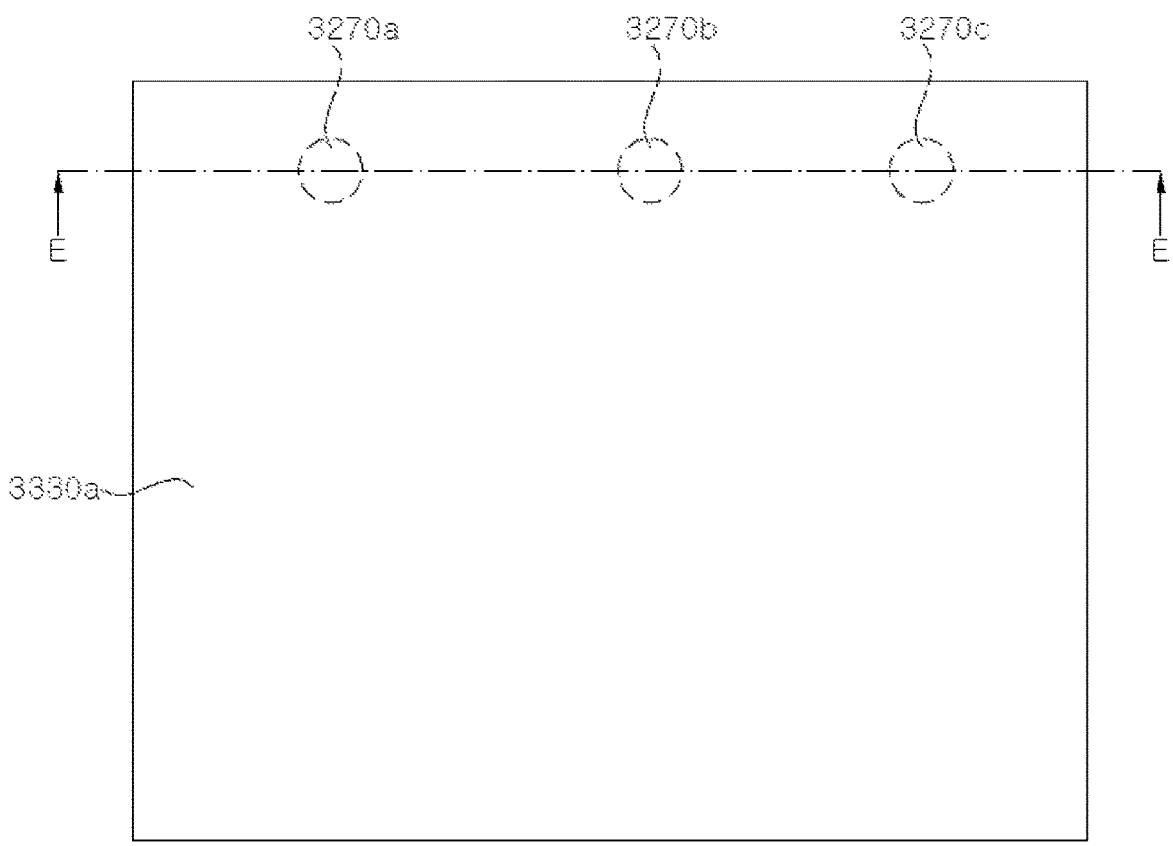
Figure 62B:
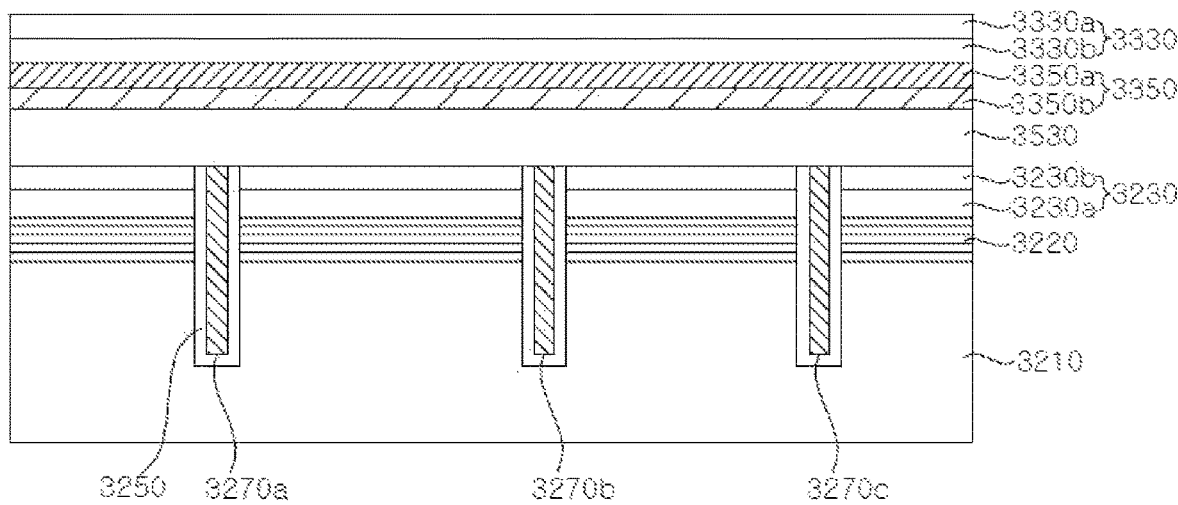

Referring to FIG. 62A and FIG. 62B, a second LED stack 3330 and a second-2 ohmic electrode 3350 may be coupled to the first LED stack 3230 via the first bonding layer 3530.

The second LED stack 3330 is grown on a second substrate, and the second-2 ohmic electrode 3350 is formed on the second LED stack 3330. The second LED stack 3330 is formed of AlGaInP-based or AlGaInN-based semiconductor layers, and may include a first conductivity type semiconductor layer 3330a, an active layer, and a second conductivity type semiconductor layer 3330b. The second substrate may be a substrate on which AlGaInP-based semiconductor layers may be grown thereon, for example, a GaAs substrate, or a substrate on which AlGaInN-based semiconductor layers may be grown thereon, for example, a sapphire substrate. The composition ratio of Al, Ga, and In for the second LED stack 3330 may be determined such that the second LED stack 3330 can emit green light. The second-2 ohmic electrode 3350 forms ohmic contact with the second conductivity type semiconductor layer 3330b, for example, a p-type semiconductor layer. The second-2 ohmic electrode 3350 may include a reflective layer 3350a, which reflects light generated from the second LED stack 3330, and a barrier layer 3350b.

The second-2 ohmic electrode 3350 is disposed to face the first LED stack 3230 and is coupled to the first LED stack 3230 by the first bonding layer 3530. Thereafter, the second substrate is removed from the second LED stack 3330 to expose the first conductivity type semiconductor layer 3330a by chemical etching or laser lift-off. A roughened surface may be formed on the exposed first conductivity type semiconductor layer 3330a by surface texturing.

According to an exemplary embodiment, an insulation layer and a reflective layer may be further formed on the first LED stack 3230 before formation of the first bonding layer 3530.

Figure 63A:
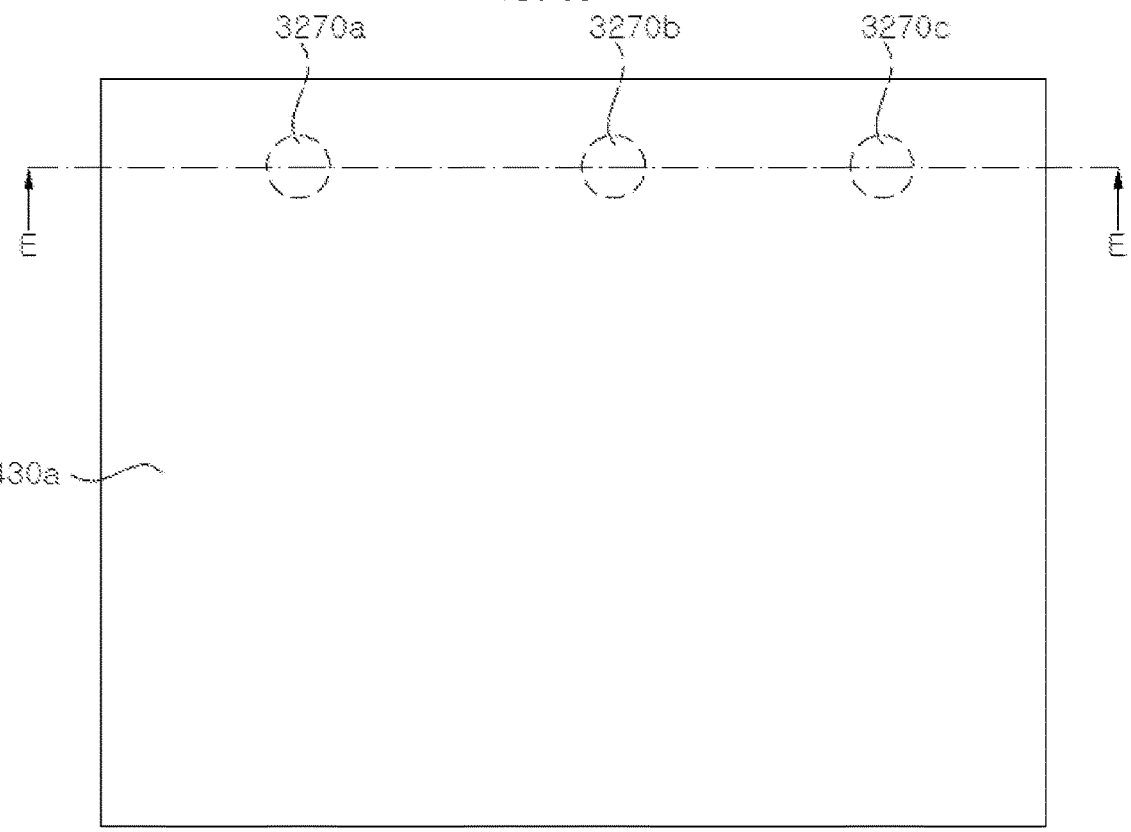
Figure 63B:
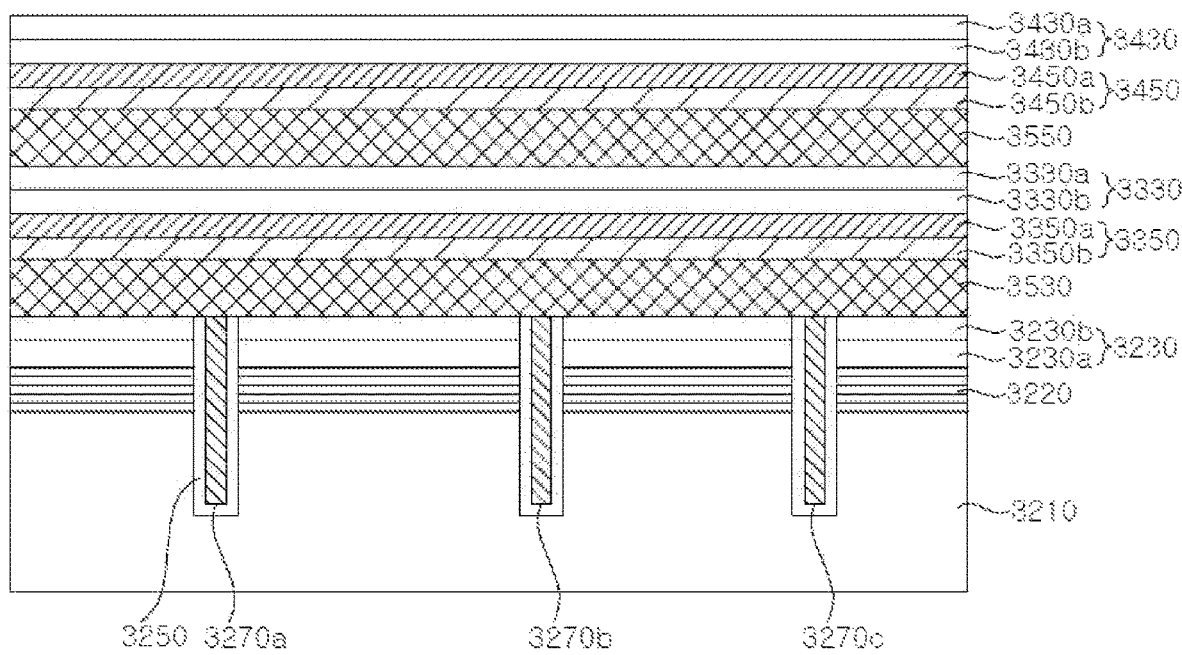

Referring to FIG. 63A and FIG. 63B, a third LED stack 3430 and a third-2 ohmic electrode 3450 may be coupled to the second LED stack 3330 via the second bonding layer 3550.

The third LED stack 3430 is grown on a third substrate, and the third-2 ohmic electrode 3450 is formed on the third LED stack 3430. The third LED stack 3430 is formed of AlGaInN-based semiconductor layers, and may include a first conductivity type semiconductor layer 3430*a*, an active layer, and a second conductivity type semiconductor layer 3430*b*. The third substrate is a substrate on which GaN-based semiconductor layers may be grown thereon, and is different from the first substrate 3210. The composition ratio of AlGaInN for the third LED stack 3430 may be determined such that the third LED stack 3430 can emit blue light. The third-2 ohmic electrode 3450 forms ohmic contact with the second conductivity type semiconductor layer 3430*b*, for example, a p-type semiconductor layer. The third-2 ohmic electrode 3450 may include a reflective layer 3450*a*, which reflects light generated from the third LED stack 3430, and a barrier layer 3450*b*.

The third-2 ohmic electrode 3450 is disposed to face the second LED stack 3330 and is coupled to the second LED stack 3330 by the second bonding layer 3550. Thereafter, the third substrate is removed from the third LED stack 3430 to expose the first conductivity type semiconductor layer 3430*a* by chemical etching or laser lift-off. A roughened surface may be formed on the exposed first conductivity type semiconductor layer 3430*a* by surface texturing.

According to an exemplary embodiment, an insulation layer and a reflective layer may be further formed on the second LED stack 3330 before formation of the second bonding layer 3550.

Figure 64A:
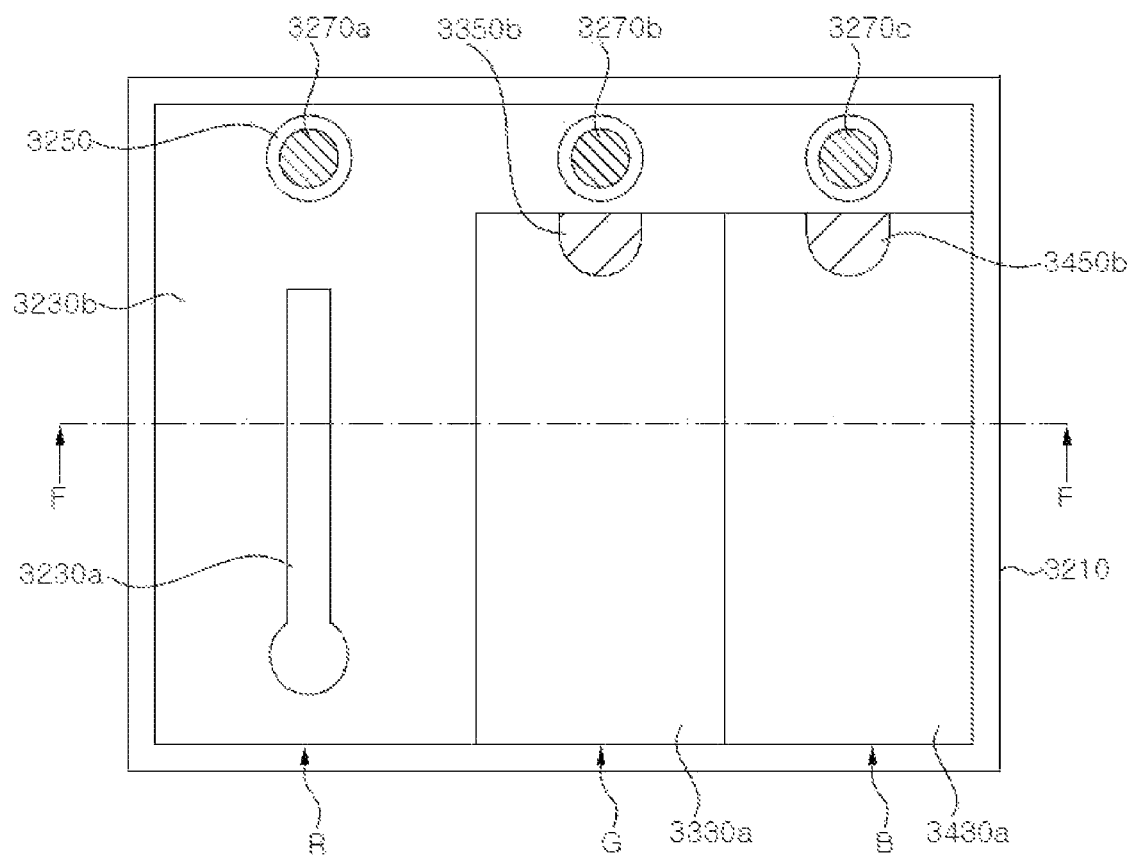
Figure 64B:
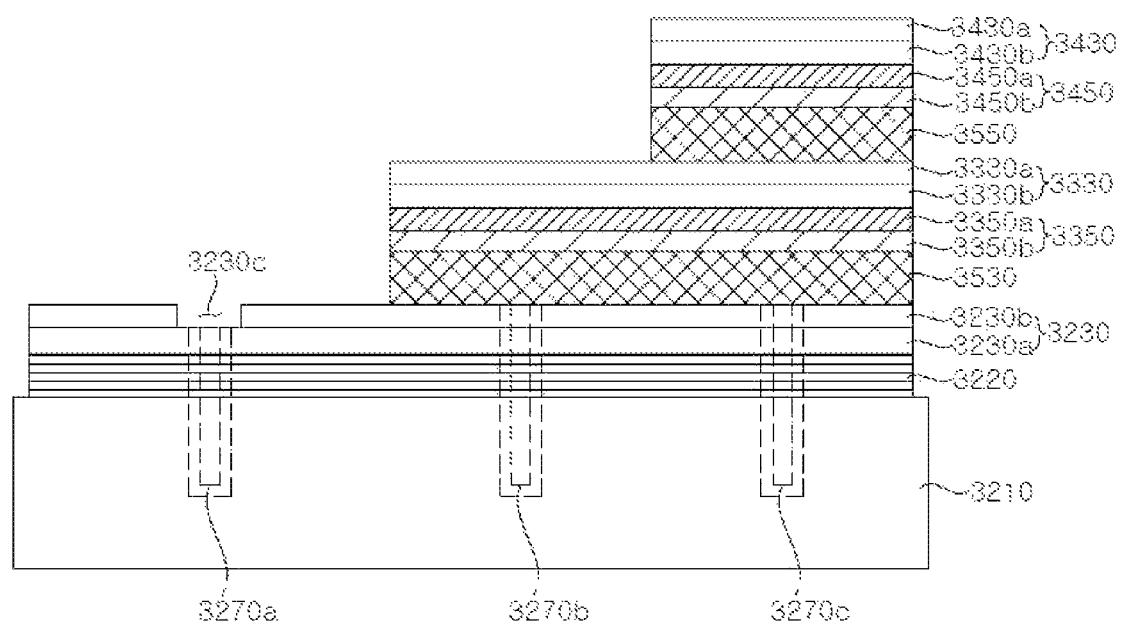

Referring to FIG. 64A and FIG. 64B, in each of pixel regions, the third LED stack 3430 is patterned to remove the third LED stack 3430 other than in the third subpixel B. In a region of the third subpixel B, an indentation is formed on the third LED stack 3430 to expose the barrier layer 3450*b* through the indentation.

Then, in regions other than the third subpixel B, the third-2 ohmic electrode 3450 and the second bonding layer 3550 are removed to expose the second LED stack 3330. As such, the third-2 ohmic electrode 3450 is restrictively placed near the region of the third subpixel B.

In each pixel region, the second LED stack 3330 is patterned to remove the second LED stack 3330 in regions other than the second subpixel G. In the region of the second subpixel G, the second LED stack 3330 partially overlaps the third LED stack 3430.

By patterning the second LED stack 3330, the second-2 ohmic electrode 3350 is exposed. The second LED stack 3330 may include an indentation, and the second-2 ohmic electrode 3350, for example, the barrier layer 3350*b*, may be exposed through the indentation.

Thereafter, the second-2 ohmic electrode 3350 and the first bonding layer 3530 are removed to expose the first LED stack 3230. As such, the second-2 ohmic electrode 3350 is disposed near the region of the second subpixel G. On the other hand, the first to third through-hole vias 3270*a*, 3270*b*, and 3270*c* are also exposed together with the first LED stack 3230.

In each pixel region, the first conductivity type semiconductor layer 3230*a* is exposed by patterning the second conductivity type semiconductor layer 3230*b* of the first LED stack 3230. As shown in FIG. 64A, the first conductivity type semiconductor layer 3230*a* may be exposed in an elongated shape, without being limited thereto.

Furthermore, the pixel regions are divided from one another by patterning the first LED stack 3230. As such, a region of the first subpixel R is defined. Here, the distributed Bragg reflector 3220 may also be divided. Alternatively, the distributed Bragg reflector 3220 may be continuously disposed over the plurality of pixels, rather than being divided. Further, the first conductivity type semiconductor layer 3230*a* may also be continuously disposed over the plurality of pixels.

Figure 65A:
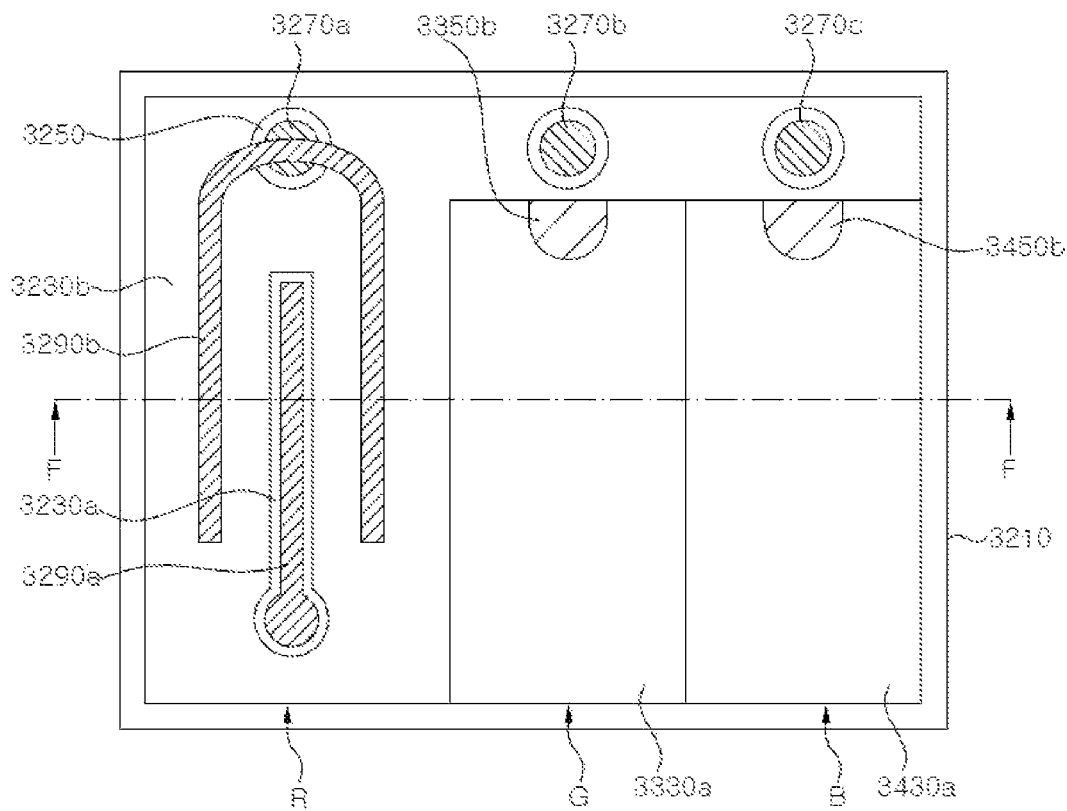
Figure 65B:
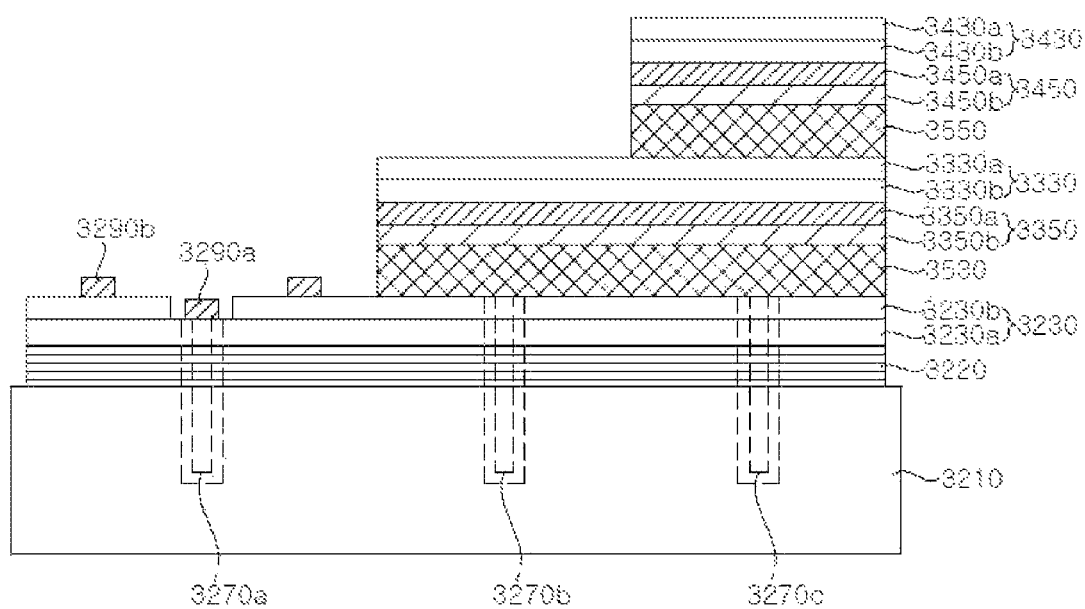

Referring to FIG. 65A and FIG. 65B, a first-1 ohmic electrode 3290*a* and a first-2 ohmic electrode 3290*b* are formed on the first LED stack 3230. The first-1 ohmic electrode 3290*a* may be formed of, for example, Au—Te or Au—Ge alloys on the exposed first conductivity type semiconductor layer 3230*a*. The first-2 ohmic electrode 3290*b* may be formed of, for example, Au—Be or Au—Zn alloys on the second conductivity type semiconductor layer 3230*b*. The first-2 ohmic electrode 3290*b* may be formed prior to the first-1 ohmic electrode 3290*a*, or vice versa. The first-2 ohmic electrode 3290*b* may be connected to the first through-hole via 3270*a*. On the other hand, the first-1 ohmic electrode 3290*a* may include a pad region and an extension, which may extend from the pad region towards the first through-hole via 3270*a*.

For current spreading, the first-2 ohmic electrode 3290*b* may be disposed to at least partially surround the first-1 ohmic electrode 3290*a*. Although each of the first-1 ohmic electrode 3290*a* and the first-2 ohmic electrode 3290*b* is being illustrated as having an elongated shape in FIG. 65A, the inventive concepts are not limited thereto. Alternatively, each of the first-1 ohmic electrode 3290*a* and the first-2 ohmic electrode 3290*b* may have a circular shape, for example.

Figure 66A:
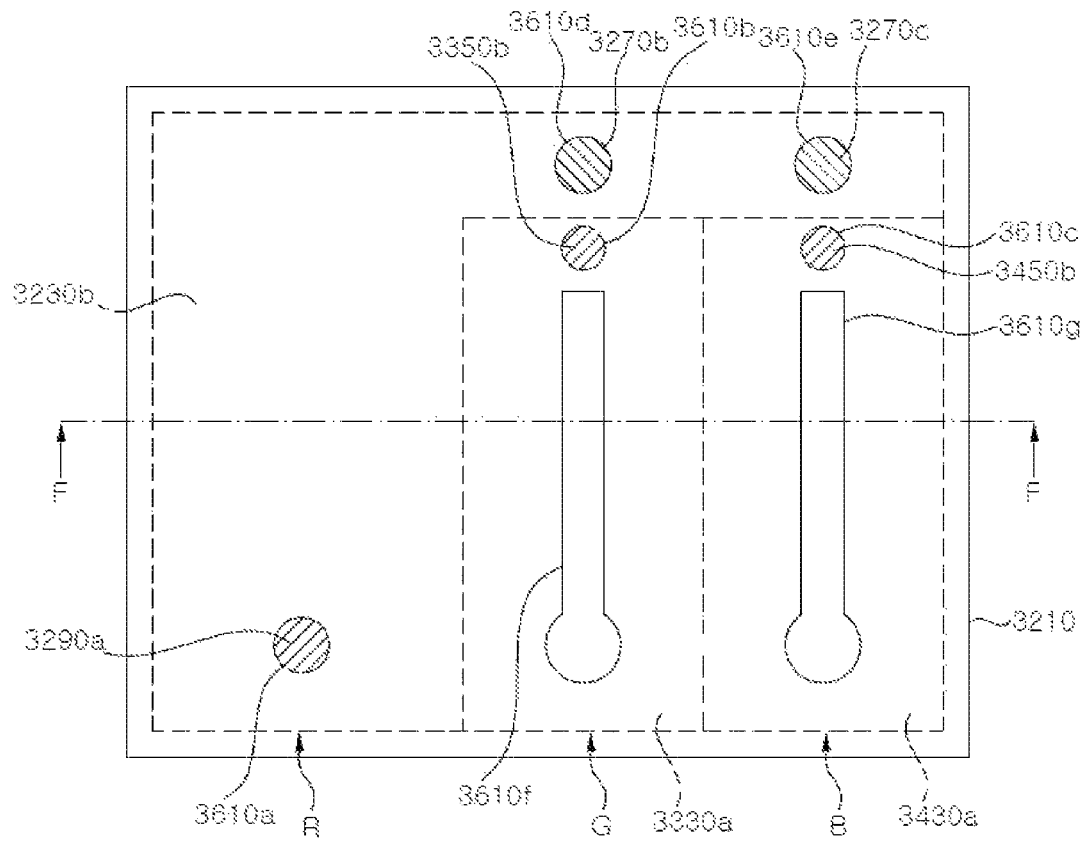
Figure 66B:
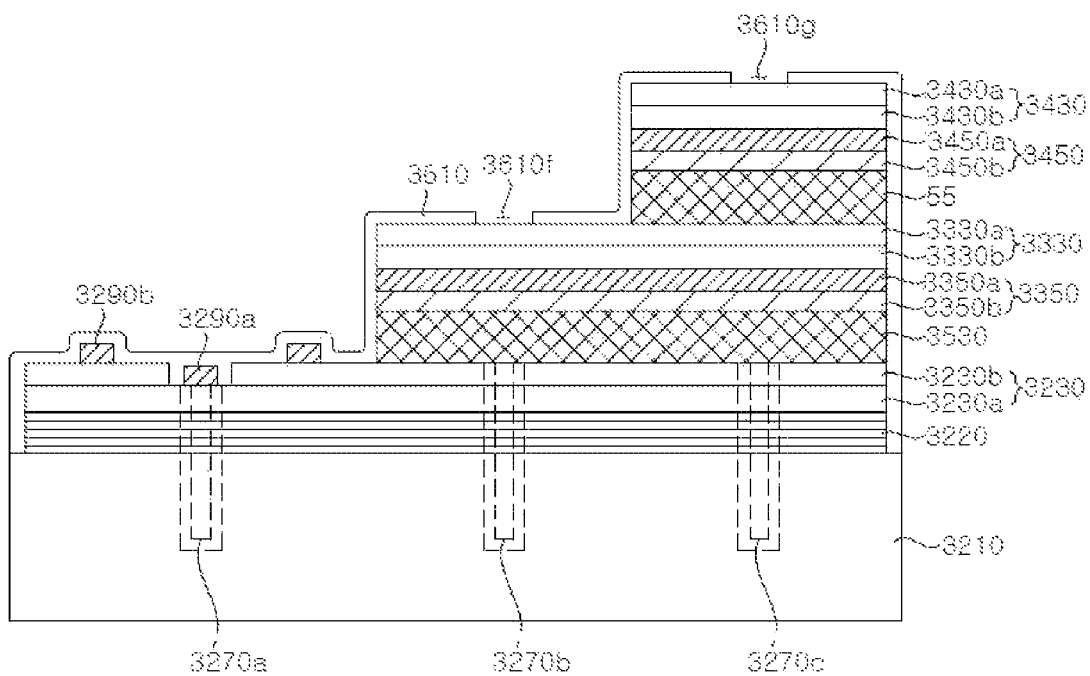

Referring to FIG. 66A and FIG. 66B, an upper insulation layer 3610 is formed to cover the first to third LED stacks 3230, 3330, 3430. The upper insulation layer 3610 may cover the first-1 ohmic electrode 3290*a* and the first-2 ohmic electrode 3290*b*. The upper insulation layer 3610 may also cover side surfaces of the first to third LED stacks 3230, 3330, and 3430, and a side surface of the distributed Bragg reflector 3220.

The upper insulation layer 3610 may have an opening 3610*a* which exposes the first-1 ohmic electrode 3290*a*, openings 3610*b*, 3610*c* which expose the barrier layers 3350*b*, 3450*b*, openings 3610*d*, 3610*e* which expose the second and third through-hole vias 3270*b*, 3270*c*, and openings 3610*f*, 3610*g* which expose the first conductivity type semiconductor layers 3330*a*, 3430*a* of the second LED stack 3330 and the third LED stack 3430.

Figure 67A:
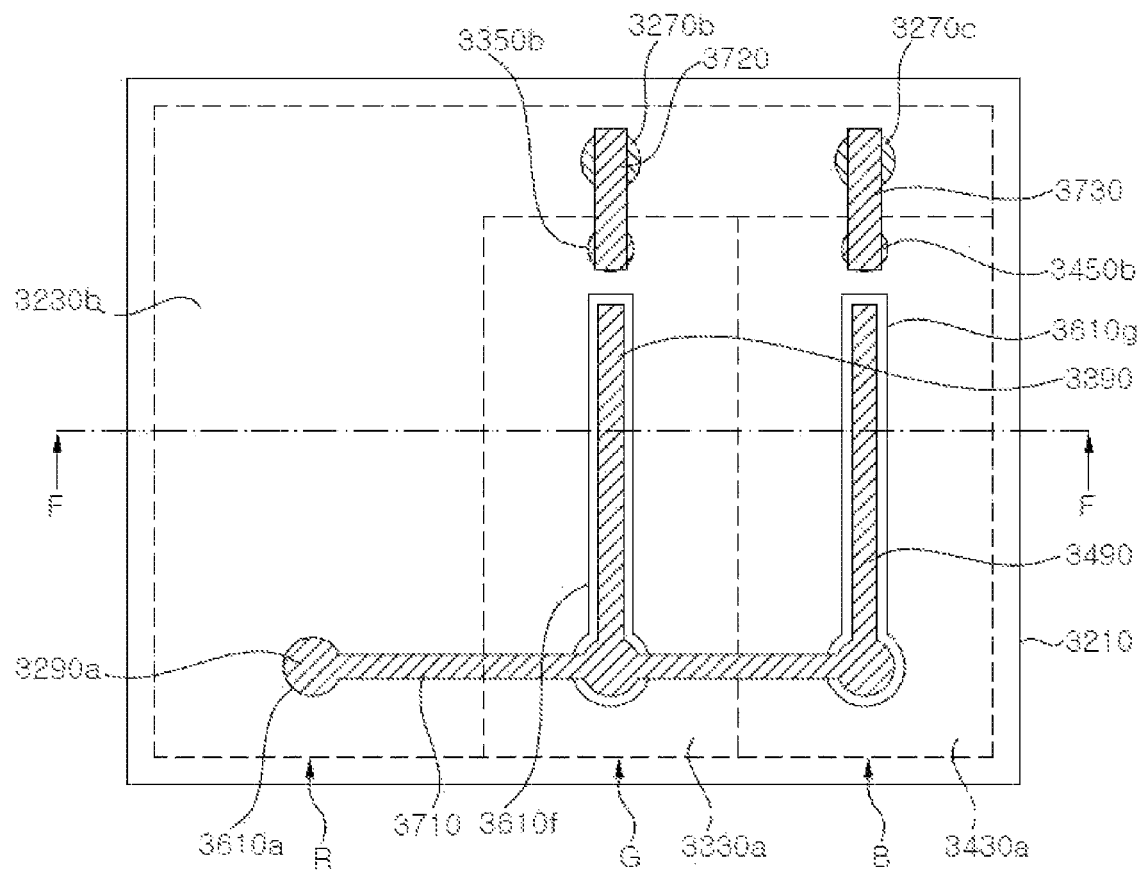
Figure 67B:
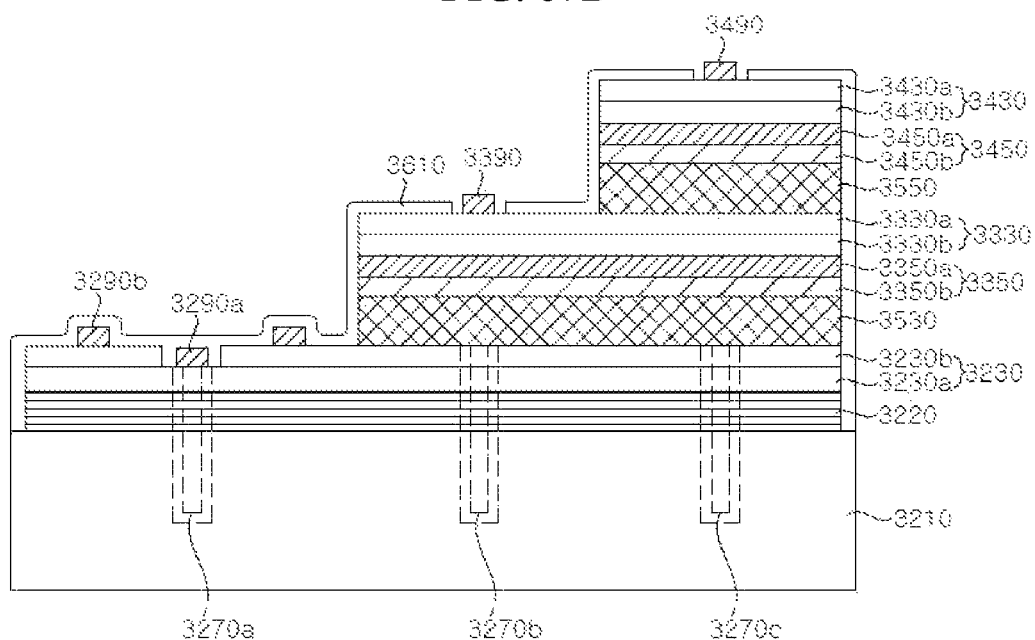

Referring to FIG. 67A and FIG. 67B, a second-1 ohmic electrode 3390, a third-1 ohmic electrode 3490 and connectors 3710, 3720, 3730 are formed. The second-1 ohmic electrode 3390 is formed in the opening 3610*f* to form ohmic contact with the first conductivity type semiconductor layer 3330*a*, and the third-1 ohmic electrode 3490 is formed in the opening 3610*g* to form ohmic contact with the first conductivity type semiconductor layer 3430*a*.

The connector 3710 electrically connects the second-1 ohmic electrode 3390 and the third-1 ohmic electrode 3490 to the first-1 ohmic electrode 3290*a*. The connector 3710 may be connected to, for example, the first-1 ohmic electrode 3290*a* exposed in the opening 3610*a*. The connector 3710 is formed on the upper insulation layer 3610 to be insulated from the second conductivity type semiconductor layers 3230*b*, 3330*b*, and 3430*b*.

The connector 3720 electrically connects the second-2 ohmic electrode 3350 to the second through-hole via 3270*b*, and the connector 3730 electrically connects the third-2 ohmic electrode 3450 to the third through-hole via 3270c. The connectors 3720, 3730 are disposed on the upper insulation layer 3610 to prevent short circuit to the first to third LED stacks 3230, 3330, and 3430.

The second-1 ohmic electrode 3390, the third-1 ohmic electrode 3490, and the connectors 3710, 3720, 3730 may be formed of substantially the same material by the same process. However, the inventive concepts are not limited thereto. Alternatively, the second-1 ohmic electrode 3390, the third-1 ohmic electrode 3490, and the connectors 3710, 3720, 3730 may be formed of different materials by different processes.

Figure 68A:
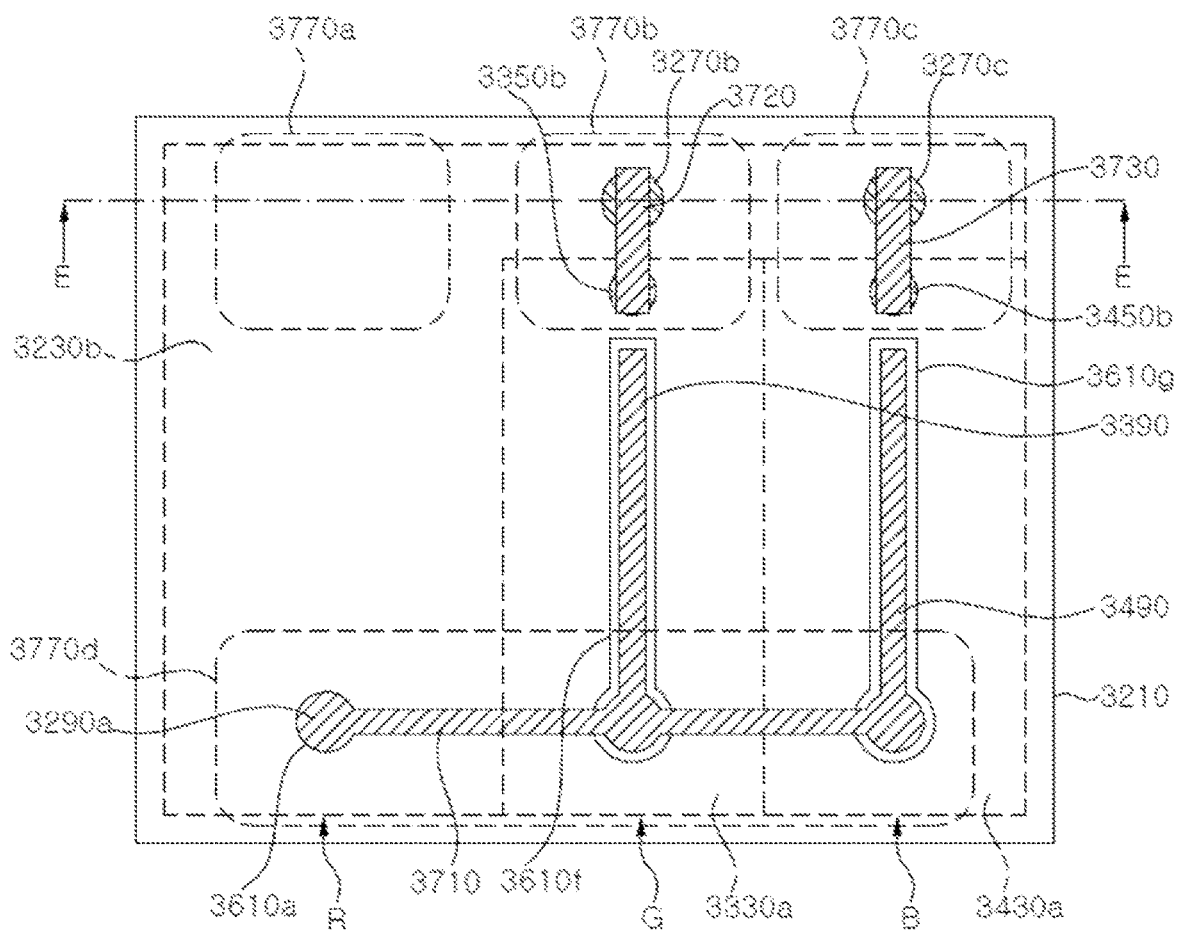
Figure 68B:
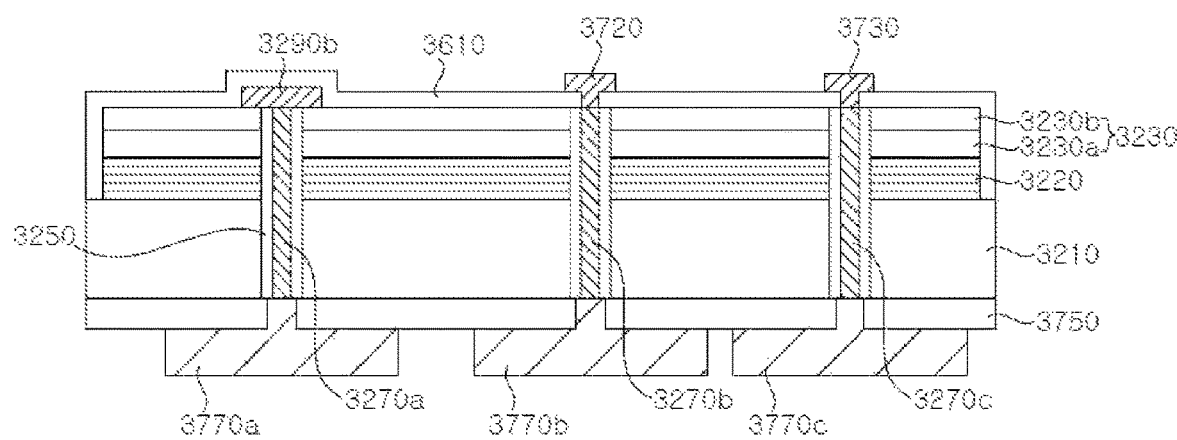

Thereafter, referring to FIG. 68A and FIG. 68B, a lower insulation layer 3750 is formed on a lower surface of the substrate 3210. The lower insulation layer 3750 has openings which expose the first to third the through-hole vias 3270a, 3270b, 3270c, and may also have opening(s) which expose the lower surface of the substrate 3210.

Electrode pads 3770a, 3770b, 3770c, 3770d are formed on the lower insulation layer 3750. The electrode pads 3770a, 3770b, 3770c are connected to the first to third the through-hole vias 3270a, 3270b, 3270c, respectively, and the electrode pad 3770d is connected to the substrate 3210.

Accordingly, the electrode pad 3770a is electrically connected to the second conductivity type semiconductor layer 3230b of the first LED stack 3230 through the first through-hole via 3270a, the electrode pad 3770b is electrically connected to the second conductivity type semiconductor layer 3330b of the second LED stack 3330 through the second through-hole via 3270b, and the electrode pad 3770c is electrically connected to the second conductivity type semiconductor layer 3430b of the third LED stack 3430 through the third through-hole via 3270c. The first conductivity type semiconductor layers 3230a, 3330a, 3430a of the first to third LED stacks 3230, 3330, 3430 are commonly electrically connected to the electrode pad 3770d.

In this manner, a display apparatus according to an exemplary embodiment may be formed by bonding the electrode pads 3770a, 3770b, 3770c, 3770d of the substrate 3210 to the circuit board 3510 shown in FIG. 56. As described above, the circuit board 3510 may include an active circuit or a passive circuit, whereby the display apparatus can be driven in an active matrix manner or in a passive matrix manner.

Figure 69:
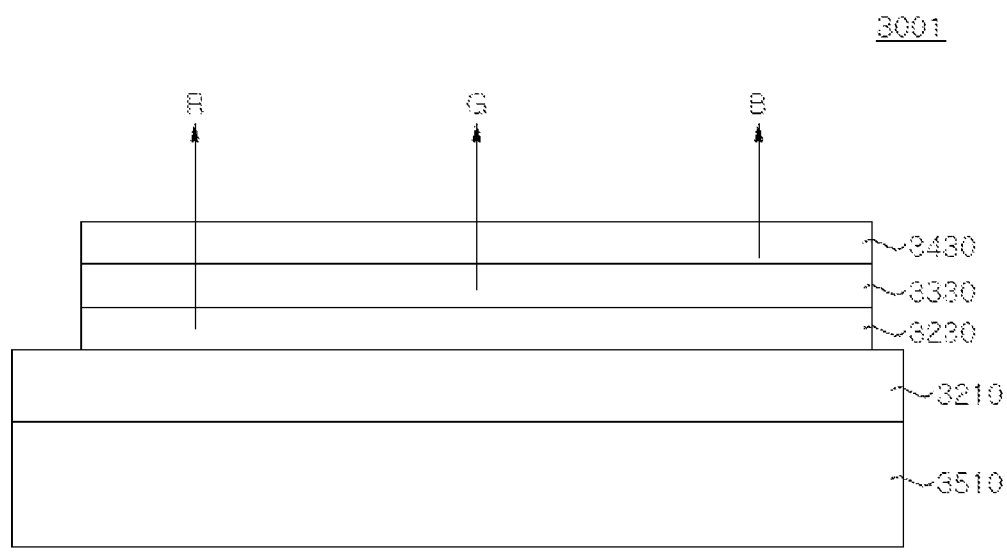
FIG. 69 is a cross-sectional view of a light emitting diode pixel for a display according to another exemplary embodiment.

FIG. 69 is a cross-sectional view of a light emitting diode pixel for a display according to another exemplary embodiment.

Referring to FIG. 69, the light emitting diode pixel 3001 of the display apparatus according to an exemplary embodiment is generally similar to the light emitting diode pixel 3000 of the display apparatus of FIG. 57, except that the second LED stack 3330 covers most of the first LED stack 3230 and the third LED stack 3430 covers most of the second LED stack 3330. In this manner, light generated from the first subpixel R is emitted to the outside after substantially passing through the second LED stack 3330 and the third LED stack 3430, and light generated from the second LED stack 3330 is emitted to the outside after substantially passing through the third LED stack 3430.

The first LED stack 3230 may include an active layer having a narrower bandgap than the second LED stack 3330 and the third LED stack 3430 to emit light having a longer wavelength than the second LED stack 3330 and the third LED stack 3430, and the second LED stack 3330 may include an active layer having a narrower bandgap than the third LED stack 3430 to emit light having a longer wavelength than the third LED stack 3430.

Figure 70:
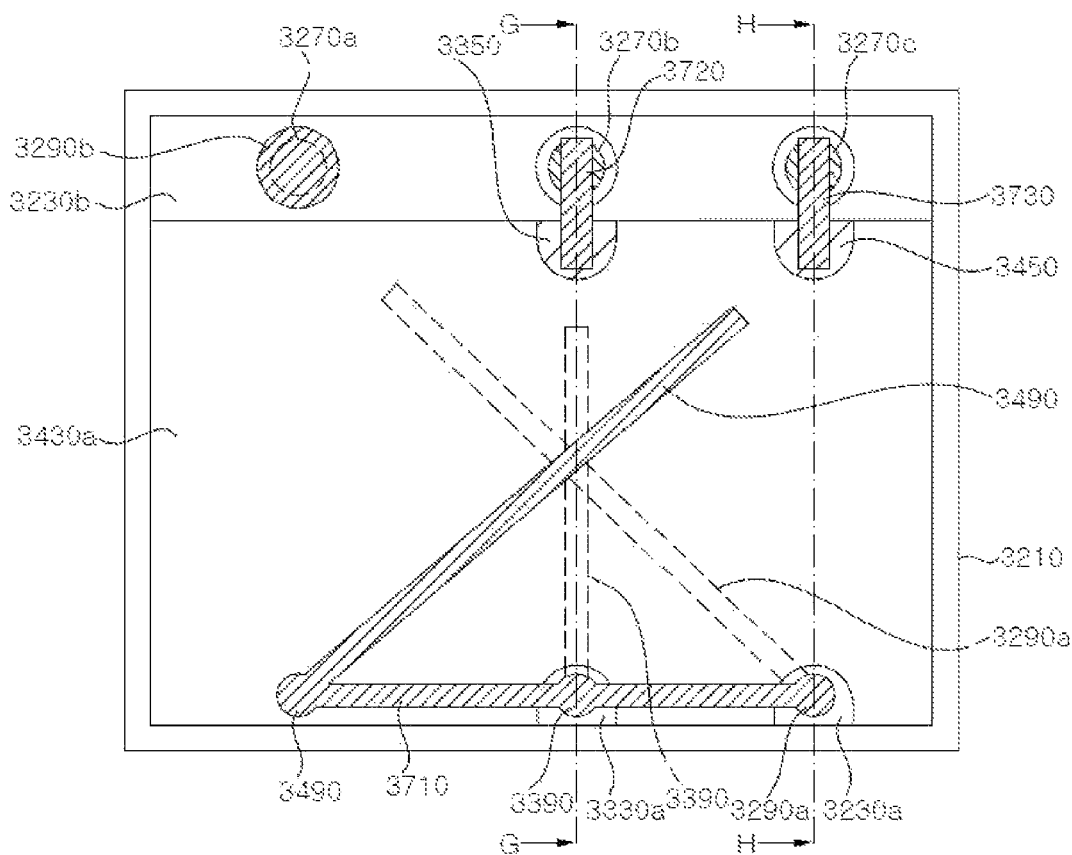
FIG. 70 is an enlarged top view of one pixel of a display apparatus according to an exemplary embodiment.
Figure 71A:
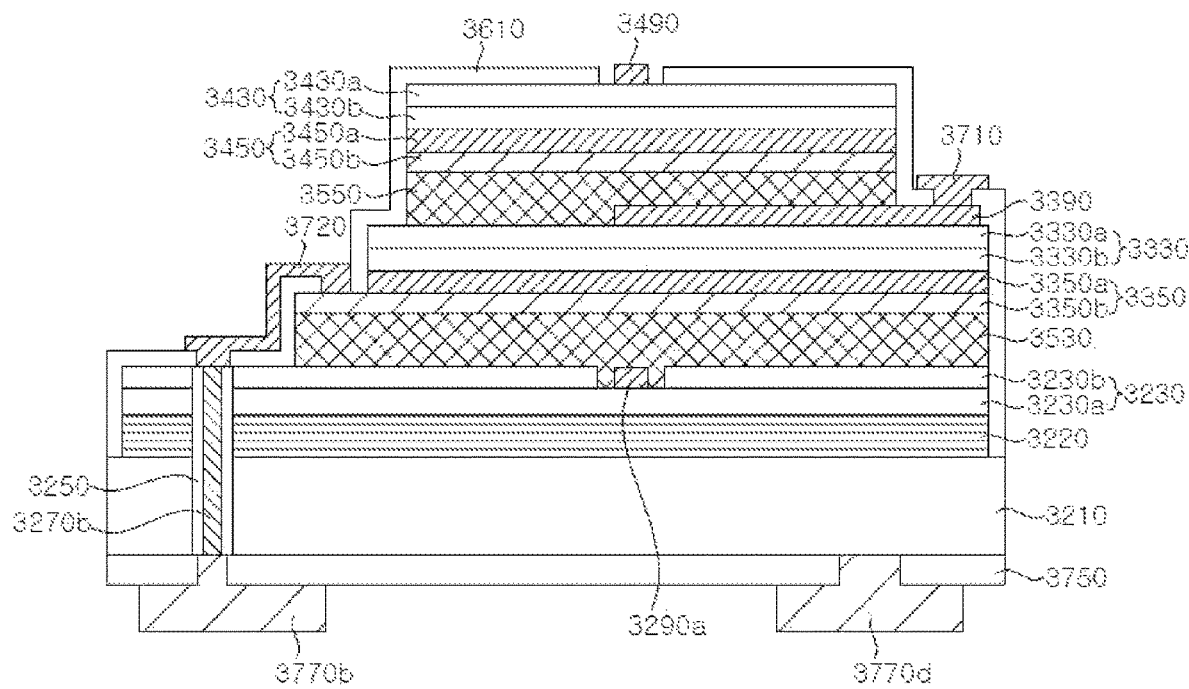
FIG. 71A and FIG. 71B are cross-sectional views taken along lines G-G and H-H of FIG. 70, respectively.
Figure 71B:
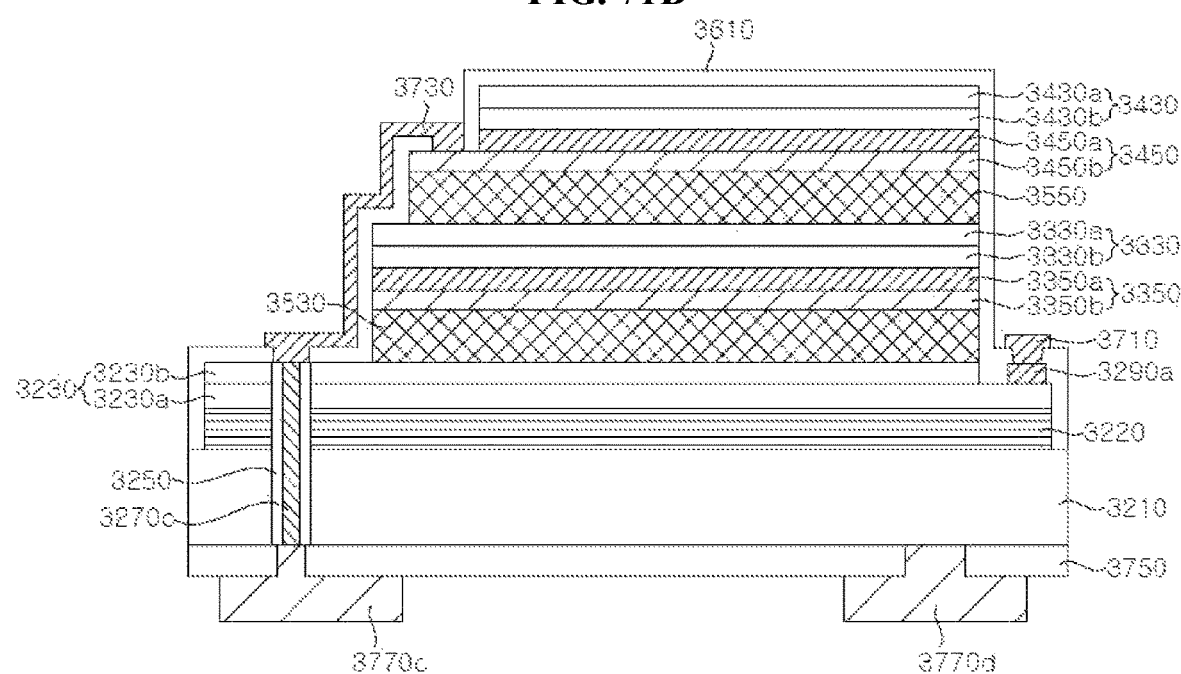

FIG. 70 is an enlarged top view of one pixel of a display apparatus according to an exemplary embodiment, and FIG. 71A and FIG. 71B are cross-sectional views taken along lines G-G and H-H of FIG. 70, respectively.

Referring to FIG. 70, FIG. 71A, and FIG. 71B, the pixel according to an exemplary embodiment is generally similar to the pixel of FIG. 59, FIG. 60A, FIG. 60B, and FIG. 60C, except that the second LED stack 3330 covers most of the first LED stack 3230 and the third LED stack 3430 covers most of the second LED stack 3330. The first to third through-hole vias 3270a, 3270b, 3270c may be disposed outside the second LED stack 3330 and the third LED stack 3430.

In addition, a portion of the first-1 ohmic electrode 3290a and a portion of the second-1 ohmic electrode 3390 may be disposed under the third LED stack 3430. As such, the first-1 ohmic electrode 3290a may be formed before the second LED stack 3330 is coupled to the first LED stack 3230, and the second-1 ohmic electrode 3390 may also be formed before the third LED stack 3430 is coupled to the second LED stack 3330.

Furthermore, light generated from the first LED stack 3230 is emitted to the outside after substantially passing through the second LED stack 3330 and the third LED stack 3430, and light generated from the second LED stack 3330 is emitted to the outside after substantially passing through the third LED stack 3430. Accordingly, the first bonding layer 3530 and the second bonding layer 3550 are formed of light transmissive materials, and the second-2 ohmic electrode 3350 and the third-2 ohmic electrode 3450 are composed of transparent conductive layers.

On the other hand, as shown in FIGS. 71A and 71B, an indentation may be formed on the third LED stack 3430 to expose the third-2 ohmic electrode 3450, and an indentation is continuously formed on the third LED stack 3430 and the second LED stack 3330 to expose the second-2 ohmic electrode 3350. The second-2 ohmic electrode 3350 and the third-2 ohmic electrode 3450 are electrically connected to the second through-hole via 3270b, and the third through-hole via 3270c through the connectors 3720, 3730, respectively.

Furthermore, the indentation may be formed on the third LED stack 3430 to expose the second-1 ohmic electrode 3390 formed on the first conductivity type semiconductor layer 3330a of the second LED stack 3330, and the indentation may be continuously formed on the third LED stack 3430 and the second LED stack 3330 to expose the first-1 ohmic electrode 3290a formed on the first conductivity type semiconductor layer 3230a of the first LED stack 3230. The connector 3710 may connect the first-1 ohmic electrode 3290a and the second-1 ohmic electrode 3390 to the third-1 ohmic electrode 3490. The third-1 ohmic electrode 3490 may be formed together with the connector 3710 and may be connected to the pad regions of the first-1 ohmic electrode 3290a and the second-1 ohmic electrode 3390.

The first-1 ohmic electrode 3290a and the second-1 ohmic electrode 3390 are partially disposed under the third LED stack 3430, but the inventive concepts are not limited thereto. For example, the portions of the first-1 ohmic electrode 3290a and the second-1 ohmic electrode 3390 disposed under the third LED stack 3430 may be omitted. Furthermore, the second-1 ohmic electrode 3390 may be omitted and the connector 3710 may form ohmic contact with the first conductivity type semiconductor layer 3330a.

According to exemplary embodiments, a plurality of pixels may be formed at the wafer level through wafer bonding, and thus, the process of individually mounting light emitting diodes may be obviated or substantially reduced.

Furthermore, since the through-hole vias 3270a, 3270b, 3270c are formed in the substrate 3210 and used as current paths, the substrate 3210 may not need to be removed. Accordingly, a growth substrate used for growth of the first LED stack 3230 can be used as the substrate 3210 without being removed from the first LED stack 3230.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode (LED) pixel for a display, comprising:
    a first LED stack;
    a second LED stack disposed on a partial region of the first LED stack;
    a third LED stack disposed on a partial region of the second LED stack;
    a first ohmic electrode disposed on the first LED stack and forming ohmic contact with the first LED stack;
    a second transparent electrode disposed between the second LED stack and the third LED stack and in ohmic contact with an upper surface of the second LED stack; and
    a third transparent electrode in ohmic contact with an upper surface of the third LED stack,
    wherein the first ohmic electrode is laterally spaced apart from the second LED stack.

2. The light emitting diode pixel of claim 1, wherein:
    a first portion of light generated from the first LED stack is emitted to the outside without passing through the second LED stack, a second portion of light generated from the first LED stack is emitted to the outside by passing through the second LED stack and the second transparent electrode, and a third portion of light generated from the first LED stack is emitted to the outside by passing through the second LED stack, the second transparent electrode, the third LED stack, and the third transparent electrode; and
    a first portion of light generated from the second LED stack is emitted to the outside without passing through the third LED stack, and a second portion of light generated from the third LED stack is emitted to the outside by passing through the third transparent electrode.

3. The light emitting diode pixel of claim 1, wherein each of the first LED stack, the second LED stack, and the third LED stack comprises a first-type semiconductor layer, a second-type semiconductor layer, and an active layer between the first-type semiconductor layer and the second-type semiconductor layer.

4. The light emitting diode pixel of claim 3, further comprising:
    a second ohmic electrode in contact with the first-type semiconductor layer of the second LED stack;
    a second current spreading layer disposed on the second transparent electrode;
    a third ohmic electrode in contact with the first-type semiconductor layer of the third LED stack; and
    a third current spreading layer disposed on the third transparent electrode,
    wherein the first ohmic electrode is in contact with the second-type semiconductor layer of the first LED stack, the second transparent electrode is in contact with the second-type semiconductor layer of the second LED stack, and the third transparent electrode is in contact with the second-type semiconductor layer of the third LED stack.

5. The light emitting diode pixel of claim 4, wherein the first ohmic electrode comprises a pad region and an extension part.

6. The light emitting diode pixel of claim 5, wherein each of the second current spreading layer and the third current spreading layer comprises a pad region and an extension part.

7. The light emitting diode pixel of claim 6, wherein one of the extension parts of the first ohmic electrode, the second current spreading layer, and the third current spreading layer extends in a direction opposite to a direction in which the remaining extension parts extend.

8. The light emitting diode pixel of claim 4, further comprising:
    a first bonding layer interposed between the first LED stack and the second LED stack; and
    a second bonding layer interposed between the second LED stack and the third LED stack,
    wherein the first bonding layer is configured to transmit light generated from the first LED stack and the second bonding layer is configured to transmit light generated from the second LED stack.

9. The light emitting diode pixel of claim 8, further comprising:
    a first color filter interposed between the first bonding layer and the second LED stack; and
    a second color filter interposed between the second bonding layer and the third LED stack,
    wherein the first color filter is configured to transmit light generated from the first LED stack and reflect light generated from the second LED stack, and
    wherein the second color filter is configured to transmit light generated from the second LED stack and reflect light generated from the third LED stack.

10. The light emitting diode pixel of claim 4, further comprising a reflection layer disposed under the first LED stack and in contact with the first-type semiconductor layer of the first LED stack.

11. The light emitting diode pixel of claim 10, wherein the second ohmic electrode and the third ohmic electrode are electrically connected to the reflection layer.

12. The light emitting diode pixel of claim 4, wherein the second ohmic electrode and the second current spreading layer are laterally spaced apart from the third LED stack.

13. The light emitting diode pixel of claim 4, further comprising a first current spreading layer disposed on the first ohmic electrode,
    wherein the first ohmic electrode is transparent.

14. The light emitting diode pixel of claim 1, wherein:
    the second LED stack is formed toward one side on the first LED stack; and
    the third LED stack is formed toward one side on the second LED stack.

15. The light emitting diode pixel of claim 1, wherein:

the first LED stack, the second LED stack, and the third LED stack are configured to emit light having wavelengths different from one another, respectively; and
the first LED stack, the second LED stack, and the third LED stack are configured to be driven independently.

16. A displaying apparatus comprising:
a support substrate; and
a plurality of pixels arranged on the support substrate, at least one of the pixels comprising:
  a first LED stack;
  a second LED stack disposed on a partial region of the first LED stack;
  a third LED stack disposed on a partial region of the second LED stack;
  a first ohmic electrode disposed on the first LED stack and forming ohmic contact with the first LED stack;
  a second transparent electrode disposed between the second LED stack and the third LED stack and in ohmic contact with an upper surface of the second LED stack; and
  a third transparent electrode in ohmic contact with an upper surface of the third LED stack,
wherein the first ohmic electrode is laterally spaced apart from the second LED stack.

17. The displaying apparatus of claim 16, wherein:
a first portion of light generated from the first LED stack is emitted to the outside without passing through the second LED stack, a second portion generated from the first LED stack is emitted to the outside by passing through the second LED stack and the second transparent electrode, and a third portion of light generated from the first LED stack is emitted to the outside by passing through the second LED stack, the second transparent electrode, the third LED stack, and the third transparent electrode; and
a first portion of light generated from the second LED stack is emitted to the outside without passing through the third LED stack, and a second portion of light generated from the second LED stack is emitted to the outside by passing through the third LED stack and the third transparent electrode.

18. The displaying apparatus of claim 16, wherein each of the first LED stack, the second LED stack, and the third LED stack comprises a first-type semiconductor layer, a second-type semiconductor layer, and an active layer between the first-type semiconductor layer and the second-type semiconductor layer.

19. The displaying apparatus of claim 18, further comprising:
  a second ohmic electrode in contact with the first-type semiconductor layer of the second LED stack;
  a second current spreading layer disposed on the second transparent electrode;
  a third ohmic electrode in contact with the first-type semiconductor layer of the third LED stack; and
  a third current spreading layer disposed on the third transparent electrode,
wherein the first ohmic electrode is in contact with the second-type semiconductor layer of the first LED stack, the second transparent electrode is in contact with the second-type semiconductor layer of the second LED stack, and the third transparent electrode is in contact with the second-type semiconductor layer of the third LED stack.

20. The light emitting diode pixel for a display of claim 19, wherein each of the first ohmic electrode, the second current spreading layer, and the third current spreading layer comprises a pad region and an extension part.

* * * * *